US011268996B2

(12) United States Patent
Vitullo et al.

(10) Patent No.: US 11,268,996 B2
(45) Date of Patent: Mar. 8, 2022

(54) BUILDING ENERGY MANAGEMENT SYSTEM WITH VIRTUAL AUDIT METRICS

(71) Applicant: Johnson Controls Technology Company, Auburn Hills, MI (US)

(72) Inventors: Steven R. Vitullo, Milwaukee, WI (US); Youngchoon Park, Brookfield, WI (US); Sudhi R. Sinha, Milwaukee, WI (US); Karl Reichenberger, Mequon, WI (US); Young M. Lee, Old Westbury, NY (US); Ada L. Ma, Kenmore, WA (US)

(73) Assignee: Johnson Controls Tyco IP Holdings LLP, Milwaukee, WI (US)

( * ) Notice: Subject to any disclaimer, the term of this patent is extended or adjusted under 35 U.S.C. 154(b) by 251 days.

(21) Appl. No.: 16/366,862

(22) Filed: Mar. 27, 2019

(65) Prior Publication Data

US 2019/0302157 A1 Oct. 3, 2019

Related U.S. Application Data

(60) Provisional application No. 62/650,401, filed on Mar. 30, 2018.

(51) Int. Cl.
*G01R 22/10* (2006.01)
*G01R 22/06* (2006.01)
(Continued)

(52) U.S. Cl.
CPC ........... *G01R 22/10* (2013.01); *G01R 22/063* (2013.01); *G01W 1/06* (2013.01); *G05B 15/02* (2013.01)

(58) Field of Classification Search
CPC ....... G01R 22/10; G01R 22/063; G01W 1/06; G05B 15/02; G05B 2219/2642; G01K 17/20
See application file for complete search history.

(56) References Cited

U.S. PATENT DOCUMENTS 6,785,592 B1 * 8/2004 Smith .................... G06Q 50/06 700/291
9,354,968 B2 5/2016 Wenzel et al.
(Continued)

FOREIGN PATENT DOCUMENTS

CN 202870581 U * 4/2013 ........... G05B 19/418
CN 104279692 A * 1/2015 ............. F24F 11/30
(Continued)

OTHER PUBLICATIONS

Abraxas Energy Consulting, LLC. Jan. 30, 2018. URL: https://www.abraxasenergy.com/energy-auditsbanner/?gclid=EAIaIQob-ChMIgdKk7az92AIVXbbACh203w91EAMYAyAAEgl6j_D_BwE.

(Continued)

*Primary Examiner* — Tung S Lau
(74) *Attorney, Agent, or Firm* — Foley & Lardner LLP

(57) ABSTRACT

The present disclosure is directed to a method for performing energy analytics in a building management system. The method can include collecting respective data samples of one or more variables from building equipment during a first period of time and a second period of time. The method can include calculating a first plurality of values for one or more energy audit metrics based on the data samples collected during the first period of time and the second period of time. The method can include comparing the first plurality of values and second plurality of values. The method can include displaying, based on the comparison, at least one of the first plurality of values and/or at least one of the second plurality of values on a dashboard to facilitate adjustment of the one or move variables.

20 Claims, 76 Drawing Sheets

(51) Int. Cl.
*G01W 1/06* (2006.01)
*G05B 15/02* (2006.01)

(56) References Cited

U.S. PATENT DOCUMENTS

| | | | | | |
|---|---|---|---|---|---|
| 9,410,752 | B2 * | 8/2016 | Wallace | F28F 27/00 | |
| 10,545,525 | B2 * | 1/2020 | Kamel | H02J 13/0006 | |
| 2003/0229572 | A1 * | 12/2003 | Raines | G06Q 40/00 | 705/37 |
| 2010/0283606 | A1 * | 11/2010 | Tsypin | G05B 15/02 | 340/540 |
| 2012/0150509 | A1 * | 6/2012 | Shiel | G06Q 50/06 | 703/2 |
| 2013/0304269 | A1 * | 11/2013 | Shiel | G06Q 50/06 | 700/291 |
| 2014/0129197 | A1 * | 5/2014 | Sons | G06F 30/13 | 703/7 |
| 2014/0371936 | A1 * | 12/2014 | Kamel | G01R 21/1333 | 700/291 |
| 2016/0180220 | A1 * | 6/2016 | Boettcher | G05B 19/042 | 700/276 |
| 2017/0179716 | A1 * | 6/2017 | Vitullo | G05B 13/04 | |
| 2017/0212482 | A1 * | 7/2017 | Boettcher | F24F 11/62 | |
| 2017/0276571 | A1 * | 9/2017 | Vitullo | G06Q 10/06 | |
| 2018/0113482 | A1 * | 4/2018 | Vitullo | G05D 23/1917 | |
| 2019/0302157 | A1 * | 10/2019 | Vitullo | G01R 22/063 | |
| 2019/0302709 | A1 * | 10/2019 | Vitullo | G05B 13/041 | |
| 2019/0338972 | A1 * | 11/2019 | Schuster | G05B 23/0283 | |

FOREIGN PATENT DOCUMENTS

| | | | | | |
|---|---|---|---|---|---|
| CN | 104571034 | A | * | 4/2015 | G05B 19/418 |
| CN | 102460335 | B | * | 7/2015 | G06Q 10/04 |
| CN | 108800431 | A | * | 11/2018 | F24F 11/84 |
| CN | 208936370 | U | * | 6/2019 | Y02E 60/14 |
| CN | 209054644 | U | * | 7/2019 | Y02E 10/40 |
| WO | WO 0197511 | A1 | * | 12/2001 | H04N 5/44 |
| WO | WO 03058385 | A2 | * | 7/2003 | G06Q 30/02 |
| WO | WO 2019157602 | A1 | * | 8/2019 | F24F 11/64 |

OTHER PUBLICATIONS

ANSI/ASHRAE/IES Standard 100-2015. Energy Efficiency in Existing Buildings. 2015.

Arpa E. Virtual Building Energy Audits. Case Western Reserve University. Data Analytics for Virtual Energy Audits and Value Capture Assessments of Buildings. Open 2015 Grant Funded Project. URL: https://arpa-e.energy.gov/?q=slick-sheet-project/virtual-building-energy-audits.

Hung, A. Energy Efficiency and Statistical Analysis of Buildings at Case Western Reserve University. Master's Thesis. Department of Mechanical and Aerospace Engineering, Case Western Reserve University. Jan. 2016. URL: https://core.ac.uk/download/pdf/47055624.pdf.

Pickering, E. M. A cross-sectional study of the temporal evolution of electricity consumption of six commercial buildings. PLOS One. URL: http://journals.plos.org/plosone/article?id=10.1371/journal.pone.0187129. Oct. 31, 2017.

US Department of Energy, Energy Efficiency & Renewable Energy, Building Technologies Program. A Guide to Energy Audits. Sep. 25, 2011. PNNL-20956. https://www.pnnl.gov/main/publications/external/technicaL _reports/PNNL-20956.pdf.

Vitullo, et al. "Mathematical Models for Natural Gas Forecasting," Canadian Applied Mathematics Quarterly, vol. 17, No. 7, Winter 2009, 22 pages.

* cited by examiner

750

| Raw Data Timeseries (704) | | Average Quarter-Hour Timeseries (706) | | Average Hourly Timeseries (708) | | Average Daily Timeseries (710) | |
|---|---|---|---|---|---|---|---|
| Timestamp | Value | Timestamp | Value | Timestamp | Value | Timestamp | Value |
| 2015-12-31T23:10:00 | 10 | 2015-12-31T23:00:00 | 10 | 2015-12-31T23:00:00 | 28.8 | 2015-12-31T23:00:00 | 28.8 |
| 2015-12-31T23:20:01 | 20 | 2015-12-31T23:15:00 | 20 | | | | |
| 2015-12-31T23:30:02 | 30 | 2015-12-31T23:30:00 | 35 | | | | |
| 2015-12-31T23:40:03 | 40 | | | | | | |
| 2015-12-31T23:50:04 | 50 | 2015-12-31T23:45:00 | 50 | | | | |
| 2016-01-01T00:00:05 | 60 | 2016-01-01T00:00:00 | 65 | 2016-01-01T00:00:00 | 87.5 | 2016-01-01T00:00:00 | 87.5 |
| 2016-01-01T00:10:06 | 70 | | | | | | |
| 2016-01-01T00:20:07 | 80 | 2016-01-01T00:15:00 | 80 | | | | |
| 2016-01-01T00:30:08 | 90 | 2016-01-01T00:30:00 | 95 | | | | |
| 2016-01-01T00:40:09 | 100 | | | | | | |
| 2016-01-01T00:50:10 | 110 | 2016-01-01T00:45:00 | 110 | | | | |

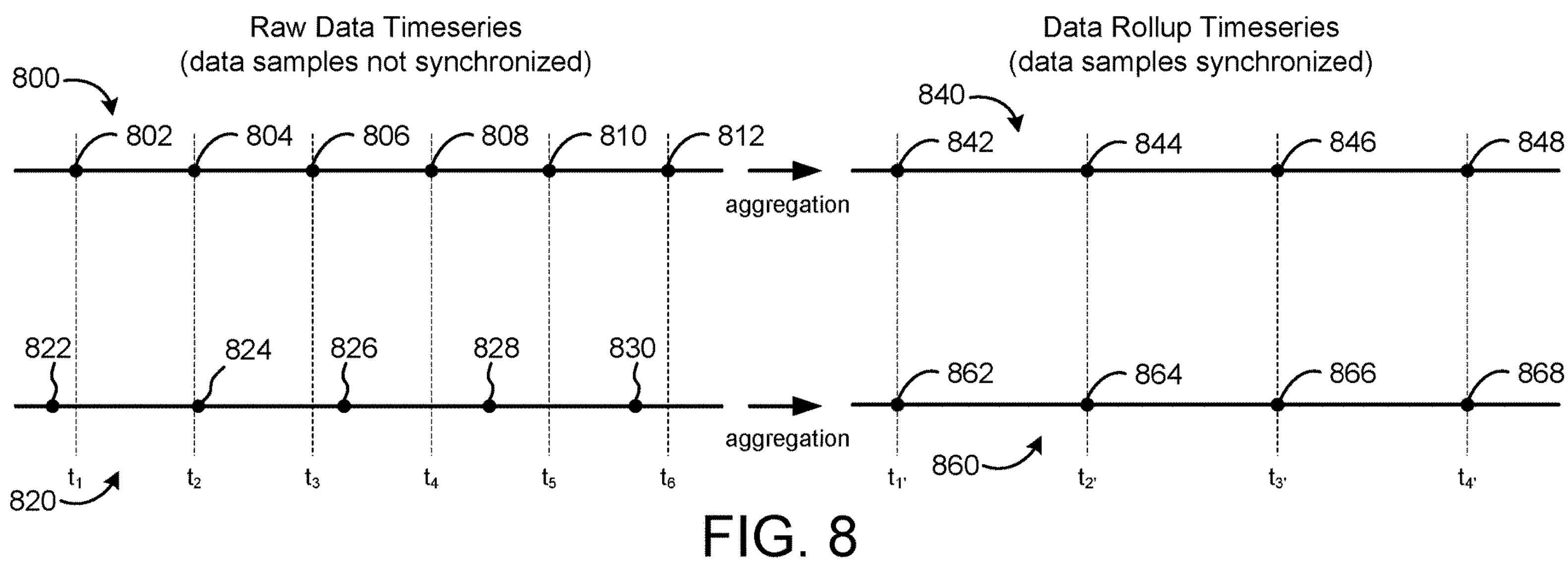
FIG. 8
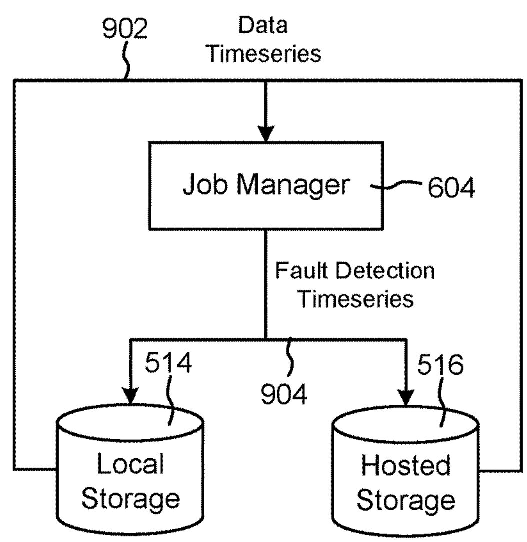
FIG. 9A
900 902 904
| Data Timeseries | | Fault Detection Timeseries | |
|---|---|---|---|
| Timestamp | Value | Timestamp | Value |
| 2015-12-31T23:10:00 | 65 | 2015-12-31T23:10:00 | Not in Fault |
| 2015-12-31T23:20:00 | 65 | 2015-12-31T23:20:00 | Not in Fault |
| 2015-12-31T23:30:00 | 42 | 2015-12-31T23:30:00 | Fault |
| 2015-12-31T23:40:00 | 66 | 2015-12-31T23:40:00 | Not in Fault |
| 2015-12-31T23:50:00 | 42 | 2015-12-31T23:50:00 | Fault |
| 2016-01-01T00:00:00 | 42 | 2016-01-01T00:00:00 | Fault |
| 2016-01-01T00:10:00 | 66 | 2016-01-01T00:10:00 | Not in Fault |
| 2016-01-01T00:20:00 | 66 | 2016-01-01T00:20:00 | Not in Fault |
FIG. 9B

1400

```
{
  "name" : "University Campus/Main Building/Main Floor/Wing3",   } 1402
  "collapsible" : false,
  "maximizable" : false,
  "editable" : false,
  "rows" : [                                   1404
    {
      "columns": [                             1406
        {
          "widget" : {                         1408
            "name" : "MEMS Meter",             } 1412
            "type" : "spline",
            "config" : {
              "title" : "",                    } 1414
              "x_title": "datetime",
              "y_title": "KW",
              "token_api": "https://dev-platform.bldng.io/IDM/ims/connect/token",
              "sample_api" : "https://dev-platform.bldng.io/Timeseries2/samples",
              "points" : ["6f2504f5-a1f9-459c-b9d9-6fff8ce027b0.Raw",
                          "6f2504f5-a1f9-459c-b9d9-6fff8ce027b0.AverageYearly",
                          "6f2504f5-a1f9-459c-b9d9-6fff8ce027b0.AverageQuarterHour",
                          "6f2504f5-a1f9-459c-b9d9-6fff8ce027b0.AverageMonthly",
                          "6f2504f5-a1f9-459c-b9d9-6fff8ce027b0.AverageHourly",
                          "6f2504f5-a1f9-459c-b9d9-6fff8ce027b0.AverageDaily"]
            }
          }
        },
        {
          "widget" : {                         1410
            "name" : "MEMS Meter",             } 1416
            "type" : "column",
            "config" : {
              "title" : "Instantaneous Consumption",   } 1418
              "x_title": "datetime",
              "y_title": "KWH",
              "token_api": "https://dev-platform.bldng.io/IDM/ims/connect/token",
              "sample_api" : "https://dev-platform.bldng.io/Timeseries2/samples",
              "points" : ["b4c4dc93-5eff-4158-b731-4337aa3812ca.Raw",
                          "b4c4dc93-5eff-4158-b731-4337aa3812ca.DeltaYearly",
                          "b4c4dc93-5eff-4158-b731-4337aa3812ca.DeltaQuarterHour",
                          "b4c4dc93-5eff-4158-b731-4337aa3812ca.DeltaMonthly",
                          "b4c4dc93-5eff-4158-b731-4337aa3812ca.DeltaHourly",
                          "b4c4dc93-5eff-4158-b731-4337aa3812ca.DeltaDaily"]
            }
          }
        }
      ]
    }
  ]
}
```

FIG. 14

```
{
  "name" : "University Campue/Main Building/Main Floor/Wing5",
  "collapsible" : false,
  "maximizable" : false,
  "editable" : false,
  "rows" : [
    {
      "columns": [
        {
          "widget" : {
              "name" : "BTU Meter",
              "type" : "spline",
              "config" : {
                "title" : "Instantaneous Consumption",
                "x_title": "datetime",
                "y_title": "",
                "token_api": "https://dev-platform.bldng.io/IDM/ims/connect/token",
                "sample_api" : "https://dev-platform.bldng.io/Timeseries2/samples",
                "points" : ["f6e4bb1c-f8f5-47d1-8da5-283362cb3f5d.Raw",
                          "f6e4bb1c-f8f5-47d1-8da5-283362cb3f5d.TotalYearly",
                          "f6e4bb1c-f8f5-47d1-8da5-283362cb3f5d.TotalQuarterHour",
                          "f6e4bb1c-f8f5-47d1-8da5-283362cb3f5d.TotalMonthly",
                          "f6e4bb1c-f8f5-47d1-8da5-283362cb3f5d.TotalHourly",
                          "f6e4bb1c-f8f5-47d1-8da5-283362cb3f5d.TotalDaily"]
              }
          }
        }
      ]
    },
        {
      "columns": [
        {
          "widget" : {
              "name" : "Meter 1",
              "type" : "spline",
              "config" : {
                "title" : "Instantaneous Consumption",
                "x_title": "datetime",
                "y_title": "",
                "token_api": "https://dev-platform.bldng.io/IDM/ims/connect/token",
                "sample_api" : "https://dev-platform.bldng.io/Timeseries2/samples",
                "points" : ["1e829c3f-1967-41ef-a3b4-8b1ecbcca2e6.Raw",
                          "1e829c3f-1967-41ef-a3b4-8b1ecbcca2e6.AverageYearly",
                          "1e829c3f-1967-41ef-a3b4-8b1ecbcca2e6.AverageQuarterHour",
                          "1e829c3f-1967-41ef-a3b4-8b1ecbcca2e6.AverageMonthly",
                          "1e829c3f-1967-41ef-a3b4-8b1ecbcca2e6.AverageHourly",
                          "1e829c3f-1967-41ef-a3b4-8b1ecbcca2e6.AverageDaily"]
              }
          }
        },
        {
          "widget" : {
              "name" : "Meter 1",
              "type" : "spline",
              "config" : {
                "title" : "Interval Consumption",
                "x_title": "datetime",
                "y_title": "",
                "token_api": "https://dev-platform.bldng.io/IDM/ims/connect/token",
                "sample_api" : "https://dev-platform.bldng.io/Timeseries2/samples",
                "points" : ["e332d56e-a8e2-402c-89f5-a66b5ac93c3f.Raw",
                          "e332d56e-a8e2-402c-89f5-a66b5ac93c3f.TotalYearly",
                          "e332d56e-a8e2-402c-89f5-a66b5ac93c3f.TotalQuarterHour",
                          "e332d56e-a8e2-402c-89f5-a66b5ac93c3f.TotalMonthly",
                          "e332d56e-a8e2-402c-89f5-a66b5ac93c3f.TotalHourly",
                          "e332d56e-a8e2-402c-89f5-a66b5ac93c3f.TotalDaily"]
              }
          }
        }
      ]
    }
  ]
}
```

BUILDING ENERGY MANAGEMENT SYSTEM WITH VIRTUAL AUDIT METRICS

CROSS-REFERENCE TO RELATED APPLICATION

The present application claims priority to U.S. Provisional Patent Application No. 62/650,401, filed on Mar. 30, 2018, which is incorporated by reference herein in its entirety.

BACKGROUND

A building management system (BMS) is, in general, a system of devices configured to control, monitor, and manage equipment in and/or around a building or building area. A BMS can include, for example, an HVAC system, a security system, a lighting system, a fire alerting system, and any other system that is capable of managing building functions or devices, or any combination thereof. As the number of BMS devices used in various sectors increases, the amount of data being produced and collected has been increasing exponentially. Accordingly, effective analysis and information management of a plethora of collected data is desired.

BRIEF SUMMARY

In some embodiments, systems and methods are discussed herein for incorporating various calculated metrics into an automated digital building energy audit system and/or into a dashboard application. These digital audit markers can be brought into the dashboard application via the cloud and can be displayed next to other building efficiency metrics. These digital audit metrics can be determined at a particular period. In some embodiments, the metrics are determined yearly as they may tend not to change significantly unless there is a change in building construction. Furthermore, yearly reported synthetic time series can be generated from these digital audit markers to compare year over year efficiency performance.

In some embodiments, the systems and methods can be configured to implement building markers in a dashboard application for display with other energy efficiency metrics to provide insights on energy efficiency and potential energy saving opportunities to users. In some embodiments, the systems and methods can combine digital energy audit results with energy management dashboards. Furthermore, the systems and methods can be configured to perform digital energy audits based on the virtual audit metrics to generate recommendations to customers through the dashboard application for retrofitting improvements like a level 1 American Society of heating, Refrigeration, and Air-Conditioning Engineers (ASHRAE) building audit.

In some embodiments, the systems and methods can be configured to detect when a building HVAC turns on in an automated and accurate way using an occupancy schedule marker virtual audit metric. This schedule can supplement and/or replace a user defined schedule. In some embodiments, the systems and methods may receive a user defined baseline. However, the system can supplement and/or the user defined baseline with a determined virtual audit metric baseline.

In some embodiments, the systems and methods can be configured to use a baseline virtual audit metric, heating load audit metrics, and/or cooling load audit metrics to provide insight into a building HVAC needs. The systems and methods can be configured to use the baseline load audit metric to determine whether electric consumption is above and/or below the baseline and can provide various insights into a building HVAC needs to an end user.

In some embodiments, the systems and metrics can determine R-value audit metrics. The systems and methods can be configured to display the R-value audit metrics next to a current energy density, consumption, and weather normalization value in a dashboard to provide the user information about their buildings energy efficiency. In some embodiments, the systems and methods can be configured to generate recommendations to improve building efficiency based on the virtual audit metrics. Examples of such recommendations may be pointing out where building scheduling could be improved, recommending for more insulation to be installed, recommending to use more gas heating instead of electric heat, etc.

In one aspect, the present disclosure is directed to a method for performing energy analytics in a building management system. The method can include operating building equipment of a building to monitor and control one or more variables of a building management system. The method can include collecting respective data samples of the one or more variables from the building equipment during a first period of time. The method can include calculating a first plurality of values for one or more energy audit metrics based on the data samples collected during the first period of time. The method can include collecting respective data samples of the one or more variables from the building equipment during a second period of time. The method can include calculating a second plurality of values for the one or more energy audit metrics based on the data samples collected during the second period of time. The method can include comparing the first plurality of values and second plurality of values. The method can include displaying, based on the comparison, at least one of the first plurality of values and/or at least one of the second plurality of values on a dashboard to facilitate adjustment of the one or move variables.

In another aspect, the present disclosure is directed to a computing device. The computing device includes a memory and one or more processors operatively coupled to the memory. The one or more processors are configured to operate building equipment of a building to monitor and control one or more variables of a building management system. The one or more processors are configured to collect respective data samples of the one or more variables from the building equipment during a first period of time. The one or more processors are configured to calculate a first plurality of values for one or more energy audit metrics based on the data samples collected during the first period of time. The one or more processors are configured to collect respective data samples of the one or more variables from the building equipment during a second period of time. The one or more processors are configured to calculate a second plurality of values for the one or more energy audit metrics based on the data samples collected during the second period of time. The one or more processors are configured to compare the first plurality of values and second plurality of values. The one or more processors are configured to display, based on the comparison, at least one of the first plurality of values and/or at least one of the second plurality of values on a dashboard to facilitate adjustment of the one or move variables.

In yet another aspect, the present disclosure is directed to a non-transitory computer readable medium storing program instructions. The program instructions can cause the one or more processors to operate building equipment of a building to monitor and control one or more variables of a building management system. The program instructions can cause the one or more processors to collect respective data samples of the one or more variables from the building equipment during a first period of time. The program instructions can cause the one or more processors to calculate a first plurality of values for one or more energy audit metrics based on the data samples collected during the first period of time. The program instructions can cause the one or more processors to collect respective data samples of the one or more variables from the building equipment during a second period of time. The program instructions can cause the one or more processors to calculate a second plurality of values for the one or more energy audit metrics based on the data samples collected during the second period of time. The program instructions can cause the one or more processors to compare the first plurality of values and second plurality of values. The program instructions can cause the one or more processors to display, based on the comparison, at least one of the first plurality of values and/or at least one of the second plurality of values on a dashboard to facilitate adjustment of the one or move variables.

BRIEF DESCRIPTION OF THE DRAWINGS

FIG. 8 is a drawing of several timeseries illustrating the synchronization of data samples which can be performed by the data aggregator shown in FIG. 6, according to some embodiments.

FIG. 9A is a flow diagram illustrating the creation and storage of a fault detection timeseries which can be performed by the job manager shown in FIG. 6, according to some embodiments.

FIG. 9B is a data table which can be used to store the raw data timeseries and the fault detection timeseries, according to some embodiments.

FIG. 14 is an example of object code describing a dashboard layout which can be generated by the dashboard layout generator of FIG. 5, according to some embodiments.

FIG. 16 is another example of object code describing another dashboard layout which can be generated by the dashboard layout generator of FIG. 5, according to some embodiments.

DETAILED DESCRIPTION

Overview

Referring generally to the FIGURES, systems and methods are shown for determining virtual audit metrics, according to an exemplary embodiment. The systems and methods can generate virtual audit metrics and/or other information about energy consumption and efficiency for a facility and can help facility managers and users to gain insights into their buildings operations and energy efficiency. The systems and methods can provide additional information to a user so that the user can better understand their building and its operations. This additional information can incorporate various calculated virtual audit metrics for automated digital building energy audits into a dashboard application.

The virtual audit metrics can be brought into the dashboard application via the cloud and can be displayed next to other existing energy efficiency metrics. In many cases, building energy audits are performed with an on-site inspection. However, the systems and methods configured to generate the virtual audit metrics allow for digital energy audits to be performed via the dashboard application. The dashboard can use many building automated digital characteristics to provide a user with information regarding their energy efficiency and building characteristics that they would not otherwise have.

The systems and methods can determine the virtual audit metrics periodically (e.g., every 10 minutes, every hour, every day, every month, every year, etc.) In some embodiments, the systems can be configured to determine the virtual energy metrics yearly if they tend to not change significantly unless there is a change in building construction. In some embodiments, a change in building construction may cause the system to generate the virtual audit metrics.

In some embodiments, the systems and methods can perform periodic reporting, e.g., periodically presenting a user with a report via the dashboard. The report may track the virtual audit metrics over time so that a user can compare their building efficiency performance over time (e.g., year to year changes in performance). The virtual audit metrics can be synthetic time-series data points and can be presented as trends to a user via the dashboard.

In some embodiments, the systems and methods can implement building markers (e.g., the virtual audit metrics) in a dashboard for display next to other energy efficiency metrics to provide insights on energy efficiency and potential energy saving opportunities to customers. Furthermore, the systems and methods can combine digital energy audit metrics or a digital audit with an energy management dashboard. Furthermore, the systems and methods can generate recommendations to a user via the dashboard for various improvements (e.g., building retrofits) based on a digital energy audit (e.g., based on the digital audit metrics). The improvements may be improvements much like the improvements determined from level 1 ASHRAE building audits.

Building Management System and HVAC System

Figure 1:
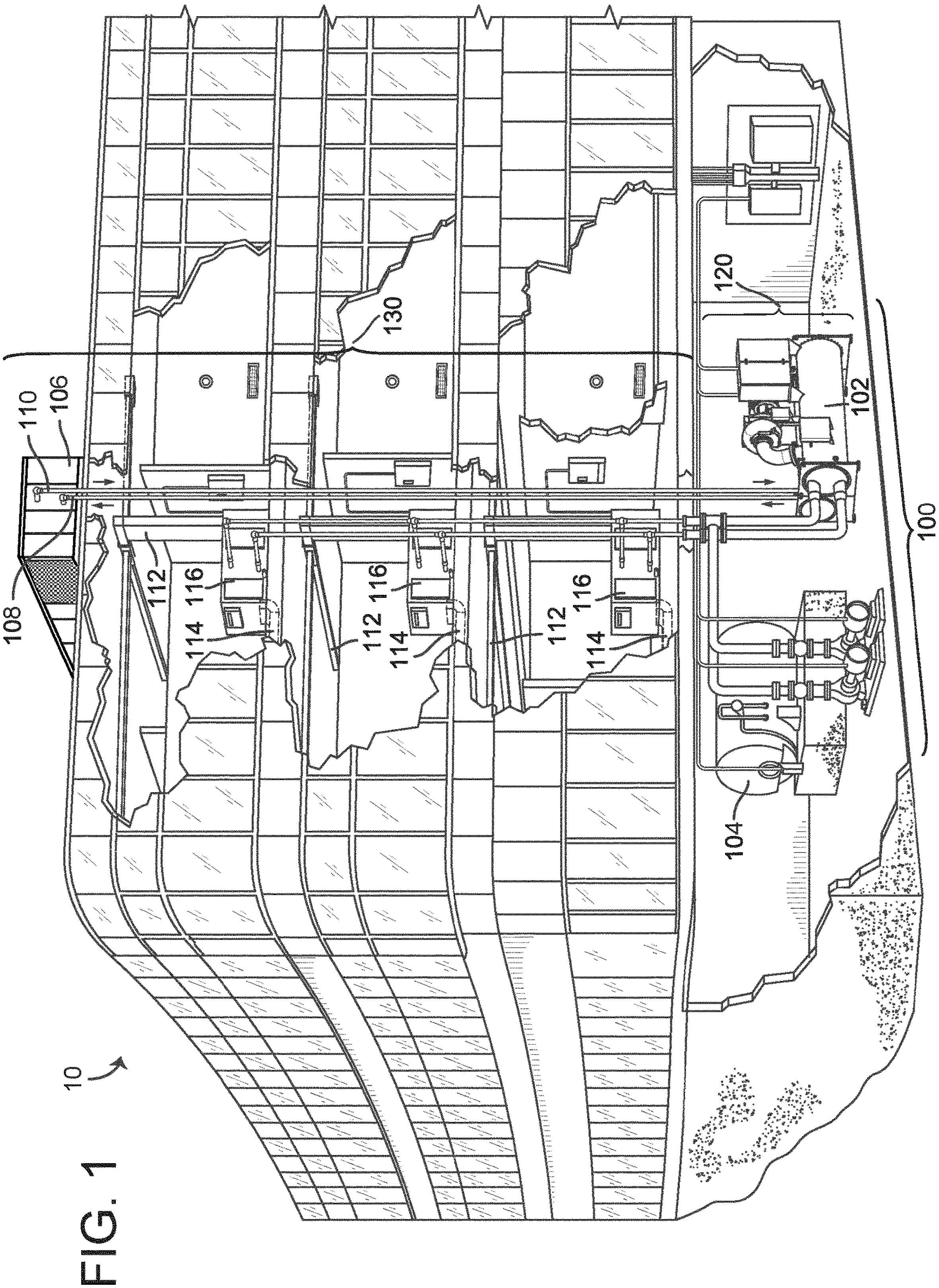
FIG. 1 is a drawing of a building equipped with a building management system (BMS) and a HVAC system, according to some embodiments.

Referring now to FIGS. 1-4, an exemplary building management system (BMS) and HVAC system in which the systems and methods of the present disclosure can be implemented are shown, according to an exemplary embodiment. Referring particularly to FIG. 1, a perspective view of a building 10 is shown. Building 10 is served by a BMS. A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof.

The BMS that serves building 10 includes an HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 can provide a heated or chilled fluid to an air handling unit of airside system 130. Airside system 130 can use the heated or chilled fluid to heat or cool an airflow provided to building 10. An exemplary waterside system and airside system which can be used in HVAC system 100 are described in greater detail with reference to FIGS. 2-3.

HVAC system 100 is shown to include a chiller 102, a boiler 104, and a rooftop air handling unit (AHU) 106. Waterside system 120 can use boiler 104 and chiller 102 to heat or cool a working fluid (e.g., water, glycol, etc.) and can circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 can add heat to the circulated fluid, for example, by burning a combustible material (e.g., natural gas) or using an electric heating element. Chiller 102 can place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 can place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 can transfer heat between the airflow and the working fluid to provide heating or cooling for the airflow. For example, AHU 106 can include one or more fans or blowers configured to pass the airflow over or through a heat exchanger containing the working fluid. The working fluid can then return to chiller 102 or boiler 104 via piping 110.

Airside system 130 can deliver the airflow supplied by AHU 106 (i.e., the supply airflow) to building 10 via air supply ducts 112 and can provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 can receive input from sensors located within AHU 106 and/or within the building zone and can adjust the flow rate, temperature, or other attributes of the supply airflow through AHU 106 to achieve setpoint conditions for the building zone.

Figure 2:
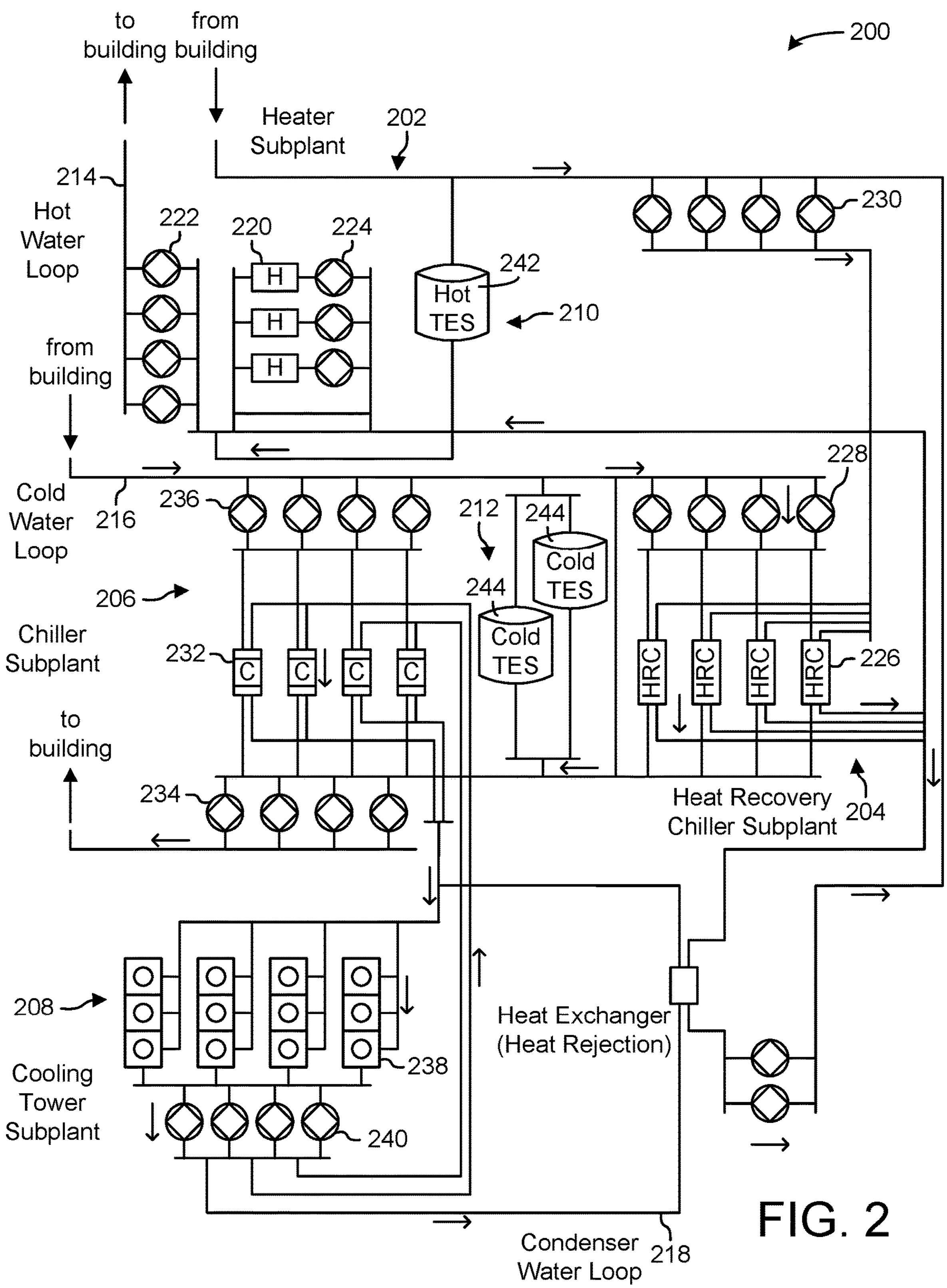
FIG. 2 is a schematic of a waterside system which can be used as part of the HVAC system of FIG. 1, according to some embodiments.

Referring now to FIG. 2, a block diagram of a waterside system 200 is shown, according to an exemplary embodiment. In various embodiments, waterside system 200 can supplement or replace waterside system 120 in HVAC system 100 or can be implemented separate from HVAC system 100. When implemented in HVAC system 100, waterside system 200 can include a subset of the HVAC devices in HVAC system 100 (e.g., boiler 104, chiller 102, pumps, valves, etc.) and can operate to supply a heated or chilled fluid to AHU 106. The HVAC devices of waterside system 200 can be located within building 10 (e.g., as components of waterside system 120) or at an offsite location such as a central plant.

In FIG. 2, waterside system 200 is shown as a central plant having a plurality of subplants 202-212. Subplants 202-212 are shown to include a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve the thermal energy loads (e.g., hot water, cold water, heating, cooling, etc.) of a building or campus. For example, heater subplant 202 can be configured to heat water in a hot water loop 214 that circulates the hot water between heater subplant 202 and building 10. Chiller subplant 206 can be configured to chill water in a cold water loop 216 that circulates the cold water between chiller subplant 206 building 10. Heat recovery chiller subplant 204 can be configured to transfer heat from cold water loop 216 to hot water loop 214 to provide additional heating for the hot water and additional cooling for the cold water. Condenser water loop 218 can absorb heat from the cold water in chiller subplant 206 and reject the absorbed heat in cooling tower subplant 208 or transfer the absorbed heat to hot water loop 214. Hot TES subplant 210 and cold TES subplant 212 can store hot and cold thermal energy, respectively, for subsequent use.

Hot water loop 214 and cold water loop 216 can deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air can be delivered to individual zones of building 10 to serve the thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, CO2, etc.) can be used in place of or in addition to water to serve the thermal energy loads. In other embodiments, subplants 202-212 can provide heating and/or cooling directly to the building or campus without requiring an intermediate heat transfer fluid. These and other variations to waterside system 200 are within the teachings of the present invention.

Each of subplants 202-212 can include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 can also include one or more pumps or valves configured to control the flow rate of the hot water into or out of hot TES tank 242. Cold TES subplant 212 is shown to include cold TES tanks 244 configured to store the cold water for later use. Cold TES subplant 212 can also include one or more pumps or valves configured to control the flow rate of the cold water into or out of cold TES tanks 244.

In some embodiments, one or more of the pumps in waterside system 200 (e.g., pumps 222, 224, 228, 230, 234, 236, and/or 240) or pipelines in waterside system 200 include an isolation valve associated therewith. Isolation valves can be integrated with the pumps or positioned upstream or downstream of the pumps to control the fluid flows in waterside system 200. In various embodiments, waterside system 200 can include more, fewer, or different types of devices and/or subplants based on the particular configuration of waterside system 200 and the types of loads served by waterside system 200.

Figure 3:
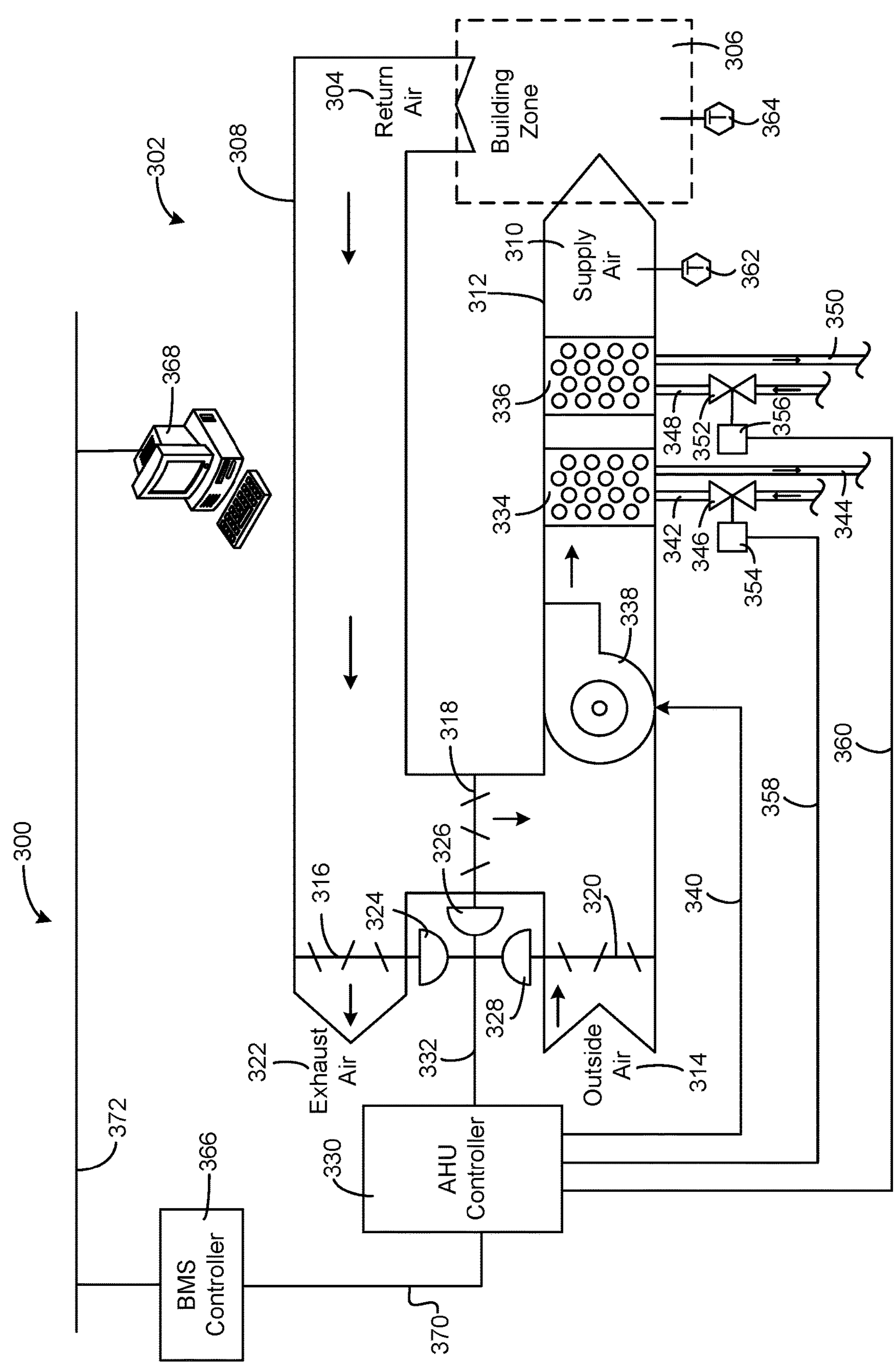
FIG. 3 is a block diagram of an airside system which can be used as part of the HVAC system of FIG. 1, according to some embodiments.

Referring now to FIG. 3, a block diagram of an airside system 300 is shown, according to an exemplary embodiment. In various embodiments, airside system 300 can supplement or replace airside system 130 in HVAC system 100 or can be implemented separate from HVAC system 100. When implemented in HVAC system 100, airside system 300 can include a subset of the HVAC devices in HVAC system 100 (e.g., AHU 106, VAV units 116, ducts 112-114, fans, dampers, etc.) and can be located in or around building 10. Airside system 300 can operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 can receive return air 304 from building zone 306 via return air duct 308 and can deliver supply air 310 to building zone 306 via supply air duct 312. In some embodiments, AHU 302 is a rooftop unit located on the roof of building 10 (e.g., AHU 106 as shown in FIG. 1) or otherwise positioned to receive both return air 304 and outside air 314. AHU 302 can be configured to operate exhaust air damper 316, mixing damper 318, and outside air damper 320 to control an amount of outside air 314 and return air 304 that combine to form supply air 310. Any return air 304 that does not pass through mixing damper 318 can be exhausted from AHU 302 through exhaust damper 316 as exhaust air 322.

Each of dampers 316-320 can be operated by an actuator. For example, exhaust air damper 316 can be operated by actuator 324, mixing damper 318 can be operated by actuator 326, and outside air damper 320 can be operated by actuator 328. Actuators 324-328 can communicate with an AHU controller 330 via a communications link 332. Actuators 324-328 can receive control signals from AHU controller 330 and can provide feedback signals to AHU controller 330. Feedback signals can include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that can be collected, stored, or used by actuators 324-328. AHU controller 330 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 can be configured to force supply air 310 through cooling coil 334 and/or heating coil 336 and provide supply air 310 to building zone 306. AHU controller 330 can communicate with fan 338 via communications link 340 to control a flow rate of supply air 310. In some embodiments, AHU controller 330 controls an amount of heating or cooling applied to supply air 310 by modulating a speed of fan 338.

Cooling coil 334 can receive a chilled fluid from waterside system 200 (e.g., from cold water loop 216) via piping 342 and can return the chilled fluid to waterside system 200 via piping 344. Valve 346 can be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 can receive a heated fluid from waterside system 200 (e.g., from hot water loop 214) via piping 348 and can return the heated fluid to waterside system 200 via piping 350. Valve 352 can be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, by BMS controller 366, etc.) to modulate an amount of heating applied to supply air 310.

Each of valves 346 and 352 can be controlled by an actuator. For example, valve 346 can be controlled by actuator 354 and valve 352 can be controlled by actuator 356. Actuators 354-356 can communicate with AHU controller 330 via communications links 358-360. Actuators 354-356 can receive control signals from AHU controller 330 and can provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 can also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a setpoint temperature for supply air 310 or to maintain the temperature of supply air 310 within a setpoint temperature range). The positions of valves 346 and 352 affect the amount of heating or cooling provided to supply air 310 by cooling coil 334 or heating coil 336 and may correlate with the amount of energy consumed to achieve a desired supply air temperature. AHU controller 330 can control the temperature of supply air 310 and/or building zone 306 by activating or deactivating coils 334-336, adjusting a speed of fan 338, or a combination of both.

Still referring to FIG. 3, airside system 300 is shown to include a building management system (BMS) controller 366 and a client device 368. BMS controller 366 can include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 can communicate with multiple downstream building systems or subsystems (e.g., HVAC system 100, a security system, a lighting system, waterside system 200, etc.) via a communications link 370 according to like or disparate protocols (e.g., LON, BACnet, etc.). In various embodiments, AHU controller 330 and BMS controller 366 can be separate (as shown in FIG. 3) or integrated. In an integrated implementation, AHU controller 330 can be a software module configured for execution by a processor of BMS controller 366.

In some embodiments, AHU controller 330 receives information from BMS controller 366 (e.g., commands, setpoints, operating boundaries, etc.) and provides information to BMS controller 366 (e.g., temperature measurements, valve or actuator positions, operating statuses, diagnostics, etc.). For example, AHU controller 330 can provide BMS controller 366 with temperature measurements from temperature sensors 362-364, equipment on/off states, equipment operating capacities, and/or any other information that can be used by BMS controller 366 to monitor or control a variable state or condition within building zone 306.

Client device 368 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 can be a computer workstation, a client terminal, a remote or local interface, or any other type of user interface device. Client device 368 can be a stationary terminal or a mobile device. For example, client device 368 can be a desktop computer, a computer server with a user interface, a laptop computer, a tablet, a smartphone, a PDA, or any other type of mobile or non-mobile device. Client device 368 can communicate with BMS controller 366 and/or AHU controller 330 via communications link 372.

Figure 4:
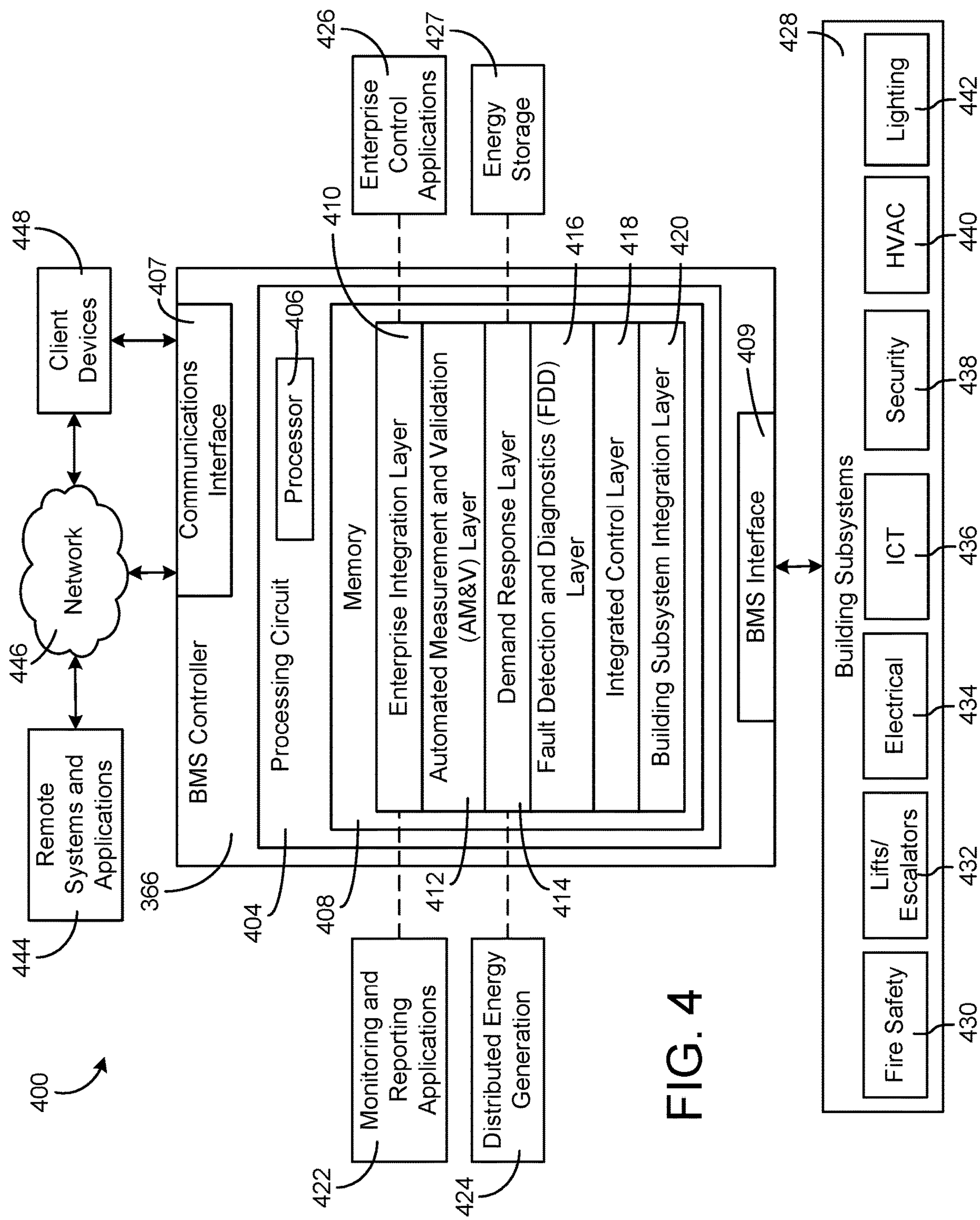
FIG. 4 is a block diagram of a BMS which can be used in the building of FIG. 1, according to some embodiments.

Referring now to FIG. 4, a block diagram of a building management system (BMS) 400 is shown, according to an exemplary embodiment. BMS 400 can be implemented in building 10 to automatically monitor and control various building functions. BMS 400 is shown to include BMS controller 366 and a plurality of building subsystems 428. Building subsystems 428 are shown to include a building electrical subsystem 434, an information communication technology (ICT) subsystem 436, a security subsystem 438, a HVAC subsystem 440, a lighting subsystem 442, a lift/escalators subsystem 432, and a fire safety subsystem 430. In various embodiments, building subsystems 428 can include fewer, additional, or alternative subsystems. For example, building subsystems 428 can also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 10. In some embodiments, building subsystems 428 include waterside system 200 and/or airside system 300, as described with reference to FIGS. 2-3.

Each of building subsystems 428 can include any number of devices, controllers, and connections for completing its individual functions and control activities. HVAC subsystem 440 can include many of the same components as HVAC system 100, as described with reference to FIGS. 1-3. For example, HVAC subsystem 440 can include a chiller, a boiler, any number of air handling units, economizers, field controllers, supervisory controllers, actuators, temperature sensors, and other devices for controlling the temperature, humidity, airflow, or other variable conditions within building 10. Lighting subsystem 442 can include any number of light fixtures, ballasts, lighting sensors, dimmers, or other devices configured to controllably adjust the amount of light provided to a building space. Security subsystem 438 can include occupancy sensors, video surveillance cameras, digital video recorders, video processing servers, intrusion detection devices, access control devices and servers, or other security-related devices.

Still referring to FIG. 4, BMS controller 366 is shown to include a communications interface 407 and a BMS interface 409. Interface 407 can facilitate communications between BMS controller 366 and external applications (e.g., monitoring and reporting applications 422, enterprise control applications 426, remote systems and applications 444, applications residing on client devices 448, etc.) for allowing user control, monitoring, and adjustment to BMS controller 366 and/or subsystems 428. Interface 407 can also facilitate communications between BMS controller 366 and client devices 448. BMS interface 409 can facilitate communications between BMS controller 366 and building subsystems 428 (e.g., HVAC, lighting security, lifts, power distribution, business, etc.).

Interfaces 407, 409 can be or include wired or wireless communications interfaces (e.g., jacks, antennas, transmitters, receivers, transceivers, wire terminals, etc.) for conducting data communications with building subsystems 428 or other external systems or devices. In various embodiments, communications via interfaces 407, 409 can be direct (e.g., local wired or wireless communications) or via a communications network 446 (e.g., a WAN, the Internet, a cellular network, etc.). For example, interfaces 407, 409 can include an Ethernet card and port for sending and receiving data via an Ethernet-based communications link or network. In another example, interfaces 407, 409 can include a WiFi transceiver for communicating via a wireless communications network. In another example, one or both of interfaces 407, 409 can include cellular or mobile phone communications transceivers. In one embodiment, communications interface 407 is a power line communications interface and BMS interface 409 is an Ethernet interface. In other embodiments, both communications interface 407 and BMS interface 409 are Ethernet interfaces or are the same Ethernet interface.

Still referring to FIG. 4, BMS controller 366 is shown to include a processing circuit 404 including a processor 406 and memory 408. Processing circuit 404 can be communicably connected to BMS interface 409 and/or communications interface 407 such that processing circuit 404 and the various components thereof can send and receive data via interfaces 407, 409. Processor 406 can be implemented as a general purpose processor, an application specific integrated circuit (ASIC), one or more field programmable gate arrays (FPGAs), a group of processing components, or other suitable electronic processing components.

Memory 408 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 408 can be or include volatile memory or non-volatile memory. Memory 408 can include database components, object code components, script components, or any other type of information structure for supporting the various activities and information structures described in the present application. According to an exemplary embodiment, memory 408 is communicably connected to processor 406 via processing circuit 404 and includes computer code for executing (e.g., by processing circuit 404 and/or processor 406) one or more processes described herein.

In some embodiments, BMS controller 366 is implemented within a single computer (e.g., one server, one housing, etc.). In various other embodiments BMS controller 366 can be distributed across multiple servers or computers (e.g., that can exist in distributed locations). Further, while FIG. 4 shows applications 422 and 426 as existing outside of BMS controller 366, in some embodiments, applications 422 and 426 can be hosted within BMS controller 366 (e.g., within memory 408).

Still referring to FIG. 4, memory 408 is shown to include an enterprise integration layer 410, an automated measurement and validation (AM&V) layer 412, a demand response (DR) layer 414, a fault detection and diagnostics (FDD) layer 416, an integrated control layer 418, and a building subsystem integration later 420. Layers 410-420 can be configured to receive inputs from building subsystems 428 and other data sources, determine optimal control actions for building subsystems 428 based on the inputs, generate control signals based on the optimal control actions, and provide the generated control signals to building subsystems 428. The following paragraphs describe some of the general functions performed by each of layers 410-420 in BMS 400.

Enterprise integration layer 410 can be configured to serve clients or local applications with information and services to support a variety of enterprise-level applications. For example, enterprise control applications 426 can be configured to provide subsystem-spanning control to a graphical user interface (GUI) or to any number of enterprise-level business applications (e.g., accounting systems, user identification systems, etc.). Enterprise control applications 426 can also or alternatively be configured to provide configuration GUIs for configuring BMS controller 366. In yet other embodiments, enterprise control applications 426 can work with layers 410-420 to optimize building performance (e.g., efficiency, energy use, comfort, or safety) based on inputs received at interface 407 and/or BMS interface 409.

Building subsystem integration layer 420 can be configured to manage communications between BMS controller 366 and building subsystems 428. For example, building subsystem integration layer 420 can receive sensor data and input signals from building subsystems 428 and provide output data and control signals to building subsystems 428. Building subsystem integration layer 420 can also be configured to manage communications between building subsystems 428. Building subsystem integration layer 420 translate communications (e.g., sensor data, input signals, output signals, etc.) across a plurality of multi-vendor/multi-protocol systems.

Demand response layer 414 can be configured to optimize resource usage (e.g., electricity use, natural gas use, water use, etc.) and/or the monetary cost of such resource usage in response to satisfy the demand of building 10. The optimization can be based on time-of-use prices, curtailment signals, energy availability, or other data received from utility providers, distributed energy generation systems 424, from energy storage 427 (e.g., hot TES 242, cold TES 244, etc.), or from other sources. Demand response layer 414 can receive inputs from other layers of BMS controller 366 (e.g., building subsystem integration layer 420, integrated control layer 418, etc.). The inputs received from other layers can include environmental or sensor inputs such as temperature, carbon dioxide levels, relative humidity levels, air quality sensor outputs, occupancy sensor outputs, room schedules, and the like. The inputs can also include inputs such as electrical use (e.g., expressed in kWh), thermal load measurements, pricing information, projected pricing, smoothed pricing, curtailment signals from utilities, and the like.

According to an exemplary embodiment, demand response layer 414 includes control logic for responding to the data and signals it receives. These responses can include communicating with the control algorithms in integrated control layer 418, changing control strategies, changing setpoints, or activating/deactivating building equipment or subsystems in a controlled manner. Demand response layer 414 can also include control logic configured to determine when to utilize stored energy. For example, demand response layer 414 can determine to begin using energy from energy storage 427 just prior to the beginning of a peak use hour.

In some embodiments, demand response layer 414 includes a control module configured to actively initiate control actions (e.g., automatically changing setpoints) which minimize energy costs based on one or more inputs representative of or based on demand (e.g., price, a curtailment signal, a demand level, etc.). In some embodiments, demand response layer 414 uses equipment models to determine an optimal set of control actions. The equipment models can include, for example, thermodynamic models describing the inputs, outputs, and/or functions performed by various sets of building equipment. Equipment models can represent collections of building equipment (e.g., subplants, chiller arrays, etc.) or individual devices (e.g., individual chillers, heaters, pumps, etc.).

Demand response layer 414 can further include or draw upon one or more demand response policy definitions (e.g., databases, XML files, etc.). The policy definitions can be edited or adjusted by a user (e.g., via a graphical user interface) so that the control actions initiated in response to demand inputs can be tailored for the user's application, desired comfort level, particular building equipment, or based on other concerns. For example, the demand response policy definitions can specify which equipment can be turned on or off in response to particular demand inputs, how long a system or piece of equipment should be turned off, what setpoints can be changed, what the allowable set point adjustment range is, how long to hold a high demand setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.).

Integrated control layer 418 can be configured to use the data input or output of building subsystem integration layer 420 and/or demand response later 414 to make control decisions. Due to the subsystem integration provided by building subsystem integration layer 420, integrated control layer 418 can integrate control activities of the subsystems 428 such that the subsystems 428 behave as a single integrated supersystem. In an exemplary embodiment, integrated control layer 418 includes control logic that uses inputs and outputs from a plurality of building subsystems to provide greater comfort and energy savings relative to the comfort and energy savings that separate subsystems could provide alone. For example, integrated control layer 418 can be configured to use an input from a first subsystem to make an energy-saving control decision for a second subsystem. Results of these decisions can be communicated back to building subsystem integration layer 420.

Integrated control layer 418 is shown to be logically below demand response layer 414. Integrated control layer 418 can be configured to enhance the effectiveness of demand response layer 414 by enabling building subsystems 428 and their respective control loops to be controlled in coordination with demand response layer 414. This configuration may advantageously reduce disruptive demand response behavior relative to conventional systems. For example, integrated control layer 418 can be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller.

Integrated control layer 418 can be configured to provide feedback to demand response layer 414 so that demand response layer 414 checks that constraints (e.g., temperature, lighting levels, etc.) are properly maintained even while demanded load shedding is in progress. The constraints can also include setpoint or sensed boundaries relating to safety, equipment operating limits and performance, comfort, fire codes, electrical codes, energy codes, and the like. Integrated control layer 418 is also logically below fault detection and diagnostics layer 416 and automated measurement and validation layer 412. Integrated control layer 418 can be configured to provide calculated inputs (e.g., aggregations) to these higher levels based on outputs from more than one building subsystem.

Automated measurement and validation (AM&V) layer 412 can be configured to verify that control strategies commanded by integrated control layer 418 or demand response layer 414 are working properly (e.g., using data aggregated by AM&V layer 412, integrated control layer 418, building subsystem integration layer 420, FDD layer 416, or otherwise). The calculations made by AM&V layer 412 can be based on building system energy models and/or equipment models for individual BMS devices or subsystems. For example, AM&V layer 412 can compare a model-predicted output with an actual output from building subsystems 428 to determine an accuracy of the model.

Fault detection and diagnostics (FDD) layer 416 can be configured to provide on-going fault detection for building subsystems 428, building subsystem devices (i.e., building equipment), and control algorithms used by demand response layer 414 and integrated control layer 418. FDD layer 416 can receive data inputs from integrated control layer 418, directly from one or more building subsystems or devices, or from another data source. FDD layer 416 can automatically diagnose and respond to detected faults. The responses to detected or diagnosed faults can include providing an alert message to a user, a maintenance scheduling system, or a control algorithm configured to attempt to repair the fault or to work-around the fault.

FDD layer 416 can be configured to output a specific identification of the faulty component or cause of the fault (e.g., loose damper linkage) using detailed subsystem inputs available at building subsystem integration layer 420. In other exemplary embodiments, FDD layer 416 is configured to provide "fault" events to integrated control layer 418 which executes control strategies and policies in response to the received fault events. According to an exemplary embodiment, FDD layer 416 (or a policy executed by an integrated control engine or business rules engine) can shut-down systems or direct control activities around faulty devices or systems to reduce energy waste, extend equipment life, or assure proper control response.

FDD layer 416 can be configured to store or access a variety of different system data stores (or data points for live data). FDD layer 416 can use some content of the data stores to identify faults at the equipment level (e.g., specific chiller, specific AHU, specific terminal unit, etc.) and other content to identify faults at component or subsystem levels. For example, building subsystems 428 can generate temporal (i.e., time-series) data indicating the performance of BMS 400 and the various components thereof. The data generated by building subsystems 428 can include measured or calculated values that exhibit statistical characteristics and provide information about how the corresponding system or process (e.g., a temperature control process, a flow control process, etc.) is performing in terms of error from its setpoint. These processes can be examined by FDD layer 416 to expose when the system begins to degrade in performance and alert a user to repair the fault before it becomes more severe.

Building Management System With Data Platform Services

Figure 5:
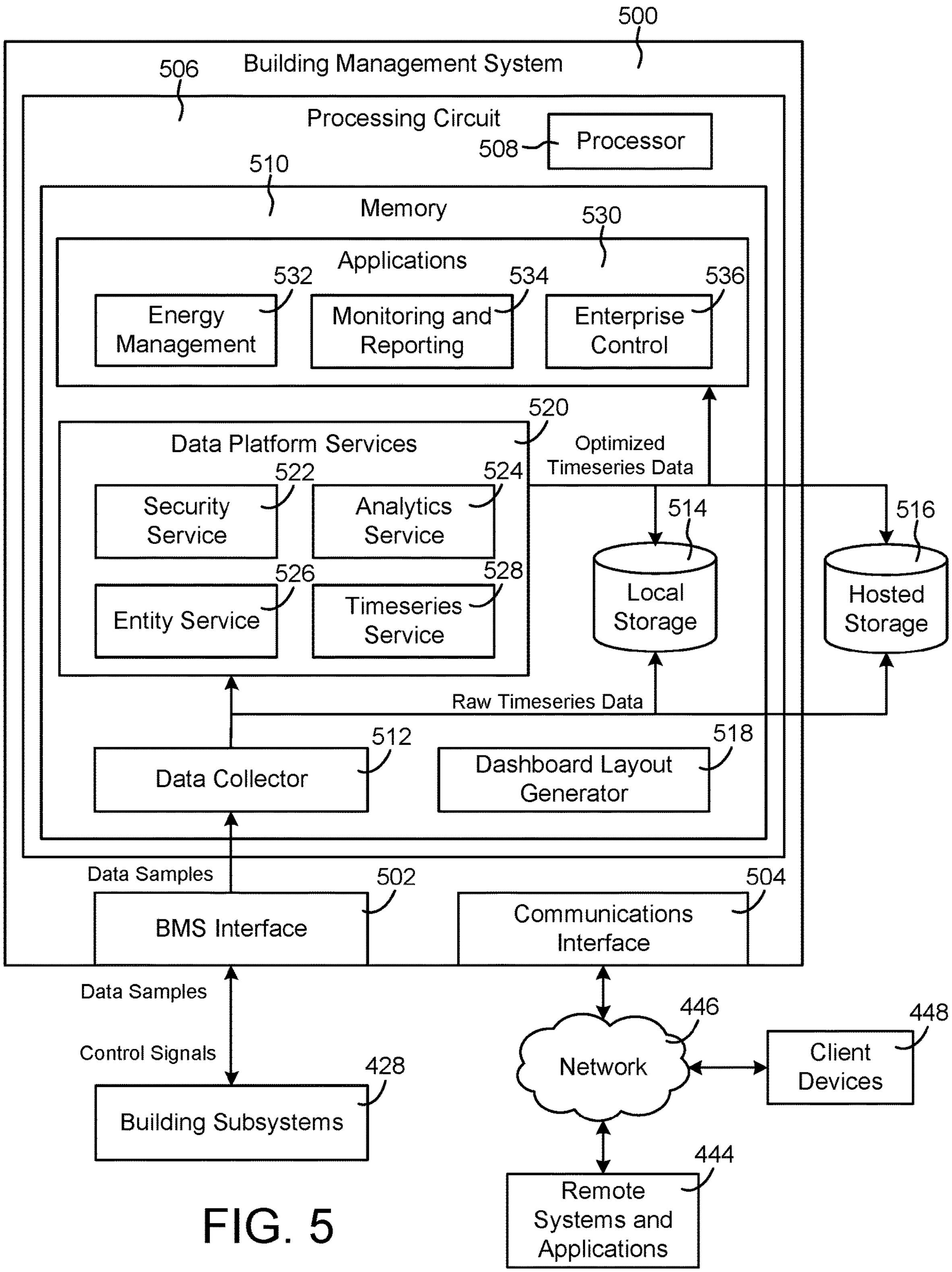
FIG. 5 is a block diagram of another BMS which can be used in the building of FIG. 1. The BMS is shown to include a data collector, data platform services, applications, and a dashboard layout generator, according to some embodiments.

Referring now to FIG. 5, a block diagram of another building management system (BMS) 500 is shown, according to some embodiments. BMS 500 is configured to collect data samples from building subsystems 428 and generate raw timeseries data from the data samples. BMS 500 can process the raw timeseries data using a variety of data platform services 520 to generate optimized timeseries data (e.g., data rollups). The optimized timeseries data can be provided to various applications 530 and/or stored in local storage 514 or hosted storage 516. In some embodiments, BMS 500 separates data collection; data storage, retrieval, and analysis; and data visualization into three different layers. This allows BMS 500 to support a variety of applications 530 that use the optimized timeseries data and allows new applications 530 to reuse the existing infrastructure provided by data platform services 520.

Before discussing BMS 500 in greater detail, it should be noted that the components of BMS 500 can be integrated within a single device (e.g., a supervisory controller, a BMS controller, etc.) or distributed across multiple separate systems or devices. For example, the components of BMS 500 can be implemented as part of a METASYS® brand building automation system or a METASYS® Energy Management System (MEMS), as sold by Johnson Controls Inc. In other embodiments, some or all of the components of BMS 500 can be implemented as part of a cloud-based computing system configured to receive and process data from one or more building management systems. In other embodiments, some or all of the components of BMS 500 can be components of a subsystem level controller (e.g., a HVAC controller), a subplant controller, a device controller (e.g., AHU controller 330, a chiller controller, etc.), a field controller, a computer workstation, a client device, or any other system or device that receives and processes data from building equipment.

BMS 500 can include many of the same components as BMS 400, as described with reference to FIG. 4. For example, BMS 500 is shown to include a BMS interface 502 and a communications interface 504. Interfaces 502-504 can include wired or wireless communications interfaces (e.g., jacks, antennas, transmitters, receivers, transceivers, wire terminals, etc.) for conducting data communications with building subsystems 428 or other external systems or devices. Communications conducted via interfaces 502-504 can be direct (e.g., local wired or wireless communications) or via a communications network 446 (e.g., a WAN, the Internet, a cellular network, etc.).

Communications interface 504 can facilitate communications between BMS 500 and external applications (e.g., remote systems and applications 444) for allowing user control, monitoring, and adjustment to BMS 500. Communications interface 504 can also facilitate communications between BMS 500 and client devices 448. BMS interface 502 can facilitate communications between BMS 500 and building subsystems 428. BMS 500 can be configured to communicate with building subsystems 428 using any of a variety of building automation systems protocols (e.g., BACnet, Modbus, ADX, etc.). In some embodiments, BMS 500 receives data samples from building subsystems 428 and provides control signals to building subsystems 428 via BMS interface 502.

Building subsystems 428 can include building electrical subsystem 434, information communication technology (ICT) subsystem 436, security subsystem 438, HVAC subsystem 440, lighting subsystem 442, lift/escalators subsystem 432, and/or fire safety subsystem 430, as described with reference to FIG. 4. In various embodiments, building subsystems 428 can include fewer, additional, or alternative subsystems. For example, building subsystems 428 can also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 10. In some embodiments, building subsystems 428 include waterside system 200 and/or airside system 300, as described with reference to FIGS. 2-3. Each of building subsystems 428 can include any number of devices, controllers, and connections for completing its individual functions and control activities. Building subsystems 428 can include building equipment (e.g., sensors, air handling units, chillers, pumps, valves, etc.) configured to monitor and control a building condition such as temperature, humidity, airflow, etc.

Still referring to FIG. 5, BMS 500 is shown to include a processing circuit 506 including a processor 508 and memory 510. Processor 508 can be a general purpose or specific purpose processor, an application specific integrated circuit (ASIC), one or more field programmable gate arrays (FPGAs), a group of processing components, or other suitable processing components. Processor 508 is configured to execute computer code or instructions stored in memory 510 or received from other computer readable media (e.g., CDROM, network storage, a remote server, etc.).

Memory 510 can include one or more devices (e.g., memory units, memory devices, storage devices, etc.) for storing data and/or computer code for completing and/or facilitating the various processes described in the present disclosure. Memory 510 can include random access memory (RAM), read-only memory (ROM), hard drive storage, temporary storage, non-volatile memory, flash memory, optical memory, or any other suitable memory for storing software objects and/or computer instructions. Memory 510 can include database components, object code components, script components, or any other type of information structure for supporting the various activities and information structures described in the present disclosure. Memory 510 can be communicably connected to processor 508 via processing circuit 506 and can include computer code for executing (e.g., by processor 508) one or more processes described herein. When processor 508 executes instructions stored in memory 510, processor 508 generally configures processing circuit 506 to complete such activities.

Still referring to FIG. 5, BMS 500 is shown to include a data collector 512. Data collector 512 is shown receiving data samples from building subsystems 428 via BMS interface 502. In some embodiments, the data samples include data values for various data points. The data values can be measured or calculated values, depending on the type of data point. For example, a data point received from a temperature sensor can include a measured data value indicating a temperature measured by the temperature sensor. A data point received from a chiller controller can include a calculated data value indicating a calculated efficiency of the chiller. Data collector 512 can receive data samples from multiple different devices within building subsystems 428.

The data samples can include one or more attributes that describe or characterize the corresponding data points. For example, the data samples can include a name attribute defining a point name or ID (e.g., "B1F4R2.T-Z"), a device attribute indicating a type of device from which the data samples is received (e.g., temperature sensor, humidity sensor, chiller, etc.), a unit attribute defining a unit of measure associated with the data value (e.g., ° F., ° C., kPA, etc.), and/or any other attribute that describes the corresponding data point or provides contextual information regarding the data point. The types of attributes included in each data point can depend on the communications protocol used to send the data samples to BMS 500. For example, data samples received via the ADX protocol or BACnet protocol can include a variety of descriptive attributes along with the data value, whereas data samples received via the Modbus protocol may include a lesser number of attributes (e.g., only the data value without any corresponding attributes).

In some embodiments, each data sample is received with a timestamp indicating a time at which the corresponding data value was measured or calculated. In other embodiments, data collector 512 adds timestamps to the data samples based on the times at which the data samples are received. Data collector 512 can generate raw timeseries data for each of the data points for which data samples are received. Each timeseries can include a series of data values for the same data point and a timestamp for each of the data values. For example, a timeseries for a data point provided by a temperature sensor can include a series of temperature values measured by the temperature sensor and the corresponding times at which the temperature values were measured.

Data collector 512 can add timestamps to the data samples or modify existing timestamps such that each data sample includes a local timestamp. Each local timestamp indicates the local time at which the corresponding data sample was measured or collected and can include an offset relative to universal time. The local timestamp indicates the local time at the location the data point was measured at the time of measurement. The offset indicates the difference between the local time and a universal time (e.g., the time at the international date line). For example, a data sample collected in a time zone that is six hours behind universal time can include a local timestamp (e.g., Timestamp=2016-03-18T14:10:02) and an offset indicating that the local timestamp is six hours behind universal time (e.g., Offset=−6:00). The offset can be adjusted (e.g., +1:00 or −1:00) depending on whether the time zone is in daylight savings time when the data sample is measured or collected.

The combination of the local timestamp and the offset provides a unique timestamp across daylight saving time boundaries. This allows an application using the timeseries data to display the timeseries data in local time without first converting from universal time. The combination of the local timestamp and the offset also provides enough information to convert the local timestamp to universal time without needing to look up a schedule of when daylight savings time occurs. For example, the offset can be subtracted from the local timestamp to generate a universal time value that corresponds to the local timestamp without referencing an external database and without requiring any other information.

In some embodiments, data collector 512 organizes the raw timeseries data. Data collector 512 can identify a system or device associated with each of the data points. For example, data collector 512 can associate a data point with a temperature sensor, an air handler, a chiller, or any other type of system or device. In various embodiments, data collector uses the name of the data point, a range of values of the data point, statistical characteristics of the data point, or other attributes of the data point to identify a particular system or device associated with the data point. Data collector 512 can then determine how that system or device relates to the other systems or devices in the building site. For example, data collector 512 can determine that the identified system or device is part of a larger system (e.g., a HVAC system) or serves a particular space (e.g., a particular building, a room or zone of the building, etc.). In some embodiments, data collector 512 uses or creates an entity graph when organizing the timeseries data. An example of such an entity graph is described in greater detail with reference to FIG. 10A.

Data collector 512 can provide the raw timeseries data to data platform services 520 and/or store the raw timeseries data in local storage 514 or hosted storage 516. As shown in FIG. 5, local storage 514 can be data storage internal to BMS 500 (e.g., within memory 510) or other on-site data storage local to the building site at which the data samples are collected. Hosted storage 516 can include a remote database, cloud-based data hosting, or other remote data storage. For example, hosted storage 516 can include remote data storage located off-site relative to the building site at which the data samples are collected.

Still referring to FIG. 5, BMS 500 is shown to include data platform services 520. Data platform services 520 can receive the raw timeseries data from data collector 512 and/or retrieve the raw timeseries data from local storage 514 or hosted storage 516. Data platform services 520 can include a variety of services configured to analyze and process the raw timeseries data. For example, data platform services 520 are shown to include a security service 522, an analytics service 524, an entity service 526, and a timeseries service 528. Security service 522 can assign security attributes to the raw timeseries data to ensure that the timeseries data are only accessible to authorized individuals, systems, or applications. Entity service 526 can assign entity information to the timeseries data to associate data points with a particular system, device, or space. Timeseries service 528 and analytics service 524 can generate new optimized timeseries from the raw timeseries data.

In some embodiments, timeseries service 528 aggregates predefined intervals of the raw timeseries data (e.g., quarter-hourly intervals, hourly intervals, daily intervals, monthly intervals, etc.) to generate new optimized timeseries of the aggregated values. These optimized timeseries can be referred to as "data rollups" since they are condensed versions of the raw timeseries data. The data rollups generated by timeseries service 528 provide an efficient mechanism for applications 530 to query the timeseries data. For example, applications 530 can construct visualizations of the timeseries data (e.g., charts, graphs, etc.) using the pre-aggregated data rollups instead of the raw timeseries data. This allows applications 530 to simply retrieve and present the pre-aggregated data rollups without requiring applications 530 to perform an aggregation in response to the query. Since the data rollups are pre-aggregated, applications 530 can present the data rollups quickly and efficiently without requiring additional processing at query time to generate aggregated timeseries values.

In some embodiments, timeseries service 528 calculates virtual points based on the raw timeseries data and/or the optimized timeseries data. Virtual points can be calculated by applying any of a variety of mathematical operations (e.g., addition, subtraction, multiplication, division, etc.) or functions (e.g., average value, maximum value, minimum value, thermodynamic functions, linear functions, nonlinear functions, etc.) to the actual data points represented by the timeseries data. For example, timeseries service 528 can calculate a virtual data point ($pointID_3$) by adding two or more actual data points ($pointID_1$ and $pointID_2$) (e.g., $pointID_3=pointID_1+pointID_2$). As another example, timeseries service 528 can calculate an enthalpy data point ($pointID_4$) based on a measured temperature data point ($pointID_5$) and a measured pressure data point ($pointID_6$) (e.g., $pointID_4=enthalpy(pointID_5, pointID_6)$). The virtual data points can be stored as optimized timeseries data.

Applications 530 can access and use the virtual data points in the same manner as the actual data points. Applications 530 do not need to know whether a data point is an actual data point or a virtual data point since both types of data points can be stored as optimized timeseries data and can be handled in the same manner by applications 530. In some embodiments, the optimized timeseries data are stored with attributes designating each data point as either a virtual data point or an actual data point. Such attributes allow applications 530 to identify whether a given timeseries represents a virtual data point or an actual data point, even though both types of data points can be handled in the same manner by applications 530.

In some embodiments, analytics service 524 analyzes the raw timeseries data and/or the optimized timeseries data to detect faults. Analytics service 524 can apply a set of fault detection rules to the timeseries data to determine whether a fault is detected at each interval of the timeseries. Fault detections can be stored as optimized timeseries data. For example, analytics service 524 can generate a new timeseries with data values that indicate whether a fault was detected at each interval of the timeseries. The time series of fault detections can be stored along with the raw timeseries data and/or optimized timeseries data in local storage 514 or hosted storage 516. These and other features of analytics service 524 and timeseries service 528 are described in greater detail with reference to FIG. 6.

Still referring to FIG. 5, BMS 500 is shown to include several applications 530 including an energy management application 532, monitoring and reporting applications 534, and enterprise control applications 536. Although only a few applications 530 are shown, it is contemplated that applications 530 can include any of a variety of applications configured to use the optimized timeseries data generated by data platform services 520. In some embodiments, applications 530 exist as a separate layer of BMS 500 (i.e., separate from data platform services 520 and data collector 512). This allows applications 530 to be isolated from the details of how the optimized timeseries data are generated. In other embodiments, applications 530 can exist as remote applications that run on remote systems or devices (e.g., remote systems and applications 444, client devices 448).

Figure 15:
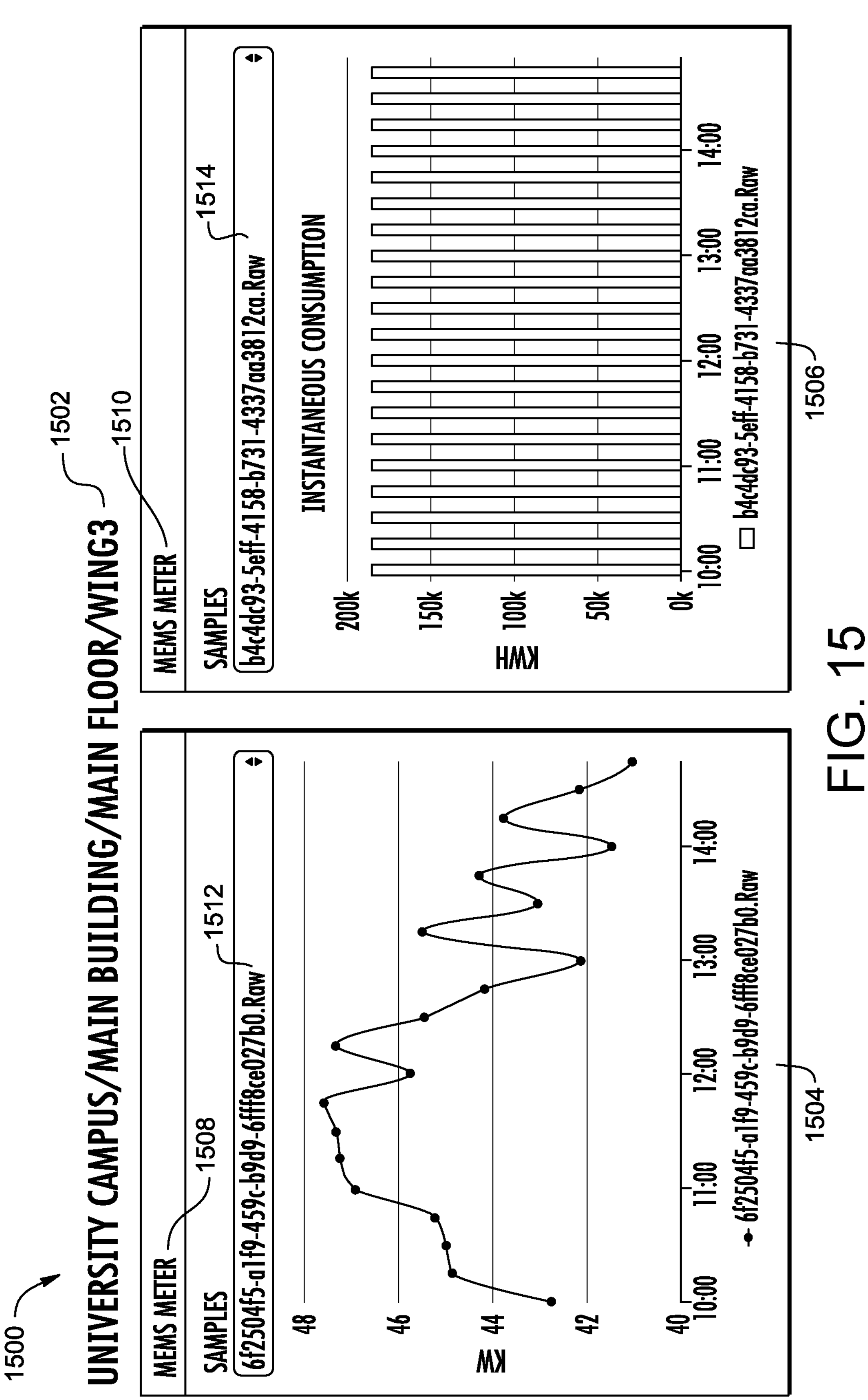
FIG. 15 is a user interface illustrating a dashboard layout which can be generated from the dashboard layout description of FIG. 14, according to some embodiments.
Figure 17:
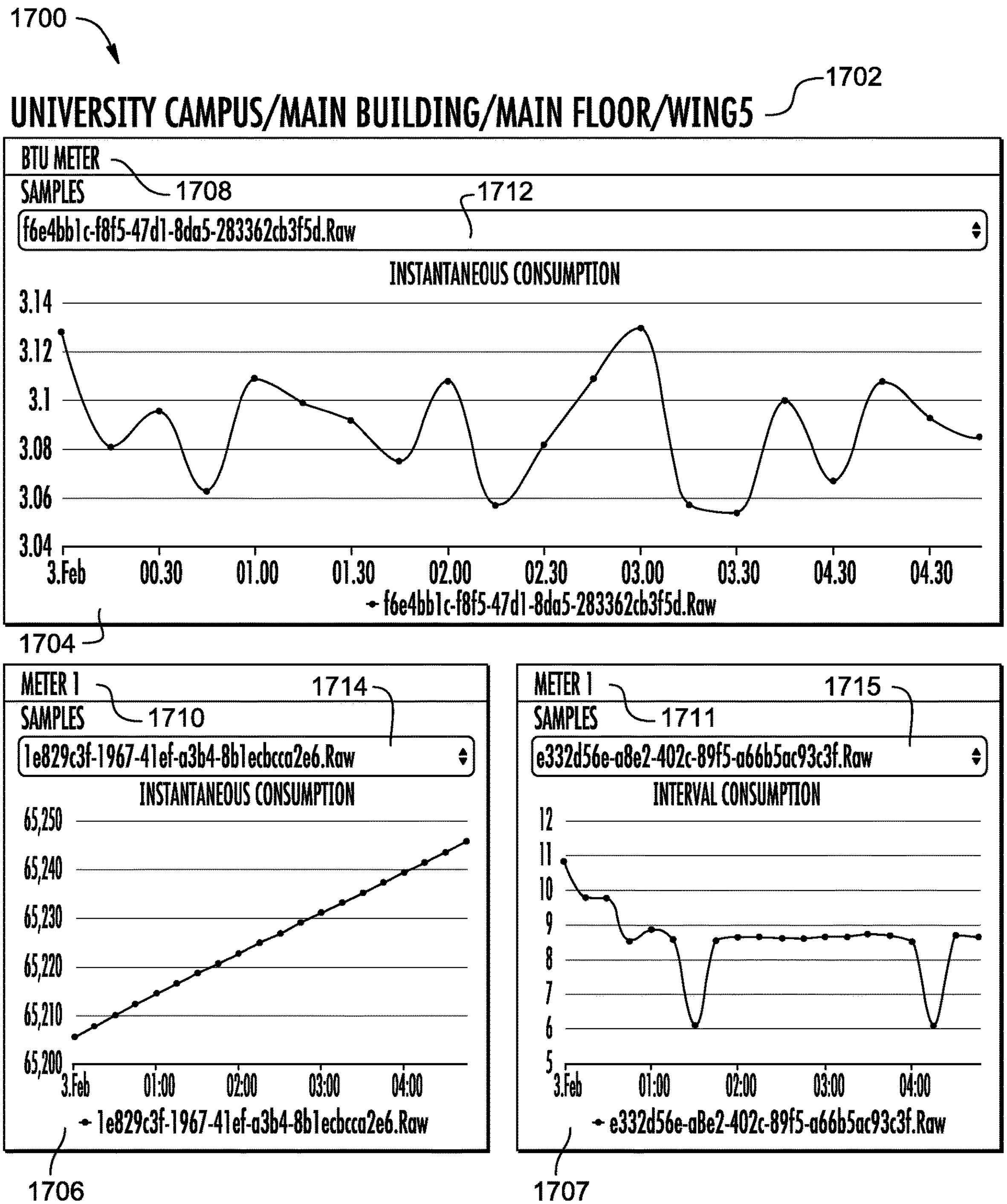
FIG. 17 is a user interface illustrating a dashboard layout which can be generated from the dashboard layout description of FIG. 16, according to some embodiments.

Applications 530 can use the optimized timeseries data to perform a variety data visualization, monitoring, and/or control activities. For example, energy management application 532 and monitoring and reporting application 534 can use the optimized timeseries data to generate user interfaces (e.g., charts, graphs, etc.) that present the optimized timeseries data to a user. In some embodiments, the user interfaces present the raw timeseries data and the optimized data rollups in a single chart or graph. For example, a dropdown selector can be provided to allow a user to select the raw timeseries data or any of the data rollups for a given data point. Several examples of user interfaces that can be generated based on the optimized timeseries data are shown in FIGS. 15 and 17.

Enterprise control application 536 can use the optimized timeseries data to perform various control activities. For example, enterprise control application 536 can use the optimized timeseries data as input to a control algorithm (e.g., a state-based algorithm, an extremum seeking control (ESC) algorithm, a proportional-integral (PI) control algorithm, a proportional-integral-derivative (PID) control algorithm, a model predictive control (MPC) algorithm, a feedback control algorithm, etc.) to generate control signals for building subsystems 428. In some embodiments, building subsystems 428 use the control signals to operate building equipment. Operating the building equipment can affect the measured or calculated values of the data samples provided to BMS 500. Accordingly, enterprise control application 536 can use the optimized timeseries data as feedback to control the systems and devices of building subsystems 428.

Still referring to FIG. 5, BMS 500 is shown to include a dashboard layout generator 518. Dashboard layout generator 518 is configured to generate a layout for a user interface (i.e., a dashboard) visualizing the timeseries data. In some embodiments, the dashboard layout is not itself a user interface, but rather a description which can be used by applications 530 to generate the user interface. In some embodiments, the dashboard layout is a schema that defines the relative locations of various widgets (e.g., charts, graphs, etc.) which can be rendered and displayed as part of the user interface. The dashboard layout can be read by a variety of different frameworks and can be used by a variety of different rendering engines (e.g., a web browser, a pdf engine, etc.) or applications 530 to generate the user interface.

In some embodiments, the dashboard layout defines a grid having one or more rows and one or more columns located within each row. The dashboard layout can define the location of each widget at a particular location within the grid. The dashboard layout can define an array of objects (e.g., JSON objects), each of which is itself an array. In some embodiments, the dashboard layout defines attributes or properties of each widget. For example, the dashboard layout can define the type of widget (e.g., graph, plain text, image, etc.). If the widget is a graph, the dashboard layout can define additional properties such as graph title, x-axis title, y-axis title, and the timeseries data used in the graph. Dashboard layout generator 518 and the dashboard layouts are described in greater detail with reference to FIGS. 12-17.

Timeseries and Analytics Data Platform Services

Figure 6:
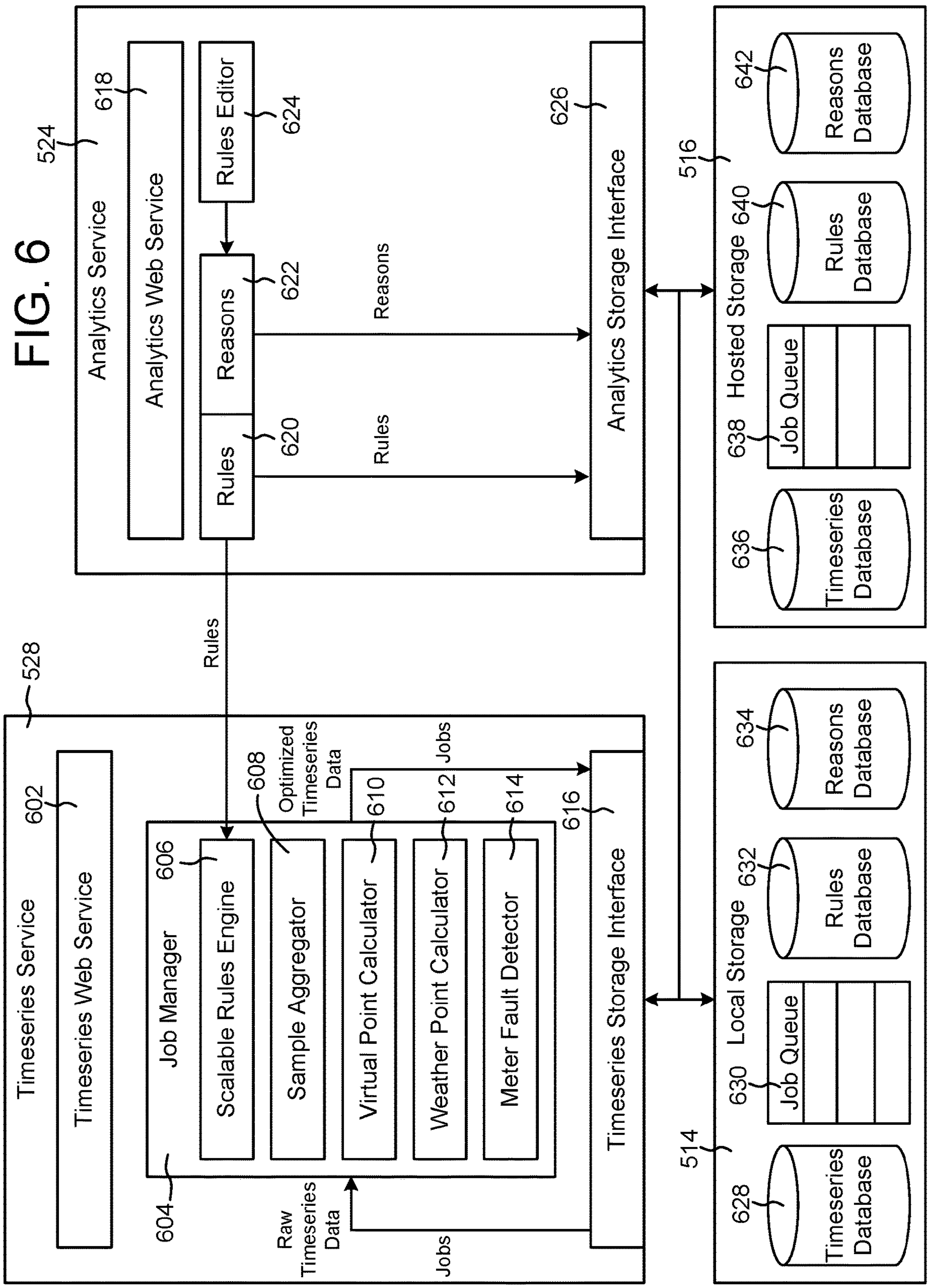
FIG. 6 is a block diagram of a timeseries service and an analytics service which can be implemented as some of the data platform services shown in FIG. 5, according to some embodiments.

Referring now to FIG. 6, a block diagram illustrating timeseries service 528 and analytics service 524 in greater detail is shown, according to some embodiments. Timeseries service 528 is shown to include a timeseries web service 602, a job manager 604, and a timeseries storage interface 616. Timeseries web service 602 is configured to interact with web-based applications to send and/or receive timeseries data. In some embodiments, timeseries web service 602 provides timeseries data to web-based applications. For example, if one or more of applications 530 are web-based applications, timeseries web service 602 can provide optimized timeseries data and raw timeseries data to the web-based applications. In some embodiments, timeseries web service 602 receives raw timeseries data from a web-based data collector. For example, if data collector 512 is a web-based application, timeseries web service 602 can receive data samples or raw timeseries data from data collector 512.

Timeseries storage interface 616 is configured to interact with local storage 514 and/or hosted storage 516. For example, timeseries storage interface 616 can retrieve raw timeseries data from a local timeseries database 628 within local storage 514 or from a hosted timeseries database 636 within hosted storage 516. Timeseries storage interface 616 can also store optimized timeseries data in local timeseries database 628 or hosted timeseries database 636. In some embodiments, timeseries storage interface 616 is configured to retrieve jobs from a local job queue 630 within local storage 514 or from a hosted job queue 638 within hosted storage 516. Timeseries storage interface 616 can also store jobs within local job queue 630 or hosted job queue 638. Jobs can be created and/or processed by job manager 604 to generate optimized timeseries data from the raw timeseries data.

Still referring to FIG. 6, job manager 604 is shown to include a sample aggregator 608. Sample aggregator 608 is configured to generate optimized data rollups from the raw timeseries data. For each data point, sample aggregator 608 can aggregate a set of data values having timestamps within a predetermined time interval (e.g., a quarter-hour, an hour, a day, etc.) to generate an aggregate data value for the predetermined time interval. For example, the raw timeseries data for a particular data point may have a relatively short interval (e.g., one minute) between consecutive samples of the data point. Sample aggregator 608 can generate a data rollup from the raw timeseries data by aggregating all of the samples of the data point having timestamps within a relatively longer interval (e.g., a quarter-hour) into a single aggregated value that represents the longer interval.

For some types of timeseries, sample aggregator 608 performs the aggregation by averaging all of the samples of the data point having timestamps within the longer interval. Aggregation by averaging can be used to calculate aggregate values for timeseries of non-cumulative variables such as measured value. For other types of timeseries, sample aggregator 608 performs the aggregation by summing all of the samples of the data point having timestamps within the longer interval. Aggregation by summation can be used to calculate aggregate values for timeseries of cumulative variables such as the number of faults detected since the previous sample.

Figures 7A, 7B:
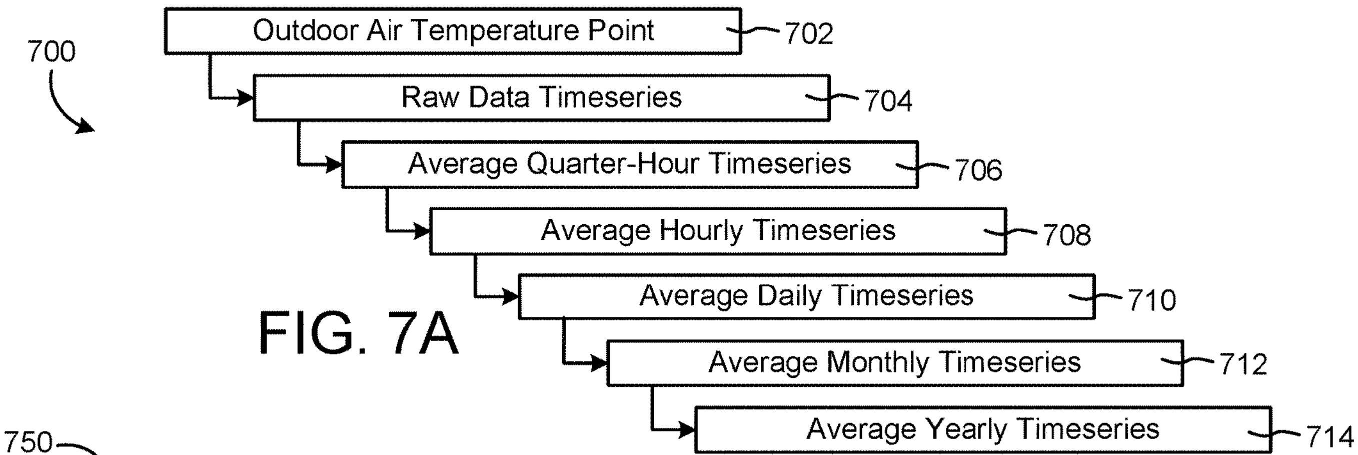
FIG. 7A is a block diagram illustrating an aggregation technique which can be used by the sample aggregator shown in FIG. 6 to aggregate raw data samples, according to some embodiments.
FIG. 7B is a data table which can be used to store raw data timeseries and a variety of optimized data timeseries which can be generated by the timeseries service of FIG. 6, according to some embodiments.

Referring now to FIGS. 7A-7B, a block diagram 700 and a data table 750 illustrating an aggregation technique which can be used by sample aggregator 608 is shown, according to some embodiments. In FIG. 7A, a data point 702 is shown. Data point 702 is an example of a measured data point for which timeseries values can be obtained. For example, data point 702 is shown as an outdoor air temperature point and has values which can be measured by a temperature sensor. Although a specific type of data point 702 is shown in FIG. 7A, it should be understood that data point 702 can be any type of measured or calculated data point. Timeseries values of data point 702 can be collected by data collector 512 and assembled into a raw data timeseries 704.

As shown in FIG. 7B, the raw data timeseries 704 includes a timeseries of data samples, each of which is shown as a separate row in data table 750. Each sample of raw data timeseries 704 is shown to include a timestamp and a data value. The timestamps of raw data timeseries 704 are ten minutes and one second apart, indicating that the sampling interval of raw data timeseries 704 is ten minutes and one second. For example, the timestamp of the first data sample is shown as 2015-12-31T23:10:00 indicating that the first data sample of raw data timeseries 704 was collected at 11:10:00 PM on Dec. 31, 2015. The timestamp of the second data sample is shown as 2015-12-31T23:20:01 indicating that the second data sample of raw data timeseries 704 was collected at 11:20:01 PM on Dec. 31, 2015. In some embodiments, the timestamps of raw data timeseries 704 are stored along with an offset relative to universal time, as previously described. The values of raw data timeseries 704 start at a value of 10 and increase by 10 with each sample. For example, the value of the second sample of raw data timeseries 704 is 20, the value of the third sample of raw data timeseries 704 is 30, etc.

In FIG. 7A, several data rollup timeseries 706-714 are shown. Data rollup timeseries 706-714 can be generated by sample aggregator 608 and stored as optimized timeseries data. The data rollup timeseries 706-714 include an average quarter-hour timeseries 706, an average hourly timeseries 708, an average daily timeseries 710, an average monthly timeseries 712, and an average yearly timeseries 714. Each of the data rollup timeseries 706-714 is dependent upon a parent timeseries. In some embodiments, the parent timeseries for each of the data rollup timeseries 706-714 is the timeseries with the next shortest duration between consecutive timeseries values. For example, the parent timeseries for average quarter-hour timeseries 706 is raw data timeseries 704. Similarly, the parent timeseries for average hourly timeseries 708 is average quarter-hour timeseries 706; the parent timeseries for average daily timeseries 710 is average hourly timeseries 708; the parent timeseries for average monthly timeseries 712 is average daily timeseries 710; and the parent timeseries for average yearly timeseries 714 is average monthly timeseries 712.

Sample aggregator 608 can generate each of the data rollup timeseries 706-714 from the timeseries values of the corresponding parent timeseries. For example, sample aggregator 608 can generate average quarter-hour timeseries 706 by aggregating all of the samples of data point 702 in raw data timeseries 704 that have timestamps within each quarter-hour. Similarly, sample aggregator 608 can generate average hourly timeseries 708 by aggregating all of the timeseries values of average quarter-hour timeseries 706 that have timestamps within each hour. Sample aggregator 608 can generate average daily timeseries 710 by aggregating all of the time series values of average hourly timeseries 708 that have timestamps within each day. Sample aggregator 608 can generate average monthly timeseries 712 by aggregating all of the time series values of average daily timeseries 710 that have timestamps within each month. Sample aggregator 608 can generate average yearly timeseries 714 by aggregating all of the time series values of average monthly timeseries 712 that have timestamps within each year.

In some embodiments, the timestamps for each sample in the data rollup timeseries 706-714 are the beginnings of the aggregation interval used to calculate the value of the sample. For example, the first data sample of average quarter-hour timeseries 706 is shown to include the timestamp 2015-12-31T23:00:00. This timestamp indicates that the first data sample of average quarter-hour timeseries 706 corresponds to an aggregation interval that begins at 11:00:00 PM on Dec. 31, 2015. Since only one data sample of raw data timeseries 704 occurs during this interval, the value of the first data sample of average quarter-hour timeseries 706 is the average of a single data value (i.e., average(10)=10). The same is true for the second data sample of average quarter-hour timeseries 706 (i.e., average(20)=20).

The third data sample of average quarter-hour timeseries 706 is shown to include the timestamp 2015-12-31T23:30:00. This timestamp indicates that the third data sample of average quarter-hour timeseries 706 corresponds to an aggregation interval that begins at 11:30:00 PM on Dec. 31, 2015. Since each aggregation interval of average quarter-hour timeseries 706 is a quarter-hour in duration, the end of the aggregation interval is 11:45:00 PM on Dec. 31, 2015. This aggregation interval includes two data samples of raw data timeseries 704 (i.e., the third raw data sample having a value of 30 and the fourth raw data sample having a value of 40). Sample aggregator 608 can calculate the value of the third sample of average quarter-hour timeseries 706 by averaging the values of the third raw data sample and the fourth raw data sample (i.e., average(30, 40)=35). Accordingly, the third sample of average quarter-hour timeseries 706 has a value of 35. Sample aggregator 608 can calculate the remaining values of average quarter-hour timeseries 706 in a similar manner.

Still referring to FIG. 7B, the first data sample of average hourly timeseries 708 is shown to include the timestamp 2015-12-31T23:00:00. This timestamp indicates that the first data sample of average hourly timeseries 708 corresponds to an aggregation interval that begins at 11:00:00 PM on Dec. 31, 2015. Since each aggregation interval of average hourly timeseries 708 is an hour in duration, the end of the aggregation interval is 12:00:00 AM on Jan. 1, 2016. This aggregation interval includes the first four samples of average quarter-hour timeseries 706. Sample aggregator 608 can calculate the value of the first sample of average hourly timeseries 708 by averaging the values of the first four values of average quarter-hour timeseries 706 (i.e., average (10, 20, 35, 50)=28.8). Accordingly, the first sample of average hourly timeseries 708 has a value of 28.8. Sample aggregator 608 can calculate the remaining values of average hourly timeseries 708 in a similar manner.

The first data sample of average daily timeseries 710 is shown to include the timestamp 2015-12-31T00:00:00. This timestamp indicates that the first data sample of average daily timeseries 710 corresponds to an aggregation interval that begins at 12:00:00 AM on Dec. 31, 2015. Since each aggregation interval of the average daily timeseries 710 is a day in duration, the end of the aggregation interval is 12:00:00 AM on Jan. 1, 2016. Only one data sample of average hourly timeseries 708 occurs during this interval. Accordingly, the value of the first data sample of average daily timeseries 710 is the average of a single data value (i.e., average(28.8)=28.8). The same is true for the second data sample of average daily timeseries 710 (i.e., average (87.5)=87.5).

In some embodiments, sample aggregator 608 stores each of the data rollup timeseries 706-714 in a single data table (e.g., data table 750) along with raw data timeseries 704. This allows applications 530 to retrieve all of the timeseries 704-714 quickly and efficiently by accessing a single data table. In other embodiments, sample aggregator 608 can store the various timeseries 704-714 in separate data tables which can be stored in the same data storage device (e.g., the same database) or distributed across multiple data storage devices. In some embodiments, sample aggregator 608 stores data timeseries 704-714 in a format other than a data table. For example, sample aggregator 608 can store timeseries 704-714 as vectors, as a matrix, as a list, or using any of a variety of other data storage formats.

In some embodiments, sample aggregator 608 automatically updates the data rollup timeseries 706-714 each time a new raw data sample is received. Updating the data rollup timeseries 706-714 can include recalculating the aggregated values based on the value and timestamp of the new raw data sample. When a new raw data sample is received, sample aggregator 608 can determine whether the timestamp of the new raw data sample is within any of the aggregation intervals for the samples of the data rollup timeseries 706-714. For example, if a new raw data sample is received with a timestamp of 2016-01-01T00:52:00, sample aggregator 608 can determine that the new raw data sample occurs within the aggregation interval beginning at timestamp 2016-01-01T00:45:00 for average quarter-hour timeseries 706. Sample aggregator 608 can use the value of the new raw data point (e.g., value=120) to update the aggregated value of the final data sample of average quarter-hour timeseries 706 (i.e., average(110, 120)=115).

If the new raw data sample has a timestamp that does not occur within any of the previous aggregation intervals, sample aggregator 608 can create a new data sample in average quarter-hour timeseries 706. The new data sample in average quarter-hour timeseries 706 can have a new data timestamp defining the beginning of an aggregation interval that includes the timestamp of the new raw data sample. For example, if the new raw data sample has a timestamp of 2016-01-01T01:00: 11, sample aggregator 608 can determine that the new raw data sample does not occur within any of the aggregation intervals previously established for average quarter-hour timeseries 706. Sample aggregator 608 can generate a new data sample in average quarter-hour timeseries 706 with the timestamp 2016-01-01T01:00:00 and can calculate the value of the new data sample in average quarter-hour timeseries 706 based on the value of the new raw data sample, as previously described.

Sample aggregator 608 can update the values of the remaining data rollup timeseries 708-714 in a similar manner. For example, sample aggregator 608 determine whether the timestamp of the updated data sample in average quarter-hour timeseries is within any of the aggregation intervals for the samples of average hourly timeseries 708. Sample aggregator 608 can determine that the timestamp 2016-01-01T00:45:00 occurs within the aggregation interval beginning at timestamp 2016-01-01T00:00:00 for average hourly timeseries 708. Sample aggregator 608 can use the updated value of the final data sample of average quarter-hour timeseries 706 (e.g., value=115) to update the value of the second sample of average hourly timeseries 708 (i.e., average(65, 80, 95, 115)=88.75). Sample aggregator 608 can use the updated value of the final data sample of average hourly timeseries 708 to update the final sample of average daily timeseries 710 using the same technique.

In some embodiments, sample aggregator 608 updates the aggregated data values of data rollup timeseries 706-714 each time a new raw data sample is received. Updating each time a new raw data sample is received ensures that the data rollup timeseries 706-714 always reflect the most recent data samples. In other embodiments, sample aggregator 608 updates the aggregated data values of data rollup timeseries 706-714 periodically at predetermined update intervals (e.g., hourly, daily, etc.) using a batch update technique. Updating periodically can be more efficient and require less data processing than updating each time a new data sample is received, but can result in aggregated data values that are not always updated to reflect the most recent data samples.

In some embodiments, sample aggregator 608 is configured to cleanse raw data timeseries 704. Cleansing raw data timeseries 704 can include discarding exceptionally high or low data. For example, sample aggregator 608 can identify a minimum expected data value and a maximum expected data value for raw data timeseries 704. Sample aggregator 608 can discard data values outside this range as bad data. In some embodiments, the minimum and maximum expected values are based on attributes of the data point represented by the timeseries. For example, data point 702 represents a measured outdoor air temperature and therefore has an expected value within a range of reasonable outdoor air temperature values for a given geographic location (e.g., between −20° F. and 110° F.). Sample aggregator 608 can discard a data value of 330 for data point 702 since a temperature value of 330° F. is not reasonable for a measured outdoor air temperature.

In some embodiments, sample aggregator 608 identifies a maximum rate at which a data point can change between consecutive data samples. The maximum rate of change can be based on physical principles (e.g., heat transfer principles), weather patterns, or other parameters that limit the maximum rate of change of a particular data point. For example, data point 702 represents a measured outdoor air temperature and therefore can be constrained to have a rate of change less than a maximum reasonable rate of change for outdoor temperature (e.g., five degrees per minute). If two consecutive data samples of the raw data timeseries 704 have values that would require the outdoor air temperature to change at a rate in excess of the maximum expected rate of change, sample aggregator 608 can discard one or both of the data samples as bad data.

Sample aggregator 608 can perform any of a variety of data cleansing operations to identify and discard bad data samples. Several examples of data cleansing operations which can be performed by sample aggregator 608 are described in U.S. Pat. No. 9,354,968 titled "Systems and Methods for Data Quality Control and Cleansing" and issued on May 31, 2016, the entire disclosure of which is incorporated by reference herein. In some embodiments, sample aggregator 608 performs the data cleansing operations for raw data timeseries 704 before generating the data rollup timeseries 706-714. This ensures that raw data timeseries 704 used to generate data rollup timeseries 706-714 does not include any bad data samples. Accordingly, the data rollup timeseries 706-714 do not need to be re-cleansed after the aggregation is performed.

Referring again to FIG. 6, job manager 604 is shown to include a virtual point calculator 610. Virtual point calculator 610 is configured to create virtual data points and calculate timeseries values for the virtual data points. A virtual data point is a type of calculated data point derived from one or more actual data points. In some embodiments, actual data points are measured data points, whereas virtual data points are calculated data points. Virtual data points can be used as substitutes for actual sensor data when the sensor data desired for a particular application does not exist, but can be calculated from one or more actual data points. For example, a virtual data point representing the enthalpy of a refrigerant can be calculated using actual data points measuring the temperature and pressure of the refrigerant. Virtual data points can also be used to provide timeseries values for calculated quantities such as efficiency, coefficient of performance, and other variables that cannot be directly measured.

Virtual point calculator 610 can calculate virtual data points by applying any of a variety of mathematical operations or functions to actual data points or other virtual data points. For example, virtual point calculator 610 can calculate a virtual data point ($pointID_3$) by adding two or more actual data points ($pointID_1$ and $pointID_2$) (e.g., $pointID_3=pointID_1+pointID_2$). As another example, virtual point calculator 610 can calculate an enthalpy data point ($pointID_4$) based on a measured temperature data point ($pointID_5$) and a measured pressure data point ($pointID_6$) (e.g., $pointID_4=enthalpy(pointID_5, pointID_6)$). In some instances, a virtual data point can be derived from a single actual data point. For example, virtual point calculator 610 can calculate a saturation temperature ($pointID_7$) of a known refrigerant based on a measured refrigerant pressure ($pointID_8$) (e.g., $pointID_7=T_{sat}(pointID_8)$). In general, virtual point calculator 610 can calculate the timeseries values of a virtual data point using the timeseries values of one or more actual data points and/or the timeseries values of one or more other virtual data points.

In some embodiments, virtual point calculator 610 uses a set of virtual point rules to calculate the virtual data points. The virtual point rules can define one or more input data points (e.g., actual or virtual data points) and the mathematical operations that should be applied to the input data point(s) to calculate each virtual data point. The virtual point rules can be provided by a user, received from an external system or device, and/or stored in memory 510. Virtual point calculator 610 can apply the set of virtual point rules to the timeseries values of the input data points to calculate timeseries values for the virtual data points. The timeseries values for the virtual data points can be stored as optimized timeseries data in local timeseries database 628 and/or hosted timeseries database 636.

Virtual point calculator 610 can calculate virtual data points using the values of raw data timeseries 704 and/or the aggregated values of the data rollup timeseries 706-714. In some embodiments, the input data points used to calculate a virtual data point are collected at different sampling times and/or sampling rates. Accordingly, the samples of the input data points may not be synchronized with each other, which can lead to ambiguity in which samples of the input data points should be used to calculate the virtual data point. Using the data rollup timeseries 706-714 to calculate the virtual data points ensures that the timestamps of the input data points are synchronized and eliminates any ambiguity in which data samples should be used.

Referring now to FIG. 8, several timeseries 800, 820, 840, and 860 illustrating the synchronization of data samples resulting from aggregating the raw timeseries data are shown, according to some embodiments. Timeseries 800 and 820 are raw data timeseries. Raw data timeseries 800 has several raw data samples 802-810. Raw data sample 802 is collected at time $t_1$; raw data sample 804 is collected at time $t_2$; raw data sample 806 is collected at time $t_3$; raw data sample 808 is collected at time $t_4$; raw data sample 810 is collected at time $t_5$; and raw data sample 812 is collected at time $t_6$.

Raw data timeseries 820 also has several raw data samples 822, 824, 826, 828, and 830. However, raw data samples, 822-830 are not synchronized with raw data samples 802-812. For example, raw data sample 822 is collected before time $t_1$; raw data sample 824 is collected between times $t_2$ and $t_3$; raw data sample 826 is collected between times $t_3$ and $t_4$; raw data sample 828 is collected between times $t_4$ and $t_5$; and raw data sample 830 is collected between times $t_5$ and $t_6$. The lack of synchronization between data samples 802-812 and raw data samples 822-830 can lead to ambiguity in which of the data samples should be used together to calculate a virtual data point.

Timeseries 840 and 860 are data rollup timeseries. Data rollup timeseries 840 can be generated by sample aggregator 608 by aggregating raw data timeseries 800. Similarly, data rollup timeseries 860 can be generated by sample aggregator 608 by aggregating raw data timeseries 820. Both raw data timeseries 800 and 820 can be aggregated using the same aggregation interval. Accordingly, the resulting data rollup timeseries 840 and 860 have synchronized data samples. For example, aggregated data sample 842 is synchronized with aggregated data sample 862 at time $t_1'$. Similarly, aggregated data sample 844 is synchronized with aggregated data sample 864 at time $t_2'$; aggregated data sample 846 is synchronized with aggregated data sample 866 at time $t_3'$; and aggregated data sample 848 is synchronized with aggregated data sample 868 at time $t_4'$.

The synchronization of data samples in data rollup timeseries 840 and 860 allows virtual point calculator 610 to readily identify which of the data samples should be used together to calculate a virtual point. For example, virtual point calculator 610 can identify which of the samples of data rollup timeseries 840 and 860 have the same timestamp (e.g., data samples 842 and 862, data samples 844 and 864, etc.). Virtual point calculator 610 can use two or more aggregated data samples with the same timestamp to calculate a timeseries value of the virtual data point. In some embodiments, virtual point calculator 610 assigns the shared timestamp of the input data samples to the timeseries value of the virtual data point calculated from the input data samples.

Referring again to FIG. 6, job manager 604 is shown to include a weather point calculator 612. Weather point calculator 612 is configured to perform weather-based calculations using the timeseries data. In some embodiments, weather point calculator 612 creates virtual data points for weather-related variables such as cooling degree days (CDD), heating degree days (HDD), cooling energy days (CED), heating energy days (HED), and normalized energy consumption. The timeseries values of the virtual data points calculated by weather point calculator 612 can be stored as optimized timeseries data in local timeseries database 628 and/or hosted timeseries database 636.

Weather point calculator 612 can calculate CDD by integrating the positive temperature difference between the time-varying outdoor air temperature $T_{OA}$ and the cooling balance point $T_{bC}$ for the building as shown in the following equation:

$$CDD=\int^{period}\max\{0,(T_{OA}-T_{bC})\}dt$$

where period is the integration period. In some embodiments, the outdoor air temperature $T_{OA}$ is a measured data point, whereas the cooling balance point $T_{bC}$ is a stored parameter. To calculate CDD for each sample of the outdoor air temperature $T_{OA}$, weather point calculator 612 can multiply the quantity $\max\{0, (T_{OA}-T_{bC})\}$ by the sampling period $\Delta t$ of the outdoor air temperature $T_{OA}$. Weather point calculator 612 can calculate CED in a similar manner using outdoor air enthalpy $E_{OA}$ instead of outdoor air temperature $T_{OA}$. Outdoor air enthalpy $E_{OA}$ can be a measured or virtual data point.

Weather point calculator 612 can calculate HDD by integrating the positive temperature difference between a heating balance point $T_{bH}$ for the building and the time-varying outdoor air temperature $T_{OA}$ as shown in the following equation:

$$HDD=\int^{period}\max\{0,(T_{bH}-T_{OA})\}dt$$

where period is the integration period. In some embodiments, the outdoor air temperature $T_{OA}$ is a measured data point, whereas the heating balance point $T_{bH}$ is a stored parameter. To calculate HDD for each sample of the outdoor air temperature $T_{OA}$, weather point calculator 612 can multiply the quantity $\max\{0, (T_{bH}-T_{OA})\}$ by the sampling period $\Delta t$ of the outdoor air temperature $T_{OA}$. Weather point calculator 612 can calculate HED in a similar manner using outdoor air enthalpy $E_{OA}$ instead of outdoor air temperature $T_{OA}$.

In some embodiments, both virtual point calculator 610 and weather point calculator 612 calculate timeseries values of virtual data points. Weather point calculator 612 can calculate timeseries values of virtual data points that depend on weather-related variables (e.g., outdoor air temperature, outdoor air enthalpy, outdoor air humidity, outdoor light intensity, precipitation, wind speed, etc.). Virtual point calculator 610 can calculate timeseries values of virtual data points that depend on other types of variables (e.g., non-weather-related variables). Although only a few weather-related variables are described in detail here, it is contemplated that weather point calculator 612 can calculate virtual data points for any weather-related variable. The weather-related data points used by weather point calculator 612 can be received as timeseries data from various weather sensors and/or from a weather service.

Still referring to FIG. 6, job manager 604 is shown to include a meter fault detector 614 and a scalable rules engine 606. Meter fault detector 614 and scalable rules engine 606 are configured to detect faults in timeseries data. In some embodiments, meter fault detector 614 performs fault detection for timeseries data representing meter data (e.g., measurements from a sensor), whereas scalable rules engine 606 performs fault detection for other types of timeseries data. Meter fault detector 614 and scalable rules engine 606 can detect faults in the raw timeseries data and/or the optimized timeseries data.

In some embodiments, meter fault detector 614 and scalable rules engine 606 receive fault detection rules 620 and/or reasons 622 from analytics service 618. Fault detection rules 620 can be defined by a user via a rules editor 624 or received from an external system or device via analytics web service 618. In various embodiments, fault detection rules 620 and reasons 622 can be stored in rules database 632 and reasons database 634 within local storage 514 and/or rules database 640 and reasons database 642 within hosted storage 516. Meter fault detector 614 and scalable rules engine 606 can retrieve fault detection rules 620 from local storage 514 or hosted storage and use fault detection rules 620 to analyze the timeseries data.

In some embodiments, fault detection rules 620 provide criteria that can be evaluated by meter fault detector 614 and scalable rules engine 606 to detect faults in the timeseries data. For example, fault detection rules 620 can define a fault as a data value above or below a threshold value. As another example, fault detection rules 620 can define a fault as a data value outside a predetermined range of values. The threshold value and predetermined range of values can be based on the type of timeseries data (e.g., meter data, calculated data, etc.), the type of variable represented by the timeseries data (e.g., temperature, humidity, energy consumption, etc.), the system or device that measures or provides the timeseries data (e.g., a temperature sensor, a humidity sensor, a chiller, etc.), and/or other attributes of the timeseries data.

Meter fault detector 614 and scalable rules engine 606 can apply the fault detection rules 620 to the timeseries data to determine whether each sample of the timeseries data qualifies as a fault. In some embodiments, meter fault detector 614 and scalable rules engine 606 generate a fault detection timeseries containing the results of the fault detection. The fault detection timeseries can include a set of timeseries values, each of which corresponds to a data sample of the timeseries data evaluated by meter fault detector 614 and scalable rules engine 606. In some embodiments, each timeseries value in the fault detection timeseries includes a timestamp and a fault detection value. The timestamp can be the same as the timestamp of the corresponding data sample of the data timeseries. The fault detection value can indicate whether the corresponding data sample of the data timeseries qualifies as a fault. For example, the fault detection value can have a value of "Fault" if a fault is detected and a value of "Not in Fault" if a fault is not detected in the corresponding data sample of the data timeseries. The fault detection timeseries can be stored in local timeseries database 628 and/or hosted timeseries database 636 along with the raw timeseries data and the optimized timeseries data.

Referring now to FIGS. 9A-9B, a block diagram and data table 900 illustrating the fault detection timeseries is shown, according to some embodiments. In FIG. 9A, job manager 604 is shown receiving a data timeseries 902 from local storage 514 or hosted storage 516. Data timeseries 902 can be a raw data timeseries or an optimized data timeseries. In some embodiments, data timeseries 902 is a timeseries of values of an actual data point (e.g., a measured temperature). In other embodiments, data timeseries 902 is a timeseries of values of a virtual data point (e.g., a calculated efficiency). As shown in data table 900, data timeseries 902 includes a set of data samples. Each data sample includes a timestamp and a value. Most of the data samples have values within the range of 65-66. However, three of the data samples have values of 42.

Job manager 604 can evaluate data timeseries 902 using a set of fault detection rules 620 to detect faults in data timeseries 902. In various embodiments, the fault detection can be performed by meter fault detector 614 (e.g., if data timeseries 902 is meter data) or by scalable rules engine 606 (e.g., if data timeseries 902 is non-meter data). In some embodiments, job manager 604 determines that the data samples having values of 42 qualify as faults according to the fault detection rules 620.

Job manager 604 can generate a fault detection timeseries 904 containing the results of the fault detection. As shown in data table 900, fault detection timeseries 904 includes a set of data samples. Like data timeseries 902, each data sample of fault detection timeseries 904 includes a timestamp and a value. Most of the values of fault detection timeseries 904 are shown as "Not in Fault," indicating that no fault was detected for the corresponding sample of data timeseries 902 (i.e., the data sample with the same timestamp). However, three of the data samples in fault detection timeseries 904 have a value of "Fault," indicating that the corresponding sample of data timeseries 902 qualifies as a fault. As shown in FIG. 9A, job manager 604 can store fault detection timeseries 904 in local storage 514 (e.g., in local timeseries database 628) and/or hosted storage 516 (e.g., in hosted timeseries database 636) along with the raw timeseries data and the optimized timeseries data.

Fault detection timeseries 904 can be used by BMS 500 to perform various fault detection, diagnostic, and/or control processes. In some embodiments, fault detection timeseries 904 is further processed by job manager 604 to generate new timeseries derived from fault detection timeseries 904. For example, sample aggregator 608 can use fault detection timeseries 904 to generate a fault duration timeseries. Sample aggregator 608 can aggregate multiple consecutive data samples of fault detection timeseries 904 having the same data value into a single data sample. For example, sample aggregator 608 can aggregate the first two "Not in Fault" data samples of fault detection timeseries 904 into a single data sample representing a time period during which no fault was detected. Similarly, sample aggregator 608 can aggregate the final two "Fault" data samples of fault detection timeseries 904 into a single data sample representing a time period during which a fault was detected.

In some embodiments, each data sample in the fault duration timeseries has a fault occurrence time and a fault duration. The fault occurrence time can be indicated by the timestamp of the data sample in the fault duration timeseries. Sample aggregator 608 can set the timestamp of each data sample in the fault duration timeseries equal to the timestamp of the first data sample in the series of data samples in fault detection timeseries 904 which were aggregated to form the aggregated data sample. For example, if sample aggregator 608 aggregates the first two "Not in Fault" data samples of fault detection timeseries 904, sample aggregator 608 can set the timestamp of the aggregated data sample to 2015-12-31T23:10:00. Similarly, if sample aggregator 608 aggregates the final two "Fault" data samples of fault detection timeseries 904, sample aggregator 608 can set the timestamp of the aggregated data sample to 2015-12-31T23:50:00.

The fault duration can be indicated by the value of the data sample in the fault duration timeseries. Sample aggregator 608 can set the value of each data sample in the fault duration timeseries equal to the duration spanned by the consecutive data samples in fault detection timeseries 904 which were aggregated to form the aggregated data sample. Sample aggregator 608 can calculate the duration spanned by multiple consecutive data samples by subtracting the timestamp of the first data sample of fault detection timeseries 904 included in the aggregation from the timestamp of the next data sample of fault detection timeseries 904 after the data samples included in the aggregation.

For example, if sample aggregator 608 aggregates the first two "Not in Fault" data samples of fault detection timeseries 904, sample aggregator 608 can calculate the duration of the aggregated data sample by subtracting the timestamp 2015-12-31T23:10:00 (i.e., the timestamp of the first "Not in Fault" sample) from the timestamp 2015-12-31T23:30:00 (i.e., the timestamp of the first "Fault" sample after the consecutive "Not in Fault" samples) for an aggregated duration of twenty minutes. Similarly, if sample aggregator 608 aggregates the final two "Fault" data samples of fault detection timeseries 904, sample aggregator 608 can calculate the duration of the aggregated data sample by subtracting the timestamp 2015-12-31T23:50:00 (i.e., the timestamp of the first "Fault" sample included in the aggregation) from the timestamp 2016-01-01T00:10:00 (i.e., the timestamp of the first "Not in Fault" sample after the consecutive "Fault" samples) for an aggregated duration of twenty minutes.

Figure 9C:
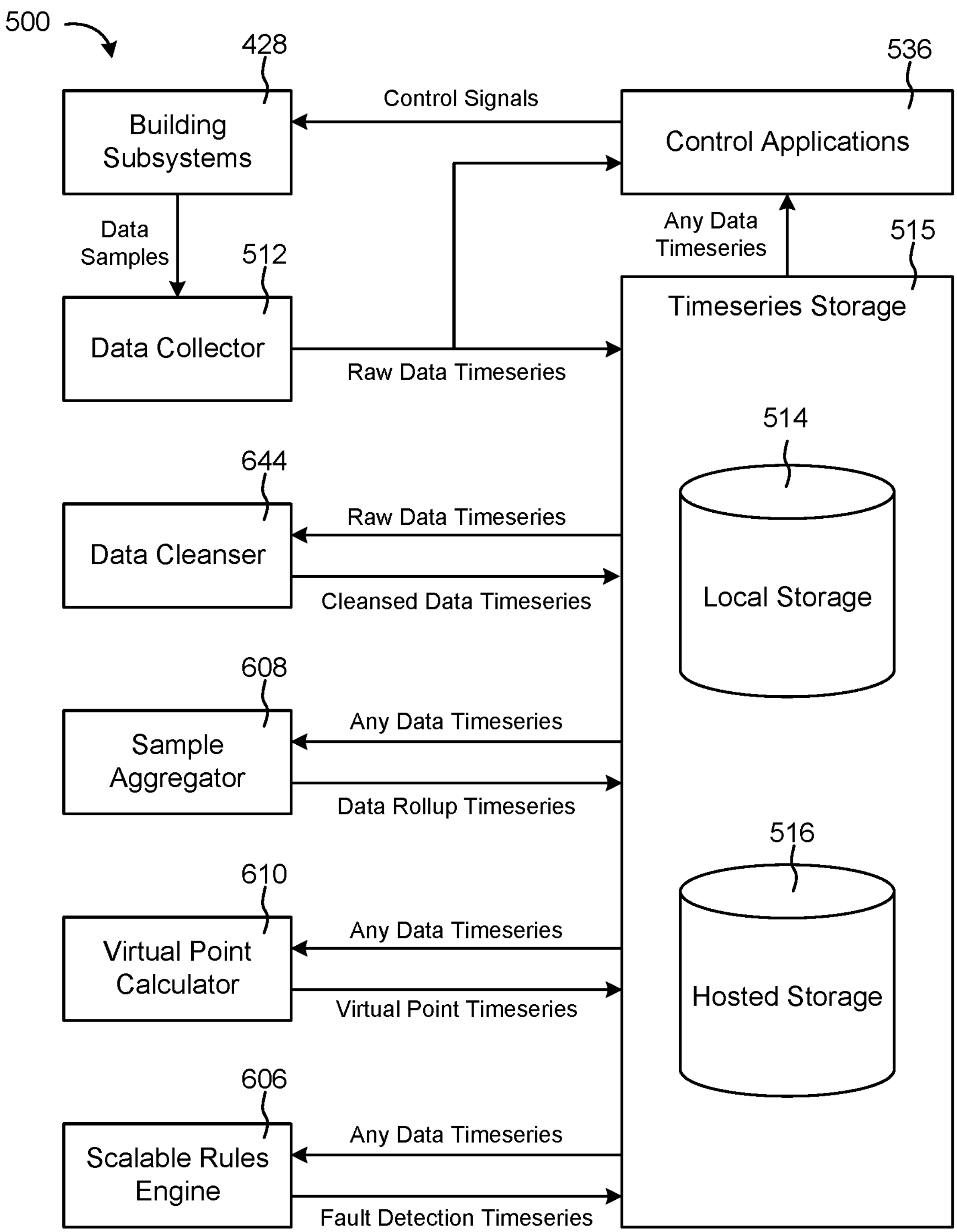
FIG. 9C is a flow diagram illustrating how various timeseries can be generated, stored, and used by the data platform services of FIG. 5, according to some embodiments.

Referring now to FIG. 9C, a flow diagram illustrating how various timeseries can be generated, stored, and used in BMS 500 is shown, according to some embodiments. Data collector 512 is shown receiving data samples from building subsystems 428. In some embodiments, the data samples include data values for various data points. The data values can be measured or calculated values, depending on the type of data point. For example, a data point received from a temperature sensor can include a measured data value indicating a temperature measured by the temperature sensor. A data point received from a chiller controller can include a calculated data value indicating a calculated efficiency of the chiller. Data collector 512 can receive data samples from multiple different devices within building subsystems 428.

In some embodiments, each data sample is received with a timestamp indicating a time at which the corresponding data value was measured or calculated. In other embodiments, data collector 512 adds timestamps to the data samples based on the times at which the data samples are received. Data collector 512 can generate raw timeseries data for each of the data points for which data samples are received. Each timeseries can include a series of data values for the same data point and a timestamp for each of the data values. For example, a timeseries for a data point provided by a temperature sensor can include a series of temperature values measured by the temperature sensor and the corresponding times at which the temperature values were measured.

Data collector 512 can add timestamps to the data samples or modify existing timestamps such that each data sample includes a local timestamp. Each local timestamp indicates the local time at which the corresponding data sample was measured or collected and can include an offset relative to universal time. The local timestamp indicates the local time at the location the data point was measured at the time of measurement. The offset indicates the difference between the local time and a universal time (e.g., the time at the international date line). For example, a data sample collected in a time zone that is six hours behind universal time can include a local timestamp (e.g., Timestamp=2016-03-18T14:10:02) and an offset indicating that the local timestamp is six hours behind universal time (e.g., Offset=−6:00). The offset can be adjusted (e.g., +1:00 or −1:00) depending on whether the time zone is in daylight savings time when the data sample is measured or collected. Data collector 512 can provide the raw timeseries data to control applications 536, data cleanser 644, and/or store the raw timeseries data in timeseries storage 515 (i.e., local storage 514 and/or hosted storage 516).

Data cleanser 644 can retrieve the raw data timeseries from timeseries storage 515 and cleanse the raw data timeseries. Cleansing the raw data timeseries can include discarding exceptionally high or low data. For example, data cleanser 644 can identify a minimum expected data value and a maximum expected data value for the raw data timeseries. Data cleanser 644 can discard data values outside this range as bad data. In some embodiments, the minimum and maximum expected values are based on attributes of the data point represented by the timeseries. For example, an outdoor air temperature data point may have an expected value within a range of reasonable outdoor air temperature values for a given geographic location (e.g., between −20° F. and 110° F.).

In some embodiments, data cleanser 644 identifies a maximum rate at which a data point can change between consecutive data samples. The maximum rate of change can be based on physical principles (e.g., heat transfer principles), weather patterns, or other parameters that limit the maximum rate of change of a particular data point. For example, an outdoor air temperature data point can be constrained to have a rate of change less than a maximum reasonable rate of change for outdoor temperature (e.g., five degrees per minute). If two consecutive data samples of the raw data timeseries have values that would require the outdoor air temperature to change at a rate in excess of the maximum expected rate of change, data cleanser 644 can discard one or both of the data samples as bad data.

Data cleanser 644 can perform any of a variety of data cleansing operations to identify and discard bad data samples. Several examples of data cleansing operations which can be performed by data cleanser 644 are described in U.S. Pat. No. 9,354,968 titled "Systems and Methods for Data Quality Control and Cleansing" and issued on May 31, 2016, the entire disclosure of which is incorporated by reference herein. In some embodiments, data cleanser 644 performs the data cleansing operations for the raw data timeseries before sample aggregator 608 generates the data rollup timeseries. This ensures that the raw data timeseries used to generate the data rollup timeseries does not include any bad data samples. Accordingly, the data rollup timeseries do not need to be re-cleansed after the aggregation is performed. Data cleanser 644 can provide the cleansed timeseries data to control applications 536, sample aggregator 608, and/or store the cleansed timeseries data in timeseries storage 515.

Sample aggregator 608 can retrieve any data timeseries from timeseries storage 515 (e.g., a raw data timeseries, a cleansed data timeseries, a data rollup timeseries, a fault detection timeseries, etc.) and generate data rollup timeseries based on the retrieved data timeseries. For each data point, sample aggregator 608 can aggregate a set of data values having timestamps within a predetermined time interval (e.g., a quarter-hour, an hour, a day, etc.) to generate an aggregate data value for the predetermined time interval. For example, the raw timeseries data for a particular data point may have a relatively short interval (e.g., one minute) between consecutive samples of the data point. Sample aggregator 608 can generate a data rollup from the raw timeseries data by aggregating all of the samples of the data point having timestamps within a relatively longer interval (e.g., a quarter-hour) into a single aggregated value that represents the longer interval.

For some types of timeseries, sample aggregator 608 performs the aggregation by averaging all of the samples of the data point having timestamps within the longer interval. Aggregation by averaging can be used to calculate aggregate values for timeseries of non-cumulative variables such as measured value. For other types of timeseries, sample aggregator 608 performs the aggregation by summing all of the samples of the data point having timestamps within the longer interval. Aggregation by summation can be used to calculate aggregate values for timeseries of cumulative variables such as the number of faults detected since the previous sample.

Sample aggregator 608 can generate any type of data rollup timeseries including, for example, an average quarter-hour timeseries, an average hourly timeseries, an average daily timeseries, an average monthly timeseries, and an average yearly timeseries, or any other type of data rollup timeseries as described with reference to FIGS. 6-8. Each of the data rollup timeseries may be dependent upon a parent timeseries. In some embodiments, sample aggregator 608 updates the aggregated data values of data rollup timeseries each time a new raw data sample is received and/or each time the parent timeseries is updated. Sample aggregator 608 can provide the data rollup timeseries to control applications 536, virtual point calculator 610, and/or store the data rollup timeseries in timeseries storage 515.

Virtual point calculator 610 can retrieve any timeseries from timeseries storage 515 and generate virtual point timeseries using the retrieved data timeseries. Virtual point calculator can create virtual data points and calculate timeseries values for the virtual data points. A virtual data point is a type of calculated data point derived from one or more actual data points. In some embodiments, actual data points are measured data points, whereas virtual data points are calculated data points. Virtual data points can be used as substitutes for actual sensor data when the sensor data desired for a particular application does not exist, but can be calculated from one or more actual data points. For example, a virtual data point representing the enthalpy of a refrigerant can be calculated using actual data points measuring the temperature and pressure of the refrigerant. Virtual data points can also be used to provide timeseries values for calculated quantities such as efficiency, coefficient of performance, and other variables that cannot be directly measured.

Virtual point calculator 610 can calculate virtual data points by applying any of a variety of mathematical operations or functions to actual data points and/or other virtual data points. For example, virtual point calculator 610 can calculate a virtual data point ($pointID_3$) by adding two or more actual data points ($pointID_1$ and $pointID_2$) (e.g., $pointID_3=pointID_1+pointID_2$). As another example, virtual point calculator 610 can calculate an enthalpy data point ($pointID_4$) based on a measured temperature data point ($pointID_5$) and a measured pressure data point ($pointID_6$) (e.g., $pointID_4=enthalpy(pointID_5, pointID_6)$).

In some instances, a virtual data point can be derived from a single actual data point. For example, virtual point calculator 610 can calculate a saturation temperature ($pointID_7$) of a known refrigerant based on a measured refrigerant pressure ($pointID_8$) (e.g., $pointID_7=T_{sat}(pointID_8)$). In general, virtual point calculator 610 can calculate the timeseries values of a virtual data point using the timeseries values of one or more actual data points and/or the timeseries values of one or more other virtual data points. In some embodiments, virtual point calculator 610 automatically updates the values of the virtual point timeseries whenever the source data used to calculate the virtual data points is updated. Virtual point calculator 610 can provide the virtual point timeseries to control applications 536, scalable rules engine 606, and/or store the virtual point timeseries in timeseries storage 515.

Scalable rules engine 606 can retrieve any timeseries from timeseries storage 515 and generate fault detection timeseries using the retrieved data timeseries. Scalable rules engine 606 can apply fault detection rules to the timeseries data to determine whether each sample of the timeseries data qualifies as a fault. In some embodiments, scalable rules engine 606 generates a fault detection timeseries containing the results of the fault detection, as described with reference to FIGS. 9A-9B. The fault detection timeseries can include a set of timeseries values, each of which corresponds to a data sample of the timeseries data evaluated by scalable rules engine 606.

In some embodiments, each timeseries value in the fault detection timeseries includes a timestamp and a fault detection value. The timestamp can be the same as the timestamp of the corresponding data sample of the data timeseries. The fault detection value can indicate whether the corresponding data sample of the data timeseries qualifies as a fault. For example, the fault detection value can have a value of "Fault" if a fault is detected and a value of "Not in Fault" if a fault is not detected in the corresponding data sample of the data timeseries. In some embodiments, scalable rules engine 606 uses the fault detection timeseries to generate derivative timeseries such as a fault duration timeseries, as described with reference to FIGS. 9A-9B. Scalable rules engine 606 can provide the fault detection timeseries to control applications 536 and/or store the fault detection timeseries in timeseries storage 515.

Each of the data platform services 520 (e.g., data cleanser 644, sample aggregator 608, virtual point calculator 610, scalable rules engine 606, etc.) can read any data timeseries from timeseries storage 515, generate new data timeseries (e.g., cleansed data timeseries, data rollup timeseries, virtual point timeseries, fault detection timeseries, etc.), and store the new data timeseries in timeseries storage 515. The new timeseries can be stored alongside the original timeseries upon which the new timeseries is based such that the original timeseries does not need to be updated. This allows multiple services to concurrently read the same data timeseries from timeseries storage 515 without requiring any service to lock the timeseries.

The timeseries stored in timeseries storage 515 can affect each other. For example, the values of one or more first data timeseries can affect the values of one or more second data timeseries based on the first data timeseries. The first and second data timeseries can be any of the raw data timeseries, cleansed data timeseries, data rollup timeseries, virtual point timeseries, fault detection timeseries, or any other timeseries generated by data platform services 520. When the first timeseries is/are updated, the second timeseries can be automatically updated by data platform services 520. Updates to the second timeseries can trigger automatic updates to one or more third data timeseries based on the second data timeseries. It is contemplated that any data timeseries can be based on any other data timeseries and can be automatically updated when the base data timeseries is updated.

In operation, a raw data timeseries can be written to timeseries storage 515 by data collector 512 as the data are collected or received from building subsystems 428. Subsequent processing by data cleanser 644, sample aggregator 608, virtual point calculator 610, and scalable rules engine 606 can occur in any order. For example, data cleanser 644 can cleanse the raw data timeseries, a data rollup timeseries, a virtual point timeseries, and/or a fault detection timeseries. Similarly, sample aggregator 608 can generate a data rollup timeseries using a raw data timeseries, a cleansed data timeseries, another data rollup timeseries, a virtual point timeseries, and/or a fault detection timeseries. Virtual point calculator 610 can generate a virtual point timeseries based on one or more raw data timeseries, cleansed data timeseries, data rollup timeseries, other virtual point timeseries, and/or fault detection timeseries. Scalable rules engine 606 can generate a fault detection timeseries using one or more raw data timeseries, cleansed data timeseries, data rollup timeseries, virtual point timeseries, and/or other fault detection timeseries.

Referring again to FIG. 6, analytics service 524 is shown to include an analytics web service 618, fault detection rules 620 and reasons 622, a rules editor 624, and an analytics storage interface 626. Analytics web service 618 is configured to interact with web-based applications to send and/or receive fault detection rules 620 and reasons 622 and results of data analytics. In some embodiments, analytics web service 618 receives fault detection rules 620 and reasons 622 from a web-based rules editor 624. For example, if rules editor 624 is a web-based application, analytics web service 618 can receive rules 620 and reasons 622 from rules editor 624. In some embodiments, analytics web service 618 provides results of the analytics to web-based applications. For example, if one or more of applications 530 are web-based applications, analytics web service 618 can provide fault detection timeseries to the web-based applications.

Analytics storage interface 626 is configured to interact with local storage 514 and/or hosted storage 516. For example, analytics storage interface 626 can retrieve rules 620 from local rules database 632 within local storage 514 or from hosted rules database 640 within hosted storage 516. Similarly, analytics storage interface 626 can retrieve reasons 622 from local reasons database 634 within local storage 514 or from hosted reasons database 642 within hosted storage 516. Analytics storage interface 626 can also store rules 620 and reasons 622 within local storage 514 and/or hosted storage 516.

Entity Graph

Figure 10A:
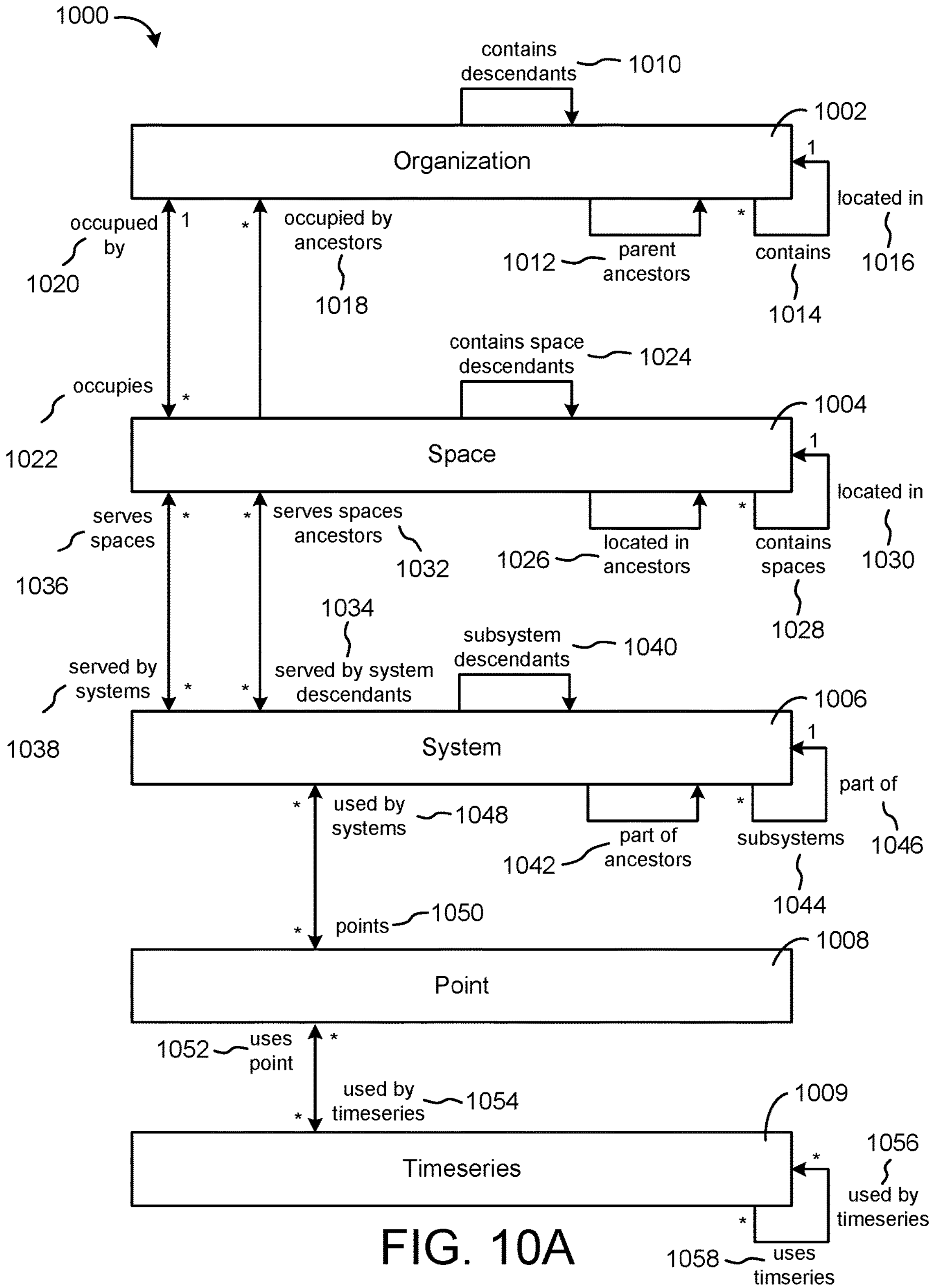
FIG. 10A is an entity graph illustrating relationships between an organization, a space, a system, a point, and a timeseries, which can be used by the data collector of FIG. 5, according to some embodiments.

Referring now to FIG. 10A, an entity graph 1000 is shown, according to some embodiments. In some embodiments, entity graph 1000 is generated or used by data collector 512, as described with reference to FIG. 5. Entity graph 1000 describes how a building is organized and how the different systems and spaces within the building relate to each other. For example, entity graph 1000 is shown to include an organization 1002, a space 1004, a system 1006, a point 1008, and a timeseries 1009. The arrows interconnecting organization 1002, space 1004, system 1006, point 1008, and timeseries 1009 identify the relationships between such entities. In some embodiments, the relationships are stored as attributes of the entity described by the attribute.

Organization 1002 is shown to include a contains descendants attribute 1010, a parent ancestors attribute 1012, a contains attribute 1014, a located in attribute 1016, an occupied by ancestors attribute 1018, and an occupies by attribute 1022. The contains descendants attribute 1010 identifies any descendant entities contained within organization 1002. The parent ancestors attribute 1012 identifies any parent entities to organization 1002. The contains attribute 1014 identifies any other organizations contained within organization 1002. The asterisk alongside the contains attribute 1014 indicates that organization 1002 can contain any number of other organizations. The located in attribute 1016 identifies another organization within which organization 1002 is located. The number 1 alongside the located in attribute 1016 indicates that organization 1002 can be located in exactly one other organization. The occupies attribute 1022 identifies any spaces occupied by organization 1002. The asterisk alongside the occupies attribute 1022 indicates that organization 1002 can occupy any number of spaces.

Space 1004 is shown to include an occupied by attribute 1020, an occupied by ancestors attribute 1018, a contains space descendants attribute 1024, a located in ancestors attribute 1026, a contains spaces attribute 1028, a located in attribute 1030, a served by systems attribute 1038, and a served by system descendants attribute 1034. The occupied by attribute 1020 identifies an organization occupied by space 1004. The number 1 alongside the occupied by attribute 1020 indicates that space 1004 can be occupied by exactly one organization. The occupied by ancestors attribute 1018 identifies one or more ancestors to organization 1002 that are occupied by space 1004. The asterisk alongside the occupied by ancestors attribute 1018 indicates that space 1004 can be occupied by any number of ancestors.

The contains space descendants attribute 1024 identifies any descendants to space 1004 that are contained within space 1004. The located in ancestors attribute 1026 identifies any ancestors to space 1004 within which space 1004 is located. The contains spaces attribute 1028 identifies any other spaces contained within space 1004. The asterisk alongside the contains spaces attribute 1028 indicates that space 1004 can contain any number of other spaces. The located in attribute 1030 identifies another space within which space 1004 is located. The number 1 alongside the located in attribute 1030 indicates that space 1004 can be located in exactly one other space. The served by systems attribute 1038 identifies any systems that serve space 1004. The asterisk alongside the served by systems attribute 1038 indicates that space 1004 can be served by any number of systems. The served by system descendants attribute 1034 identifies any descendent systems that serve space 1004. The asterisk alongside the served by descendant systems attribute 1034 indicates that space 1004 can be served by any number of descendant systems.

System 1006 is shown to include a serves spaces attribute 1036, a serves space ancestors attribute 1032, a subsystem descendants attribute 1040, a part of ancestors attribute 1042, a subsystems attribute 1044, a part of attribute 1046, and a points attribute 1050. The serves spaces attribute 1036 identifies any spaces that are served by system 1006. The asterisk alongside the serves spaces attribute 1036 indicates that system 1006 can serve any number of spaces. The serves space ancestors attribute 1032 identifies any ancestors to space 1004 that are served by system 1006. The asterisk alongside the serves ancestor spaces attribute 1032 indicates that system 1006 can serve any number of ancestor spaces.

The subsystem descendants attribute 1040 identifies any subsystem descendants of other systems contained within system 1006. The part of ancestors attribute 1042 identifies any ancestors to system 1006 that system 1006 is part of. The subsystems attribute 1044 identifies any subsystems contained within system 1006. The asterisk alongside the subsystems attribute 1044 indicates that system 1006 can contain any number of subsystems. The part of attribute 1046 identifies any other systems that system 1006 is part of. The number 1 alongside the part of attribute 1046 indicates that system 1006 can be part of exactly one other system. The points attribute 1050 identifies any data points that are associated with system 1006. The asterisk alongside the points attribute 1050 indicates that any number of data points can be associated with system 1006.

Point 1008 is shown to include a used by system attribute 1048. The asterisk alongside the used by system attribute 1048 indicates that point 1008 can be used by any number of systems. Point 1008 is also shown to include a used by timeseries attribute 1054. The asterisk alongside the used by timeseries attribute 1054 indicates that point 1008 can be used by any number of timeseries (e.g., raw data timeseries virtual point timeseries, data rollup timeseries, etc.). For example, multiple virtual point timeseries can be based on the same actual data point 1008. In some embodiments, the used by timeseries attribute 1054 is treated as a list of timeseries that subscribe to changes in value of data point 1008. When the value of point 1008 changes, the timeseries listed in the used by timeseries attribute 1054 can be identified and automatically updated to reflect the changed value of point 1008.

Timeseries 1009 is shown to include a uses point attribute 1052. The asterisk alongside the uses point attribute 1052 indicates that timeseries 1009 can use any number of actual data points. For example, a virtual point timeseries can be based on multiple actual data points. In some embodiments, the uses point attribute 1052 is treated as a list of points to monitor for changes in value. When any of the points identified by the uses point attribute 1052 are updated, timeseries 1009 can be automatically updated to reflect the changed value of the points used by timeseries 1009.

Timeseries 1009 is also shown to include a used by timeseries attribute 1056 and a uses timeseries attribute 1058. The asterisks alongside the used by timeseries attribute 1056 and the uses timeseries attribute 1058 indicate that timeseries 1009 can be used by any number of other timeseries and can use any number of other timeseries. For example, both a data rollup timeseries and a virtual point timeseries can be based on the same raw data timeseries. As another example, a single virtual point timeseries can be based on multiple other timeseries (e.g., multiple raw data timeseries). In some embodiments, the used by timeseries attribute 1056 is treated as a list of timeseries that subscribe to updates in timeseries 1009. When timeseries 1009 is updated, the timeseries listed in the used by timeseries attribute 1056 can be identified and automatically updated to reflect the change to timeseries 1009. Similarly, the uses timeseries attribute 1058 can be treated as a list of timeseries to monitor for updates. When any of the timeseries identified by the uses timeseries attribute 1058 are updated, timeseries 1009 can be automatically updated to reflect the updates to the other timeseries upon which timeseries 1009 is based.

Figure 10B:
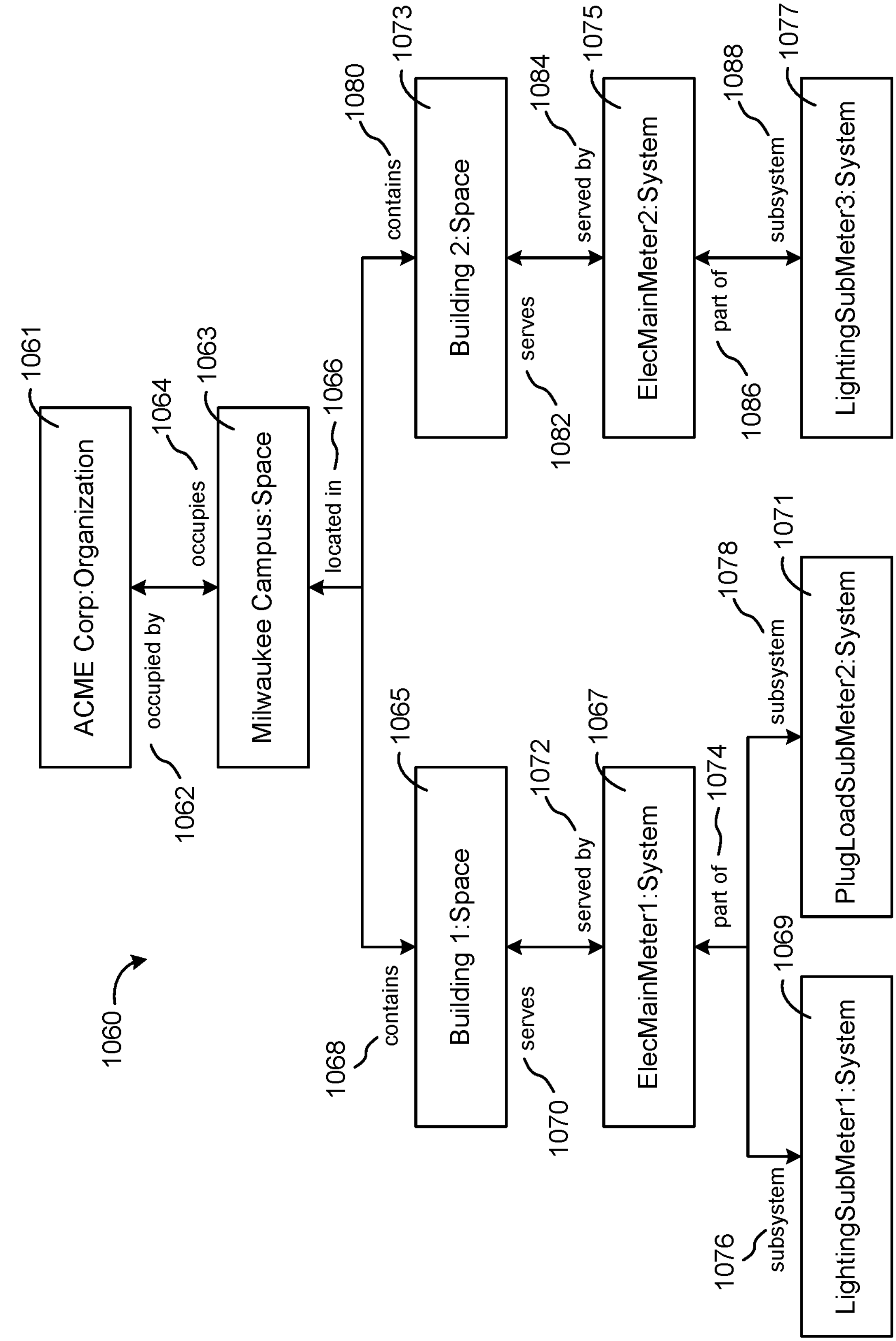
FIG. 10B is an example of an entity graph for a particular building management system according to some embodiments.

Referring now to FIG. 10B, an example of an entity graph 1060 for a particular building management system is shown, according to some embodiments. Entity graph 1060 is shown to include an organization 1061 ("ACME Corp"). Organization 1061 be a collection of people, a legal entity, a business, an agency, or other type of organization. Organization 1061 occupies space 1063 ("Milwaukee Campus"), as indicated by the occupies attribute 1064. Space 1063 is occupied by organization 1061, as indicated by the occupied by attribute 1062.

In some embodiments, space 1063 is a top level space in a hierarchy of spaces. For example, space 1063 can represent an entire campus (i.e., a collection of buildings). Space 1063 can contain various subspaces (e.g., individual buildings) such as space 1065 ("Building 1") and space 1073 ("Building 2"), as indicated by the contains attributes 1068 and 1080. Spaces 1065 and 1080 are located in space 1063, as indicated by the located in attribute 1066. Each of spaces 1065 and 1073 can contain lower level subspaces such as individual floors, zones, or rooms within each building. However, such subspaces are omitted from entity graph 1060 for simplicity.

Space 1065 is served by system 1067 ("ElecMainMeter1") as indicated by the served by attribute 1072. System 1067 can be any system that serves space 1065 (e.g., a HVAC system, a lighting system, an electrical system, a security system, etc.). The serves attribute 1070 indicates that system 1067 serves space 1065. In entity graph 1060, system 1067 is shown as an electrical system having a subsystem 1069 ("LightingSubMeter1") and a subsystem 1071 ("PlugLoadSubMeter2") as indicated by the subsystem attributes 1076 and 1078. Subsystems 1069 and 1071 are part of system 1067, as indicated by the part of attribute 1074.

Space 1073 is served by system 1075 ("ElecMainMeter2") as indicated by the served by attribute 1084. System 1075 can be any system that serves space 1073 (e.g., a HVAC system, a lighting system, an electrical system, a security system, etc.). The serves attribute 1082 indicates that system 1075 serves space 1073. In entity graph 1060, system 1075 is shown as an electrical system having a subsystem 1077 ("LightingSubMeter3") as indicated by the subsystem attribute 1088. Subsystem 1077 is part of system 1075, as indicated by the part of attribute 1086.

In addition to the attributes shown in FIG. 10B, entity graph 1060 can include "ancestors" and "descendants" attributes on each entity in the hierarchy. The ancestors attribute can identify (e.g., in a flat list) all of the entities that are ancestors to a given entity. For example, the ancestors attribute for space 1065 may identify both space 1063 and organization 1061 as ancestors. Similarly, the descendants attribute can identify all (e.g., in a flat list) of the entities that are descendants of a given entity. For example, the descendants attribute for space 1065 may identify system 1067, subsystem 1069, and subsystem 1071 as descendants. This provides each entity with a complete listing of its ancestors and descendants, regardless of how many levels are included in the hierarchical tree. This is a form of transitive closure.

In some embodiments, the transitive closure provided by the descendants and ancestors attributes allows entity graph 1060 to facilitate simple queries without having to search multiple levels of the hierarchical tree. For example, the following query can be used to find all meters under the Milwaukee Campus space 1063:

/Systems?$filter=(systemType eq

Jci.Be.Data.SystemType'Meter') and ancestorSpaces/any(a: a/name eq 'Milwaukee Campus')

and can be answered using only the descendants attribute of the Milwaukee Campus space 1063. For example, the descendants attribute of space 1063 can identify all meters that are hierarchically below space 1063. The descendants attribute can be organized as a flat list and stored as an attribute of space 1063. This allows the query to be served by searching only the descendants attribute of space 1063 without requiring other levels or entities of the hierarchy to be searched.

Figure 11:
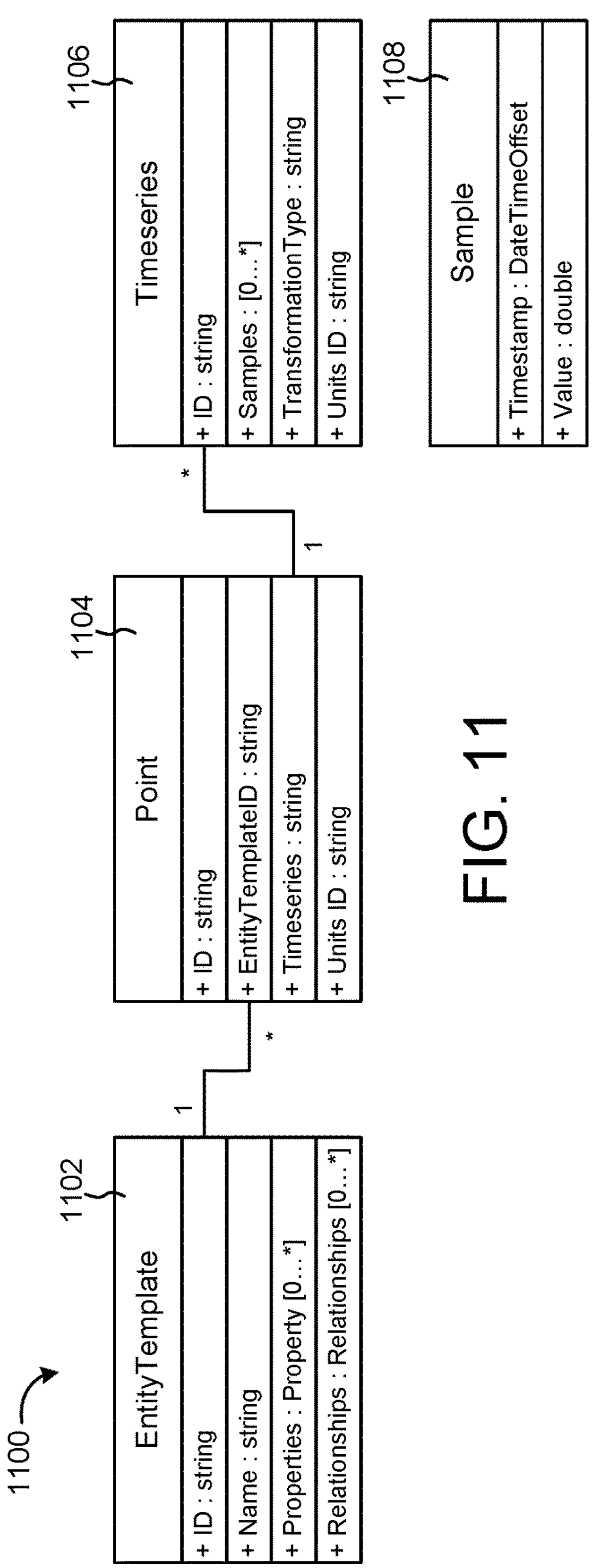
FIG. 11 is an object relationship diagram illustrating relationships between an entity template, a point, a timeseries, and a data sample, which can be used by the data collector of FIG. 5 and the timeseries service of FIG. 6, according to some embodiments.

Referring now to FIG. 11, an object relationship diagram 1100 is shown, according to some embodiments. Relationship diagram 1100 is shown to include an entity template 1102, a point 1104, a timeseries 1106, and a sample 1108. In some embodiments, entity template 1102, point 1104, timeseries 1106, and sample 1108 are stored as data objects within memory 510, local storage 514, and/or hosted storage 516. Relationship diagram 1100 illustrates the relationships between entity template 1102, point 1104, and timeseries 1106.

Entity template 1102 can include various attributes such as an ID attribute, a name attribute, a properties attribute, and a relationships attribute. The ID attribute can be provided as a text string and identifies a unique ID for entity template 1102. The name attribute can also be provided as a text string and identifies the name of entity template 1102. The properties attribute can be provided as a vector and identifies one or more properties of entity template 1102. The relationships attribute can also be provided as a vector and identifies one or more relationships of entity template 1102.

Point 1104 can include various attributes such as an ID attribute, an entity template ID attribute, a timeseries attribute, and a units ID attribute. The ID attribute can be provided as a text string and identifies a unique ID for point 1104. The entity template ID attribute can also be provided as a text string and identifies the entity template 1102 associated with point 1104 (e.g., by listing the ID attribute of entity template 1102). Any number of points 1104 can be associated with entity template 1102. However, in some embodiments, each point 11104 is associated with a single entity template 1102. The timeseries attribute can be provided as a text string and identifies any timeseries associated with point 1104 (e.g., by listing the ID string of any timeseries 1106 associated with point 1104). The units ID attribute can also be provided as a text string and identifies the units of the variable quantified by point 1104.

Timeseries 1106 can include various attributes such as an ID attribute, a samples attribute, a transformation type attribute, and a units ID attribute. The ID attribute can be provided as a text string and identifies a unique ID for timeseries 1106. The unique ID of timeseries 1106 can be listed in the timeseries attribute of point 1104 to associate timeseries 1106 with point 1104. Any number of timeseries 1106 can be associated with point 1104. Each timeseries 1106 is associated with a single point 1104. The samples attribute can be provided as a vector and identifies one or more samples associated with timeseries 1106. The transformation type attribute identifies the type of transformation used to generate timeseries 1106 (e.g., average hourly, average daily, average monthly, etc.). The units ID attribute can also be provided as a text string and identifies the units of the variable quantified by timeseries 1106.

Sample 1108 can include a timestamp attribute and a value attribute. The timestamp attribute can be provided in local time and can include an offset relative to universal time. The value attribute can include a data value of sample 1108. In some instances, the value attribute is a numerical value (e.g., for measured variables). In other instances, the value attribute can be a text string such as "Fault" if sample 1108 is part of a fault detection timeseries.

Dashboard Layouts

Figure 12:
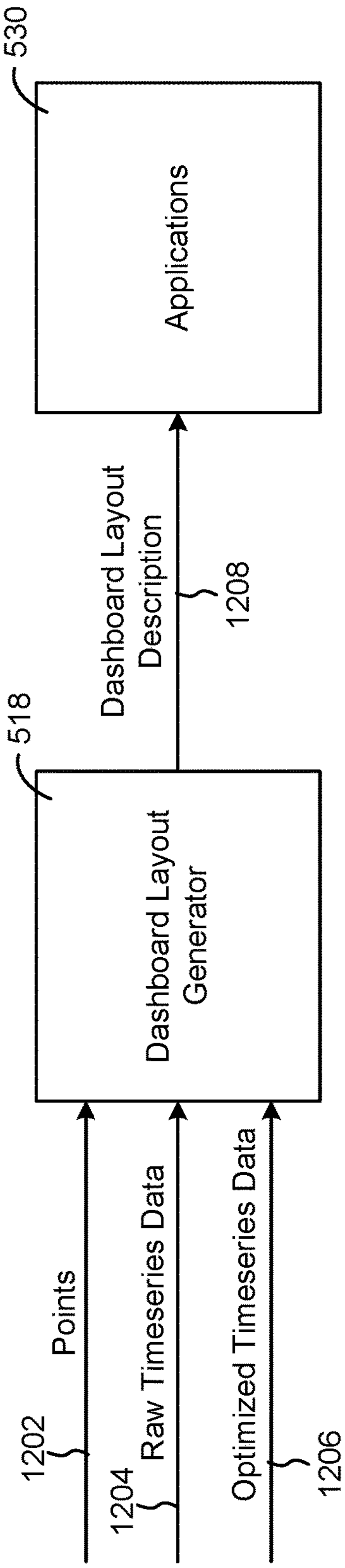
FIG. 12 is a flow diagram illustrating the operation of the dashboard layout generator of FIG. 5, according to some embodiments.

Referring now to FIG. 12, a block diagram illustrating the operation of dashboard layout generator 518 is shown, according to some embodiments. Dashboard layout generator 518 is shown receiving points 1202, raw timeseries data 1204, and optimized timeseries data 1206. Points 1202 can include actual data points (e.g., measured data points), virtual data points (e.g., calculated data points) or other types of data points for which sample data is received at BMS 500 or calculated by BMS 500. Points 1202 can include instances of point 1104, as described with reference to FIG. 11. For example, each of points 1202 can include a point ID, an entity template ID, an indication of one or more timeseries associated with the point, and a units ID. Raw timeseries data 1204 can include the raw timeseries data collected or generated by data collector 512. Optimized timeseries data 1206 can include data rollup timeseries, cleansed timeseries, virtual point timeseries, weather point timeseries, fault detection timeseries, and/or other types of timeseries data which can be generated or processed by job manager 604.

Dashboard layout generator 518 is shown generating a dashboard layout description 1208. In some embodiments, dashboard layout description 1208 is a framework agnostic layout description which can be used to render a user interface (i.e., a dashboard layout) by a variety of different rendering engines (e.g., a web browser, a PDF engine, etc.) and/or frameworks. Dashboard layout description 1208 is not itself a user interface, but rather a schema which can be used by applications 530 and other frameworks to generate a user interface. Many different frameworks and applications 530 can read and use dashboard layout description 1208 to generate a user interface according to the theming and sizing of the framework. In some embodiments, dashboard layout description 1208 describes the dashboard layout using a grid of rows and columns.

Figure 13:
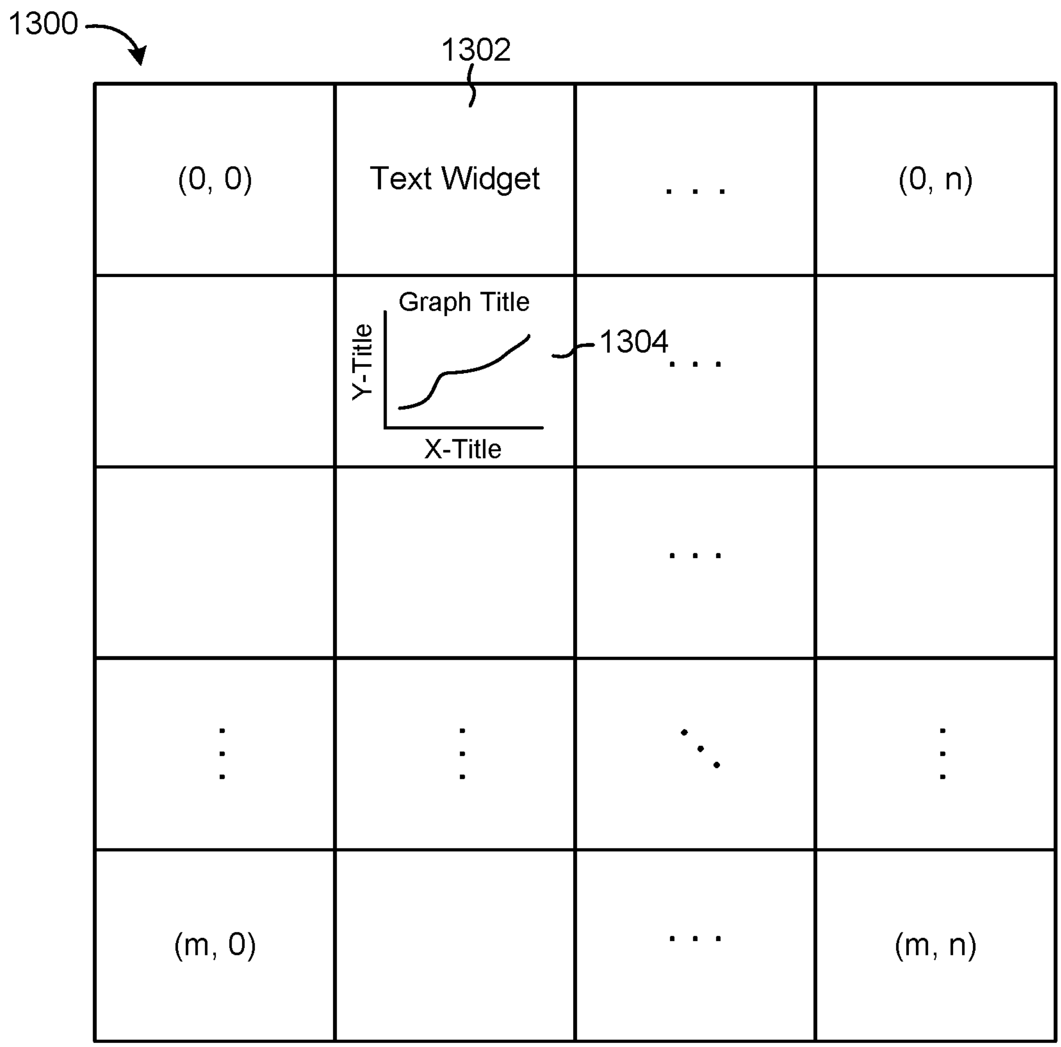
FIG. 13 is a grid illustrating dashboard layout description which can be generated by the dashboard layout generator of FIG. 5, according to some embodiments.

Referring now to FIG. 13, a grid 1300 illustrating dashboard layout description 1208 is shown. Grid 1300 is shown as a m×n grid including m rows and n columns. The intersections of the rows and columns define particular locations in grid 1300 at which widgets can be located. For example, grid 1300 is shown to include a text widget 1302 at the intersection of the first row and the second column. Grid 1300 also includes a graph widget 1304 at the intersection of the second row and the second column. In some embodiments, the locations of widgets 1302 and 1304 are defined by the row and column indices of grid 1300. For example, dashboard layout description 1208 can define the location of text widget 1302 by specifying that text widget 1302 is located at the intersection of the first row and the second column of grid 1300. Similarly, dashboard layout description 1208 can define the location of graph widget 1304 by specifying that graph widget 1304 is located at the intersection of the second row and the second column of grid 1300.

In some embodiments, dashboard layout description 1208 defines various properties for each widget. For example, widgets 1302 and 1304 can have a widget type property defining the type of the widget (e.g., text, graph, image, etc.). In some embodiments, widget 1302 has a text property defining the text displayed by widget 1302. Widget 1304 can include graph properties that define various attributes of the graph (e.g., graph title, x-axis title, y-axis title, etc.). In some embodiments, graph widget 1304 includes a property that defines one or more timeseries of data displayed in widget 1304. The timeseries can be different timeseries of the same data point (e.g., a raw data timeseries, an average hourly timeseries, an average daily timeseries, etc.) or timeseries of different data points. In some embodiments, graph widget 1304 includes properties that defines the widget name and a set of APIs that drive widget 1304 (e.g., service URLs or database URLs).

In some embodiments, dashboard layout description 1208 includes a top level dashboard element containing properties that apply to the entire dashboard layout. Such properties can include, for example, dashboard name, whether the widgets are collapsible, whether the dashboard is editable, and the grid layout. The grid layout can be defined as an array of objects (e.g., widgets), each of which is an array of properties. The dashboard layout can be static, dynamic, or user specific. Static layouts can be used when the layout does not change. Dynamic layouts can be used to add more features to an existing dashboard. User specified layouts can be used to allow the dashboard to be adjusted by the user (e.g., by adding or removing widgets).

Dashboard layout description 1208 can be used to drive various services. In some embodiments, dashboard layout description 1208 enables providing a user interface as a service. In this scenario, dashboard layout generator 518 can provide a framework with predefined widgets. The framework can read dashboard layout description 1208 and render the user interface. Providing the user interface as a service allows new widgets to be added to the predefined widgets. In other embodiments, dashboard layout description 1208 enables providing data visualization as a service.

Referring now to FIGS. 14-15, an example of a dashboard layout description 1400 and a dashboard layout 1500 that can be generated from dashboard layout description 1400 are shown, according to some embodiments. Referring particularly to FIG. 14, dashboard layout description 1400 is shown to include several properties 1402 that apply to the entire dashboard layout 1500. Properties 1402 are shown to include a name of dashboard layout 1500 and properties defining whether dashboard layout 1500 is collapsible, maximizable, and/or editable.

In some embodiments, dashboard layout description 1400 is described in JSON format. For example, dashboard layout description 1400 is shown to include a rows object 1404 and a columns object 1406 contained within rows object 1404. Columns object 1406 contains two elements. Accordingly, dashboard layout description 1400 defines a layout that includes a single row and two columns within the row. Each of the columns includes a widget. For example, the first element of columns object 1406 includes a first widget object 1408, whereas the second element of columns object 1406 includes a second widget object 1410.

Widget object 1408 includes several properties 1412 defining various attributes of widget object 1408. For example, widget object 1408 is shown to include properties defining a widget name (i.e., MEMS Meter), a widget type (i.e., spline) and a widget configuration. The spline type indicates that widget object 1408 defines a line graph. The widget configuration property includes several sub-properties 1414 defining attributes of the line graph. Sub-properties 1414 are shown to include a title, an x-axis label (i.e., datetime), a y-axis label (i.e., KW), a token API defining an API that drives widget object 1408, and a sample API defining another API that drives widget object 1408. Sub-properties 1414 also include a points property defining several timeseries that can be displayed in widget object 1408.

Similarly, widget object 1410 includes several properties 1416 defining various attributes of widget object 1410. For example, widget object 1410 is shown to include properties defining a widget name (i.e., MEMS Meter), a widget type (i.e., column) and a widget configuration. The column type indicates that widget object 1410 defines a bar graph. The widget configuration property includes several sub-properties 1418 defining attributes of the bar graph. Sub-properties 1418 are shown to include a title, an x-axis label (i.e., datetime), a y-axis label (i.e., KWH), a token API defining an API that drives widget object 1410, and a sample API defining another API that drives widget object 1410. Sub-properties 1418 also include a points property defining several timeseries that can be displayed in widget object 1410.

Referring now to FIG. 15, dashboard layout 1500 is shown to include a title 1502, a first widget 1504, and a second widget 1506. The text of title 1502 is defined by properties 1402, whereas first widget 1504 is defined by widget object 1408, and second widget 1506 is defined by widget object 1410. Dashboard layout 1500 includes a single row and two columns within the row. The first column includes first widget 1504, whereas the second column includes second widget 1506. Widget 1504 is shown to include the title 1508 "MEMS Meter" (defined by properties 1412) and a dropdown selector 1512 which can be used to select any of the timeseries defined by sub-properties 1414. Similarly, widget 1506 is shown to include the title 1510 "MEMS Meter" (defined by properties 1416) and a dropdown selector 1514 which can be used to select any of the timeseries defined by sub-properties 1418.

Referring now to FIGS. 16-17, another example of a dashboard layout description 1600 and a dashboard layout 1700 that can be generated from dashboard layout description 1600 are shown, according to some embodiments. Referring particularly to FIG. 16, dashboard layout description 1600 is shown to include several properties 1602 that apply to the entire dashboard layout 1700. Properties 1602 are shown to include a name of dashboard layout 1700 and properties defining whether dashboard layout 1700 is collapsible, maximizable, and/or editable.

In some embodiments, dashboard layout description 1600 is described in JSON format. For example, dashboard layout description 1600 is shown to include a rows object 1604. Rows object 1604 has two data elements, each defining a different row of dashboard layout 1700. The first element of rows object 1604 contains a first a columns object 1606, whereas the second element of rows object 1604 contains a second columns object 1607. Columns object 1606 has a single element which includes a first widget object 1608. However, columns object 1607 has two elements, each of which includes a widget object (i.e., widget objects 1610 and 1620). Accordingly, dashboard layout description 1600 defines a layout that includes a first row with one column and a second row with two columns. The first row contains widget object 1608. The second row contains two widget objects 1610 and 1620 in adjacent columns.

Widget object 1608 includes several properties 1612 defining various attributes of widget object 1608. For example, widget object 1608 is shown to include properties defining a widget name (i.e., BTU Meter), a widget type (i.e., spline) and a widget configuration. The spline type indicates that widget object 1608 defines a line graph. The widget configuration property includes several sub-properties 1614 defining attributes of the line graph. Sub-properties 1614 are shown to include a title, an x-axis label, a y-axis label, a token API defining an API that drives widget object 1608, and a sample API defining another API that drives widget object 1608. Sub-properties 1614 also include a points property defining several timeseries that can be displayed in widget object 1608.

Similarly, widget object 1610 includes several properties 1616 defining various attributes of widget object 1610. For example, widget object 1610 is shown to include properties defining a widget name (i.e., Meter 1), a widget type (i.e., spline) and a widget configuration. The spline type indicates that widget object 1610 defines a line graph. The widget configuration property includes several sub-properties 1618 defining attributes of the line graph. Sub-properties 1618 are shown to include a title, an x-axis label, a y-axis label, a token API defining an API that drives widget object 1610, and a sample API defining another API that drives widget object 1610. Sub-properties 1618 also include a points property defining several timeseries that can be displayed in widget object 1610.

Widget object 1620 includes several properties 1622 defining various attributes of widget object 1620. For example, widget object 1620 is shown to include properties defining a widget name (i.e., Meter 1), a widget type (i.e., spline) and a widget configuration. The spline type indicates that widget object 1620 defines a line graph. The widget configuration property includes several sub-properties 1624 defining attributes of the line graph. Sub-properties 1624 are shown to include a title, an x-axis label, a y-axis label, a token API defining an API that drives widget object 1620, and a sample API defining another API that drives widget object 1620. Sub-properties 1624 also include a points property defining several timeseries that can be displayed in widget object 1620.

Referring now to FIG. 17, dashboard layout 1700 is shown to include a title 1702, a first widget 1704, a second widget 1706, and a third widget 1707. The text of title 1702 is defined by properties 1602. The content of first widget 1704 is defined by widget object 1608; the content of second widget 1706 is defined by widget object 1610; and the content of third widget 1707 is defined by widget object 1620. Dashboard layout 1700 includes two rows. The first row includes a single column, whereas the second row includes two columns. The first row includes first widget 1704, whereas the second row includes second widget 1706 in the first column and third widget 1707 in the second column.

Widget 1704 is shown to include the title 1708 "BTU Meter" (defined by properties 1612) and a dropdown selector 1712 which can be used to select any of the timeseries defined by sub-properties 1614. Similarly, widget 1706 is shown to include the title 1710 "Meter 1" (defined by properties 1616) and a dropdown selector 1714 which can be used to select any of the timeseries defined by sub-properties 1618. Widget 1707 is shown to include the title 1711 "Meter 1" (defined by properties 1622) and a dropdown selector 1715 which can be used to select any of the timeseries defined by sub-properties 1624.

Energy Management System User Interfaces

Referring now to FIGS. 18-51, several user interfaces which can be generated by building management system 500 are shown, according to an exemplary embodiment. In some embodiments, the user interfaces are generated by energy management application 532, monitoring and reporting application 534, enterprise control application 536, or other applications 530 that consume the optimized timeseries data generated by data platform services 520. For example, the user interfaces can be generated by a building energy management system which includes an instance of energy management application 532. One example of such a building energy management system is the METASYS® Energy Management System (MEMS) by Johnson Controls Inc. The building energy management system can be implemented as part of building management system 500 (e.g., one of applications 530) or as a cloud-based application (e.g., one of remote systems and applications 444) in communication with building management system 500 via communications network 446 (e.g., the Internet, a LAN, a cellular network, etc.).

Figure 18:
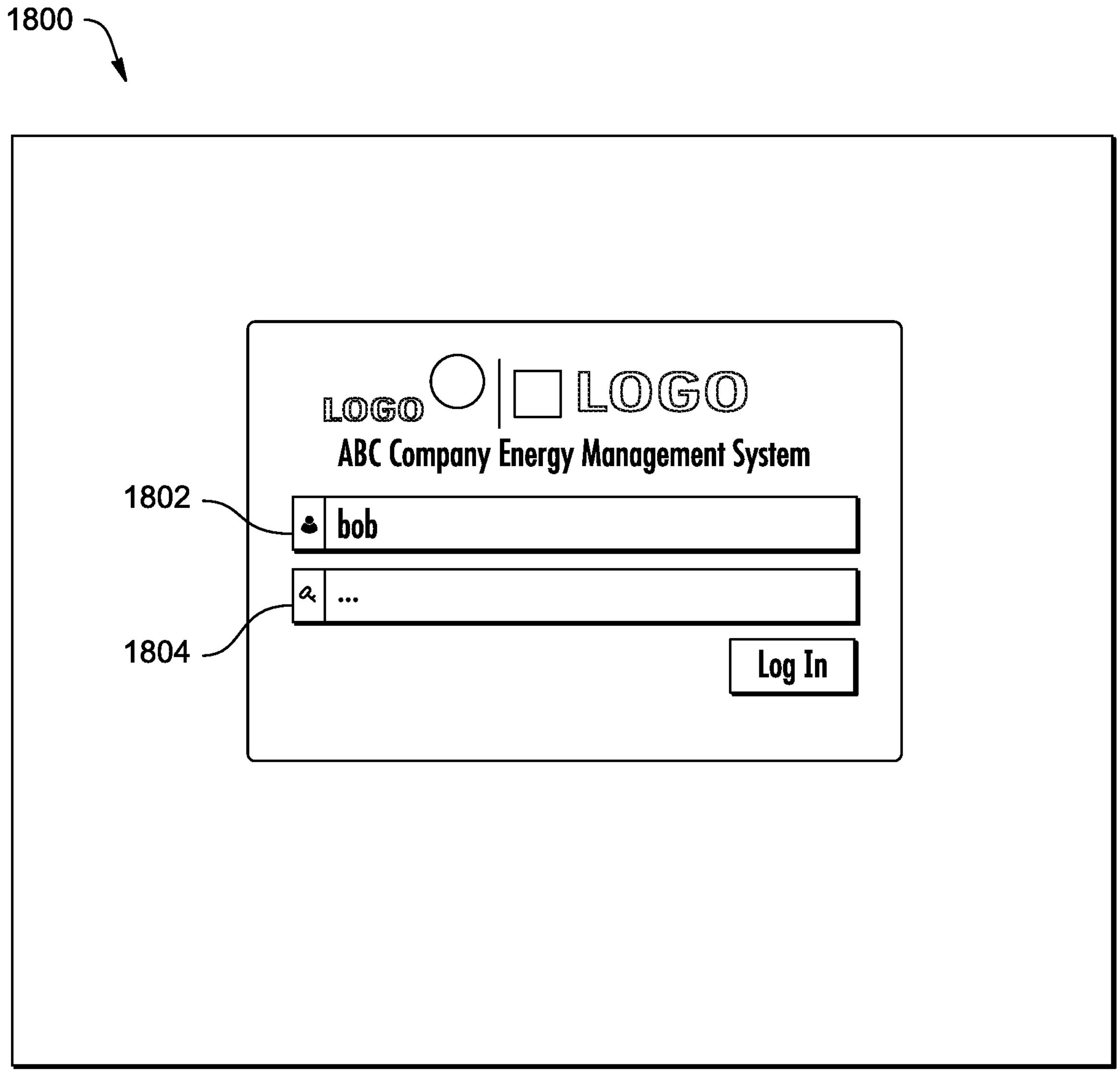
FIG. 18 is a login interface which may be generated by the BMS of FIG. 5, according to some embodiments.

Referring now to FIG. 18, a login interface 1800 is shown, according to an exemplary embodiment. Login interface 1800 may be presented via a web browser and/or via an application running on a client device (e.g., a desktop computer, a laptop computer, a tablet, a smartphone, etc.). A user can enter access credentials via login interface 1800 (e.g., username 1802 and password 1804) to login to energy management application 532. Access credentials entered via login interface 1800 may be sent to an authentication server for authentication.

Overview Dashboard

Referring now to FIGS. 19-34, an overview dashboard 1900 for energy management application 532 is shown, according to an exemplary embodiment. Overview dashboard 1900 may be presented after the user logs in and may be the first interface that the user sees after entering access credentials 1802-1804. Overview dashboard 1900 is shown to include a navigation pane 1902 on the left side of dashboard 1900. A handle bar 1904 to the right of navigation pane 1902 (immediately to the right of search box 1906) may allow a user to view or hide navigation pane 1902. Overview dashboard 1900 may include a navigation tile 1908, shown in the upper right corner. When navigation tile 1908 is selected (e.g., clicked, hovered over, etc.) a pop-up window 2000 may appear (shown in FIG. 20). Pop-up window 2000 is shown to include a dashboard button 2002 which may allow the user to navigate to dashboard 1900, and a setting button 2004 which may allow the user to navigate to a setup interface 3600 (described in greater detail below).

Figure 19:
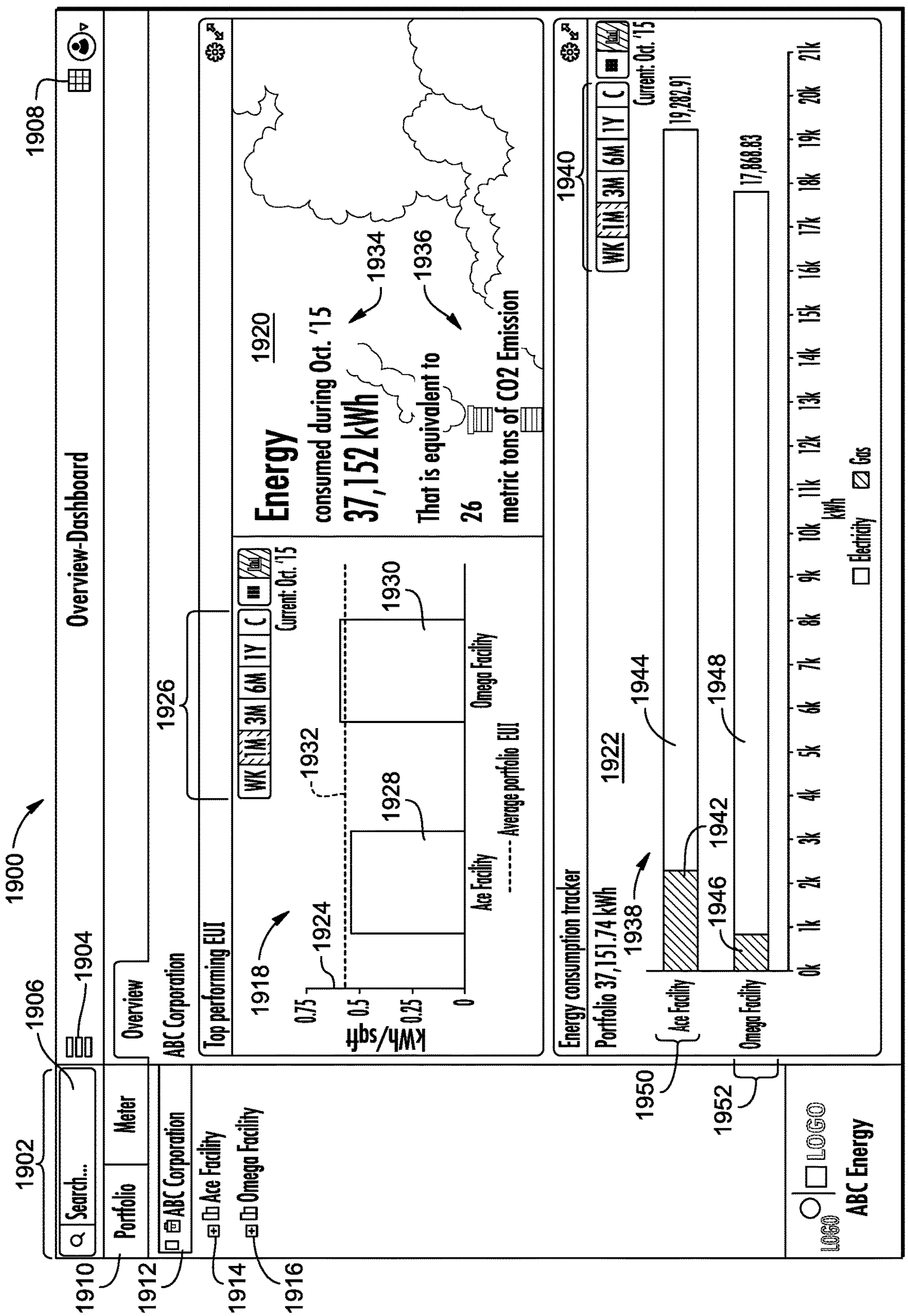
FIGS. 19-34 are drawings of an overview dashboard which may be generated by the BMS of FIG. 5, according to some embodiments.
Figure 20:
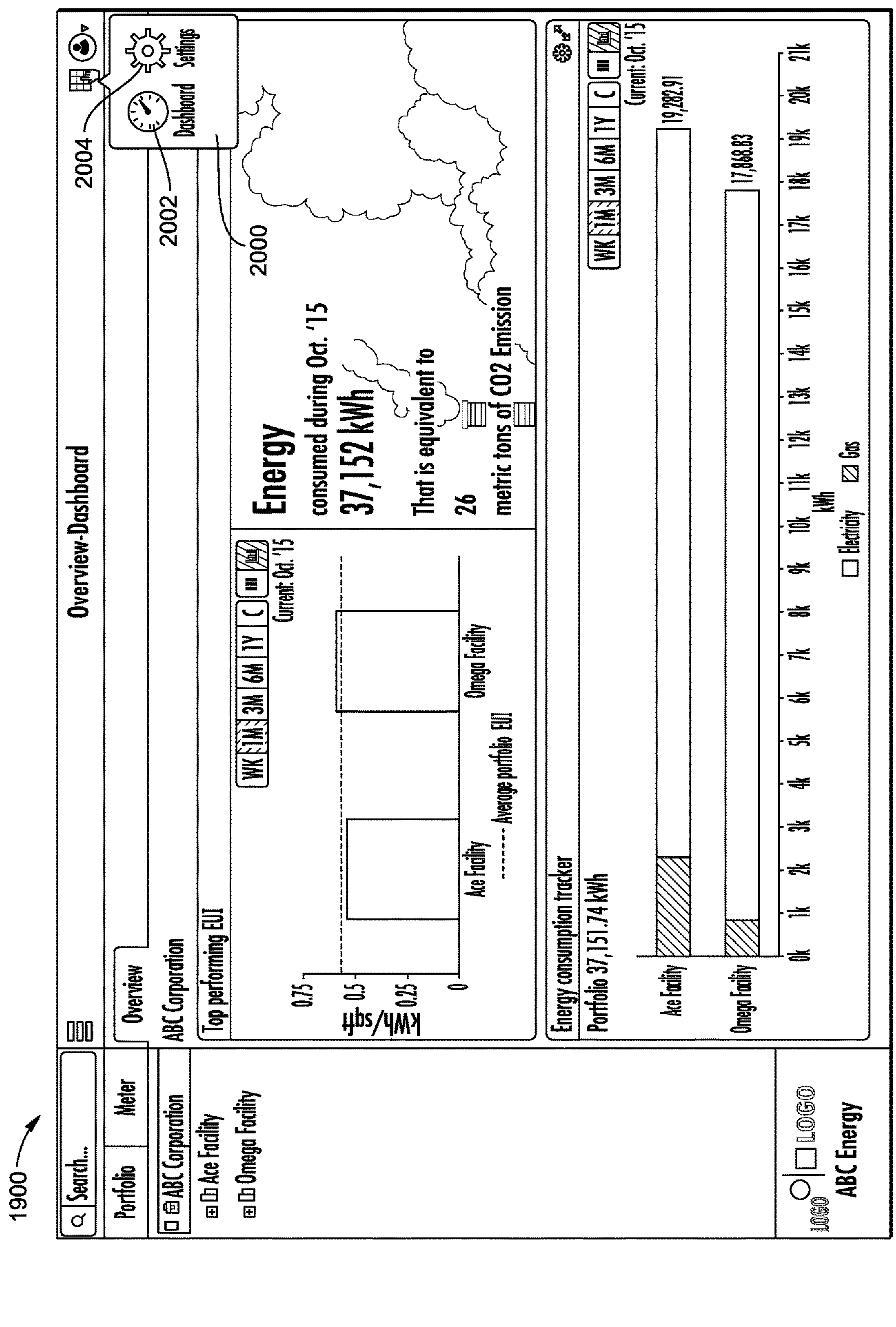
Figure 21:
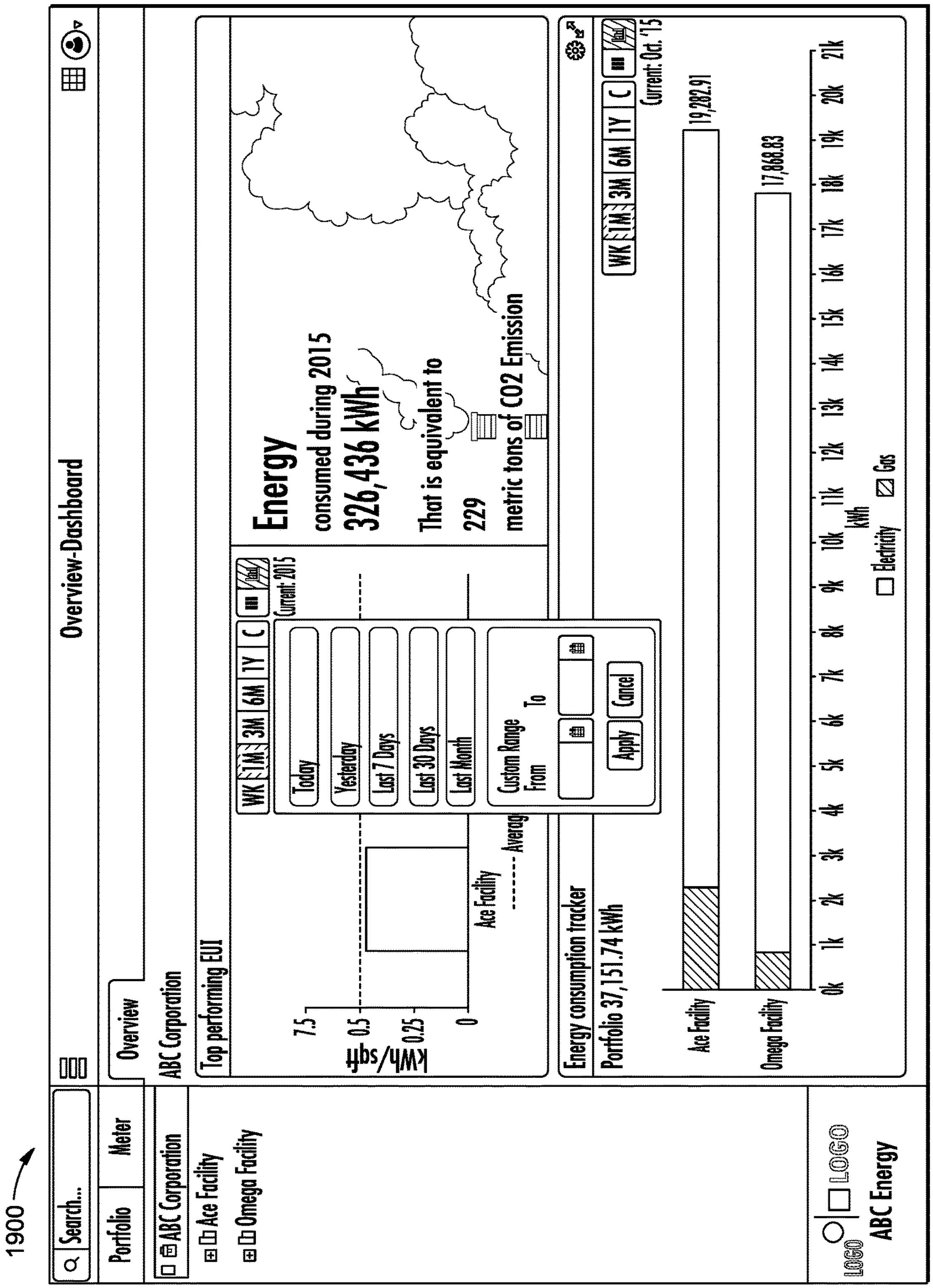

As shown in FIG. 19, navigation pane 1902 includes a portfolio tab 1910. Portfolio tab 1910 may include an outline or hierarchy of the facilities which can be viewed and managed by the user. For example, portfolio tab 1910 is shown to include a portfolio-level node 1912 indicating the name of the portfolio or enterprise managed by energy management application 532 (i.e., "ABC Corporation") and two facility-level nodes 1914 and 1916 indicating the facilities within the portfolio (i.e., "Ace Facility" and "Omega Facility"). In some embodiments, the portfolio is a set of buildings associated with the enterprise. When portfolio-level node 1912 is selected, overview dashboard 1900 may display energy-related information for the portfolio. For example, overview dashboard 1900 is shown displaying a chart 1918 of energy use intensity (EUI) for the various facilities within the portfolio, an energy facts panel 1920 to the right of chart 1918, and an energy consumption tracker 1922.

EUI chart 1918 may display the portfolio energy index as a function of the size of each facility. The dependent variable shown on the vertical axis 1924 (kWh/sqft) may be calculated by summing the total energy use for the facility and dividing by the size of the facility (e.g., square feet). A low EUI for a facility may indicate that the facility has a better energy performance, whereas a high EUI for a facility may indicate that the facility has a worse energy performance. The total energy use of the facility may be summed over a variety of different intervals by selecting different time intervals. For example, a user can click buttons 1926 above chart 1918 to select time intervals of one week, one month, three months, six months, one year, or a custom time interval (shown in FIG. 21). Hovering over a bar 1928 or 1930 in chart 1918 may display a pop-up that indicates the value of the EUI and the name of the facility. In some embodiments, EUI chart 1918 includes an average portfolio EUI line 1932 which indicates the average EUI for all of the facilities. Average portfolio EUI line 1932 may allow a user to easily compare the EUI of each facility to the portfolio average EUI.

In some embodiments, overview dashboard 1900 includes a chart of energy density for the various facilities within the portfolio. Like EUI, energy density is an energy usage metric that is normalized to the area of the facility. However, energy density may be calculated based on the change in energy usage between consecutive samples rather than the cumulative energy usage over a time interval. In some embodiments, energy density is calculated by determining the change or delta in energy usage (e.g., kWh) for the facility between consecutive samples of the energy usage and dividing the change or delta by the size of the facility (e.g., square feet). For example, if the energy consumption of a facility at 1:00 PM is 50 kWh and the energy consumption of the facility at 2:00 PM is 70 kWh, the change or delta in energy consumption between 1:00 PM and 2:00 PM would be 20 kWh. This delta (i.e., 20 kWh) can be divided by the area of the facility to determine the energy density of the facility (e.g., kWh/sqft) for the time period between 1:00 PM and 2:00 PM.

Throughout this disclosure, EUI is used as an example of an energy usage metric for a facility. However, it should be understood that energy density can be used in addition to or in place of EUI in any of the user interfaces, analytics, or dashboards described herein. Any reference to EUI in the present disclosure can be replaced/supplemented with energy density (or any other energy usage metric) without departing from the teachings of the present disclosure.

Energy facts panel 1920 may display the total amount of energy consumed by the portfolio during the time interval selected by the user. For example, energy facts panel 1920 is shown displaying an indication 1934 that the portfolio consumed 37,152 kWh during the month of October 2015. In some embodiments, energy facts panel 1920 displays an indication 1936 of the carbon footprint (i.e., $CO_2$ emission) corresponding to the total energy consumption. Energy management application 532 may automatically convert energy consumption to an amount of $CO_2$ emission and display the amount of $CO_2$ emission via energy facts panel 1920. Both EUI chart 1918 and energy facts panel 1920 may be automatically updated in response to a user selecting a different time interval via EUI chart 1918.

Energy consumption tracker 1922 breaks down the total energy consumption into various commodities such as electricity and natural gas. Energy consumption tracker 1922 may include a chart 1938 which indicates the amount of each commodity consumed by each facility during a particular time interval. The time interval may be selected by the user using buttons 1940 displayed above the chart in energy consumption tracker 1922. Similar to the time interval selection provided by EUI chart 1918, a user can select time intervals of one week, one month, three months, six months, one year, or a custom time interval.

Figure 22:
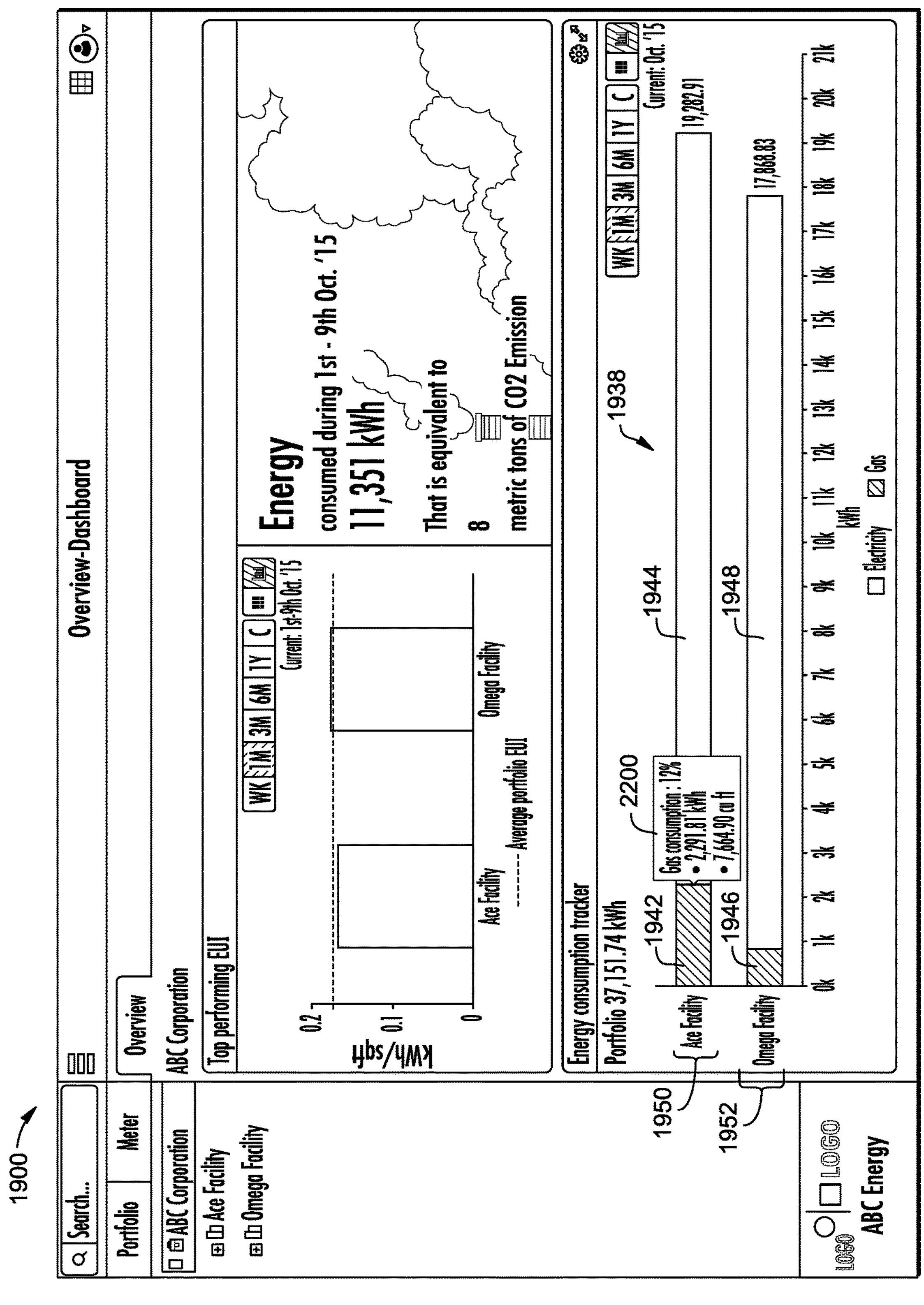

As shown in FIG. 22, selecting or hovering over a bar 1942, 1944, 1946, or 1948 for a particular commodity in chart 1938 may display a pop-up 2200 that indicates the amount of the commodity consumed by the corresponding facility during the user-selected time interval. For example, hovering over gas bar 1942 within the Ace Facility row 1950 may display the amount of gas consumption by the Ace Facility within the time interval. Similarly, hovering over gas bar 1946 within the Omega Facility row 1952 may display the amount of gas consumption by the Omega Facility within the time interval. Gas consumption may be indicated in both units of energy (e.g., kWh) and units of volume (e.g., cubic feet). Energy management application 532 may automatically convert commodity-specific units provided by an energy utility (e.g., cubic feet) to units of energy (e.g., kWh) so that the energy consumption can be directly compared across various commodities. Pop-up 2200 may also indicate the percentage of the total energy consumption corresponding to the selected commodity. For example, pop-up 2200 in FIG. 22 indicates that gas consumption contributed to 12% of the total energy consumption for the Ace Facility.

Figure 23:
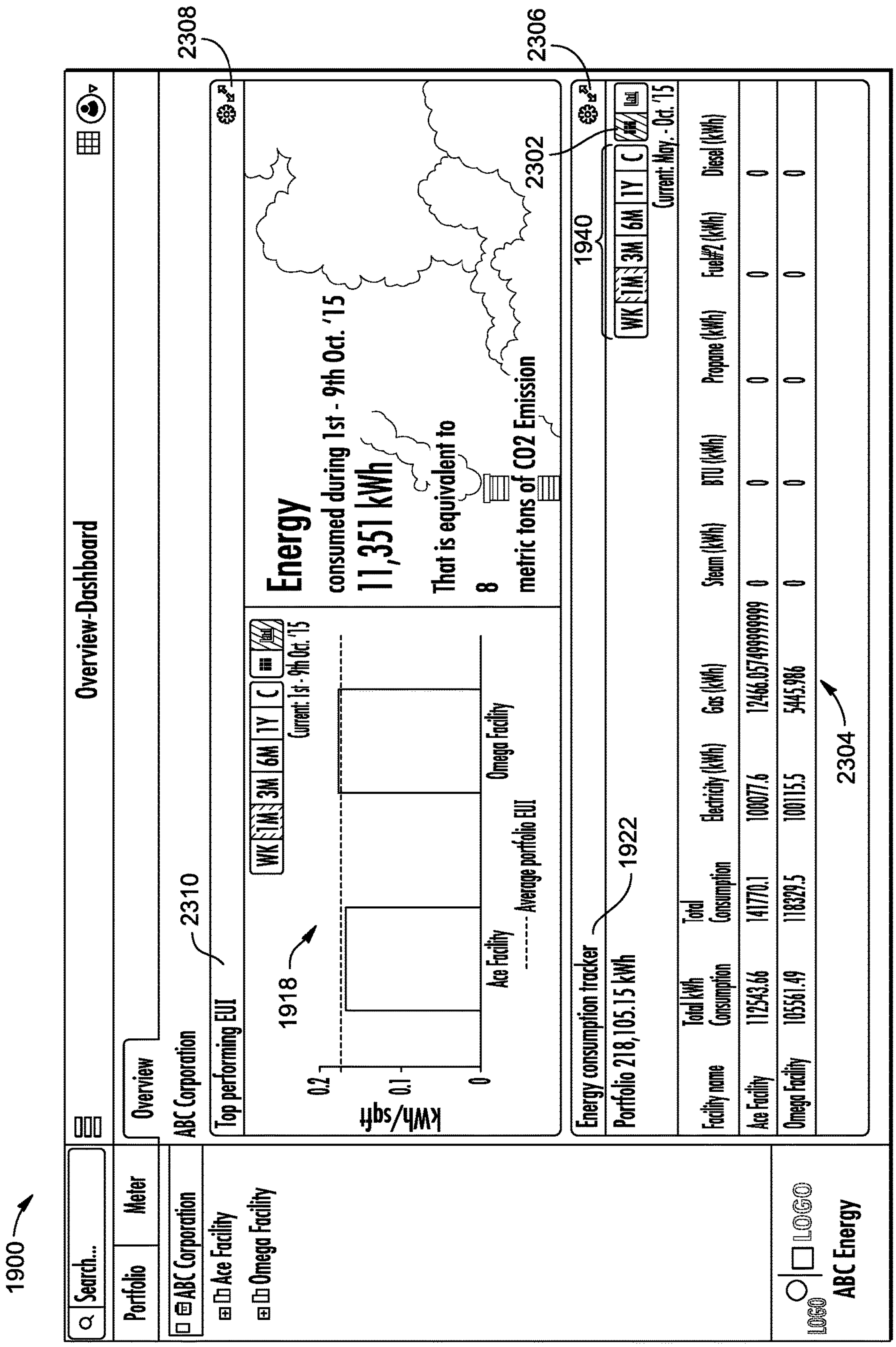

As shown in FIG. 23, selecting grid button 2302 to the right of time interval buttons 1940 may cause energy consumption tracker 1922 to display the energy consumption data 2304 in a grid format. Selecting expand button 2306 in the upper right corner of energy consumption tracker 1922 (i.e., the diagonal arrow) may cause energy consumption tracker 1922 to expand to fill the entire screen. Similarly, expand button 2308 in the upper right corner of EUI panel 2310 may cause EUI chart 1918 to expand to fill the entire screen. This may allow the user to easily see detailed data for a long list of facilities which may not all fit within the compressed widgets (i.e., EUI chart 1918 and energy consumption tracker 1922).

Figure 24:
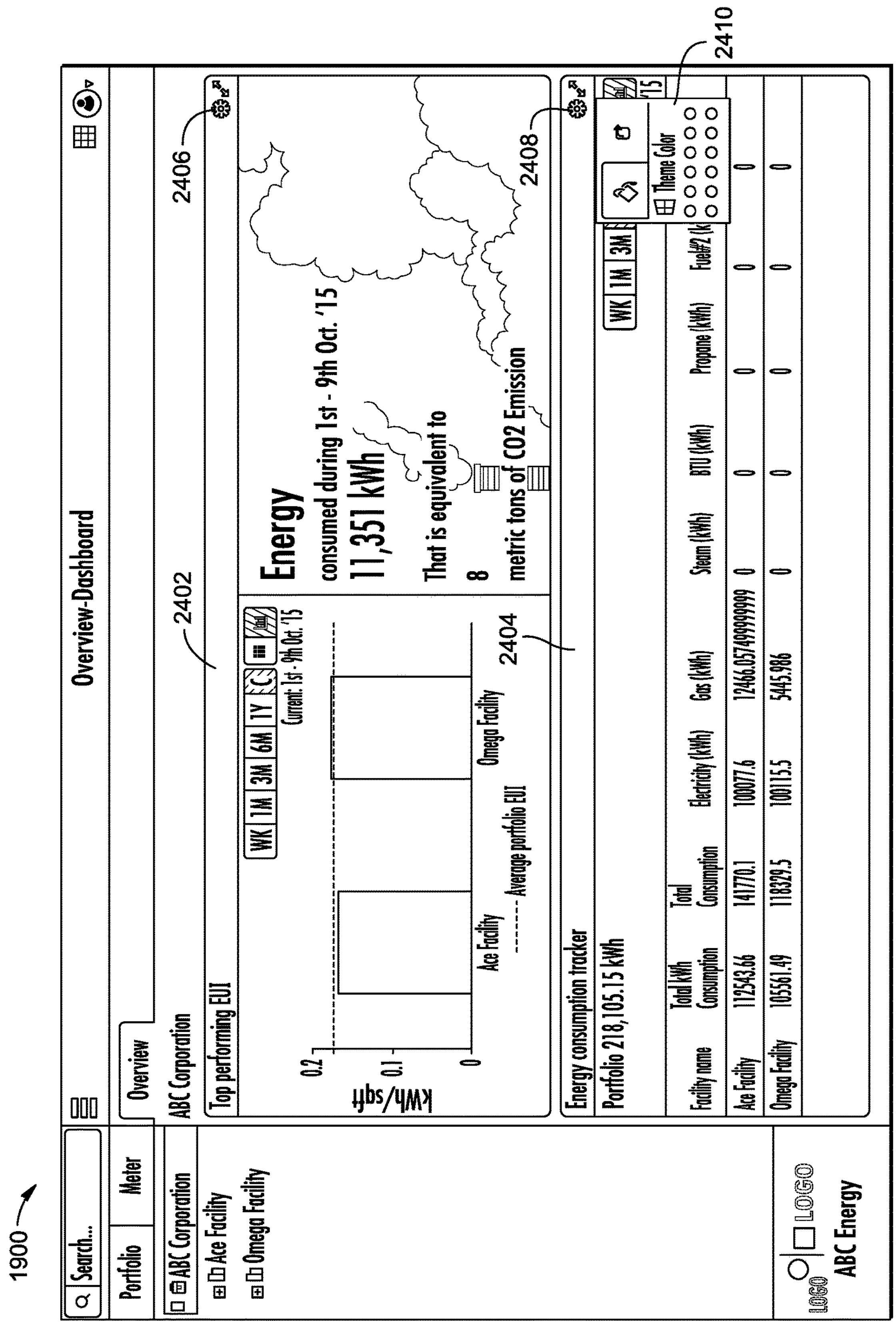
Figure 25:
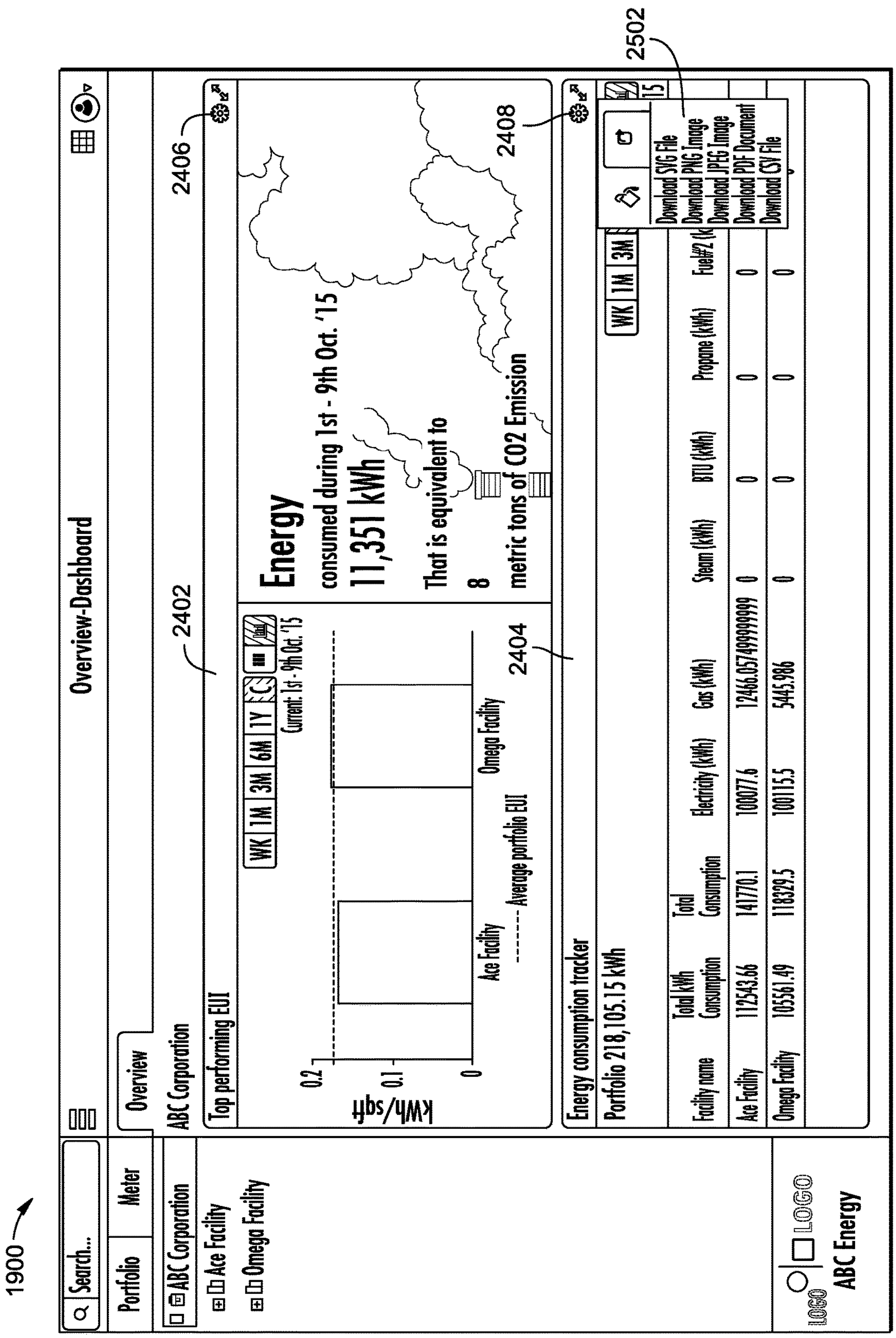

As shown in FIGS. 24-25, each of the widgets 2402 and 2404 shown in dashboard 1900 may include a settings button 2406 and 2408 (shown as a gear icon). Settings buttons 2406 and 2408 may allow the user to select different theme colors 2410 for the corresponding widget (shown in FIG. 24) and screenshot/export the data from the widgets 2402 and 2404 in various formats 2502 such as .svg, .png, .jpeg, .pdf, .csv, etc. (shown in FIG. 25).

Figure 26:
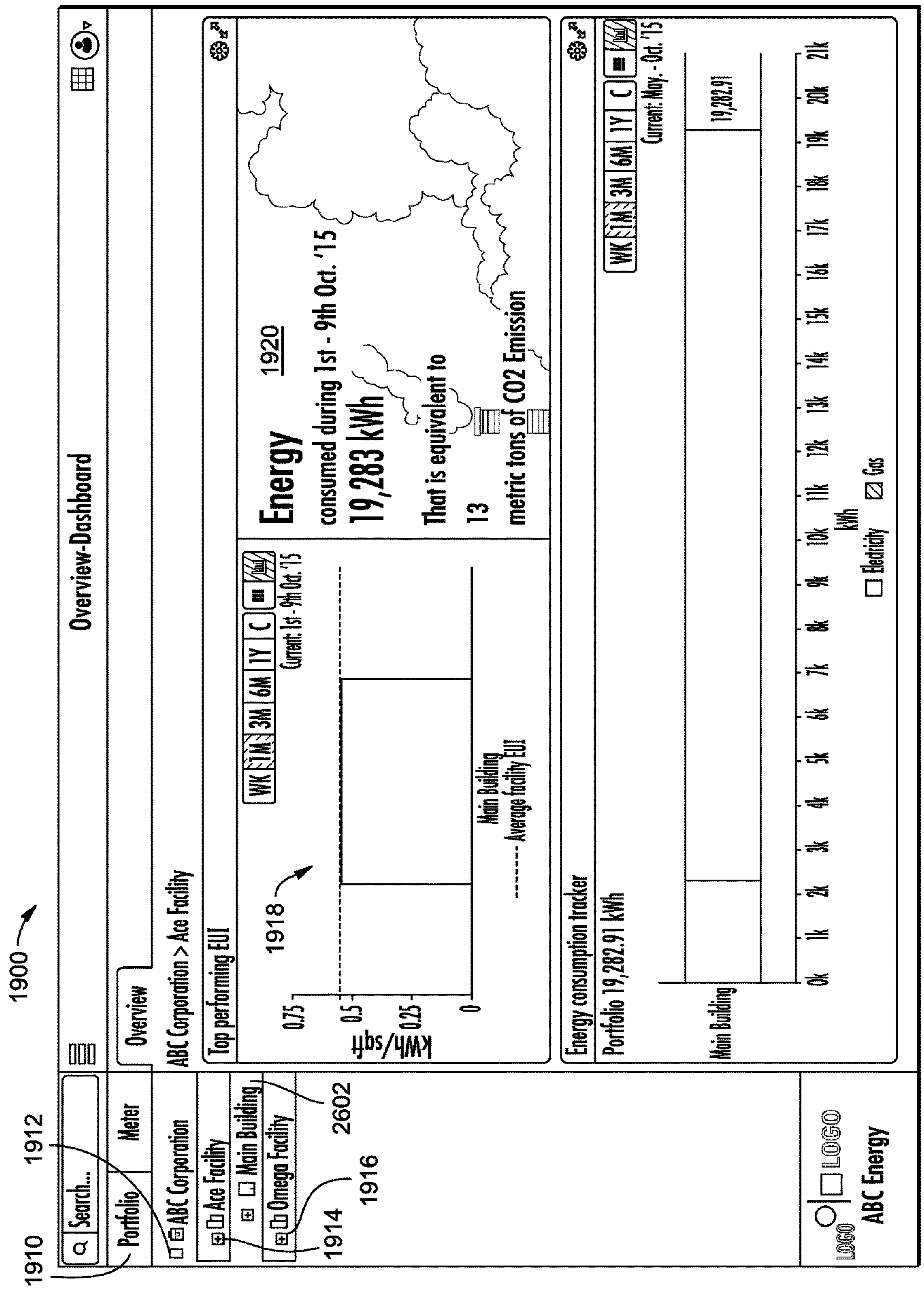

As shown in FIG. 26, selecting a particular facility 1914 or 1916 via portfolio tab 1910 may cause overview dashboard 1900 to display energy-related data for the selected facility 1914 or 1916. The energy-related data for a facility 1914 or 1916 may be similar to the energy-related data for portfolio 1912. However, instead of breaking down the energy-related data by facility, the data may be broken down by individual buildings within the selected facility. For example, Ace Facility 1914 is shown to include a single building 2602 titled "Main Building." When building 2602 is selected, EUI chart 1918 and energy consumption tracker 1922 may display energy consumption data for the selected building 2602. If additional buildings were included in the selected facility 1914, energy-related data for such buildings may also be displayed when the facility 1914 is selected.

Figure 27:
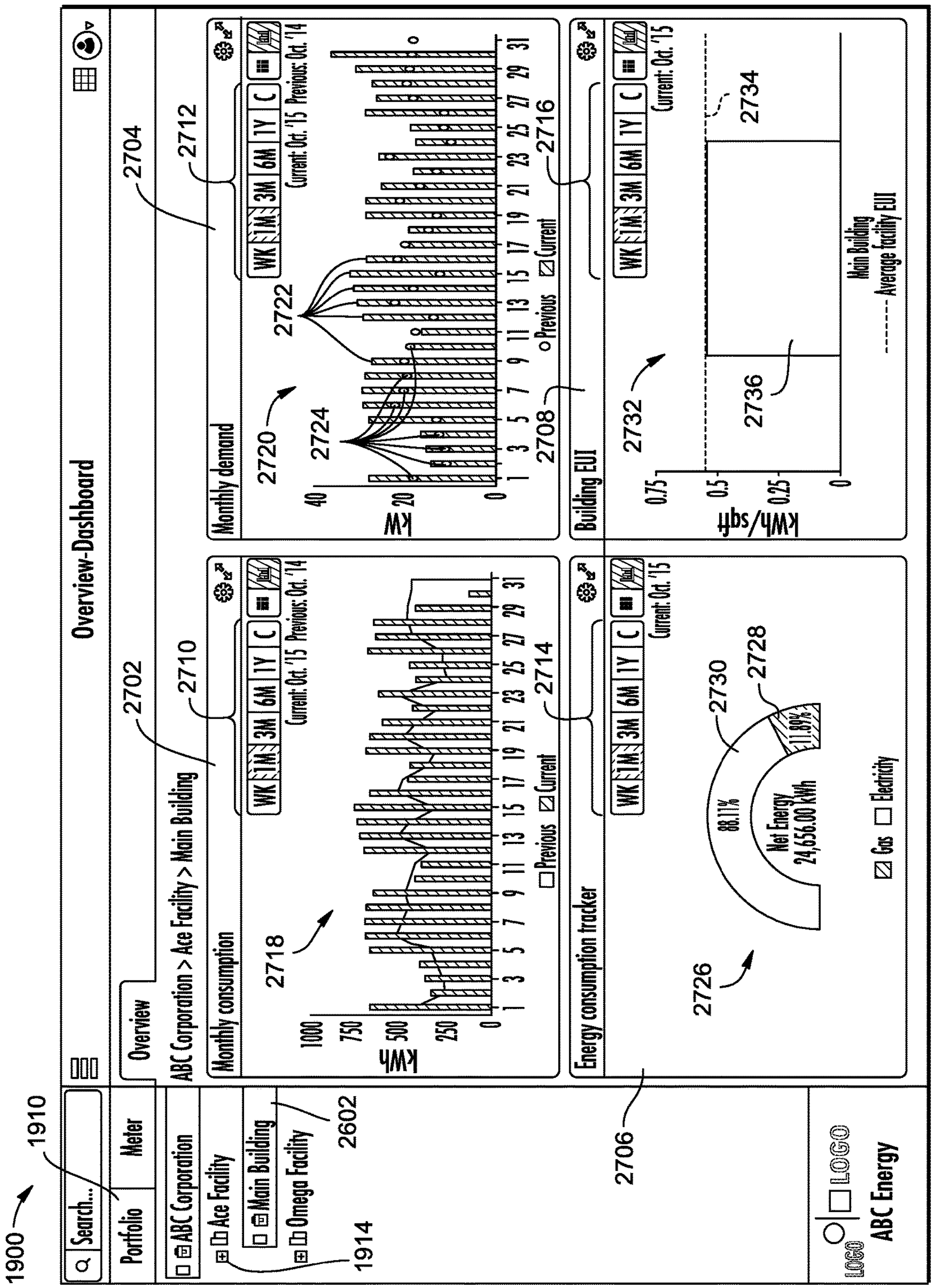

As shown in FIG. 27, selecting a particular building 2602 via portfolio tab 1910 may cause overview dashboard 1900 to display energy-related data for the selected building 2602. Dashboard 1900 is shown to include four widgets including an energy consumption widget 2702, an energy demand widget 2704, an energy consumption tracker widget 2706, and a building EUI widget 2708. Energy consumption widget 2702 may display the energy consumption 2718 of the selected building at various time intervals (e.g., weekly, daily, monthly, etc.). Each widget 2702-2708 may include a time interval selector 2710, 2712, 2714, or 2716 which allows the user to select a particular interval of data displayed in each widget 2702-2708. Like the other time selectors 1926 and 1940, a user can click the buttons within the time interval selectors 2710-2716 to select time intervals of one week, one month, three months, six months, one year, or a custom time interval. In some embodiments, the one month interval is selected by default.

Energy demand widget 2704 may display an energy demand graph 2720 of the selected building at various time intervals. Bars 2722 displayed in energy demand widget 2704 may indicate the current energy demand of the selected building. For example, FIG. 27 shows the energy demand for the building broken down by days, where the energy demand for each day is represented by a bar 2722. In various embodiments, bars 2722 may represent average energy demand or peak energy demand. The dots 2724 displayed in energy demand widget 2704 represent the energy demand for the previous time interval, prior to the time interval displayed in graph 2720. For example, a monthly graph 2720 may display the current energy demand for each day of the month using bars 2722 and the previous energy demand for each day of the previous month using dots 2724. This allows the user to easily compare energy demand for each day of two consecutive months. At other levels of granularity, the energy demand graph 2720 may display yearly energy demand (each bar 2722 corresponding to a particular month), daily energy demand (each bar 2722 corresponding to a particular hour), etc.

Energy consumption tracker widget 2706 may display a chart 2726 that indicates the amount of each commodity (e.g., gas 2728 and electricity 2730) consumed by the selected building 2602. Selecting or hovering over a commodity 2728 or 2730 in chart 2726 may display a pop-up that indicates the amount of the commodity consumed by building 2602 during the user-selected time interval. For example, hovering over the gas bar 2728 may display the amount of gas consumption by building 2602 within the time interval. Gas consumption may be indicated in both units of energy (e.g., kWh) and units of volume (e.g., cubic feet). Energy management application 532 may automatically convert commodity-specific units provided by an energy utility (e.g., cubic feet) to units of energy (e.g., kWh) so that the energy consumption can be directly compared across various commodities. The pop-up may also indicate the percentage of the total energy consumption corresponding to the selected commodity.

Building EUI widget 2708 may include an EUI graph 2732 indicating the building's EUI. Building EUI 2736 may be calculated by dividing the total energy consumption of building 2602 by the size of building 2602 (e.g., square feet). EUI graph 2732 may include an average facility EUI line 2734 which represents the average EUI for the facility 1914 which includes the selected building 2602. Average facility EUI line 2734 may allow a user to easily compare the EUI of the selected building 2602 to the facility average EUI.

Figure 28:
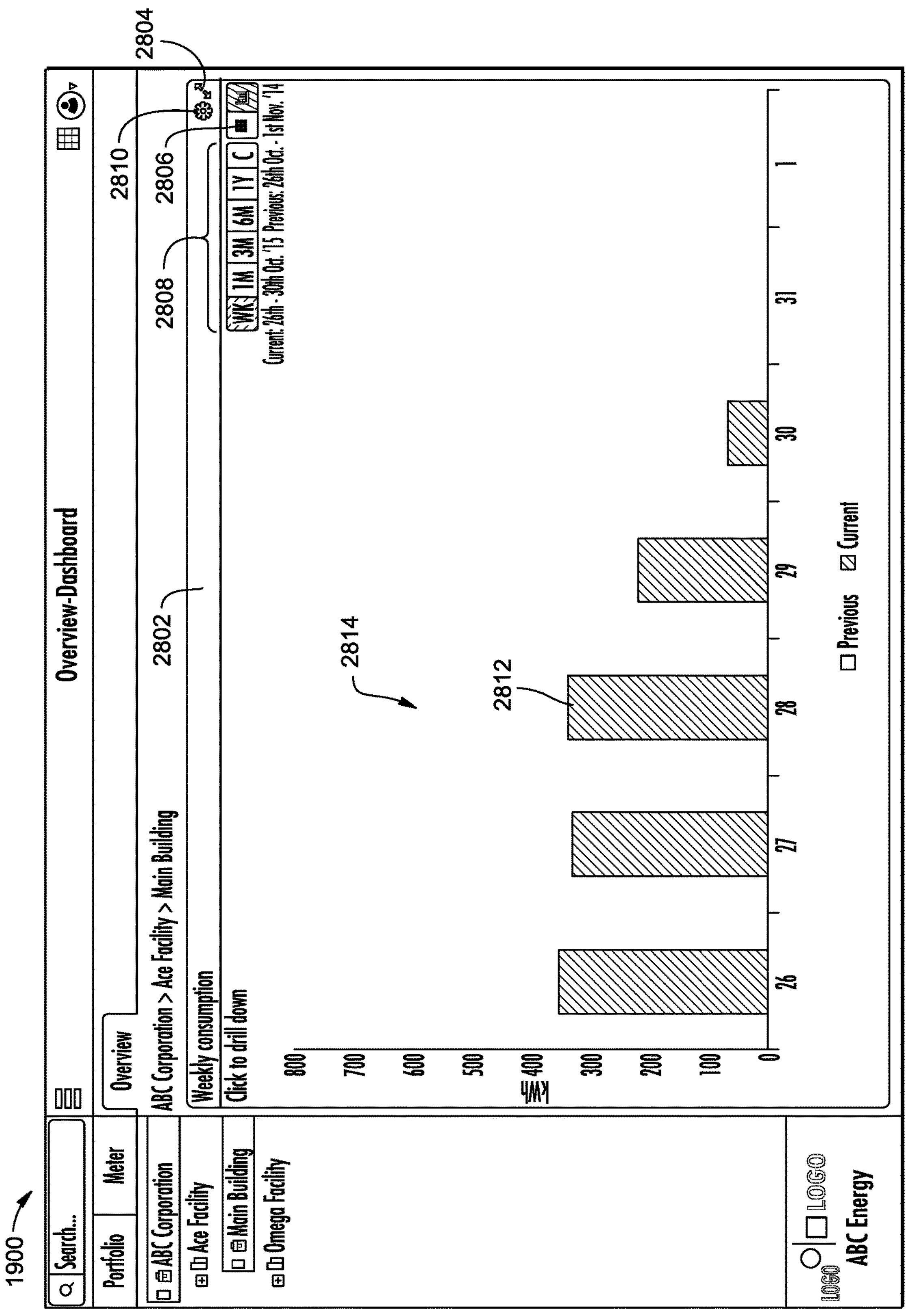

As shown in FIG. 28, each widget 2802 (e.g., any of widgets 2702-2708) can be expanded to fill the entire screen by selecting expand button 2804 in the upper right corner of widget 2802. The data shown in each widget 2802 can be displayed in grid format by selecting grid button 2806 to the right of time interval selector 2808. Each widget 2802 may include a settings button 2810 (shown as a gear icon). Settings button 2810 may allow the user to select different theme colors for the corresponding widget 2802 and screenshot/export the data from widget 2802 in various formats such as .svg, .png, .jpeg, .pdf, .csv, etc., as previously described.

Figure 29:
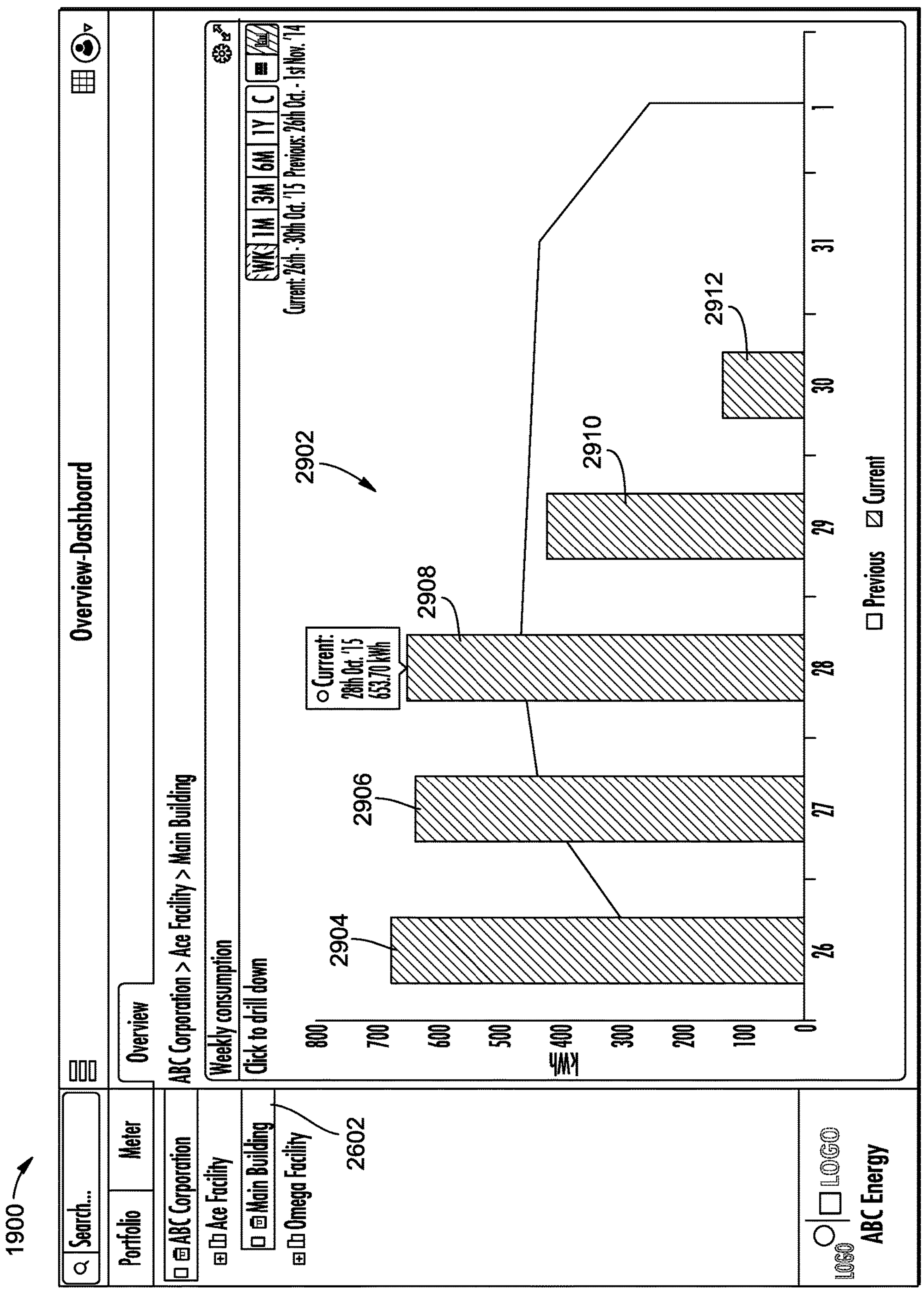
Figure 30:
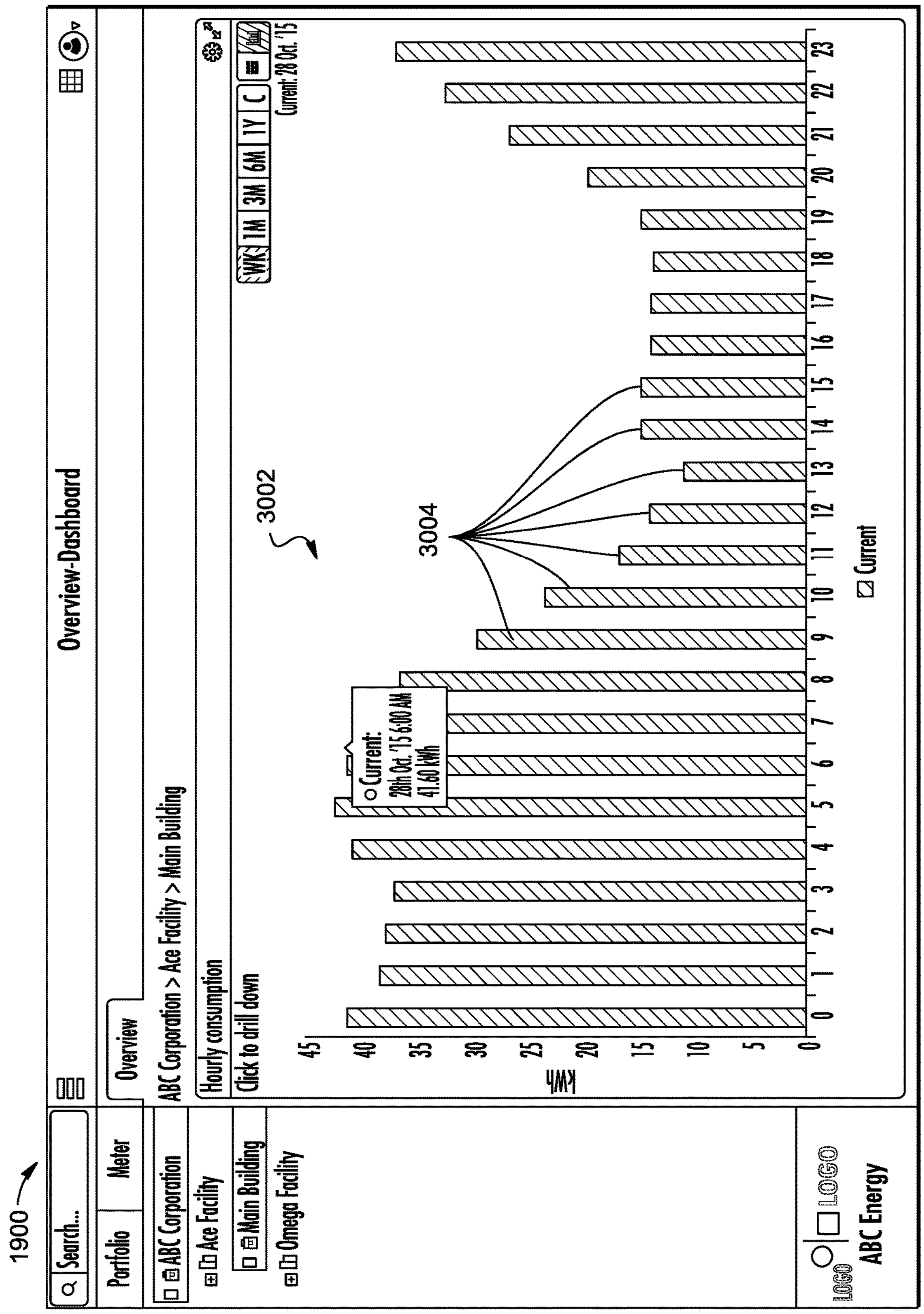
Figure 31:
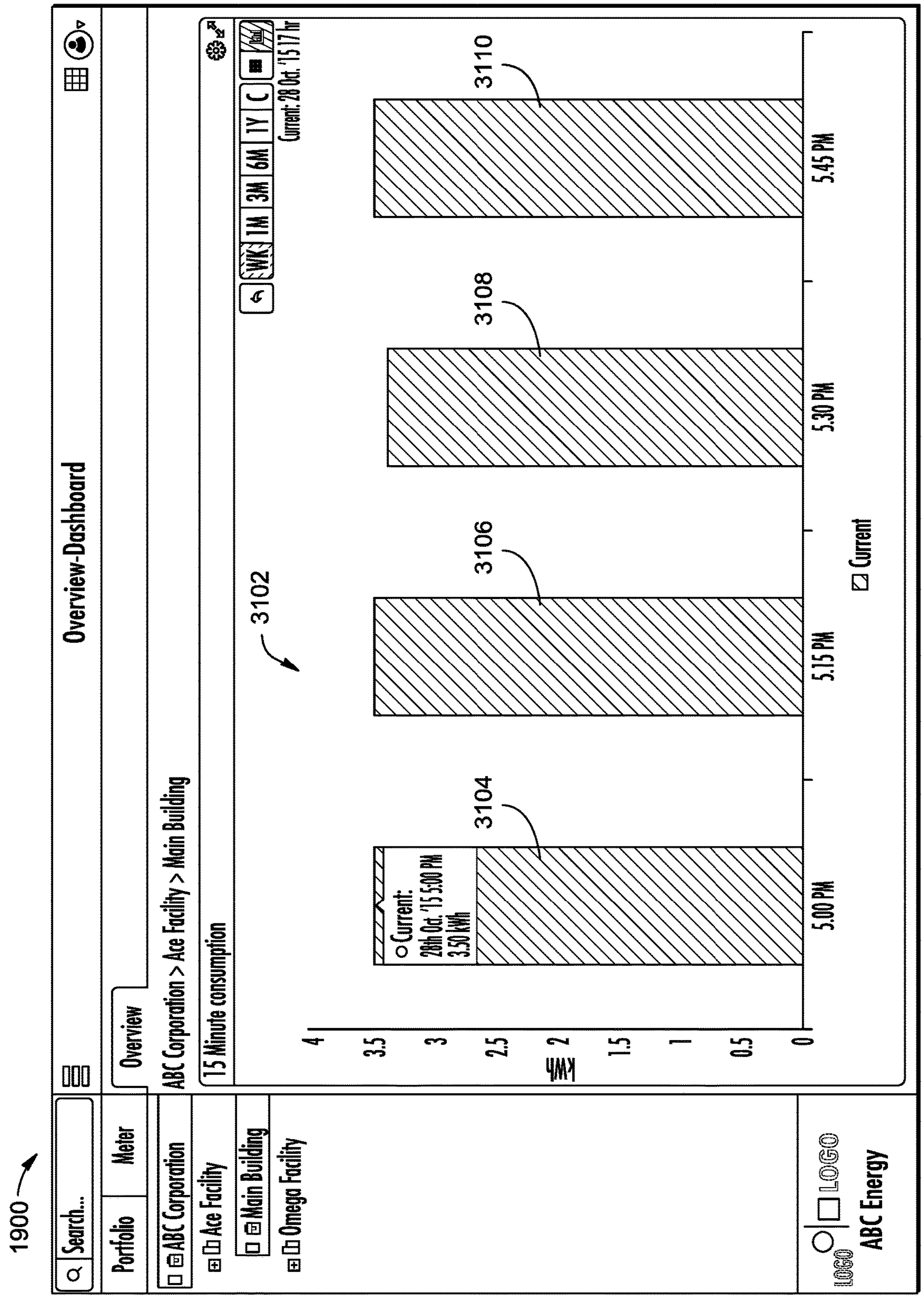

In some embodiments, selecting a bar 2812 or other graphic representing data from a particular time interval causes graph 2814 to display the selected data with an increased level of granularity. For example, FIG. 29 shows a bar chart 2902 indicating the weekly energy consumption of the Main Building 2602 with each bar 2904, 2906, 2908, 2910, and 2912 representing the energy consumption during a particular day. Selecting one of bars 2904-2912 in chart 2902 may cause the energy consumption for the selected day to be broken down by hour within the day (shown in FIG. 30). For example, FIG. 30 shows a bar chart 3002 with a bar 3004 for each hour of the day. Selecting one of bars 3004 in chart 3002 may cause the energy consumption for the selected hour to be broken down even further (e.g., by fifteen minute intervals, by five minute intervals, etc.) within the hour (shown in FIG. 31). For example, FIG. 31 shows a bar chart 3102 with a bar 3104, 3106, 3108, and 3110 for each fifteen minute interval within the selected hour. It is contemplated that the energy consumption data can be displayed at any level of granularity and that the user can transition between the different levels of granularity by clicking bars 2904-2912, 3004, and/or 3104-3110 within charts 2902, 3002, and 3102.

Figure 32:
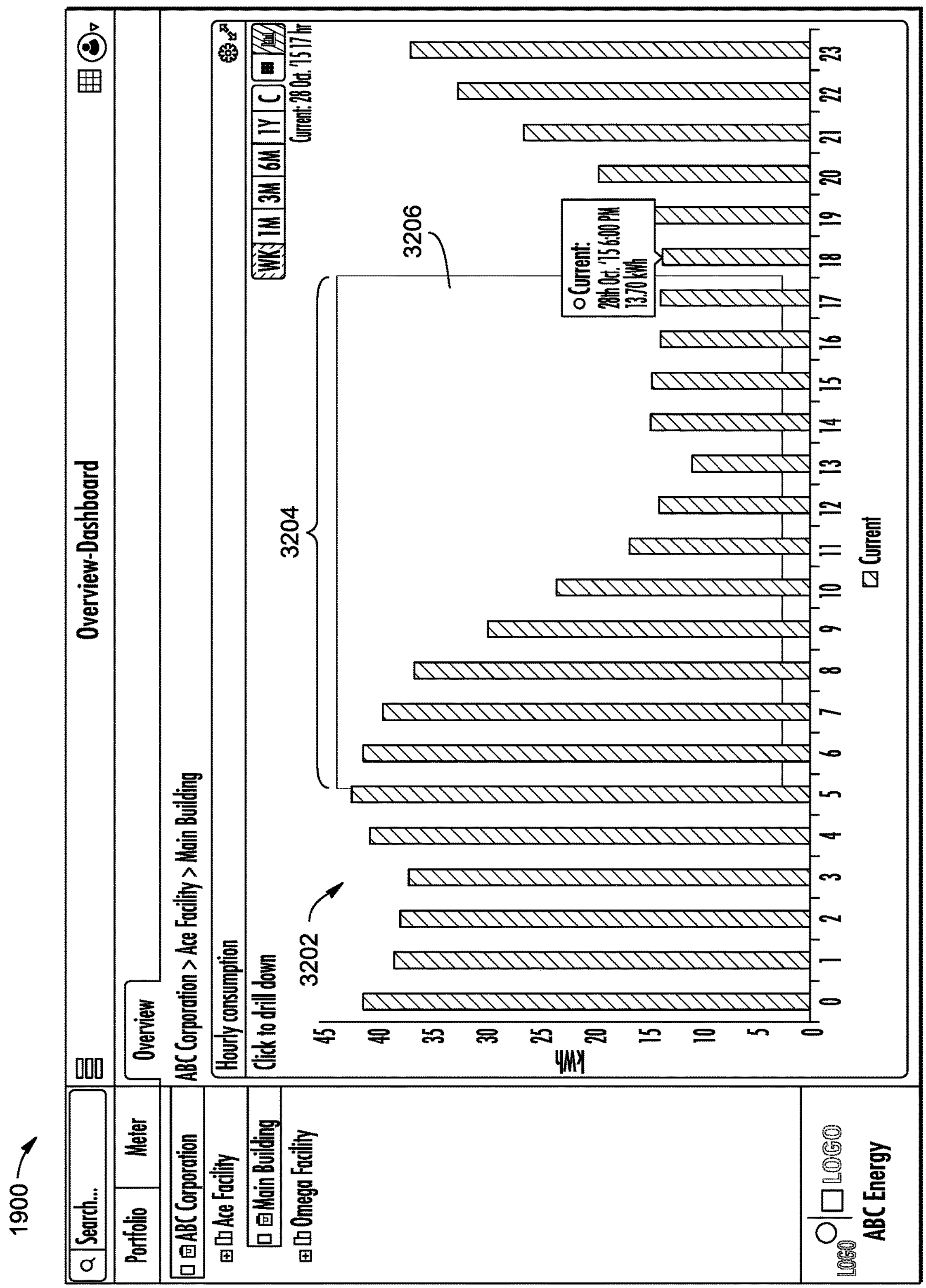
Figure 33:
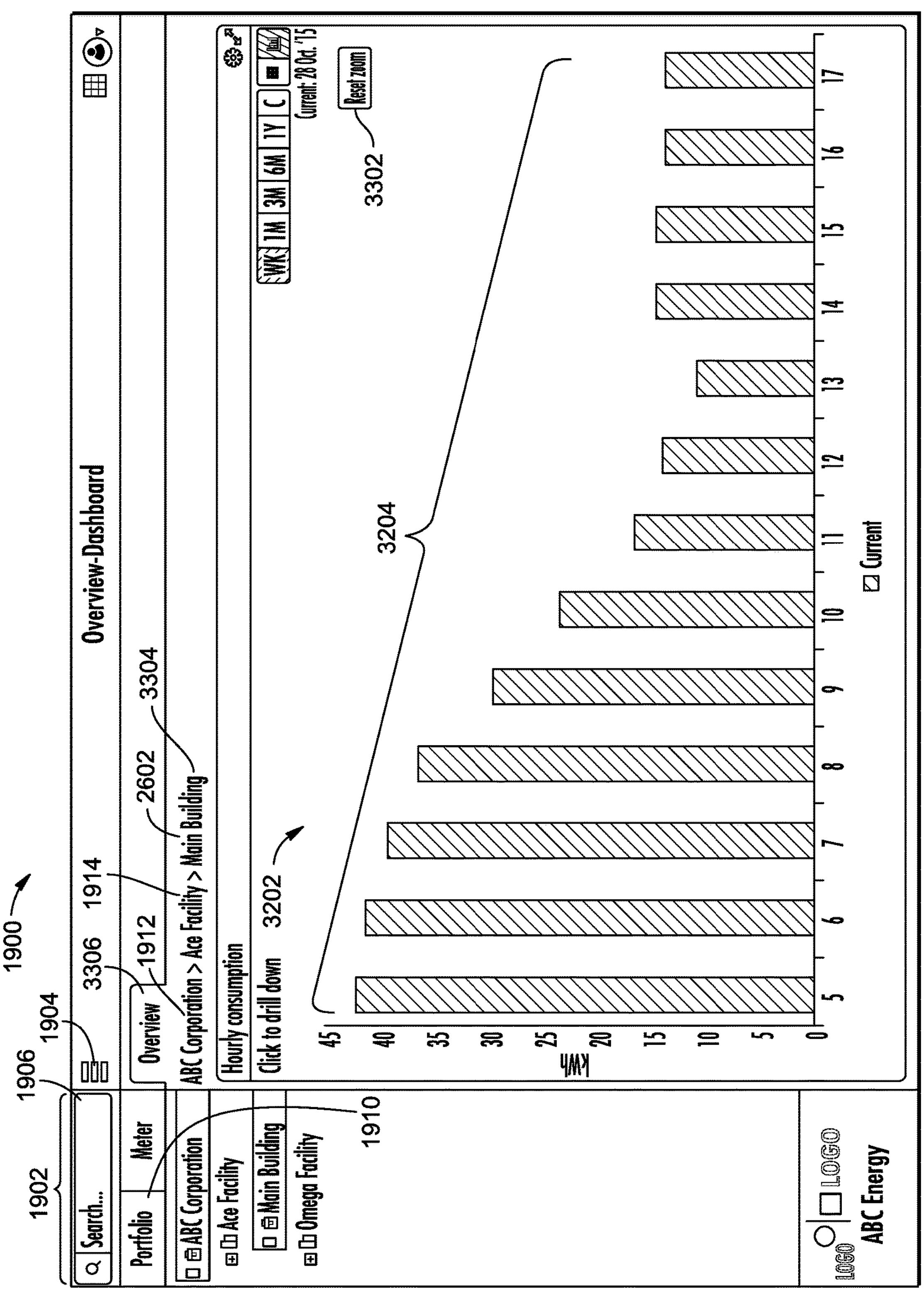

As shown in FIGS. 32-33, a user can select specific ranges of data within each chart 3202 to zoom in on the selected range 3204 of data. For example, suppose a user wants to zoom in on the data from October $5^{th}$ to October $28^{th}$. The user can click within a chart 3202 and drag the mouse cursor to draw a box 3206 around the desired range 3204 of data (shown in FIG. 32). Once the desired range 3204 of data is selected, chart 3202 may be automatically updated to display only the user-selected range 3204 of data (shown in FIG. 33). Selecting the reset zoom button 3302 may cause chart 3202 to return to the previous view.

In some embodiments, overview dashboard 1900 is configured to allow a user to navigate portfolio 1910 of buildings without requiring use of the navigation pane 1902. For example, navigation pane 1902 can be collapsed (i.e., hidden) by clicking handle bar 1904 to the right of search box 1906. When navigation pane 1902 is hidden, the user can click an item in hierarchical string 3304 at the top of overview tab 3306 (i.e., the string "ABC Corporation>Ace Facility>Main Building" shown in FIG. 33) to select the corresponding enterprise, facility, or building. Hierarchical string 3304 may be updated to show the lowest level of the hierarchy currently selected and any higher levels of the hierarchy that contain the selected lower level. For example, when Main Building 2602 is selected, hierarchical string 3304 may include the full string "ABC Corporation>Ace Facility>Main Building." However, if Ace Facility 1914 is selected, hierarchical string 3304 may be updated to show only "ABC Corporation>Ace Facility."

Figure 34:
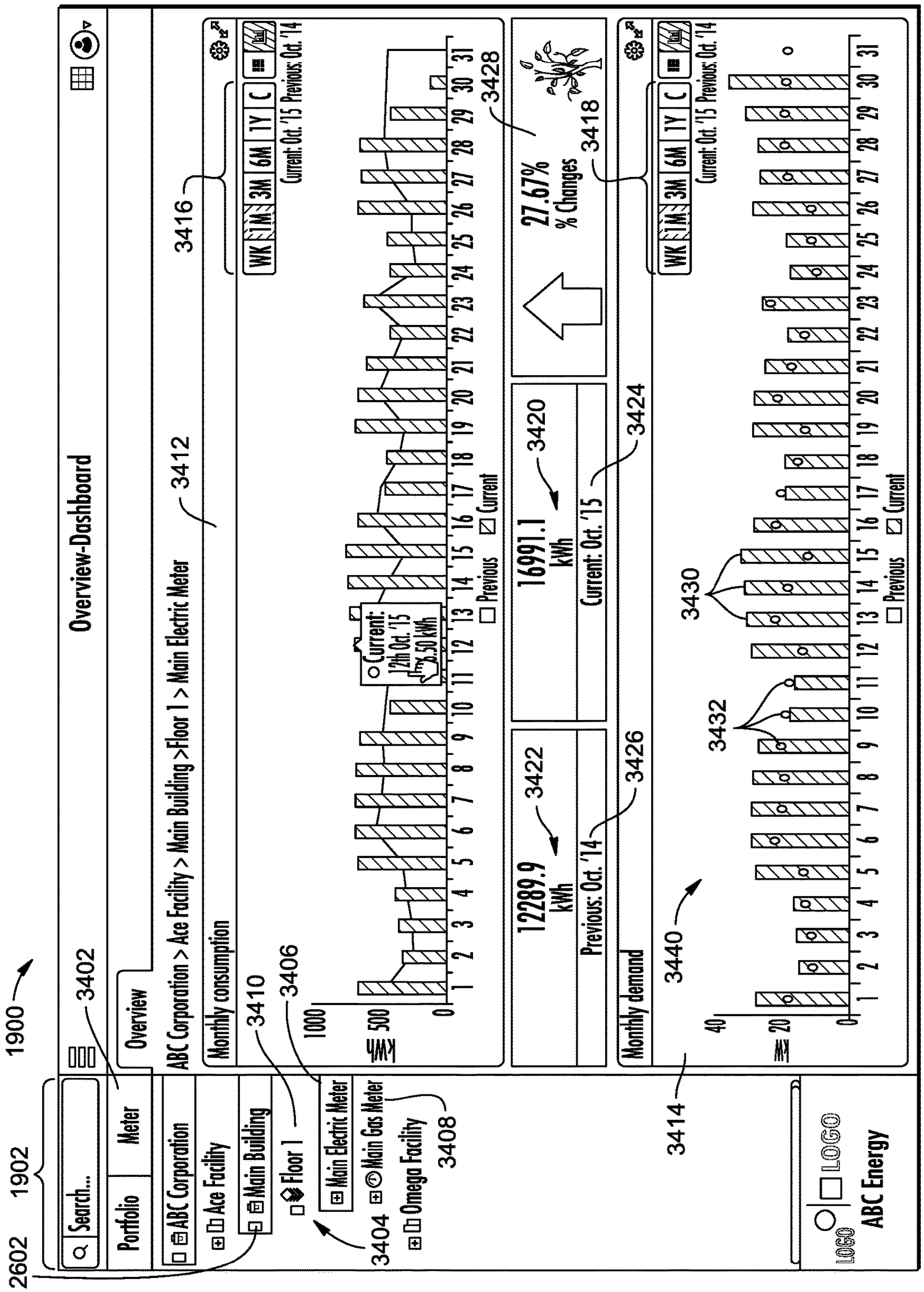

As shown in FIG. 34, navigation pane 1902 includes a meter tab 3402. When meter tab 3402 is selected, a user can expand the hierarchy 3404 shown in navigation pane 1902 to show various energy meters 3406 and 3408 located within each of the buildings. For example, the Main Building 2602 is shown to include a floor 3410 (i.e., Floor 1) which includes a "Main Electric Meter" 3406 and a "Main Gas Meter" 3408. Selecting any of the meters 3406-3408 in meter tab 3402 may cause overview dashboard 1900 to display detailed meter data for the selected meter.

The meter data is shown to include energy consumption data which may be displayed in an energy consumption widget 3412, and energy demand data which may be displayed in an energy demand widget 3414. Each widget 3412-3414 may include a time interval selector 3416 or 3418 which allows the user to select a particular interval of data displayed in each widget 3412-3414. Like the other time selectors 1926, 1940, and 2710-2716, a user can click the buttons within time interval selectors 3414-3416 to select time intervals of one week, one month, three months, six months, one year, or a custom time interval. In some embodiments, the one month interval is selected by default.

Energy consumption widget 3412 may display the energy consumption measured by the selected meter 3406 at various time intervals (e.g., weekly, daily, monthly, etc.). Energy consumption widget 3412 is shown to include a total current energy consumption 3420 for the selected time interval 3424 and the previous total energy consumption 3422 for a previous time interval 3426. In some embodiments, the previous time interval 3426 is the same month (or any other duration selected via time interval selector 3416) from a previous year (or any other time interval longer than the selected time interval). For example, the current time interval 3424 is shown as October 2015, and the previous time interval 3426 is shown as October 2014. By comparing the energy consumption during the same months of different years, changes in energy consumption due to weather differences can be reduced so that the comparison is more meaningful. Energy consumption widget 3412 may display an amount 3428 by which the energy consumption has increased or decreased (e.g., a percent change) from the previous time interval 3426 to the current time interval 3424.

Energy demand widget 3414 may display the energy demand measured by the selected meter 3406 at various time intervals. Energy demand widget 3414 is shown to include a graph 3440. The bars 3430 displayed in graph 3440 may indicate the current energy demand measured by the selected meter 3406. For example, FIG. 34 shows the energy demand for building 2602 broken down by days, where the energy demand for each day is represented by a bar 3430 in graph 3440. In various embodiments, bars 3430 may represent average energy demand or peak energy demand. Dots 3432 displayed in graph 3440 represent the energy demand for the corresponding time period of the previous time interval, prior to the time interval displayed in graph 3440. For example, a monthly graph 3440 may display the current energy demand for each day of the month using bars 3430 and the previous energy demand for each day of the previous month using dots 3432. This allows the user to easily compare energy demand for each day of two consecutive months. At other levels of granularity, energy demand graph 3440 may display yearly energy demand (each bar 3430 and dot 3432 corresponding to a particular month), daily energy demand (each bar 3430 and dot 3432 corresponding to a particular hour), etc.

Figure 35:
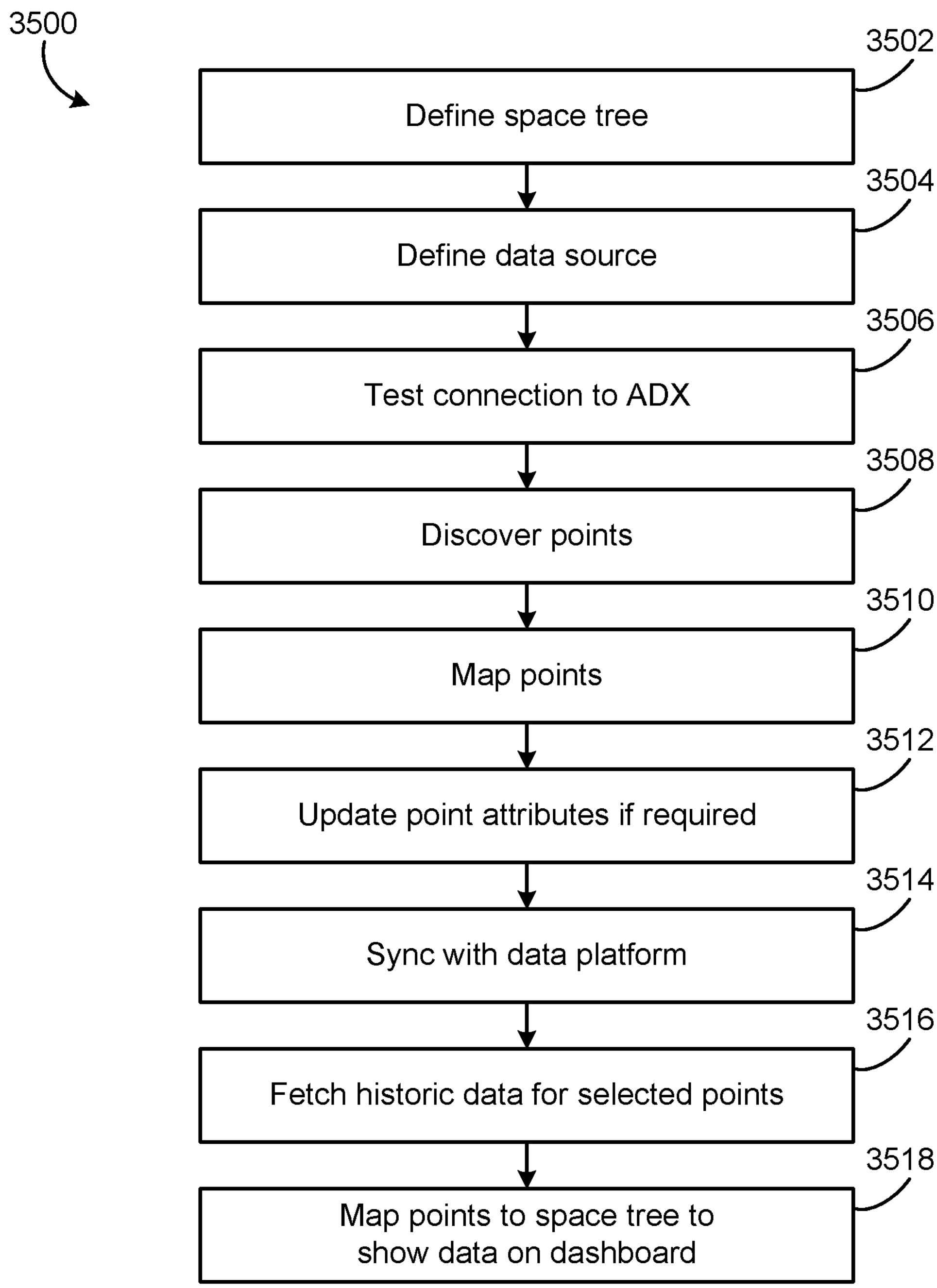
FIG. 35 is a flowchart of a process for configuring an energy management application, according to some embodiments.
Figure 36:
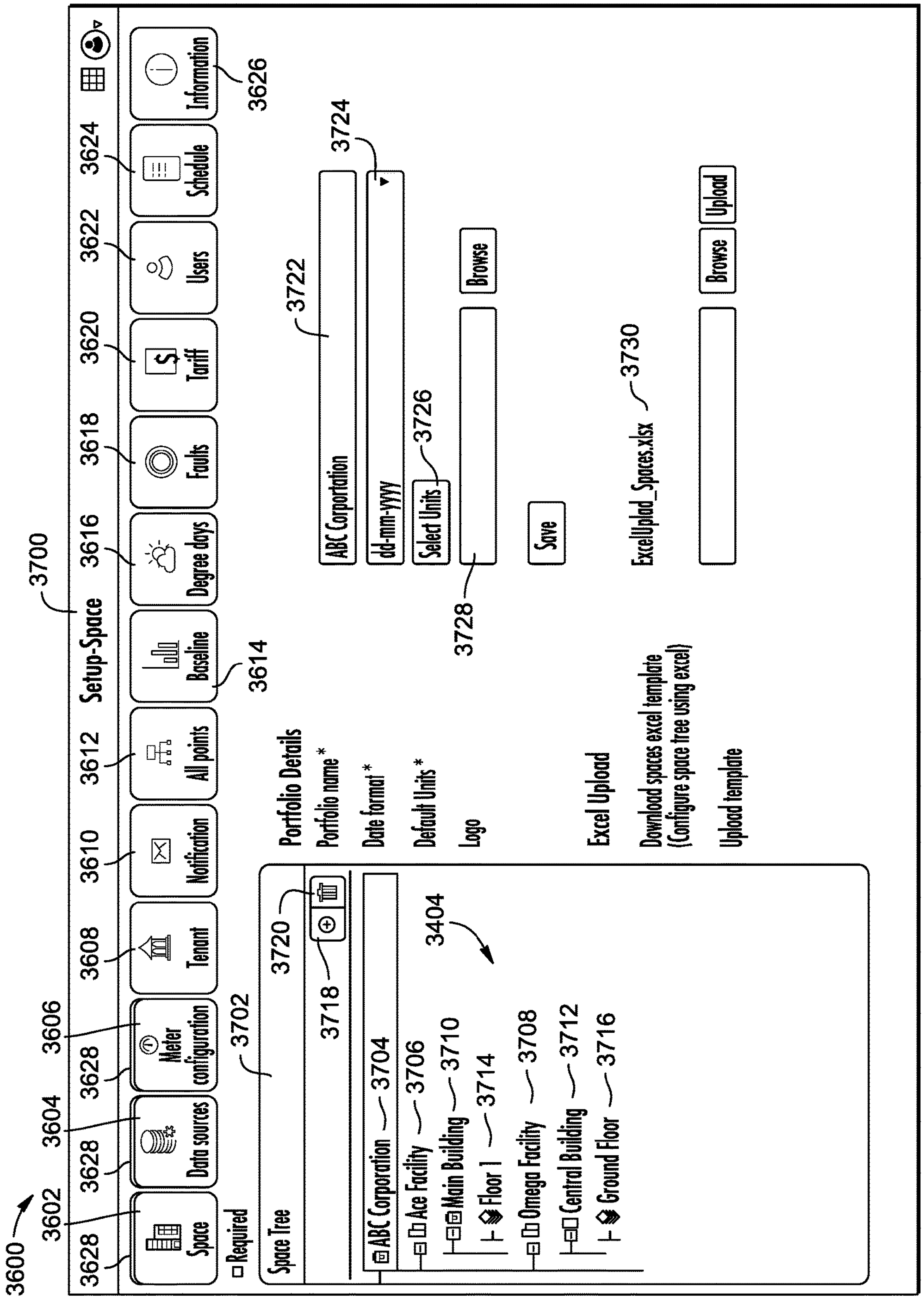
FIGS. 36-39 are drawings of an interface for configuring spaces, which may be generated by the BMS of FIG. 5, according to some embodiments.
Figure 37:
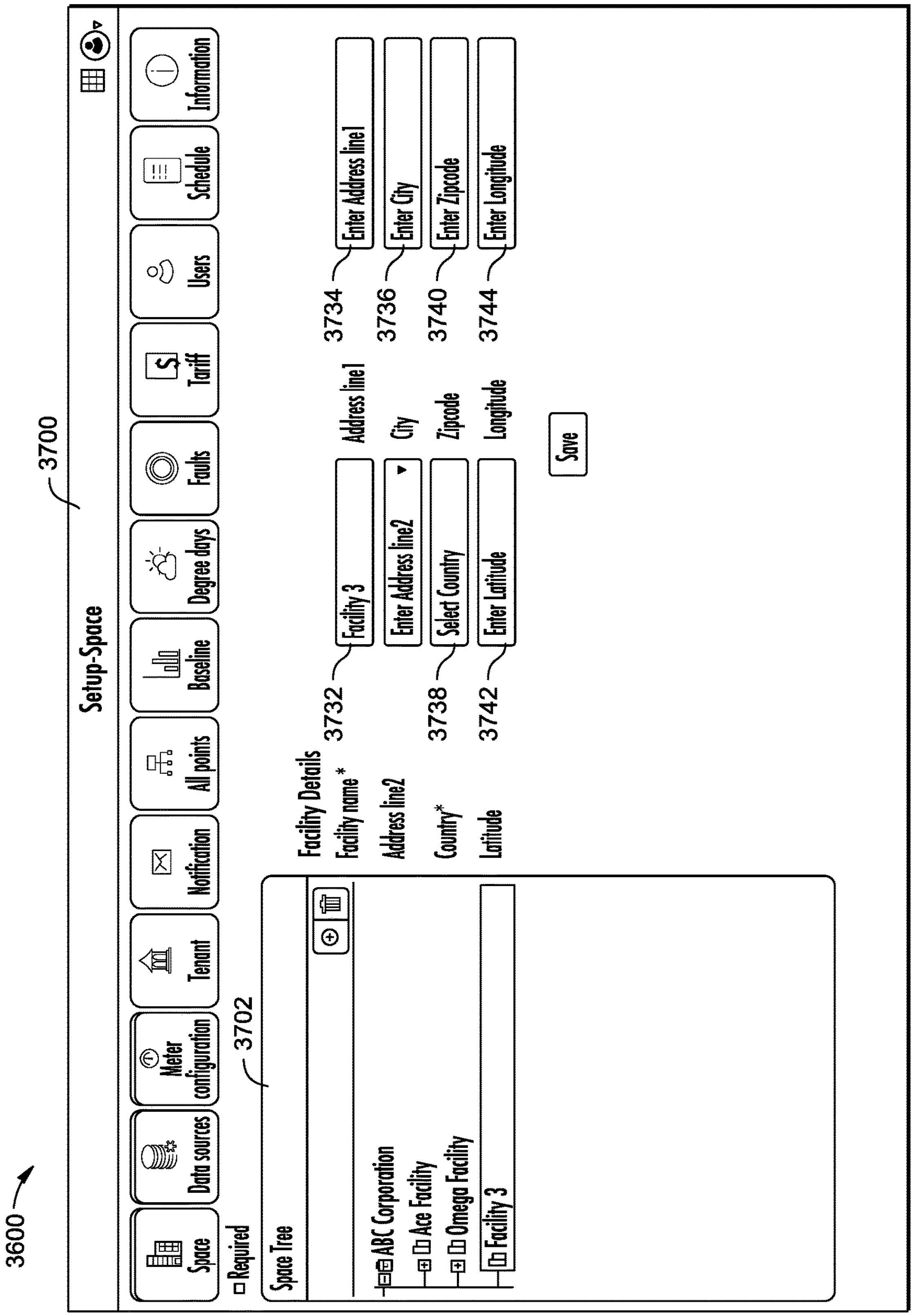
Figure 38:
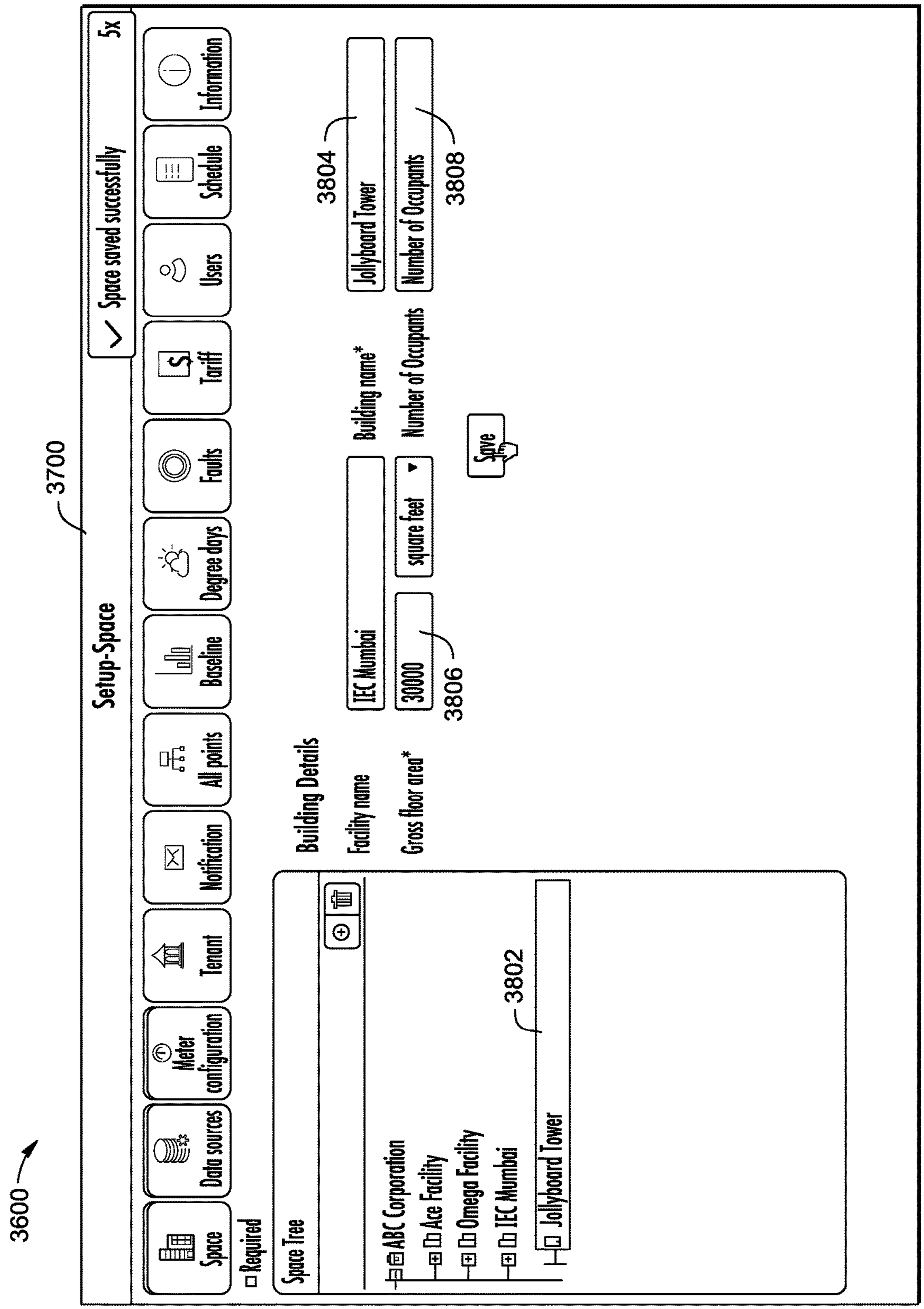
Figure 39:
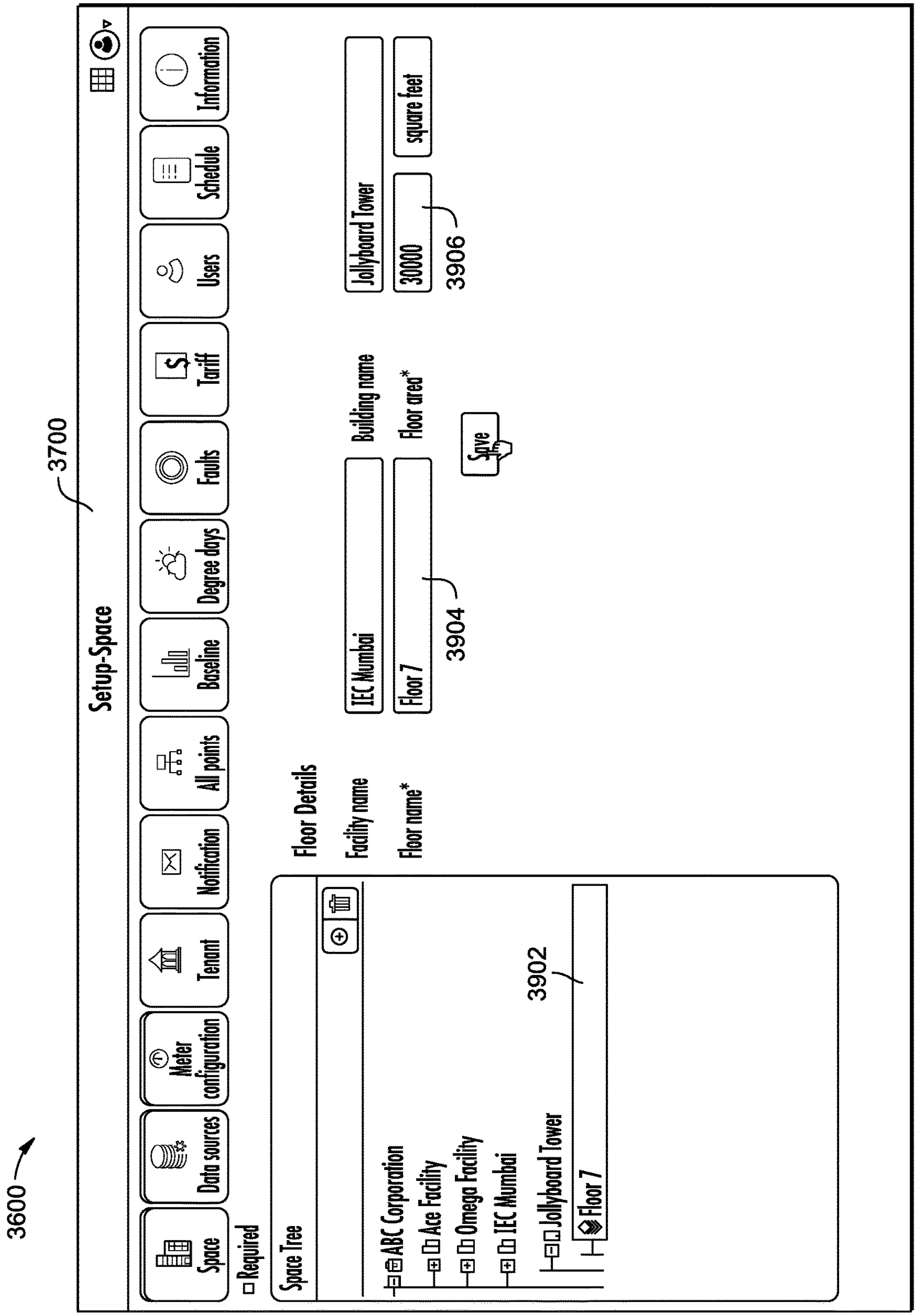

Referring now to FIG. 35 a flowchart of a process 3500 for configuring energy management application 532 is shown, according to an exemplary embodiment. Process 3500 is shown to include defining a space tree (step 3502), defining a data source (step 3504), testing a connection to the ADX (step 3506), discovering data points (step 3508), mapping data points (step 3510), updating point attributes if required (step 3512), syncing with the data platform (step 3514), fetching historic data for the selected data points (step 3516), and mapping points to a space tree to show the data on the dashboard (step 3518).

Setup Interface

Referring now to FIGS. 36-49, a setup interface 3600 which may be generated by energy management application 532 is shown, according to an exemplary embodiment. In some embodiments, setup interface 3600 is displayed in response to a user selecting settings button 2004 in overview dashboard 1900 (shown in FIG. 20). Setup interface 3600 is shown to include various tiles 3602-3626 which correspond to different types of configurable settings. For example, setup interface is shown to include a spaces tile 3602, a data sources tile 3604, a meter configuration tile 3606, a tenant tile 3608, a notification tile 3610, a points tile 3612, a baseline tile 3614, a degree days tile 3616, a faults tile 3618, a tariff tile 3620, a users tile 3622, a schedule tile 3624, and an information tile 3626. Tiles 3602-3626 may be highlighted, marked, colored, or otherwise altered to indicate that the corresponding settings require configuration before overview dashboard 1900 will display meaningful data. For example, spaces tile 3602, data sources tile 3604, and meter configuration tile 3606 are shown with markings 3628 in FIG. 26 to indicate that further configuration of the spaces, data sources, and meters used by energy management application 532 is required.

As shown in FIGS. 36-39, selecting spaces tile 3602 may display a space setup interface 3700. Space setup interface 3700 is shown to include a space tree 3702. Space tree 3702 may include the hierarchy 3404 of spaces shown in navigation pane 1902 of dashboard 1900. Spaces may include, for example, portfolios 3704, facilities 3706-3708, buildings 3710-3712, floors 3714-3716, zones, rooms, or other types of spaces at any level of granularity. A user can add spaces to space tree 3702 by selecting the plus button 3718 or remove spaces from space tree 3702 by selecting the trash button 3720. Spaces can also be added by uploading a data file 3730 (e.g., an Excel file) which defines space tree 3702.

Details of the selected space can be specified via space setup interface 3700. For example, selecting portfolio 3704 "ABC Corporation" may allow a user to enter details of portfolio 3704 such as portfolio name 3722, a date format 3724, default units 3726, and a logo 3728 (shown in FIG. 36). Selecting a facility 3706-3708 may allow a user to enter details of the facility such as the facility name 3732, address 3734, city 3736, state, country 3738, zip code 3740, latitude 3742, and longitude 3744 (shown in FIG. 37). Selecting a building 3802 may allow a user to enter details of building 3802 such as the building name 3804, the gross floor area 3806, and the number of occupants 3808 (shown in FIG. 38). Floor area 3806 may be used by energy management application 532 to calculate EUI, as previously described. Selecting a floor 3902 may allow a user to enter details of the floor 3902 such as the floor name 3904 and the floor area 3906 (shown in FIG. 39).

Figure 40:
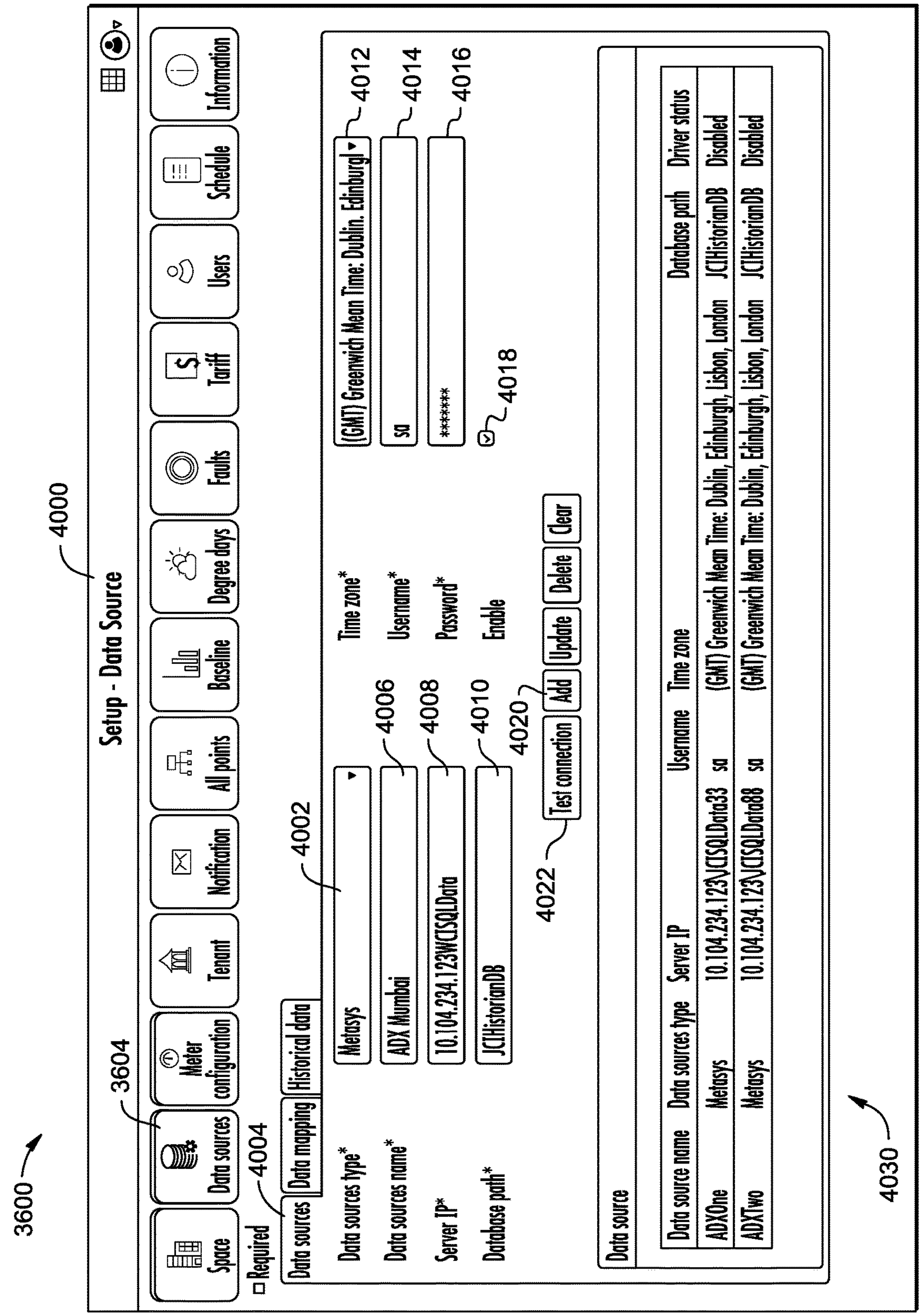
FIGS. 40-45 are drawings of an interface for configuring data sources, which may be generated by the BMS of FIG. 5, according to some embodiments.

As shown in FIG. 40, selecting data sources tile 3604 may display a data sources setup interface 4000. Data sources setup interface 4000 may be used to define various data sources 4004 used by energy management application 532. For example, a user can define a new data source by selecting a data source type (e.g., BACnet, CSV, FX, METASYS, etc.) via data source type dropdown 4002. Other attributes of the data source can also be specified via data sources setup interface 4000. Such attributes may include, for example, the data source name 4006, server IP 4008, database path 4010, time zone 4012, username 4014, and password 4016. Selecting enable box 4018 may enable the data source. Selecting add button 4020 may add the data source to the list of data sources shown in chart 4030 at the bottom of interface 4000. After a data source has been added, selecting test connection button 4022 may test whether the data source is online and properly configured.

Figure 41:
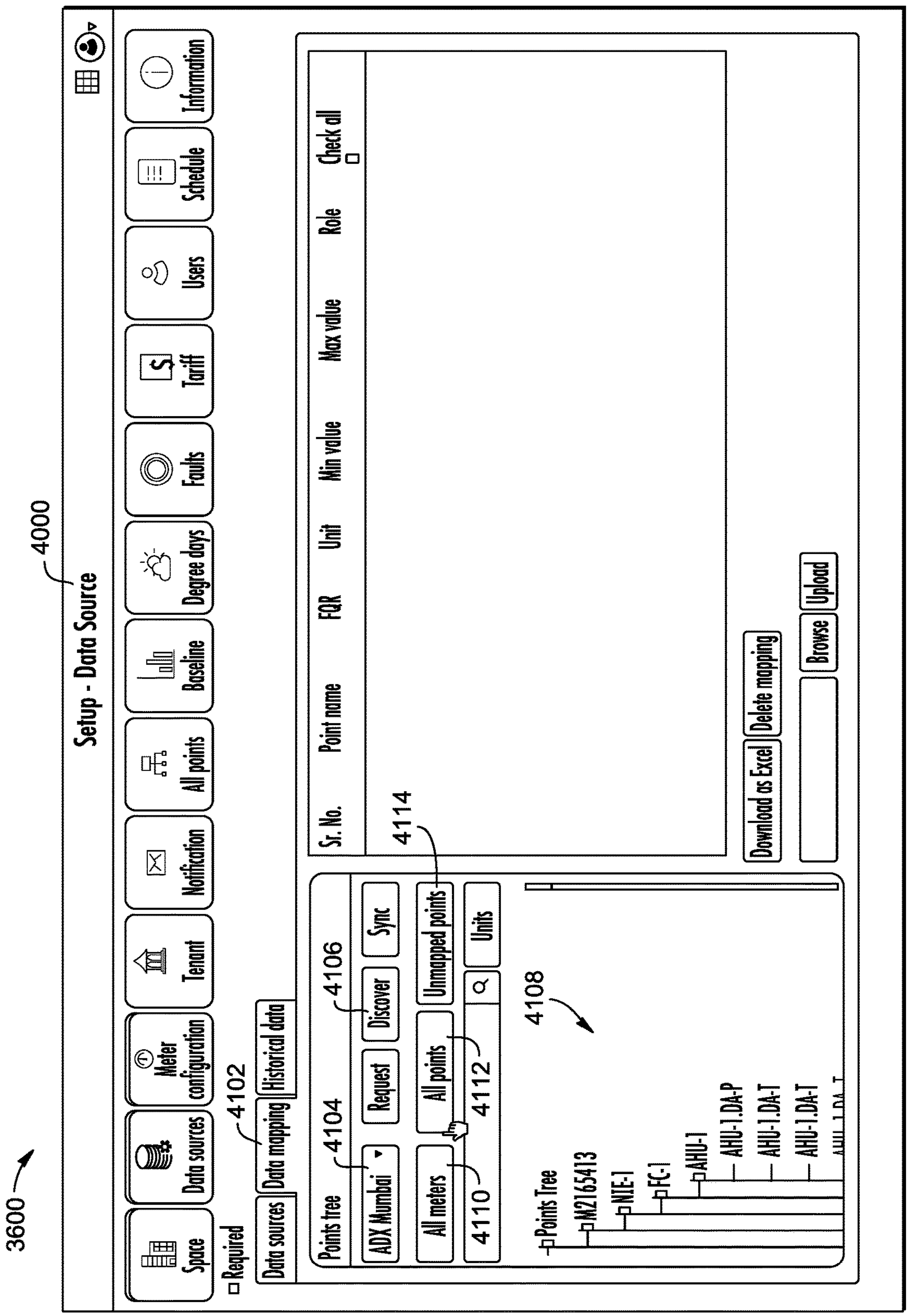

As shown in FIG. 41, data sources setup interface 4000 may include a data mapping tab 4102. Dropdown selector 4104 allows a user to select a particular data source (e.g., "ADX Mumbai"). After selecting a data source, a user can click discover button 4106 to populate points tree 4108 for the data source. Populating points tree 4108 may be performed automatically by energy management application 532. For example, energy management application 532 may send a command to the ADX to fetch the data points in response to a user clicking discover button 4106. The "All meters" button 4110, "All points" button 4112, and "Unmapped points" button 4114 may be used to filter the points by type, mapping status, and/or other attributes. Each button 4110-4114 can be toggled on/off to define a variety of different filters. For example, all meters button 4110 and unmapped points button 4114 can both be selected to view only unmapped meters. Similarly, all points button 4112 and unmapped points button 4114 can be selected to view all unmapped points.

Figure 42:
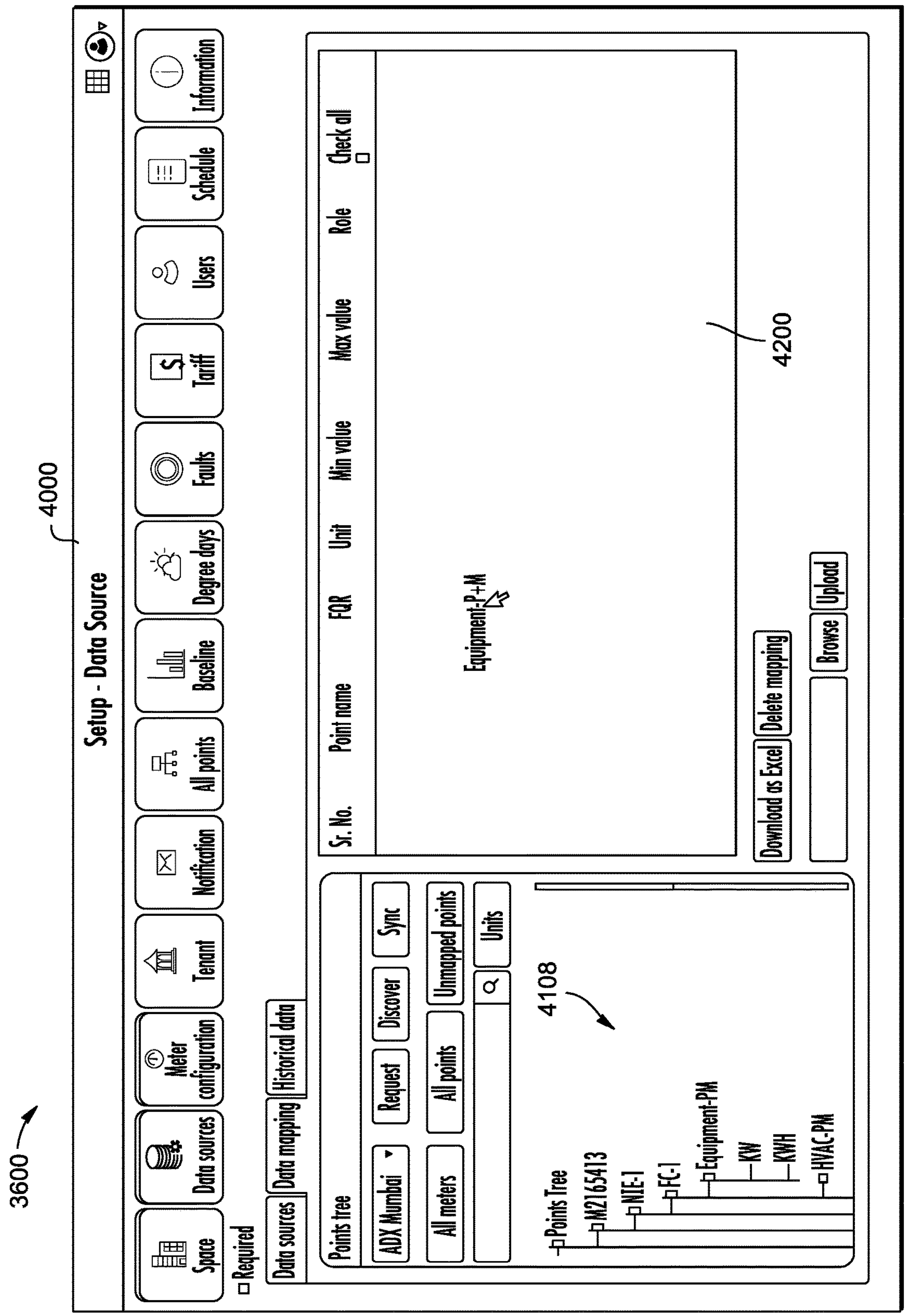
Figure 43:
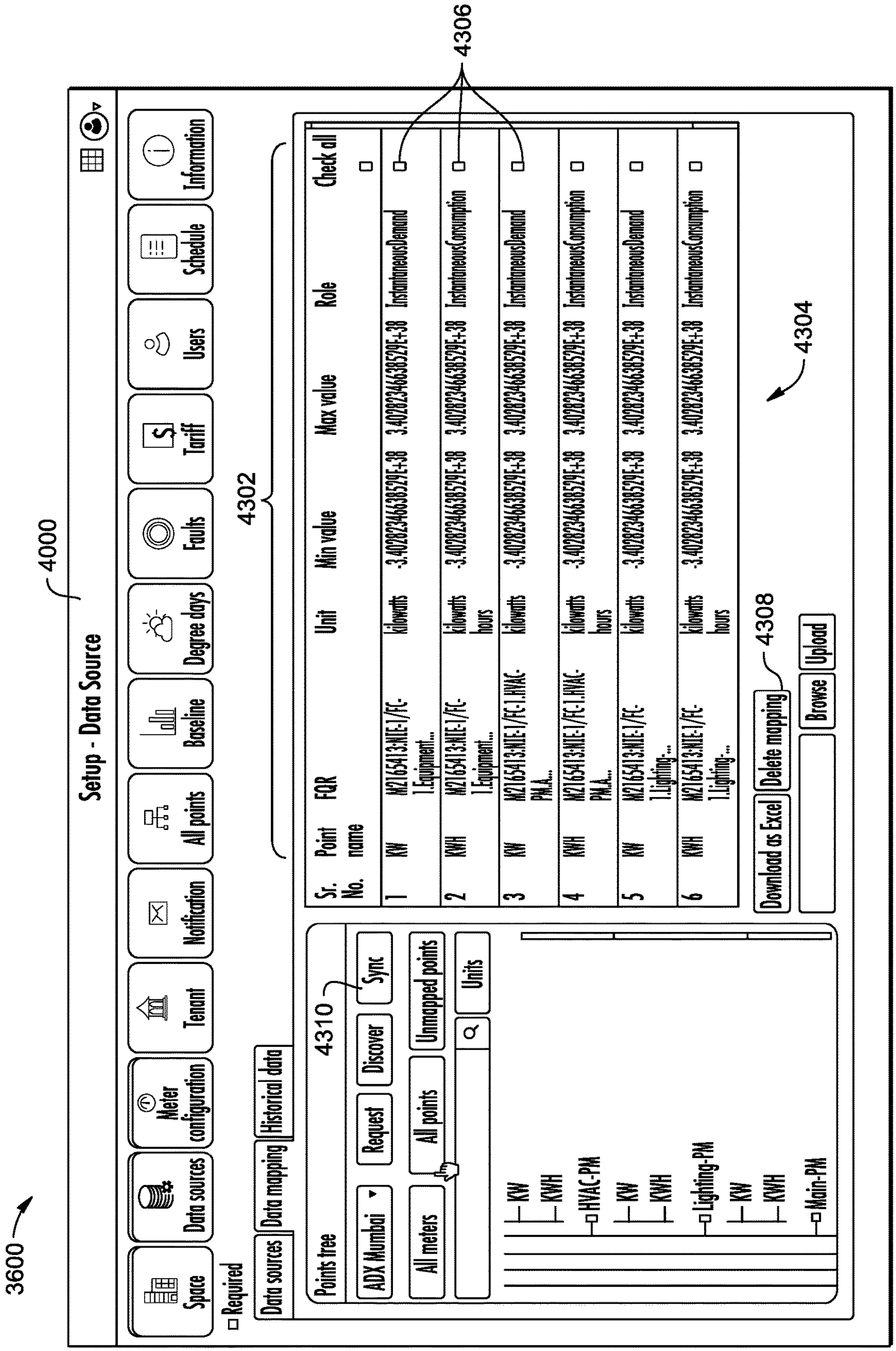
Figure 44:
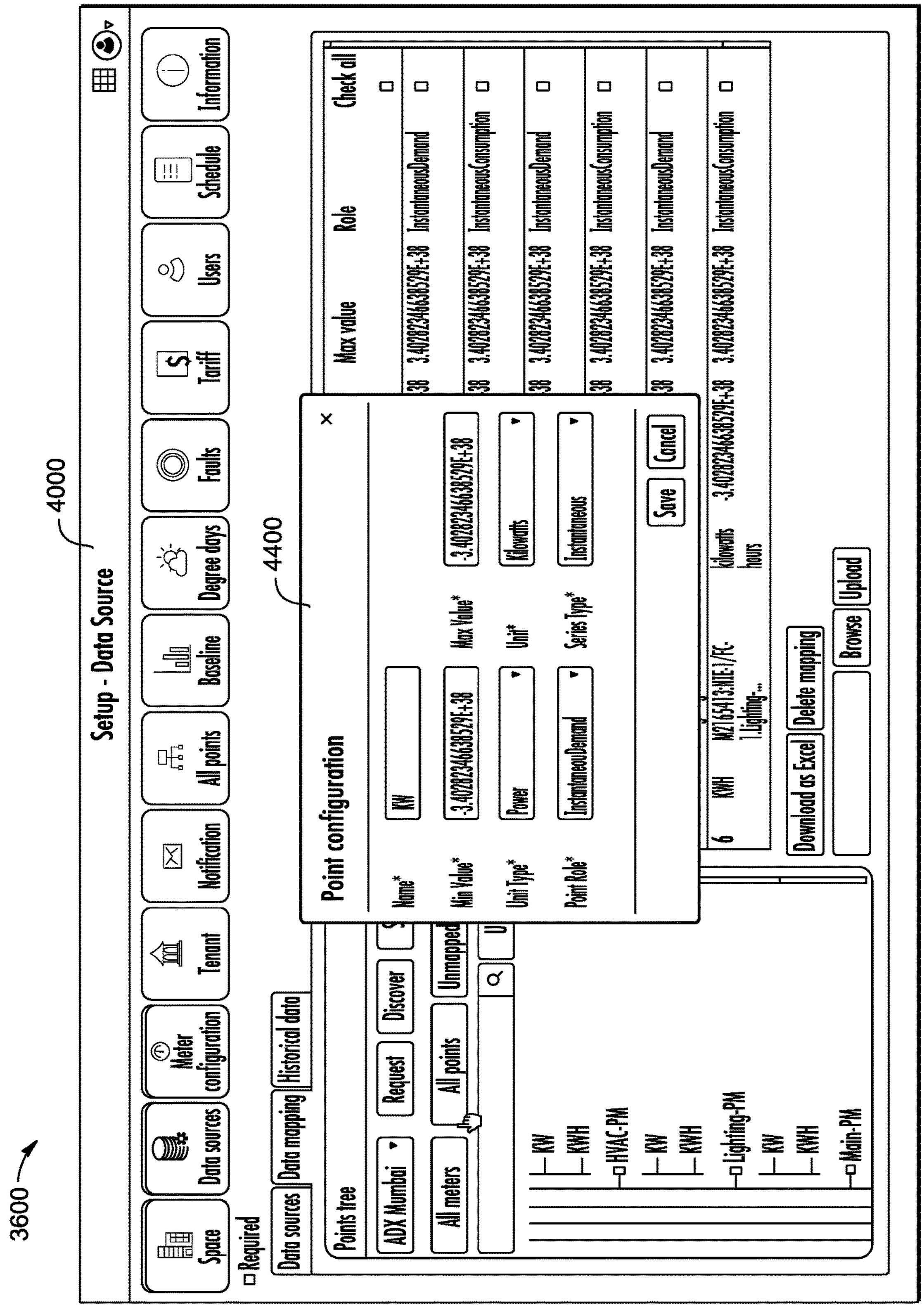

As shown in FIGS. 42-44, point mapping may be performed by dragging and dropping points from points tree 4108 onto the window 4200 to the right of points tree 4108. Any number of points can be mapped by simply dragging and dropping (shown in FIG. 42). Attributes 4302 of the mapped data points 4304 may be displayed (shown in FIG. 43). Mapped data points 4304 can be individually selected and deleted by checking check boxes 4306 next to mapped data points 4304 and selecting "delete mapping" button 4308. Attributes 4302 of a mapped data point 4304 can be edited by clicking on the data point 4304. For example, selecting a data point 4304 may cause a point configuration pop-up 4400 to be displayed (shown in FIG. 44), which allows the user to change the attributes 4302 of the data point 4304 such as units, minimum value, maximum value, point name, etc. After the data points 4304 have been mapped, the user can click the "Sync" button 4310 (shown in FIG. 43) to synchronize the mapped data points 4304 with the data platform (e.g., data platform services 520).

Figure 45:
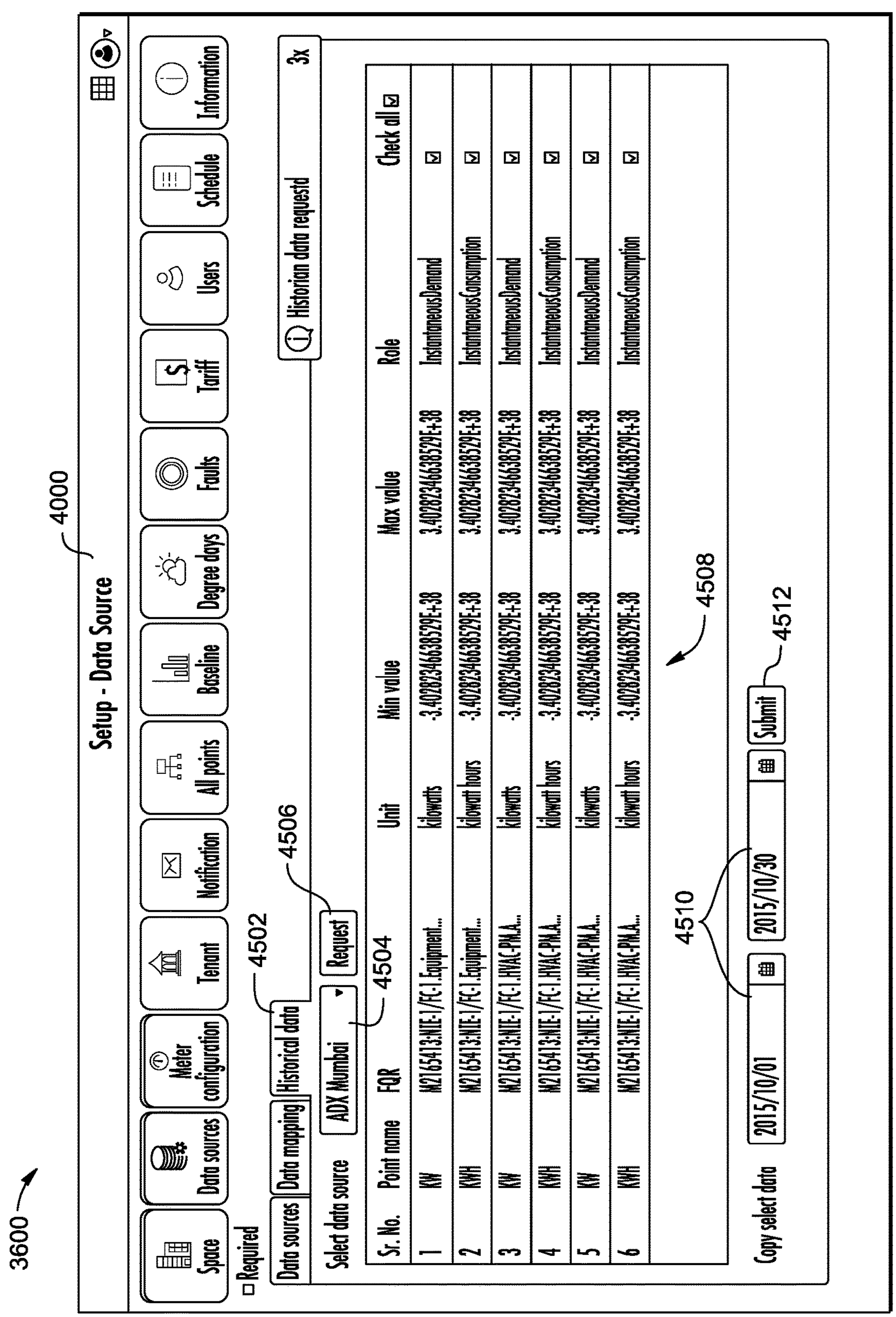

As shown in FIG. 45, data sources setup interface 4000 may include a historical data tab 4502. Historical data tab 4502 allows a user to select a data source 4504 and request a list of data points 4508 mapped to the data source (e.g., by clicking request button 4506). A user can enter a time interval (e.g., a range of dates) into date fields 4510 and click submit button 4512 to request historical data for the selected data points for the user-specified time interval.

Figure 46:
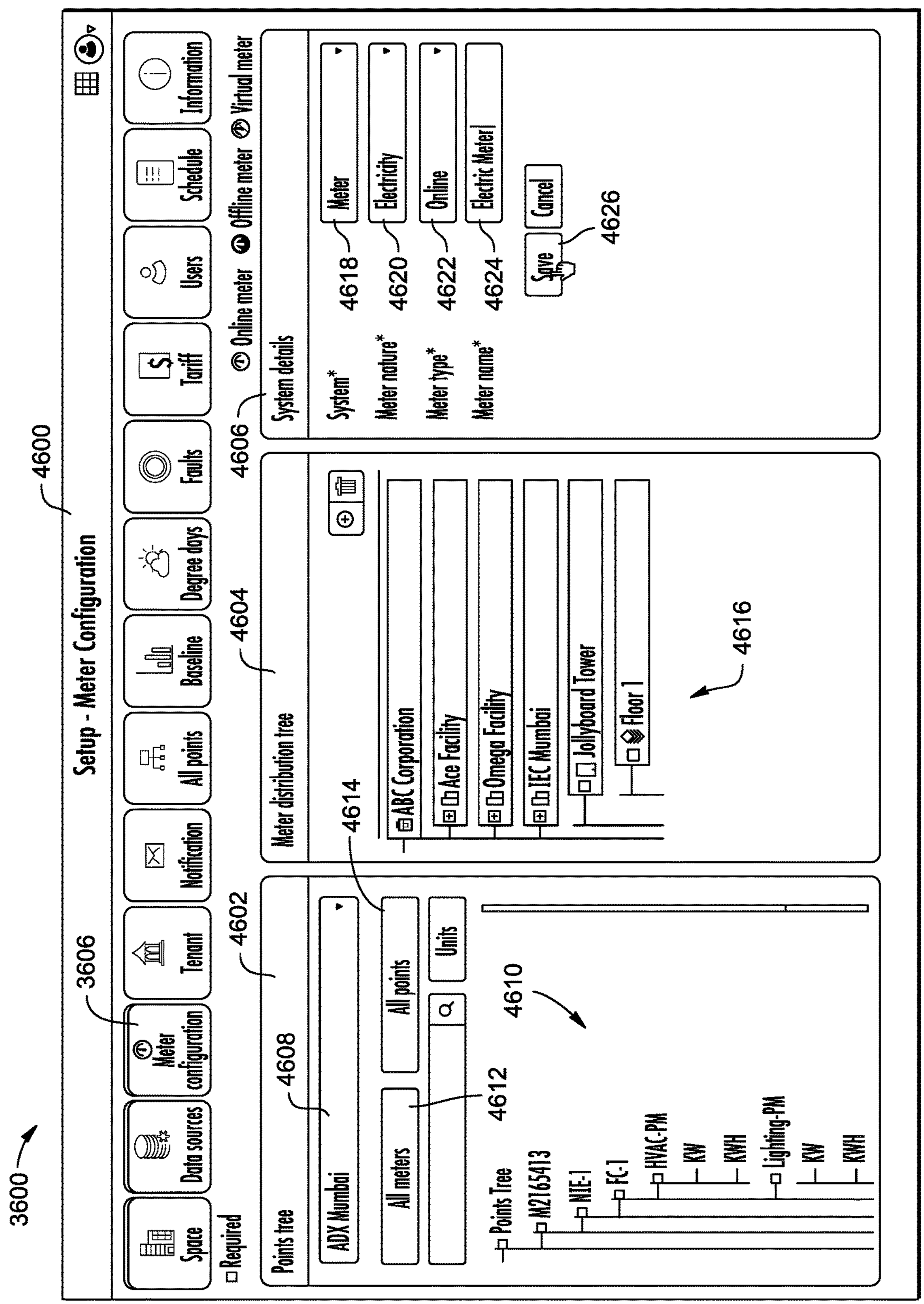
FIG. 46-49 are drawings of an interface for configuring meters, which may be generated by the BMS of FIG. 5, according to some embodiments.

As shown in FIG. 46, selecting meter configuration tile 3606 may display a meter configuration interface 4600. Meter configuration interface 4600 is shown to include a points tree 4602, a meter distribution tree 4604, and a system details panel 4606. Points tree 4602 includes a dropdown selector 4608 which allows a user to specify a data source (e.g., ADX Mumbai) and display a list of points 4610 associated with the data source. List of points 4610 can be filtered to show only meters by selecting "All meters" button 4612 and/or all points by selecting "All points" button 4614. Meter distribution tree 4604 includes spaces tree 4616, which allows the user to select a particular space. Selecting a space via meter distribution tree 4604 may cause a selected point to be associated with the space and may cause system details panel 4606 to be displayed.

System details panel 4606 allows a user to define a new meter. For example, the user can specify the type of system (e.g., meter, air handling unit, VAV box, chiller, boiler, heat exchanger, pump, fan, etc.). Selecting "meter" from the system dropdown menu 4618 identifies the new item as a meter. The user can specify the nature of the meter via the meter nature dropdown menu 4620. For example, the user can specify whether the meter measures electricity, gas, steam, water, sewer, propane, fuel, diesel, coal, BTU, or any other type of commodity which can be measured by a meter. The user can specify the meter type (e.g., online, virtual, baseline, calculated point, fault, etc.) via the meter type dropdown menu 4622. Finally the user can enter the meter name in the meter name box 4624. The information can be saved by clicking save button 4626.

Figure 47:
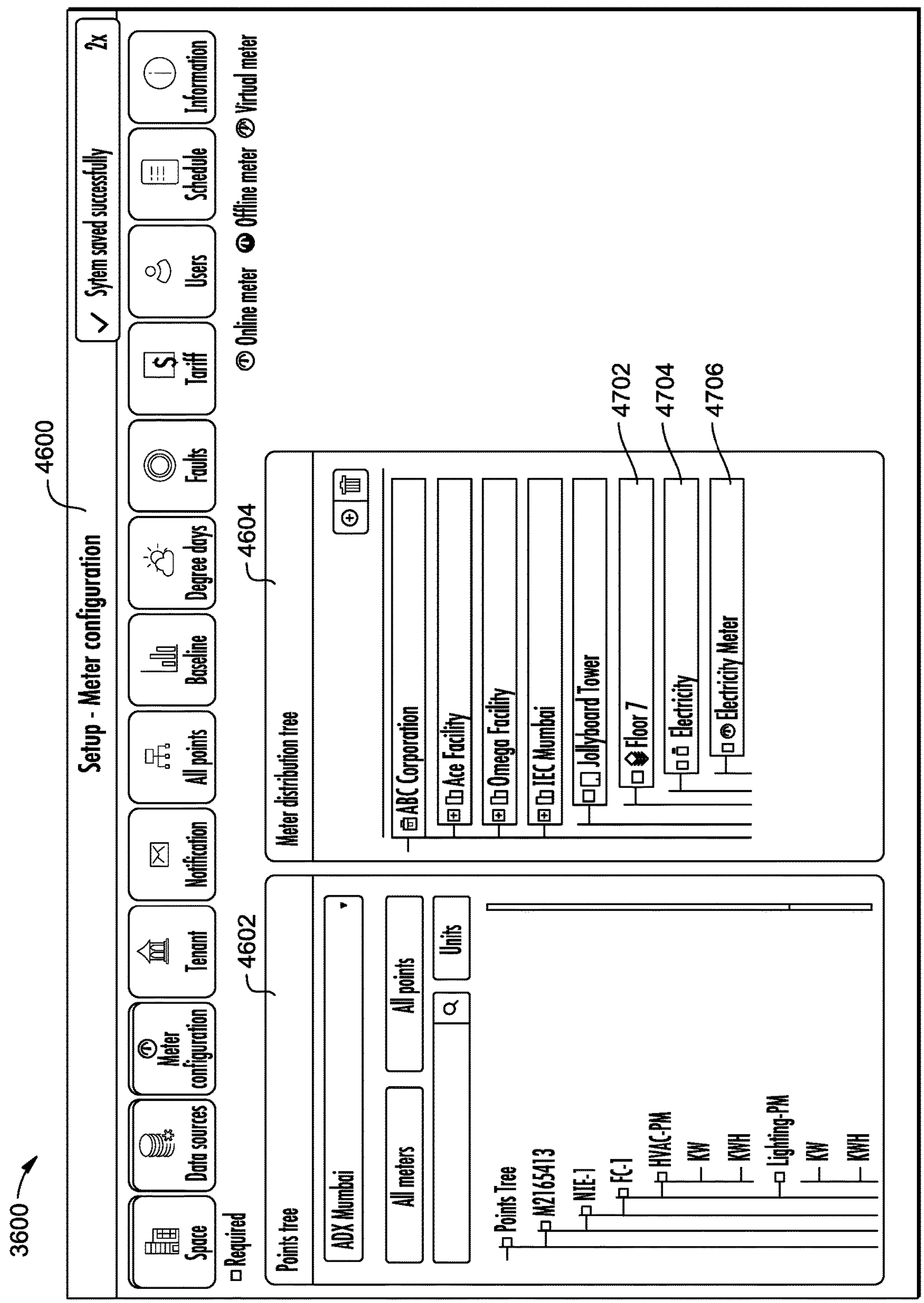
Figure 48:
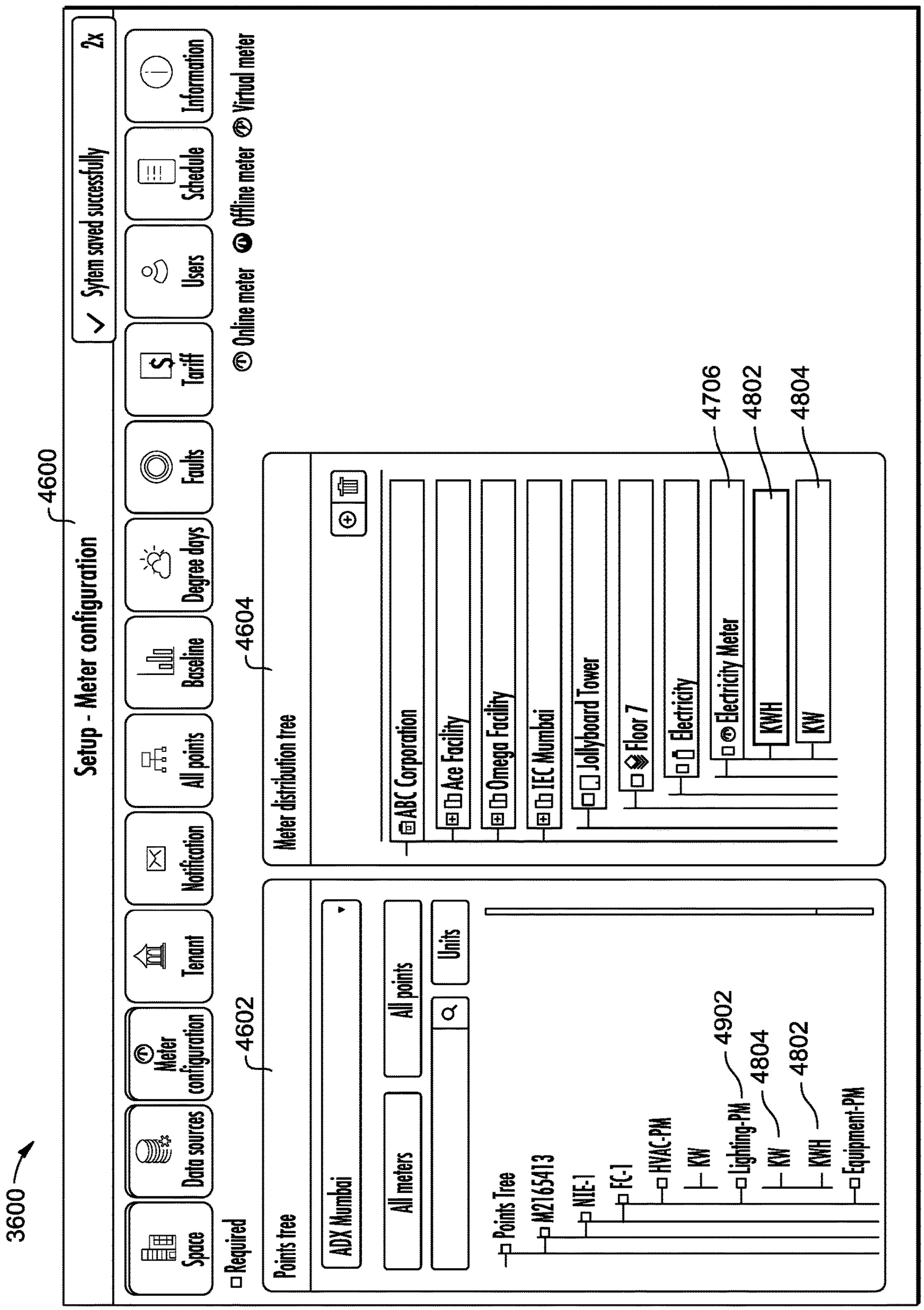
Figure 49:
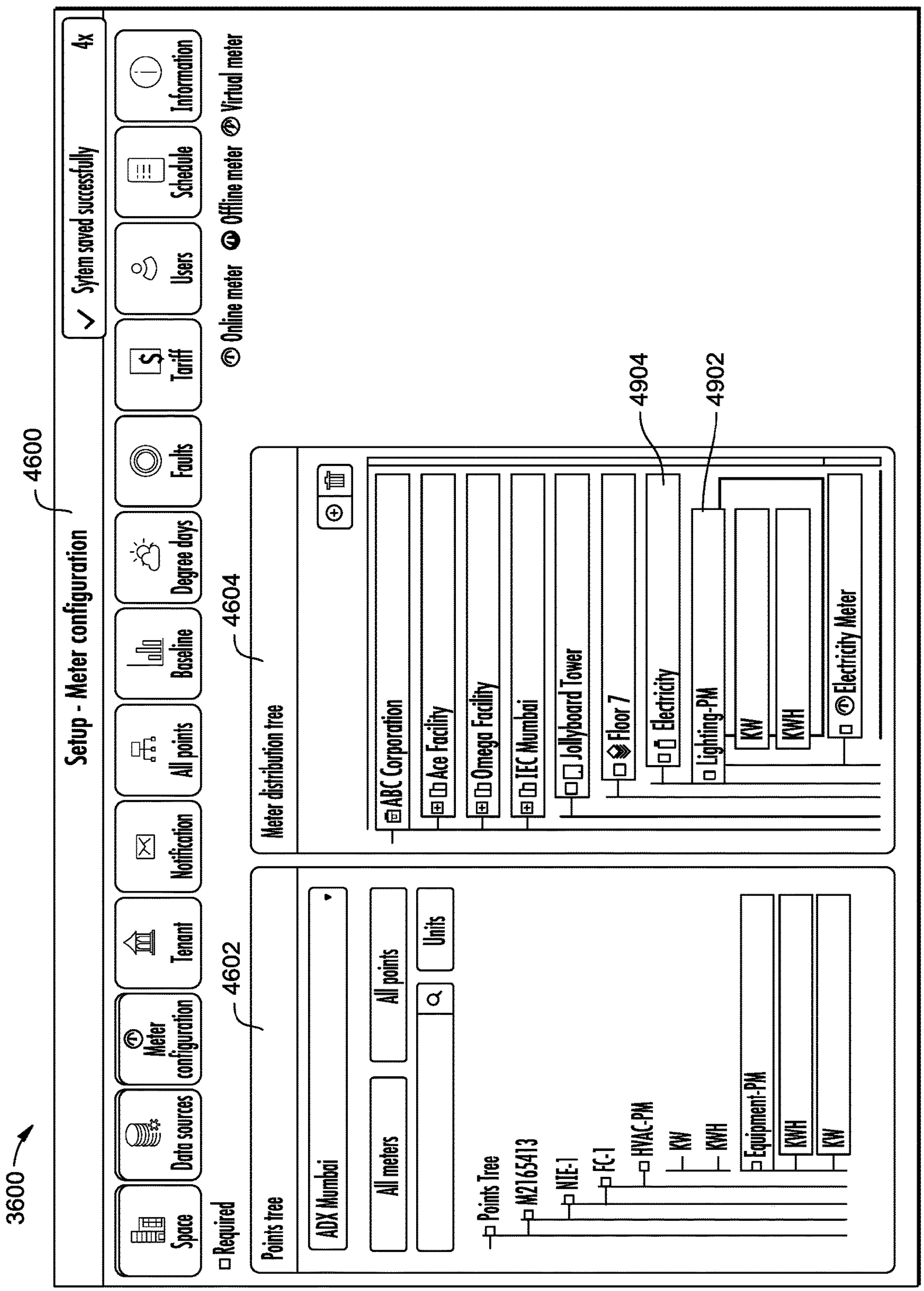

As shown in FIGS. 47-49, the selected space 4702 in meter distribution tree 4604 may be updated to include the type of commodity 4704 measured by the meter 4706 (e.g., "Electricity") and the name of the meter 4706 which measures the commodity (e.g., "Electric Meter"). This may occur automatically in response to the user clicking save button 4626. Points 4802-4804 can be added to the user-specified meter 4706 by dragging and dropping points 4802-4804 from point tree 4602 onto meter 4706 in meter distribution tree 4604 (shown in FIG. 48). Existing meters 4902 which measure a particular commodity can be added to meter distribution tree 4604 by dragging and dropping meters 4902 from points tree 4602 onto the commodity (e.g., electricity 4904) in meter distribution tree 4604 (shown in FIG. 49).

Figure 50:
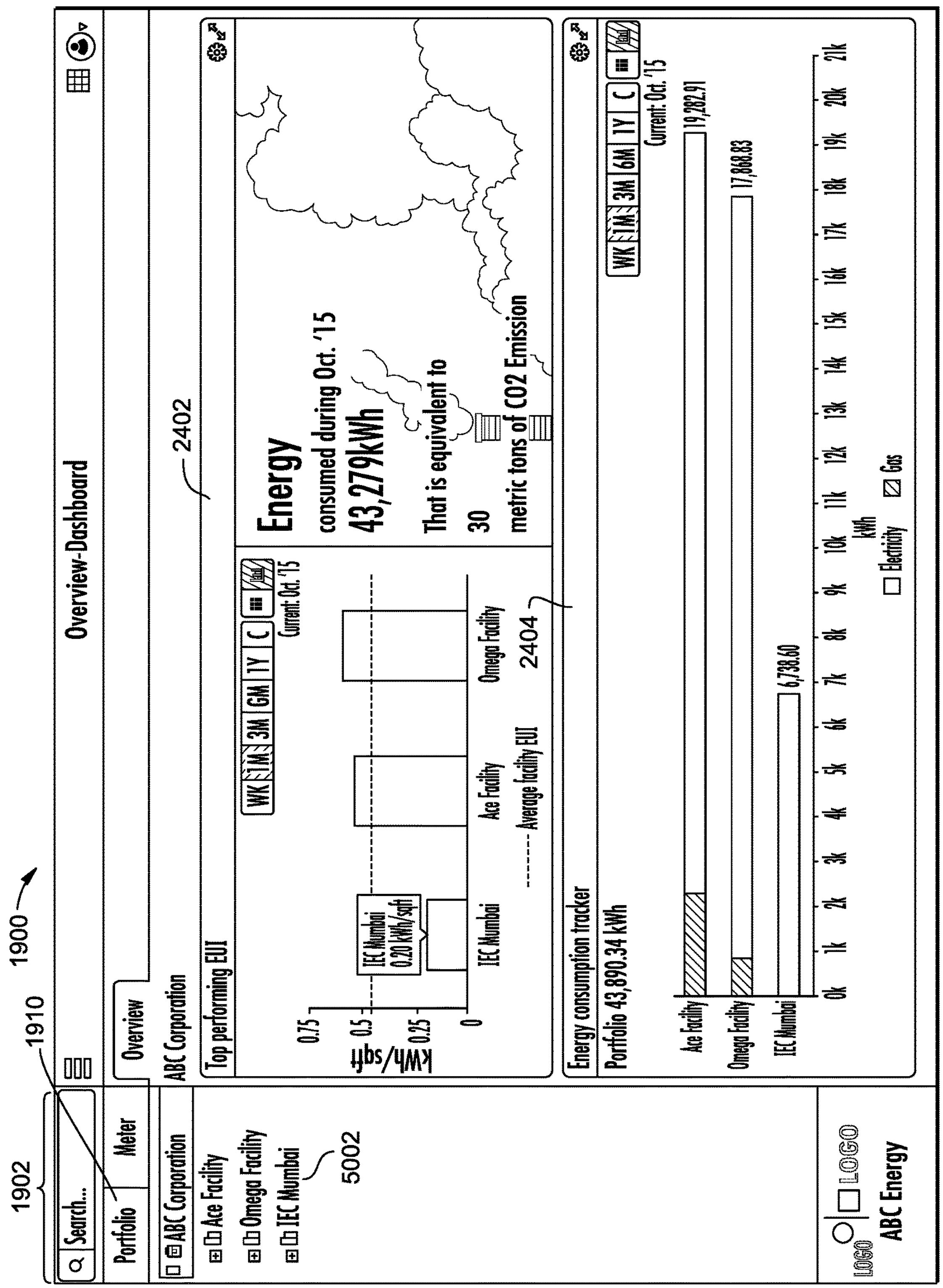
FIGS. 50-51 are additional drawings of the overview dashboard shown in FIGS. 19-34, according to some embodiments.
Figure 51:
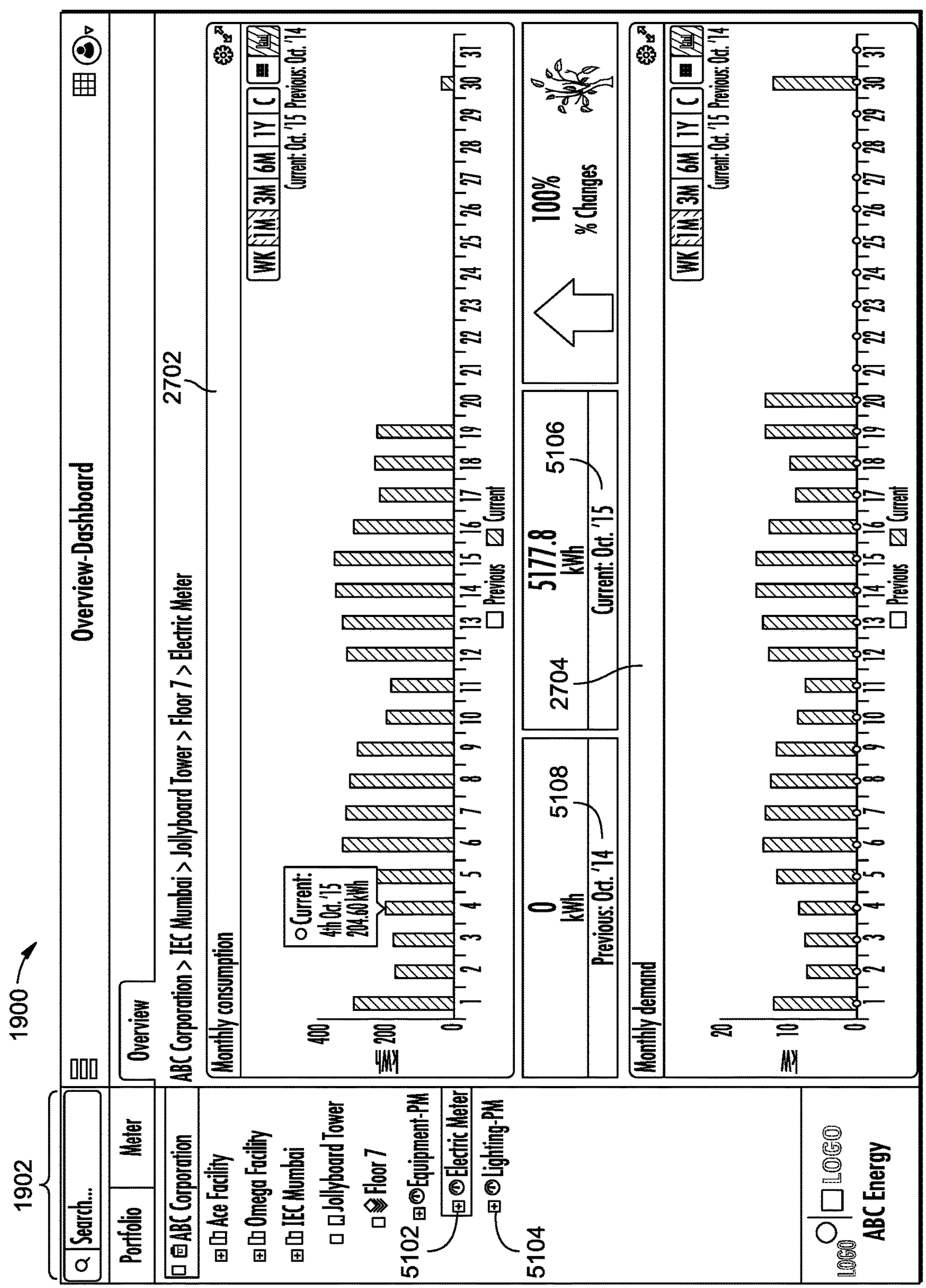

Referring now to FIGS. 50-51, overview dashboard 1900 may be automatically updated to display data from the new spaces added and configured via setup interface 3600. For example, portfolio 1910 is shown to include the newly added facility 5002 "IEC Mumbai" in navigation pane 1902. The energy-related data associated with new facility 5002 is also shown in EUI widget 2402 and energy consumption tracker widget 2404 (shown in FIG. 50).

As shown in FIG. 51, any meters 5102-5104 associated with the new space may also be displayed in navigation pane 1902. Data provided by meters 5102-5104 may be shown in energy consumption widget 2702 and energy demand widget 2704, which may be the same or similar as previously described. For example, widgets 2702-2704 shown in FIG. 51 may be configured to display meter data for a current time period 5106 and a previous time period 5108. Current time period 5106 may be populated using real-time data received from meters 5102-5104. Previous time period 5108 may be unpopulated until historical data is retrieved for meters 5102-5104 (as described with reference to FIG. 45). After historical data is retrieved, dashboard 1900 may be automatically updated to display the historical data along with the current data in energy consumption widget 2702 and energy demand widget 2704.

Energy Analytics

Figure 52:
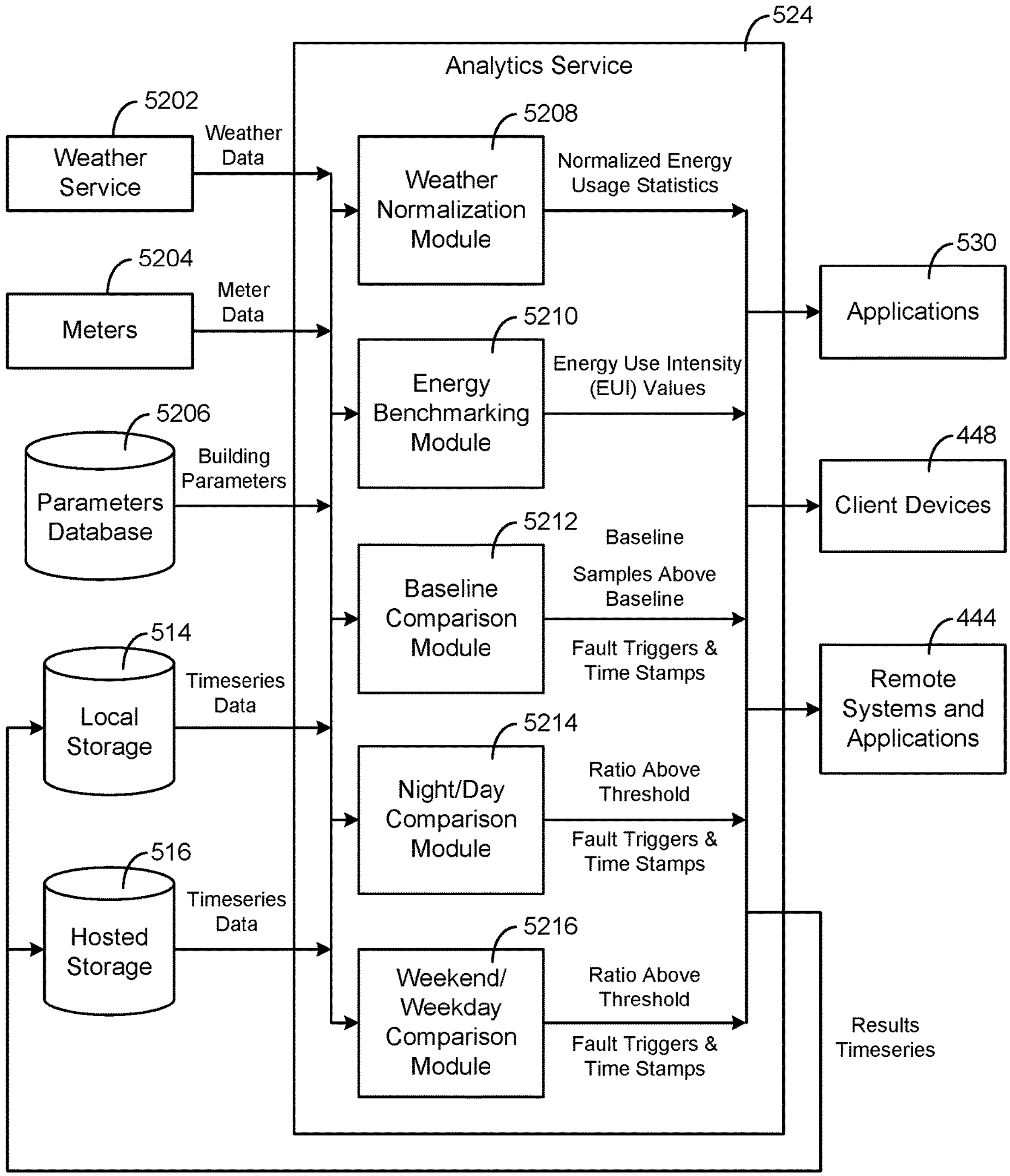
FIG. 52 is a block diagram illustrating the analytics service of FIG. 6 in greater detail showing a weather normalization module, an energy benchmarking module, a baseline comparison module, a night/day comparison module, and a weekend/weekday comparison module, according to some embodiments.

Referring now to FIG. 52, a block diagram illustrating analytics service 524 in greater detail is shown, according to an exemplary embodiment. Analytics service 524 can be implemented as one of data platform services 520 in BMS 500 (as described with reference to FIGS. 5-6), as a separate analytics system in BMS 500, or as a remote (e.g., cloud-based) analytics system outside BMS 500. Analytics service 524 can receive input from components of BMS 500 (e.g., local storage 514, hosted storage 516, meters 5204, etc.) as well as external systems and devices (e.g., weather service 5202). For example, analytics service 524 can use the timeseries data from local storage 514 and/or hosted storage 516 in combination with weather data from weather service 5202 and meter data from meters 5204 to perform various energy analytics. Analytics service 524 can provide results of the energy analytics as outputs to applications 530, client devices 448, and remote systems and applications 444. In some embodiments, analytics service 524 stores the results of the analytics as timeseries data in local storage 514 and/or hosted storage 516.

Analytics service 524 is shown to include a weather normalization module 5208. Weather normalization module 5208 can be configured normalize the energy consumption data for a facility, building, or other space to remove the effects of weather. By normalizing the energy consumption data in this way, changes in the normalized energy consumption data can be attributed factors other than weather (e.g., occupancy load, equipment efficiency, etc.). Weather normalization module 5208 can determine an expected energy usage after removing the effects of weather and can generate normalized energy usage statistics including, for example, a difference between actual and expected energy usage, a percentage change, a coefficient of variation of root mean square error (CVRME), and other energy usage statistics based on the normalized energy usage data.

In some embodiments, weather normalization module 5208 receives historical meter data. Historical meter data can include historical values for measurable amounts of resource consumption including, for example, electric consumption (kWh), water consumption (gallons), and natural gas consumption (mmBTU). The historical meter data can be received as timeseries data from local storage 514 or hosted storage 516, collected from meters 5204 over time, or received from an energy utility (e.g., as part of an energy bill). In some embodiments, the historical meter data includes one year or more of historical meter data. However, the historical meter data may cover other time periods in various other embodiments (e.g., six months, three months, one month, etc.). Weather normalization module 5208 can also receive current meter data from meters 5204.

In some embodiments, weather normalization module 5208 receives weather data from weather service 5202. Weather data can include outside air temperature measurements, humidity measurements, rainfall amounts, wind speeds, or other data indicative of weather conditions. In some embodiments, the weather data includes cooling degree day (CDD) data and heating degree day (HDD) data. CDD data and HDD data can be provided as timeseries data having a CDD value and/or HDD value for each element of the timeseries. In some embodiments, CDD and HDD are defined as:

$$CDD_i=\max(0,T_{OA,i}-T_{BalancePoint})$$

$$HDD_i=\max(0,T_{BalancePoint}-T_{OA,i})$$

where $T_{OA,i}$ is the outside air temperature at time step i and $T_{BalancePoint}$ is a temperature parameter (e.g., 60 degrees F.). $T_{BalancePoint}$ can be set/adjusted by a user, or can be automatically set/adjusted based on the temperature setpoint for the building or space being controlled.

In some embodiments, $T_{OA,i}$ is the average daily outside air temperature. $T_{OA,i}$ can be calculated as an average of the hourly temperature values or as an average of the high and low temperature values for the day. For example, $T_{OA,i}$ can be calculated using either of the following equations:

$$T_{OA,i}=\frac{\sum_{j=1}^{24} T_{OA,ij}}{24}$$

$$T_{OA,i}=\frac{T_{high,i}-T_{low,i}}{2}$$

where $T_{OA,ij}$ is the hourly outside air temperature at hour j of day i, $T_{high,i}$ is the highest temperature value of day i, and $T_{low,i}$ is the lowest temperature value of day i. In some embodiments, CDD and HDD are provided as timeseries data by weather service 5202. In other embodiments, weather service 5202 provides $T_{OA}$ as timeseries data and weather normalization module 5208 calculates the CDD timeseries and HDD timeseries based on the timeseries values of $T_{OA}$.

In some embodiments, weather normalization module 5208 uses the weather data and meter data to predict an amount of energy usage for the building or space after removing the effects of weather. Weather normalization module 5208 can compare the expected amount of energy usage to the actual amount of energy usage (defined by the meter data) to determine a difference or delta between the expected normalized energy usage and the actual energy usage, as shown in the following equation:

$$\Delta Usage_i = Usage_{expected,i} - Usage_{actual,i}$$

where $Usage_{expected,i}$ is the expected amount of energy usage after removing the effects of weather and $Usage_{actual,i}$ is the actual amount of energy usage measured by meters 5204. In some embodiments, weather normalization module 5208 calculates a percentage change between the actual usage and the expected usage, as shown in the following equation:

$$\text{Percentage Change} = 100 * \frac{Usage_{actual,i} - Usage_{expected,i}}{Usage_{expected,i}}$$

where each of $Usage_{actual,i}$ and $Usage_{expected,i}$ is a timeseries value at time step i.

In some embodiments, weather normalization module 5208 calculates a coefficient of variation of root mean square error (CVRME) based on the actual and expected energy usage values. CVRME is a measure of performance between the actual energy usage values and the expected energy usage values. Given a timeseries of n values for each timeseries, weather normalization module 5208 can calculate CVRME as follows:

$$CVRME = \frac{\sqrt{\frac{\sum_{i=1}^{n} (\hat{Y}_i - Y_i)^2}{n}}}{\overline{Y}}$$

where $\hat{Y}_i$ is the predicted energy usage at time step i (i.e., $Usage_{expected,i}$), $Y_i$ is the actual energy usage at time step i (i.e., $Usage_{actual,i}$), and Y is the mean of the timeseries Y.

Figure 53:
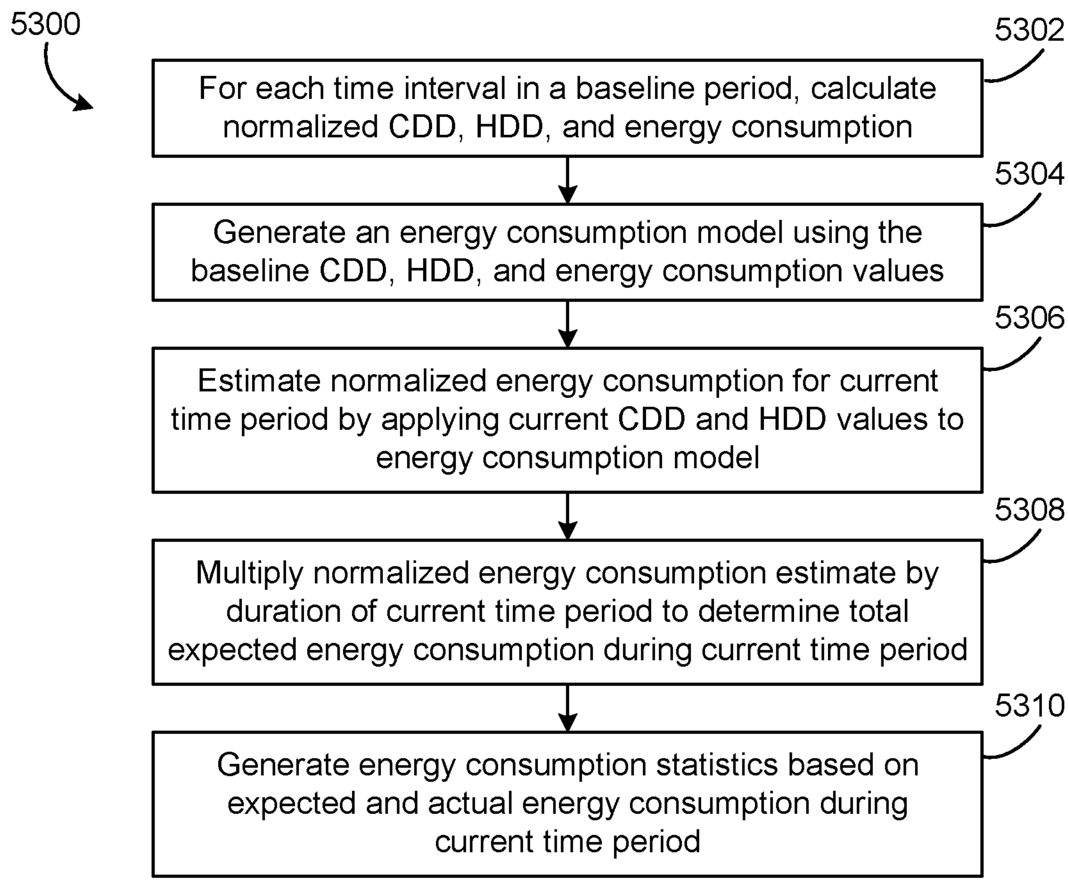
FIG. 53 is a flowchart of a process which may be performed by the weather normalization module of FIG. 52, according to some embodiments.

Referring now to FIG. 53, a flowchart of a process 5300 for normalizing energy consumption data to remove the effects of weather is shown, according to an exemplary embodiment. Process 5300 can be performed by weather normalization module 5208 normalize the energy consumption data for a facility, building, or other space to remove the effects of weather on the energy consumption values.

Process 5300 is shown to include calculating normalized CDD, HDD, and energy consumption for each time interval in a baseline period (step 5302). In some embodiments, the baseline period is a previous year and each time interval in the baseline period is a month in the previous year. However, it is contemplated that the baseline period and time intervals can have any duration in various other embodiments. In some embodiments, the normalized CDD, HDD, and energy consumption values are average CDD, HDD, and energy consumption values for each time interval. For example, the normalized CDD value for a given month can be calculated by dividing the total CDD for the month (i.e., the sum of the CDD values for each day in the month) by the number of days in the month, as shown in the following equation:

$$\overline{CDD} = \frac{\sum_{month} CDD}{\#\text{ days in month}}$$

where $\overline{CDD}$ is the normalized CDD value (CDD/day) and CDD is a daily CDD value for a given day in the month.

Similarly, the normalized HDD value for a given month can be calculated by dividing the total HDD for the month (i.e., the sum of the HDD values for each day in the month) by the number of days in the month, as shown in the following equation:

$$\overline{HDD} = \frac{\sum_{month} HDD}{\#\text{ days in month}}$$

where $\overline{HDD}$ is the normalized HDD value (HDD/day) and HDD is a daily HDD value for a given day in the month.

The normalized energy consumption for a given month can be calculated by dividing the total energy consumption for the month by the number of days in the month, as shown in the following equation:

$$\overline{Usage} = \frac{\sum_{month} Usage}{\#\text{ days in month}}$$

where $\overline{Usage}$ is the normalized energy consumption value (kWh/day) and Usage is a daily energy consumption value for a given day in the month. Each of the normalized values $\overline{CDD}$, $\overline{HDD}$, and $\overline{Usage}$ can be calculated for each time interval (e.g., each month) in the baseline period (e.g., previous year) to generate a timeseries of values (e.g., monthly values) for the baseline period.

Still referring to FIG. 53, process 5300 is shown to include generating an energy consumption model using the baseline CDD, HDD, and energy consumption values (step 5304). In some embodiments, the energy consumption model has the form:

$$\overline{Usage} = b_0 + b_1 * \overline{CDD} + b_2 * \overline{HDD}$$

where the values of $b_0$, $b_1$, and $b_2$ are determined by applying a regression (e.g., weighted least squares) to the timeseries of values for $\overline{CDD}$, $\overline{HDD}$, and $\overline{Usage}$. An example of an energy consumption model which can be generated in step 5304 is shown in FIG. 54.

Figure 54:
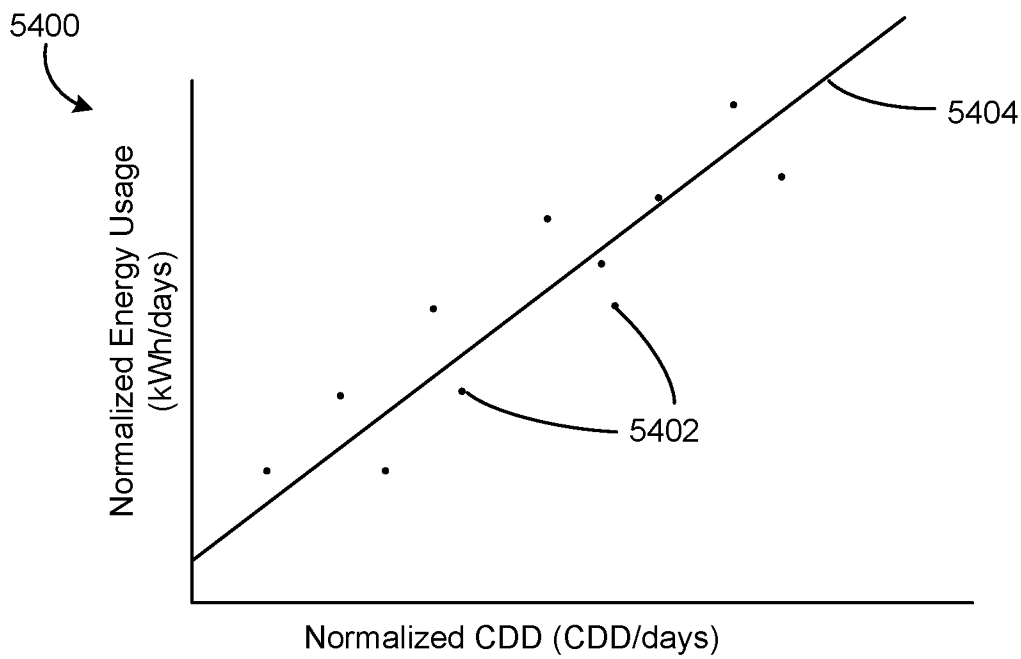
FIG. 54 is a graph illustrating a regression model which may be generated by the weather normalization module of FIG. 52, according to some embodiments.

Referring to FIG. 54, a graph 5400 of timeseries values is shown, according to an exemplary embodiment. Graph 5400 plots the timeseries of normalized CDD values $\overline{CDD}$ (x-axis) against the corresponding energy consumption values $\overline{Usage}$ (y-axis). The normalized HDD values are omitted for simplicity. Each point 5402 in graph 5400 represents a pairing of a normalized CDD value and the corresponding normalized energy consumption value. Line 5404 represents the relationship between the variables $\overline{CDD}$ and $\overline{Usage}$. The following equation can be used to represent the simplified model shown in FIG. 54:

$$\overline{Usage} = b_0 + b_1 * \overline{CDD}$$

where the values of $b_0$, and $b_1$ are determined by applying a regression (e.g., weighted least squares) to the timeseries of values for $\overline{CDD}$ and $\overline{Usage}$. For example, the regression may generate values of $b_0$=20.1 kWh/day and $b_1$=200.1 CDD/day, which results in the simplified model:

$$\overline{Usage} = 20.1 + 200.1 * \overline{CDD}$$

Referring again to FIG. 53, process 5300 is shown to include estimating normalized energy consumption for a current time period by applying current CDD and HDD values to the energy consumption model (step 5306). In some embodiments, the current time period is a current month. The current CDD and HDD values can be received from weather service 5202 or calculated by weather normalization module 5208 based on current weather conditions, as described with reference to FIG. 52. In some embodiments, the current CDD and HDD values are normalized CDD and HDD values for the current month, which can be calculated as described with reference to step 5302.

Step 5306 can include using the current CDD and HDD values as inputs to the energy consumption model and solving for the energy consumption value. For example, if the current CDD value is $$\overline{CDD} = 50\frac{CDD}{\text{day}},$$

the simplified model can be solved as follows:

$$\overline{\text{Usage}} = 20.1 + 200.1 * \overline{CDD}$$

$$\overline{\text{Usage}} = 20.1 + 200.1 * 50$$

$$\overline{\text{Usage}} = 10{,}025.1\frac{\text{kWh}}{\text{day}}$$

Process 5300 is shown to include multiplying the normalized energy consumption estimate by the duration of the current time period to determine the total expected energy consumption during the current time period (step 5308). For example, if the current time period has a duration of 31 days, the normalized energy consumption $\overline{\text{Usage}}$ can be multiplied by 31 to determine the expected energy consumption for the current month. The following equations show an example of the calculation performed in step 5308 using the normalized energy consumption value calculated in step 5306:

$$\text{Usage}_{expected} = \overline{\text{Usage}} * \text{duration}$$

$$\text{Usage}_{expected} = 10{,}025.1\frac{\text{kWh}}{\text{day}} * 31 \text{ days}$$

$$\text{Usage}_{expected} = 310{,}778.1 \text{ kWh}$$

Process 5300 is shown to include generating energy consumption statistics based on expected and actual energy consumption during the current time period (step 5310). The expected energy consumption may be the value $\text{Usage}_{expected}$ calculated in step 5308. The actual energy consumption may be the value $\text{Usage}_{current}$, which can be measured by meters 5204, received from local storage 514 or hosted storage 516, obtained from a utility (e.g., a utility bill), or otherwise observed during the current time period.

The energy consumption statistics may include, for example, a difference or delta between the expected normalized energy usage $\text{Usage}_{expected}$ and the actual energy usage $\text{Usage}_{current}$ (e.g., ΔUsage), a percentage change between the actual usage $\text{Usage}_{current}$ and the expected usage $\text{Usage}_{expected}$, a CVRME based on the actual and expected energy usage values, or other statistics derived from the actual energy usage $\text{Usage}_{current}$ and the expected energy usage $\text{Usage}_{expected}$. These and other energy consumption statistics can be calculated by weather normalization module 5208 as previously described. Process 5300 can be repeated periodically (e.g., monthly) to calculate energy consumption statistics for each time period (e.g., each month) as that time period becomes the current time period.

In some embodiments, the number of data points used to generate the energy consumption model is at least twice the number of parameters in the model. For example, for an energy consumption model with three parameters $b_0$, $b_1$, and $b_2$ a minimum of six data points (e.g., six months of historical data) may be used to train the model. In some embodiments, a full year of data is used to train the energy consumption model. If less than a full year of historical data is used, weather normalization module 5208 may flag the resulting energy consumption model as potentially unreliable. Once a full year of data has been collected, weather normalization module 5208 may remove the flag to indicate that the energy consumption model is no longer potentially unreliable.

In some embodiments, weather normalization module 5208 uses up to three years of historical data to train the energy consumption model. Using up to three years of data can minimize the impact of an anomalous year but reduces the likelihood of the baseline model changing (non-stationarity). In some embodiments, weather normalization module 5208 recalculates the energy consumption model on the first of each month with all available data up to but not exceeding three years. In addition to automatically updating the energy consumption model periodically, a user-defined trigger can be used to force a recalculation of the baseline model. The user-defined trigger can be a manual trigger (e.g., a user selecting an option to update the model) which allows the model to be updated in cases where a known change has occurred in the building (e.g., new zone added, hours of operation extended, etc.).

In some embodiments, historical data collected before the user-defined trigger is excluded when retraining the energy consumption model in response to the user-defined trigger. Alternatively, the user-defined trigger can require the user to specify a date, which is used as a threshold before which all historical data is excluded when retraining the model. If a user does not specify a date, weather normalization module 5208 may use all available data by default. If the user specifies the current date, weather normalization module 5208 may wait for a predetermined amount of time (e.g., six months) before retraining the energy consumption model to ensure that sufficient data is collected. The predetermined amount of time may be the minimum amount of time required to collect the minimum number of data points needed to ensure reliability of the model (e.g., twice the number of parameters in the model). During the waiting period, weather normalization module 5208 may display a message indicating that estimates cannot be generated until the end of the waiting period.

Referring again to FIG. 52, analytics service 524 is shown to include an energy benchmarking module 5210. Energy benchmarking module 5210 can be configured compare the energy consumption of a given building or facility to benchmark energy consumption values for buildings of a similar type. Energy benchmarking module 5210 may also compare the energy consumption of a given building or facility to baseline typical buildings of similar type in different geographical locations.

In some embodiments, energy benchmarking module 5210 receives historical meter data. Historical meter data can include historical values for measurable amounts of resource consumption including, for example, electric consumption (kWh), water consumption (gallons), and natural gas consumption (mmBTU). The historical meter data can be received as timeseries data from local storage 514 or hosted storage 516, collected from meters 5204 over time, or received from an energy utility (e.g., as part of an energy bill). In some embodiments, the historical meter data includes one year or more of historical meter data. However, the historical meter data may cover other time periods in various other embodiments (e.g., six months, three months, one month, etc.). Energy benchmarking module 5210 can also receive current meter data from meters 5204.

Energy benchmarking module 5210 may receive building parameters from parameters database 5206. Building parameters may include various characteristics or attributes of the building such as building area (e.g., square feet), building type (e.g., one of a plurality of enumerated types), building location, and building benchmarks for the applicable building type and/or location. Building benchmarks can include benchmark energy consumption values for the building. The benchmarks can be ASHRAE benchmarks for buildings in the United States or other local standards for buildings in different countries. In some embodiments, the benchmarks specify an energy use intensity (EUI) value and/or energy density value for the building. EUI is a normalized metric which quantifies the energy consumption of a building per unit area over a given time period $$\left(\text{e.g., } \frac{\text{kWh}}{\text{ft}^2 * \text{year}}\right).$$

Similarly, energy density is a normalized metric which quantifies the change in energy consumption of the building per unit area over a given time period $$\left(\text{e.g., } \frac{\Delta\text{kWh}}{\text{ft}^2 * \text{hour}}\right).$$

EUIs and energy densities can also be calculated for other commodities such as water consumption, natural gas consumption, etc.

Energy benchmarking module 5210 can use the historical meter data and building parameters to calculate EUI values and/or energy density values for the building. In some embodiments, energy benchmarking module 5210 calculates EUI values and/or energy density values for one-year time periods. This may allow the EUI values and/or energy density values to be directly compared to ASHRAE standards, which are defined by year. However, it is contemplated that EUI and/or energy density can be calculated for any time period (e.g., monthly, weekly, daily, hourly, etc.) to allow for comparison with other standards or benchmarks that use different time periods.

Figure 55:
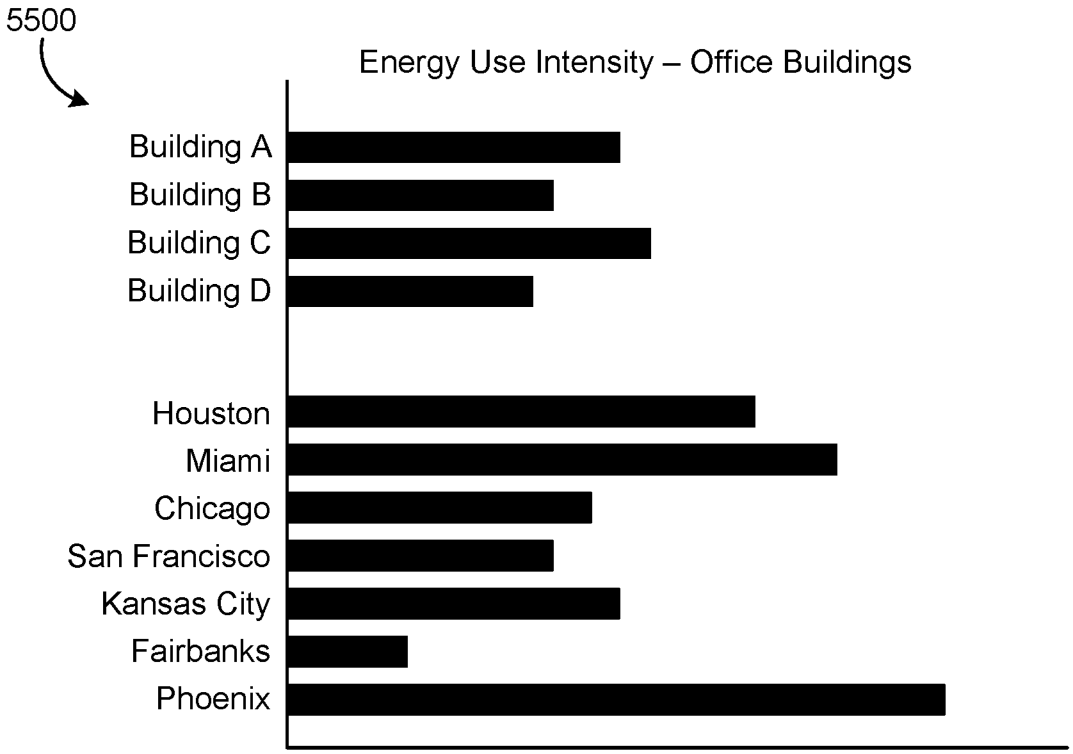
FIG. 55 is a chart of energy use intensity values, which may be generated by the energy benchmarking module of FIG. 52, according to some embodiments.

In some embodiments, energy benchmarking module 5210 collects energy consumption data, energy density values, and/or EUI values for all buildings in a portfolio and separates the buildings by type of building. Energy benchmarking module 5210 can plot all buildings of a single type on one plot along with benchmarks for that building type at different geographical locations (e.g., different cities). An example of a plot 5500 which can be generated by energy benchmarking module 5210 is shown in FIG. 55. Plot 5500 shows all of the buildings in the customer's portfolio that have the building type "Office Building." These building include Building A, Building B, Building C, and Building D. Plot 5500 shows the EUI values for each of Buildings A, B, C, and D. Plot 5500 also shows typical or benchmark EUI values for typical buildings of the same type (i.e., office buildings) in various geographic locations (e.g., Houston, Miami, Chicago, San Francisco, Kansas City, Fairbanks, Phoenix). The visualization shown in plot 5500 allows the customer to see how their buildings compare to similar buildings in their city or other cities with similar weather patterns. Although only EUI is shown, it should be understood that plot 5500 can include energy density in addition to EUI or in place of EUI in various embodiments.

Referring again to FIG. 52, analytics service 524 is shown to include a baseline comparison module 5212. Baseline comparison module 5212 can be configured to compare various timeseries against a baseline. For example, baseline comparison module 5212 can compare energy consumption, energy demand, EUI, energy density, or other timeseries which characterize the energy performance of a building. Baseline comparison module 5212 can compare timeseries at any level of granularity. For example, baseline comparison module 5212 can compare timeseries for an entire facility, a particular building, space, room, zone, meter (both physical meters and virtual meters), or any other level at which timeseries data can be collected, stored, or aggregated.

Baseline comparison module 5212 can compare timeseries data for any commodity (e.g., electricity, natural gas, water, etc.) and at any time duration (e.g., yearly, monthly, daily, hourly, etc.). In some embodiments, energy benchmarking module 5210 receives historical meter data. Historical meter data can include historical values for measurable amounts of resource consumption including, for example, electric consumption (kWh), water consumption (gallons), and natural gas consumption (mmBTU). The historical meter data can be received as timeseries data from local storage 514 or hosted storage 516, collected from meters 5204 over time, or received from an energy utility (e.g., as part of an energy bill). In some embodiments, baseline comparison module 5212 receives the EUI values and/or energy density values generated by energy benchmarking module 5210, the energy usage statistics generated by weather normalization module 5208, or other timeseries which characterize the energy performance of a building or other space. Different EUI calculations and/or energy density calculations can be used to generate the EUI values and/or energy density values for different time periods, as described with reference to energy benchmarking module 5210.

Baseline comparison module 5212 can compare timeseries against various baselines. The baselines may be threshold values which can be generated in any of a variety of ways. For example, some baselines may be defined or set by a user. Some baselines can be calculated from historical data (e.g., average consumption, average demand, average EUI, average energy density, etc.) and other building parameters. Some baselines can be set by standards such as ASHRAE 90.1 (e.g., for building-level standards). Baseline comparison module 5212 may receive building parameters from parameters database 5206. Building parameters may include various characteristics or attributes of the building such as building area (e.g., square feet), building type (e.g., one of a plurality of enumerated types), building location, etc. Baseline comparison module 5212 can use the building parameters to identify appropriate benchmarks against which the timeseries can be compared.

Baseline comparison module 5212 can output the baselines as well as results of the baseline comparisons. The results can include indications of whether the samples of the timeseries are above or below the baseline, fault triggers and time stamps, or other results which can be derived from the baseline comparison (e.g., compliance or non-compliance with a standard, fault indications, etc.). For example, baseline comparison module 5212 may apply fault detection rules which define faults relative to baseline. In some embodiments, a fault is defined as a predetermined number of samples above a baseline or below a baseline. Baseline comparison module 5212 can compare each sample of a timeseries to a baseline to determine, for each sample, whether the sample is above or below the baseline. If a threshold number of samples fulfil the criteria of a fault detection rule (e.g., three consecutive samples above baseline, five of ten consecutive samples above baseline, etc.), baseline comparison module 5212 may generate a fault indication. The fault indications can be stored as timeseries data in local storage 514 or hosted storage 516 or provided to applications 530, client devices 448, and/or remote systems and applications 444.

Figure 56:
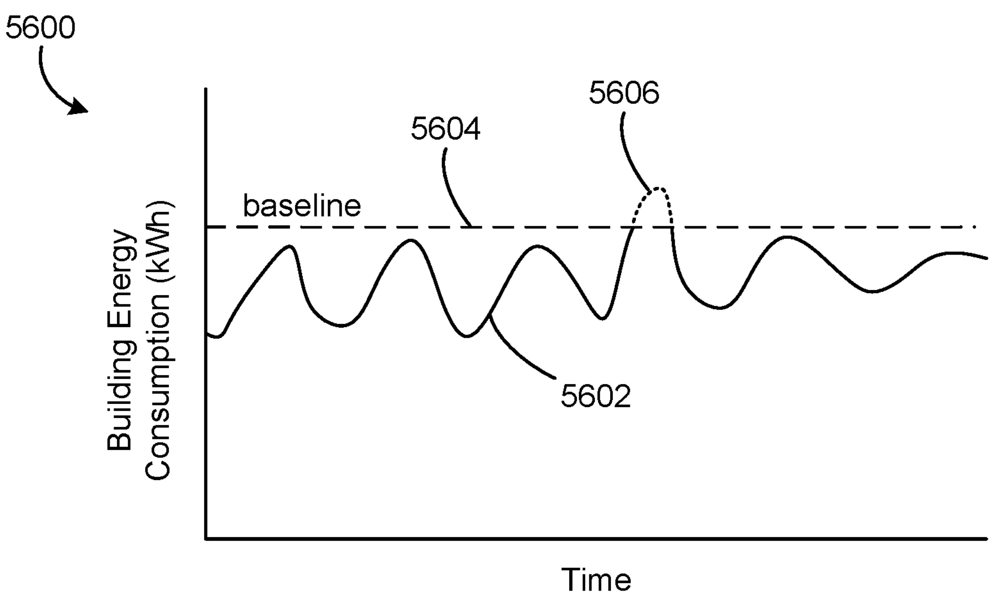
FIG. 56 is a chart of building energy consumption relative to a baseline, which may be generated by the baseline comparison module of FIG. 52, according to some embodiments.

In some embodiments, baseline comparison module 5212 generates plots or graphs which indicate the results of the baseline comparisons. An example of a graph 5600 which can be generated by baseline comparison module 5212 is shown in FIG. 56. Graph 5600 plots the values of a building energy consumption timeseries 5602 relative to a baseline 5604. For each sample of timeseries 5602, baseline comparison module 5212 can compare the value of the sample to baseline 5604. Any samples that exceed baseline 5604 (i.e., samples, 5606), can be automatically highlighted, colored, or otherwise marked by baseline comparison module 5212 in graph 5600. This allows a user to readily identify and distinguish the samples 5606 that exceed baseline 5604.

Referring again to FIG. 52, analytics service 524 is shown to include a night/day comparison module 5214. Night/day comparison module 5214 can be configured to compare night building energy loads against day building energy loads. The night/day comparison can be performed for energy consumption, energy demand, EUI, energy density, or other timeseries which characterize the energy performance of a building. In some embodiments, night/day comparison module 5214 calculates a ratio of the minimum night load to the peak day load and compares the calculated ratio to a threshold (e.g., 0.5). If the ratio deviates from a threshold by a predetermined amount (e.g., greater than 1.2 times the threshold ratio), night/day comparison module 5214 can generate a fault indication which indicates a high nightly load.

In some embodiments, night/day comparison module 5214 receives historical meter data. Historical meter data can include historical values for measurable amounts of resource consumption including, for example, electric consumption (kWh), water consumption (gallons), and natural gas consumption (mmBTU). The historical meter data can be received as timeseries data from local storage 514 or hosted storage 516, collected from meters 5204 over time, or received from an energy utility (e.g., as part of an energy bill). In some embodiments, the historical meter data includes one year or more of historical meter data. However, the historical meter data may cover other time periods in various other embodiments (e.g., six months, three months, one month, etc.). Night/day comparison module 5214 can also receive current meter data from meters 5204.

In some embodiments, night/day comparison module 5214 receives timeseries data from local storage 514 and/or hosted storage 516. The timeseries data can include one or more timeseries of energy consumption, energy demand, EUI, energy density, or other timeseries which characterize the energy performance of a building. In some embodiments, night/day comparison module 5214 receives a building schedule as an input. Night/day comparison module 5214 can use the building schedule to separate the timeseries into night portions (e.g., samples of the timeseries with timestamps at night) and day portions (e.g., samples of the timeseries with timestamps during the day). In some embodiments, the building schedule is an occupancy schedule. In other embodiments, the building schedule defines the sunrise time and sunset time at the geographic location of the building. Night/day comparison module 5214 can receive the building schedule as an input or can automatically generate the building schedule. For example, night/day comparison module 5214 can automatically determine the sunrise times and sunset times for a building based on the date and the geographic location of the building (e.g., zip code, latitude and longitude, etc.).

Night/day comparison module 5214 can use the timeseries data to calculate a load ratio $Q_{ratio}$ for the one or more timeseries. In some embodiments, the load ratio $Q_{ratio}$ is a ratio of the minimum load during night hours (e.g., a minimum of the timeseries samples designated as nighttime samples) to the maximum load during day hours (e.g., a maximum of the timeseries samples designated as daytime samples). For example, night/day comparison module 5214 can calculate the load ratio for a given timeseries using the following equation:

$$Q_{ratio} = \frac{Q_{min}}{Q_{max}}$$

where $Q_{min}$ is the minimum load during night hours and $Q_{max}$ is the maximum load during day hours. Night/day comparison module 5214 can calculate the load ratio $Q_{ratio}$ for each timeseries using the samples of the timeseries. Night/day comparison module 5214 can generate a value of $Q_{ratio}$ for each day of each timeseries. In some embodiments, night/day comparison module 5214 stores the daily values of $Q_{ratio}$ as a new timeseries in local storage 514 and/or hosted storage 516. Each element of the new timeseries may correspond to a particular day and may include the calculated value of $Q_{ratio}$ for that day.

Night/day comparison module 5214 can receive a threshold parameter from parameters database 5206. The threshold parameter may be a threshold ratio between night load and day load. In some embodiments, the threshold ratio has a value of approximately T=0.5. However, it is contemplated that the threshold ratio can have any value in various other embodiments. The value of the threshold ratio can be defined/updated by a user, automatically calculated based on a history of previous night loads and day loads, or otherwise determined by night/day comparison module 5214.

Night/day comparison module 5214 can compare the calculated load ratio $Q_{ratio}$ to the threshold value T (or to some function of the threshold T). In some embodiments, night/day comparison module 5214 determines whether the calculated load ratio $Q_{ratio}$ exceeds the threshold T by a predetermined amount (e.g., 20%). For example, night/day comparison module 5214 can evaluate the following inequality to determine whether the calculated load ratio $Q_{ratio}$ exceeds the threshold T by a predetermined amount θ:

$$Q_{ratio} \geq \theta * T$$

where the parameter θ is a indicates an amount or percentage by which the ratio $Q_{ratio}$ must exceed the threshold T to qualify as a fault. For example, a value of θ=1.2 indicates that the ratio $Q_{ratio}$ qualifies as a fault if $Q_{ratio}$ exceeds the threshold T by 20% or more.

Night/day comparison module 5214 can output the load ratio timeseries as well as the results of the threshold comparisons. The results can include indications of whether the calculated load ratios $Q_{ratio}$ are above or below the threshold value T (or a function of the threshold value T), fault triggers and time stamps, or other results which can be derived from the threshold comparison (e.g., compliance or non-compliance with a standard, fault indications, etc.). For example, night/day comparison module 5214 may apply fault detection rules which define faults relative to threshold T. In some embodiments, a fault is defined as a predetermined number of samples of $Q_{ratio}$ that satisfy the inequality $Q_{ratio} \geq \theta * T$. The fault indications can be stored as timeseries data in local storage 514 or hosted storage 516 or provided to applications 530, client devices 448, and/or remote systems and applications 444.

Figure 57:
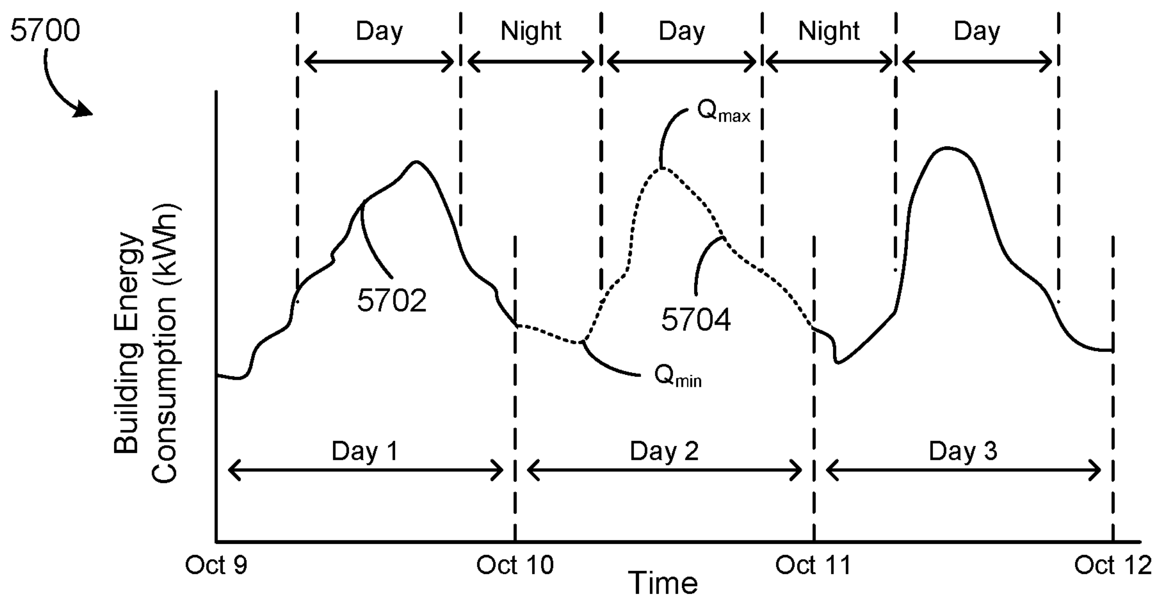
FIG. 57 is a chart of building energy consumption, which may be generated by the night/day comparison module of FIG. 52, highlighting a day with a high nighttime-to-daytime energy consumption ratio, according to some embodiments.

In some embodiments, night/day comparison module 5214 generates plots or graphs which indicate the results of the threshold comparisons. An example of a graph 5700 which can be generated by night/day comparison module 5214 is shown in FIG. 57. Graph 5700 plots a timeseries 5702 of building energy consumption for a three day period. For each day (e.g., Day 1, Day 2, Day 3), night/day comparison module 5214 may identify all of the samples of timeseries 5702 with timestamps during that day. Night/day comparison module 5214 may also classify each sample of timeseries 5702 as either a night sample or a day sample based on the time at which the sample was recorded. Samples obtained during night hours may be classified as night samples, whereas samples obtained during day hours may be classified as day samples.

For each day, night/day comparison module 5214 may identify the minimum of the night samples for that day (i.e., $Q_{min}$) and the maximum of the day samples for that day (i.e., $Q_{max}$). Night/day comparison module 5214 can calculate a ratio $Q_{ratio}$ for each day using the following equation:

$$Q_{ratio} = \frac{Q_{min}}{Q_{max}}$$

and can compare the calculated ratio to a threshold T (or a function of threshold T) as shown in the following inequality:

$$Q_{ratio} \geq \theta * T$$

If the ratio $Q_{ratio}$ for a given day satisfies the inequality, night/day comparison module 5214 can automatically highlight, color, or otherwise mark the samples for that day in graph 5700. For example, samples 5704 for Day 2 may be colored red to indicate that the ratio $Q_{ratio}$ for Day 2 exceeds the threshold T by the amount θ (e.g., 20%).

Referring again to FIG. 52, analytics service 524 is shown to include a weekend/weekday comparison module 5216. Weekend/weekday comparison module 5216 can be configured to compare weekend building energy loads against weekday building energy loads. The weekend/weekday comparison can be performed for energy consumption, energy demand, EUI, energy density, or other timeseries which characterize the energy performance of a building. In some embodiments, weekend/weekday comparison module 5216 calculates a ratio of the weekend load to the to the weekday load and compares the calculated ratio to a threshold (e.g., 0.5). If the ratio deviates from a threshold by a predetermined amount (e.g., greater than 1.2 times the threshold ratio), weekend/weekday comparison module 5216 can generate a fault indication which indicates a high weekend load.

In some embodiments, weekend/weekday comparison module 5216 receives historical meter data. Historical meter data can include historical values for measurable amounts of resource consumption including, for example, electric consumption (kWh), water consumption (gallons), and natural gas consumption (mmBTU). The historical meter data can be received as timeseries data from local storage 514 or hosted storage 516, collected from meters 5204 over time, or received from an energy utility (e.g., as part of an energy bill). In some embodiments, the historical meter data includes one year or more of historical meter data. However, the historical meter data may cover other time periods in various other embodiments (e.g., six months, three months, one month, etc.). Weekend/weekday comparison module 5216 can also receive current meter data from meters 5204. In some embodiments, weekend/weekday comparison module 5216 receives timeseries data from local storage 514 and/or hosted storage 516. The timeseries data can include one or more timeseries of energy consumption, energy demand, EUI, energy density, or other timeseries which characterize the energy performance of a building.

Weekend/weekday comparison module 5216 can use the timeseries data to calculate a load ratio $Q_{ratio}$ for the one or more timeseries. In some embodiments, the load ratio $Q_{ratio}$ is a ratio of the average load during the weekend (e.g., an average of the timeseries samples designated as weekend samples) to the average load during the weekdays (e.g., an average of the timeseries samples designated as weekday samples). For example, weekend/weekday comparison module 5216 can calculate the load ratio for a given timeseries using the following equation:

$$Q_{ratio} = \frac{Q_{weekend}}{Q_{weekday}}$$

where $Q_{weekend}$ is the average load during the weekend and $Q_{weekday}$ is the average load during the weekdays. Weekend/weekday comparison module 5216 can calculate the load ratio $Q_{ratio}$ for each timeseries using the samples of the timeseries. Weekend/weekday comparison module 5216 can generate a value of $Q_{ratio}$ for each week of each timeseries. In some embodiments, weekend/weekday comparison module 5216 stores the daily values of $Q_{ratio}$ as a new timeseries in local storage 514 and/or hosted storage 516. Each element of the new timeseries may correspond to a particular week and may include the calculated value of $Q_{ratio}$ for that week.

Weekend/weekday comparison module 5216 can receive a threshold parameter from parameters database 5206. The threshold parameter may be a threshold ratio between weekend load and weekday load. In some embodiments, the threshold ratio has a value of approximately T=0.5. However, it is contemplated that the threshold ratio can have any value in various other embodiments. The value of the threshold ratio can be defined/updated by a user, automatically calculated based on a history of previous weekend loads and weekday loads, or otherwise determined by weekend/weekday comparison module 5216.

Weekend/weekday comparison module 5216 can compare the calculated load ratio $Q_{ratio}$ to the threshold value T (or to some function of the threshold T). In some embodiments, weekend/weekday comparison module 5216 determines whether the calculated load ratio $Q_{ratio}$ exceeds the threshold T by a predetermined amount (e.g., 20%). For example, weekend/weekday comparison module 5216 can evaluate the following inequality to determine whether the calculated load ratio $Q_{ratio}$ exceeds the threshold T by a predetermined amount θ:

$$Q_{ratio} \geq \theta * T$$

where the parameter θ is a indicates an amount or percentage by which the ratio $Q_{ratio}$ must exceed the threshold T to qualify as a fault. For example, a value of 9=1.2 indicates that the ratio $Q_{ratio}$ qualifies as a fault if $Q_{ratio}$ exceeds the threshold T by 20% or more.

Weekend/weekday comparison module 5216 can output the load ratio timeseries as well as the results of the threshold comparisons. The results can include indications of whether the calculated load ratios $Q_{ratio}$ are above or below the threshold value T (or a function of the threshold value T), fault triggers and time stamps, or other results which can be derived from the threshold comparison (e.g., compliance or non-compliance with a standard, fault indications, etc.). For example, weekend/weekday comparison module 5216 may apply fault detection rules which define faults relative to threshold T. In some embodiments, a fault is defined as a predetermined number of samples of $Q_{ratio}$ that satisfy the inequality $Q_{ratio} \rightarrow \theta * T$. The fault indications can be stored as timeseries data in local storage 514 or hosted storage 516 or provided to applications 530, client devices 448, and/or remote systems and applications 444.

Figure 58:
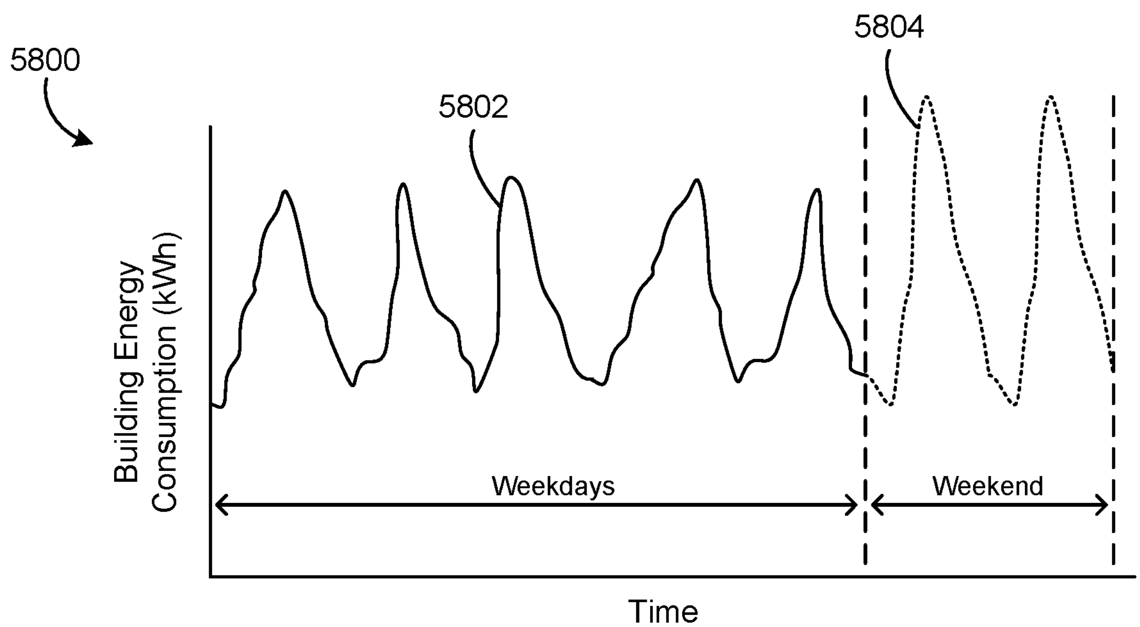
FIG. 58 is a chart of building energy consumption, which may be generated by the weekend/weekday comparison module of FIG. 52, highlighting a weekend with a high weekend-to-weekday energy consumption ratio, according to some embodiments.
Figure 59:
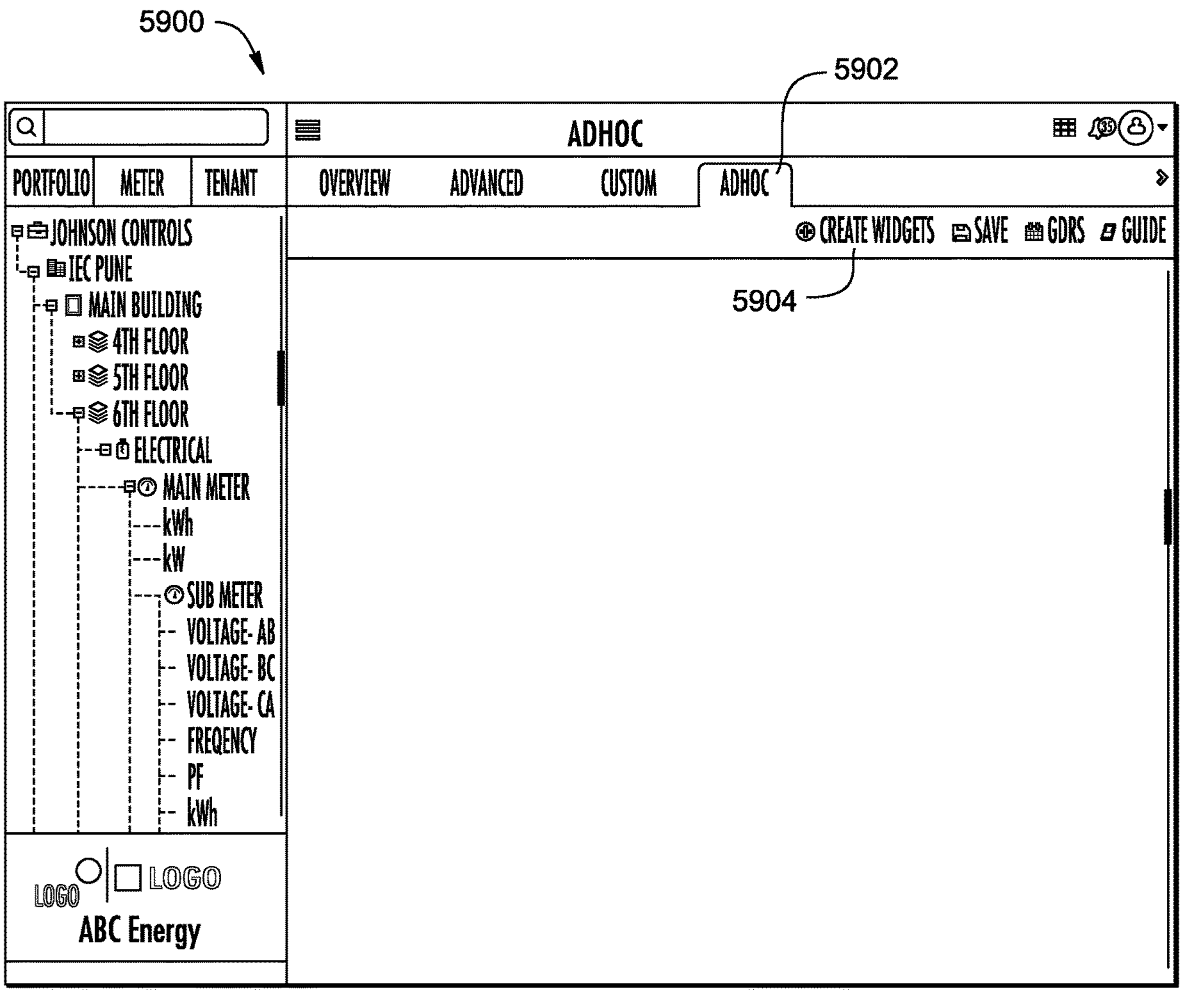
FIG. 59 is an ad hoc interface which may be generated by the BMS of FIG. 5, according to some embodiments.

In some embodiments, weekend/weekday comparison module 5216 generates plots or graphs which indicate the results of the threshold comparisons. An example of a graph 5800 which can be generated by weekend/weekday comparison module 5216 is shown in FIG. 58. Graph 5800 plots a timeseries 5802 of building energy consumption for a one-week period. For each week, weekend/weekday comparison module 5216 may identify all of the samples of timeseries 5802 with timestamps during that week. Weekend/weekday comparison module 5216 may also classify each sample of timeseries 5802 as either a weekend sample or a weekday sample based on the time at which the sample was recorded. Samples obtained during weekend days (i.e., Saturday and Sunday) may be classified as weekend samples, whereas samples obtained during weekdays (i.e., Monday-Friday) may be classified as weekday samples.

For each week, weekend/weekday comparison module 5216 may calculate the average of the weekday samples for that week (i.e., $Q_{weekday}$) and the average of the weekend samples for that week (i.e., $Q_{weekend}$). Weekend/weekday comparison module 5216 can calculate a ratio $Q_{ratio}$ for each week using the following equation:

$$Q_{ratio} = \frac{Q_{weekend}}{Q_{weekday}}$$

and can compare the calculated ratio to a threshold T (or a function of threshold T) as shown in the following inequality:

$$Q_{ratio} \geq \theta * T$$

If the ratio $Q_{ratio}$ for a given day satisfies the inequality, weekend/weekday comparison module 5216 can automatically highlight, color, or otherwise mark the weekend samples for that week in graph 5800. For example, samples 5804 for the weekend may be colored red to indicate that the ratio $Q_{ratio}$ exceeds the threshold T by the amount θ (e.g., 20%).

Ad Hoc Dashboard

Referring now to FIGS. 59-87, several user interfaces which can be generated by building management system 500 are shown, according to an exemplary embodiment. In some embodiments, user interfaces are generated by energy management application 532, monitoring and reporting application 534, enterprise control application 536, or other applications 530 that consume the optimized timeseries data generated by data platform services 520. For example, the user interfaces can be generated by a building energy management system which includes an instance of energy management application 532. One example of such a building energy management system is the METASYS® Energy Management System (MEMS) by Johnson Controls Inc. The building energy management system can be implemented as part of building management system 500 (e.g., one of applications 530) or as a cloud-based application (e.g., one of remote systems and applications 444) in communication with building management system 500 via communications network 446 (e.g., the Internet, a LAN, a cellular network, etc.).

In some embodiments, the user interfaces are components of an ad hoc dashboard 5900. Ad hoc dashboard 5900 may be displayed when a user clicks ad hoc tab 5902 shown in FIG. 59. Ad hoc dashboard 5900 may be customizable to allow the user to create and configure various types of widgets. The widgets can be configured to visually present timeseries data from local storage 514 or hosted storage 516, as well as other types of information. For example, ad hoc dashboard 5900 can be customized to include charting widgets, data visualization widgets, display widgets, time and date widgets, weather information widgets, and various other types of widgets. Several examples of user interfaces for creating and configuring widgets are described in detail below.

Creating Widgets

Figure 60:
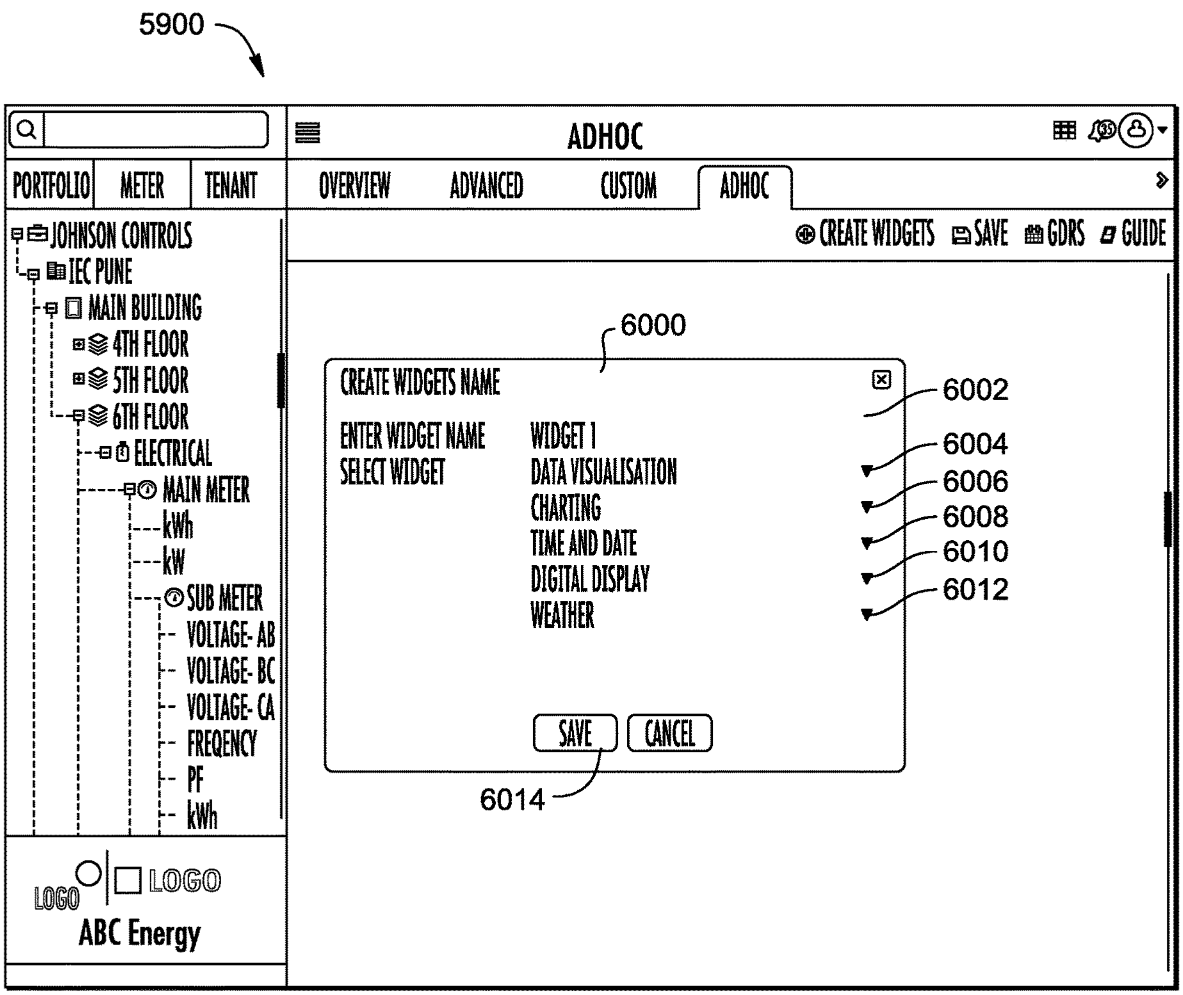
FIGS. 60-61 are interfaces for creating widgets in the ad hoc interface of FIG. 59, according to some embodiments.
Figure 61:
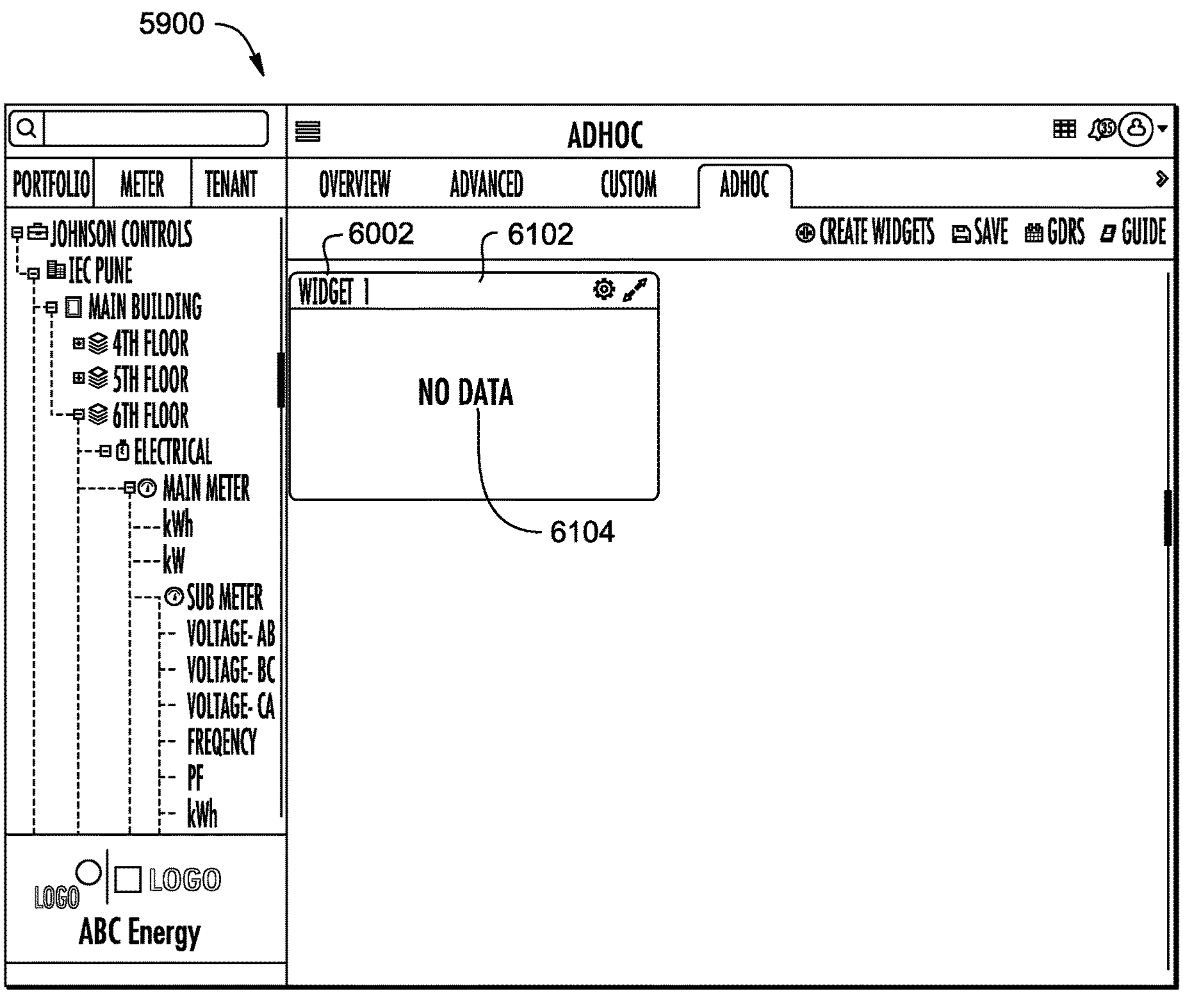

Referring now to FIGS. 60-61, a user interface 6000 for creating widgets is shown, according to an exemplary embodiment. User interface 6000 may be displayed as a popup when a user clicks the "Create Widgets" button 5904 in ad hoc dashboard 5900. Interface 6000 may allow a user to enter a widget name 6002 ("Widget 1") and select a type of widget to create. In some embodiments, the user selects a widget type by selecting an option presented via one of dropdown menus 6004-6012.

Selecting data visualization dropdown menu 6004 may display a list of data visualization widgets that can be created. In some embodiments, the data visualization widgets include a heat map widget, a radial gauge widget, a histogram widget, and a psychometric chart widget. Selecting charting dropdown menu 6006 may display a list of charting widgets that can be created. In some embodiments, the charting widgets include a line chart widget, an area chart widget, a column chart widget, a bar chart widget, a stacked chart widget, and a pie chart widget. Selecting time and date dropdown menu 6008 may display a list of time and date widgets that can be created. In some embodiments, the time and date widgets include a date display widget, a digital clock widget, and an analog clock widget. Selecting display dropdown menu 6010 may display a list of display widgets that can be created. In some embodiments, the display widgets include a data point widget, a data grid widget, a text box widget, and an image widget. Selecting weather dropdown menu 6012 may display a list of weather widgets that can be created. In some embodiments, the weather widgets include a current weather information widget and a weather forecast widget.

After the user selects a widget via one of dropdown menus 6004-6012, the user can click save button 6014 to create an empty widget of the selected type. An example of an empty widget 6102 which can be created is shown in FIG. 61. Empty widget 6102 may include the widget name 6002 and text 6104 indicating that no data is currently associated with empty widget 6102. Empty widget 6102 can be associated with one or more timeseries via widget configuration interface 6200.

Configuring Widgets

Figure 62:
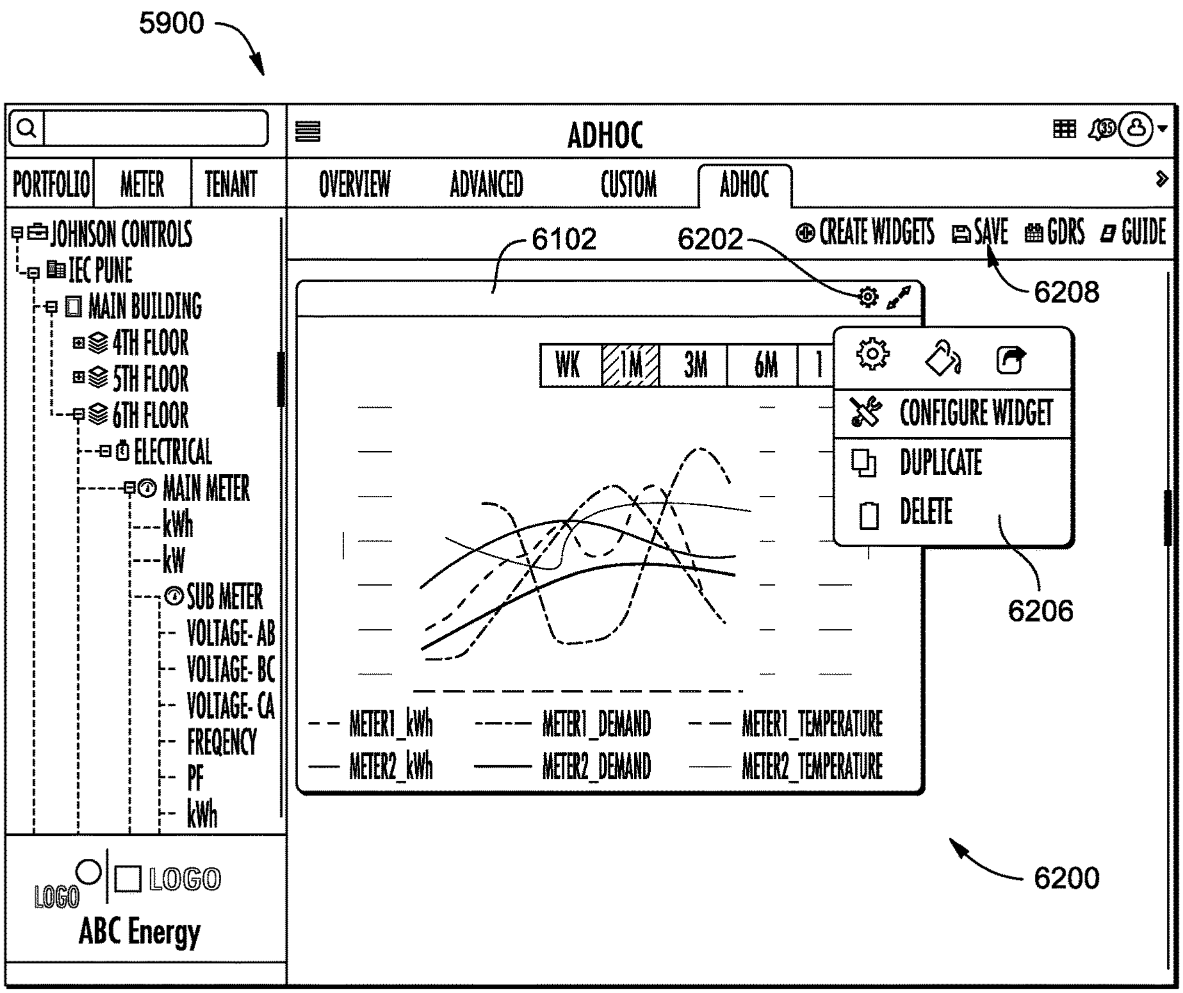
FIGS. 62-63 are interfaces for configuring widgets in the ad hoc interface of FIG. 59, according to some embodiments.
Figure 63:
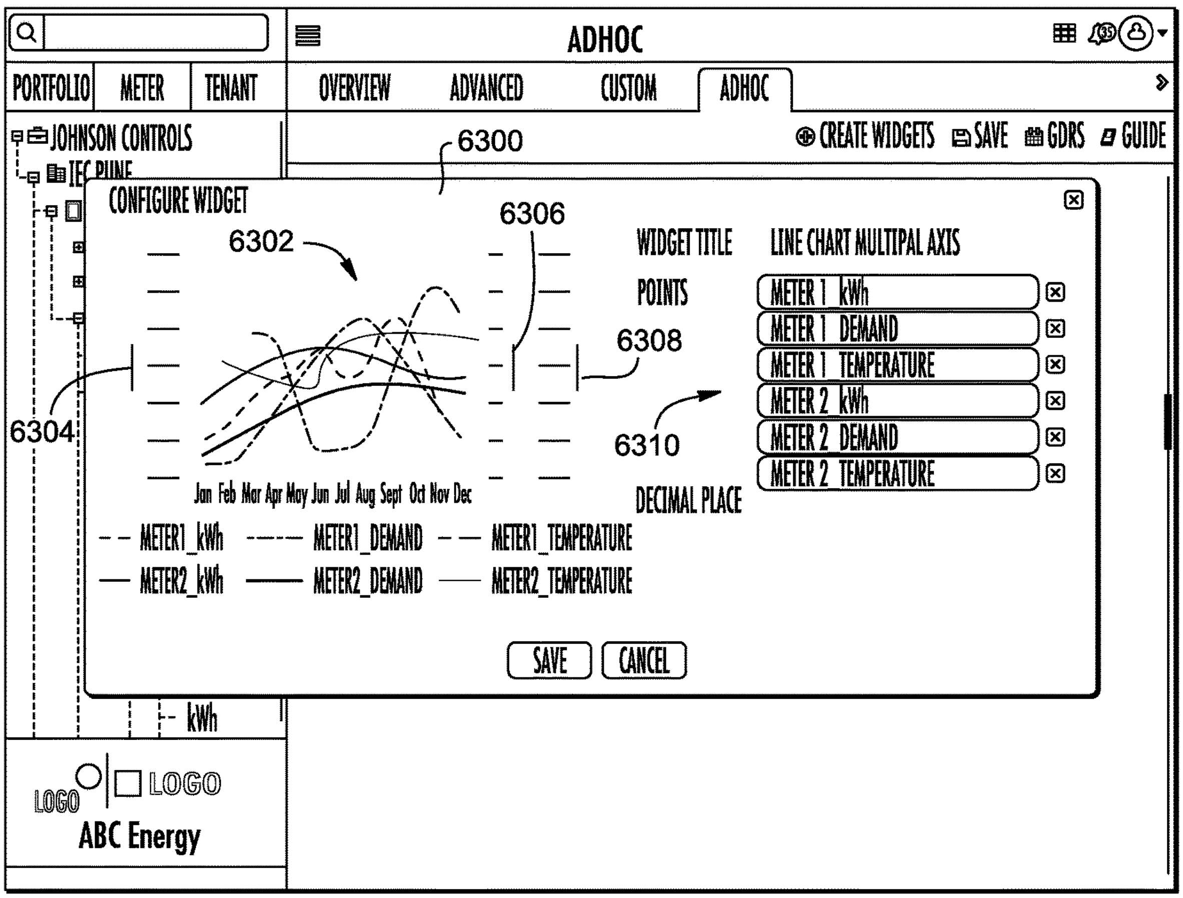

Referring now to FIGS. 62-63, a widget configuration interface 6200 is shown, according to an exemplary embodiment. Widget configuration interface 6200 allows a user to associate an empty widget 6102 with one or more timeseries or other types of data. For example, points from meter tree 6204 can be dragged and dropped into empty widget 6102 to associate the corresponding timeseries data with empty widget 6102. Although only a meter tree 6204 is shown, points can also be dragged and dropped from other types of trees such as an equipment tree. Upon dragging and dropping a point into empty widget 6102, a chart of the timeseries data associated with the selected point may begin populating. Empty widget 6102 can also be configured by selecting options button 6202 and selecting "configure widget" from dropdown menu 6206. Dropdown menu 6206 may also include options to delete or duplicate the selected widget. Duplicating a widget may include duplicating any points mapped to the widget as well as the widget's size and theme.

FIG. 63 illustrates a configure widget popup 6300 which may be displayed in response to a user selecting the configure widget option via dropdown menu 6206. Configure widget popup 6300 is an example of a configuration interface for a line chart widget. A line chart widget can be created by selecting the create widgets button 5904 in ad hoc dashboard 5900 and selecting line chart from the charting dropdown menu 6006. When a user drags and drops any point from meter tree 6204, a line chart 6302 with a single line may appear. Line chart 6302 may plot the timeseries samples associated with the selected point. The x-axis of line chart 6302 may be units of time, whereas the y-axis of line chart 6302 may be the unit of measure (UOM) of the selected point (e.g., kWh, kW, etc.). An axis label 6304 with the UOM of the timeseries may be displayed along the y-axis.

If a second point with a different UOM is added to line chart 6302 (e.g., by dragging and dropping the second point), line chart 6302 may be automatically updated to include a second line plotting the timeseries samples associated with the second point. The different UOM may be displayed along the y-axis of line chart 6302 on the opposite side (e.g., right side) from the UOM of the first point. An axis label 6306 with the UOM of the second point may be displayed along the y-axis of line chart 6302. Any number of points can be added to line chart 6302 regardless of whether the points have the same or different UOM.

In some embodiments, timeseries with different units of measure may be displayed in different colors in line chart 6302, whereas timeseries with same units of measure may be displayed in the same color but as different line types (e.g., solid lines, dashed lines, etc.). The axis labels 6304, 6304, and 6308 and numerical values along the y-axes of line chart 6302 may have the same colors as the timeseries plotted in the corresponding UOM. For example, axis label 6304 and the corresponding numerical values along the left side of line chart 6302 may be colored blue along with any lines which present data in that UOM (e.g., kWh, energy). Axis label 6306 and the corresponding numerical values along the right side of line chart 6302 may be colored green along with any lines which present data in that UOM (e.g., kW, power). A different color may be used for each axis label and timeseries line associated with a different UOM.

In some embodiments, configure widget popup 6300 displays a list 6310 of the points mapped to the widget. Each point in points list 6310 may identify the point name and may allow the user to edit the names of the mapped points, delete one or more of the mapped points, define the decimal places for the values of the mapped points, and make other edits to the mapped points. Configure widget popup 6300 may also allow the user to edit the widget title. A preview of the chart 6302 may be displayed in configure widget popup 6300 to allow the user to see the changes in real time without closing configure widget popup 6300.

After a widget has been created, the user can click save button 6208 to save the widget to ad hoc dashboard 5900. In some embodiments, a different ad hoc dashboard 5900 can be created for each level of building space, meter, and equipment. The widgets saved to a particular ad hoc dashboard 5900 may be displayed when dashboard 5900 is refreshed (e.g., by refreshing a webpage in which ad hoc dashboard 5900 is displayed).

Data Aggregation Widget

Figure 64:
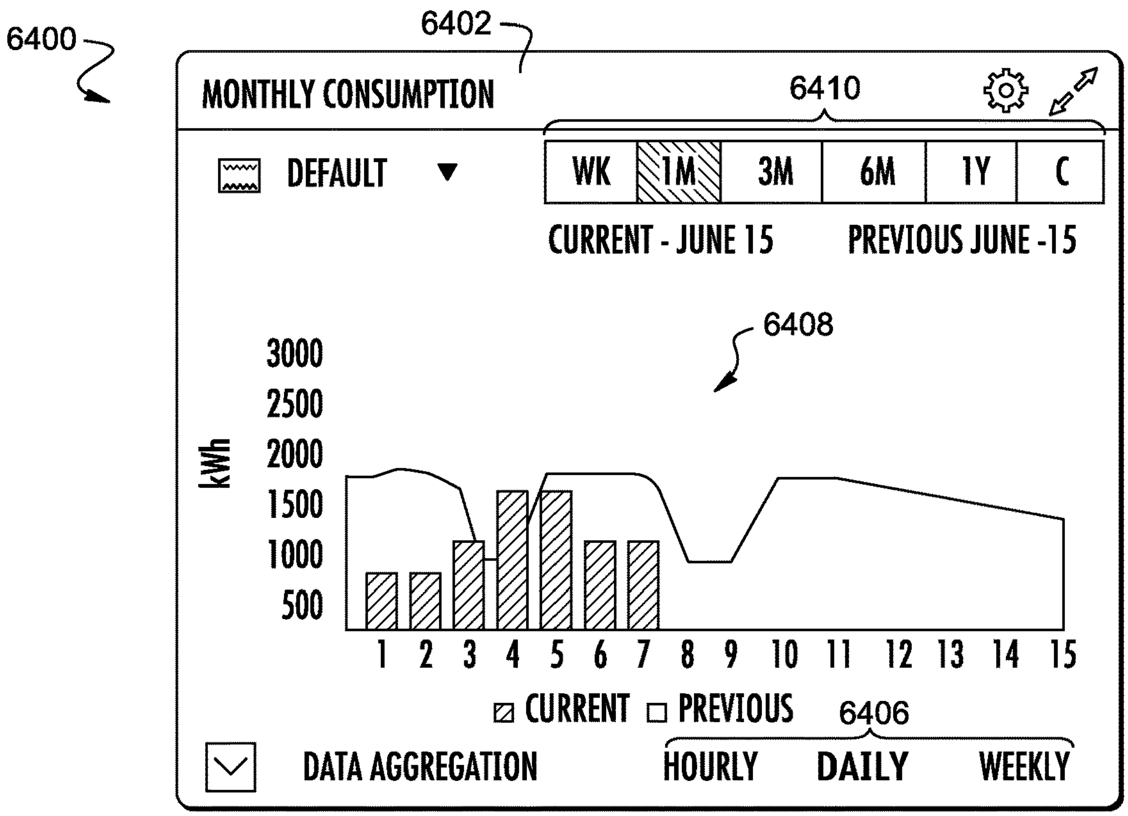
FIGS. 64-66 are interfaces for aggregating and displaying timeseries data in the ad hoc interface of FIG. 59, according to some embodiments.
Figure 65:
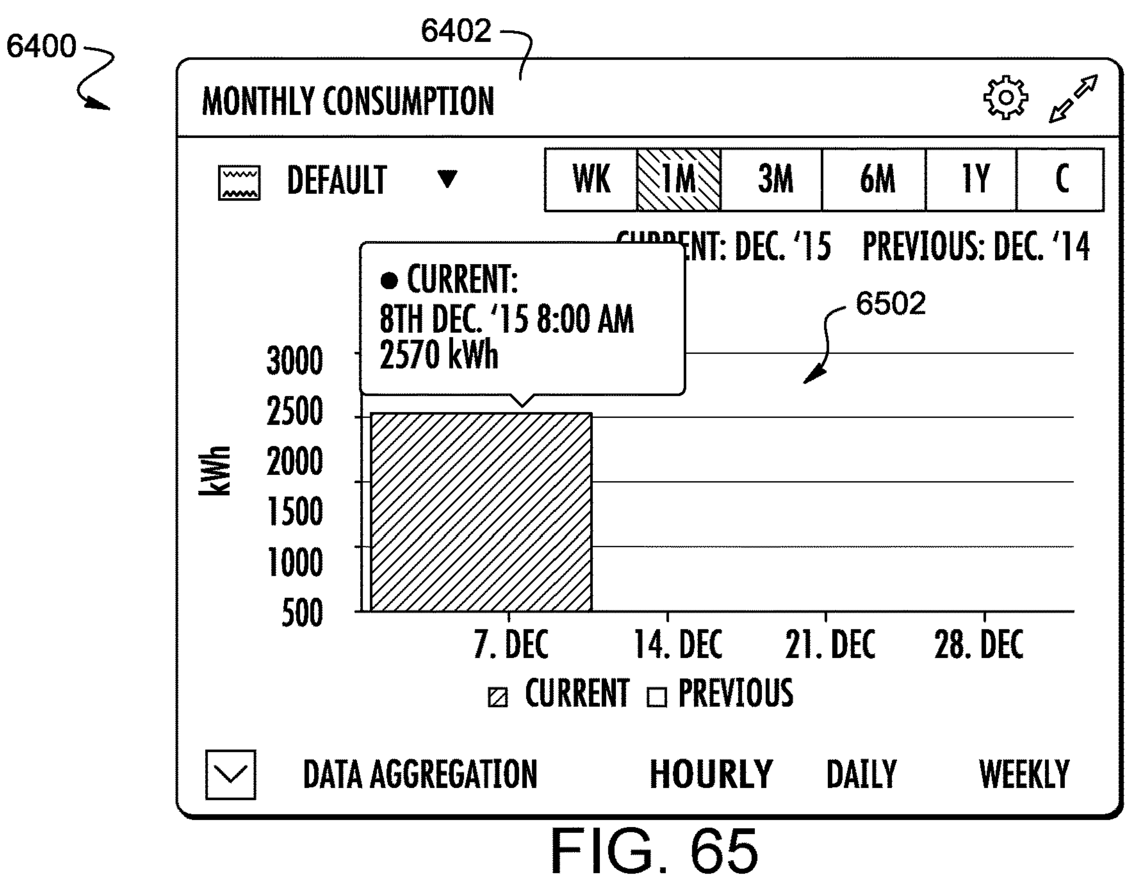
Figure 66:
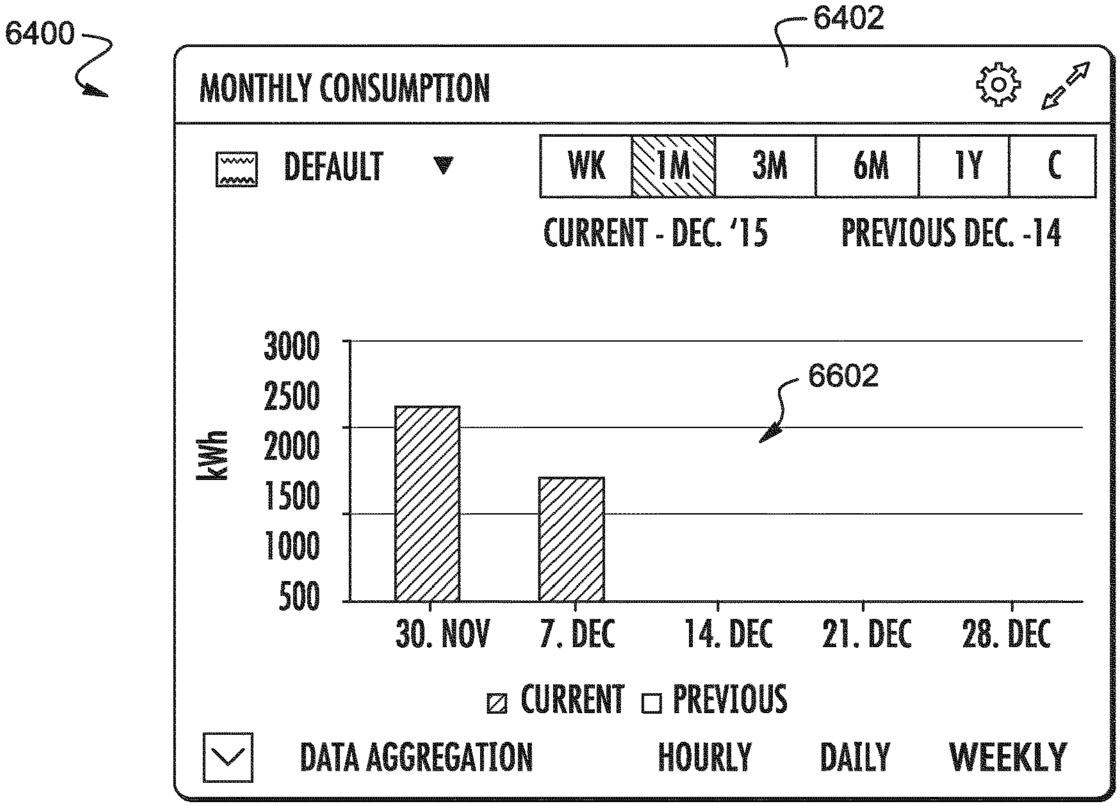

Referring now to FIGS. 64-66, a data aggregation interface 6400 is shown, according to an exemplary embodiment. Data aggregation interface 6400 allows a user to view the timeseries data associated with a particular data point with different levels of granularity. For example, interface 6400 is shown to include an energy consumption widget 6402 which displays the timeseries data associated with an energy consumption timeseries. Depending on the timeframe selected via timeframe selector 6410, different data aggregation options 6406 may be displayed. For example, if one year is selected via timeframe selector 6410, data aggregation options 6406 may include hourly, daily, weekly, and monthly (default). If six months is selected via timeframe selector 6410, data aggregation options 6406 may include hourly, daily, weekly, and monthly (default). If three months is selected via timeframe selector 6410, data aggregation options 6406 may include hourly, daily, weekly, and monthly (default). If one month is selected via timeframe selector 6410, data aggregation options 6406 may include hourly, daily (default), and weekly. If one week is selected via timeframe selector 6410, data aggregation options 6406 may include fifteen minutes, hourly, and daily (default). The default value may be highlighted.

Different data aggregation options 6406 may also be displayed for custom time periods. For example, if a custom time period of less than one week is selected via timeframe selector 6410, data aggregation options 6406 may include fifteen minutes, hourly, and daily. If a custom time period between one week and one month is selected via timeframe selector 6410, data aggregation options 6406 may include fifteen minutes, hourly, daily, and weekly. If a custom time period of one month or longer is selected via timeframe selector 6410, data aggregation options 6406 may include hourly, daily, weekly, and monthly.

In some embodiments, widget 6402 is automatically updated to display the timeseries data associated with the selected aggregation option. For example, widget 6402 may display an hourly data rollup timeseries for the point if the hourly data aggregation option is selected via aggregation options 6406. However, widget 6402 may display a weekly data rollup timeseries for the same point if the weekly data aggregation option is selected via aggregation options 6406. The x-axis of chart 6408 may also be updated based on the selected data aggregation option. For example, widget 6402 may include a chart 6408 with an x-axis scaled to daily energy consumption values when the daily aggregation option is selected (shown in FIG. 64). However, widget 6402 may include a chart 6602 with an x-axis scaled to weekly energy consumption values when the weekly aggregation option is selected (shown in FIG. 66). In some embodiments, widget 6402 includes a chart 6502 with an x-axis scaled to one data aggregation option (e.g., weekly), whereas the data presented in chart 6502 may be from a more granular timeseries. For example, FIG. 65 shows a chart 6502 with an x-axis scaled to weekly intervals and displaying hourly values of the energy consumption.

Heat Map Widget

Figure 67:
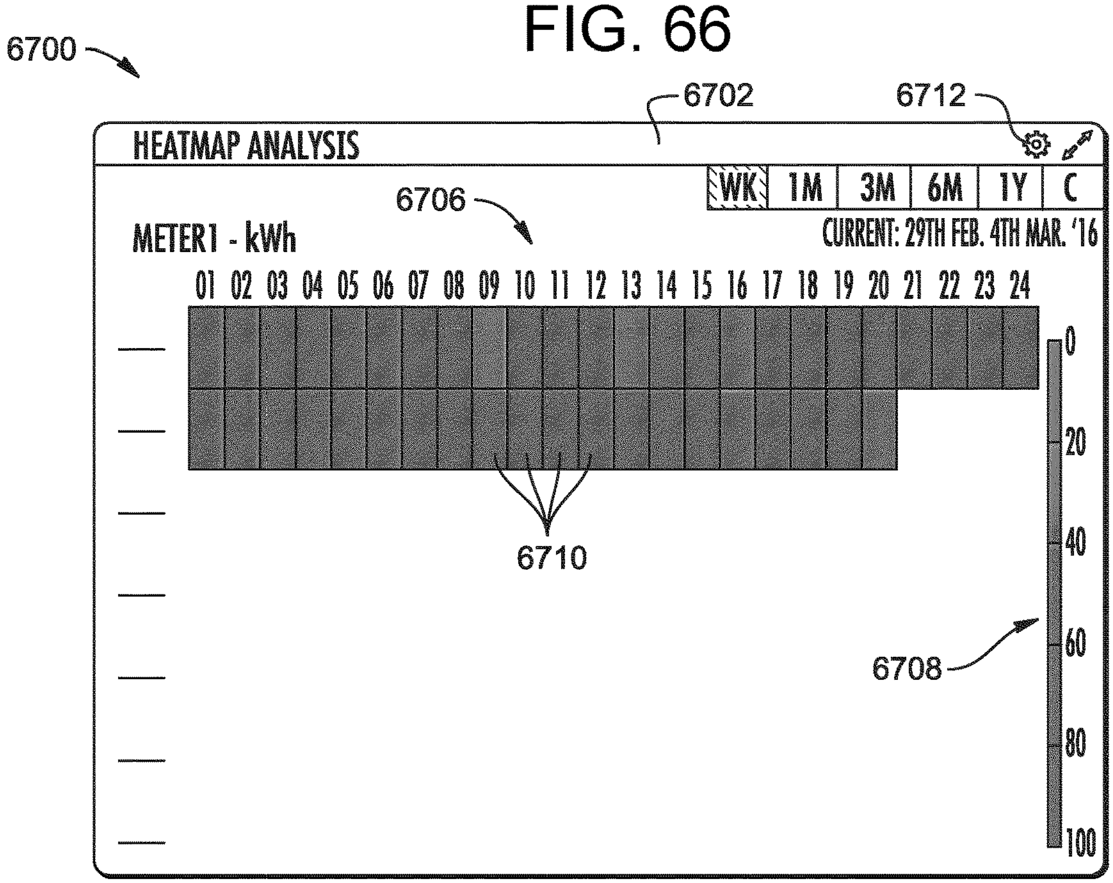
FIGS. 67-69 are interfaces for creating and configuring heat map widgets in the ad hoc interface of FIG. 59, according to some embodiments.
Figure 68:
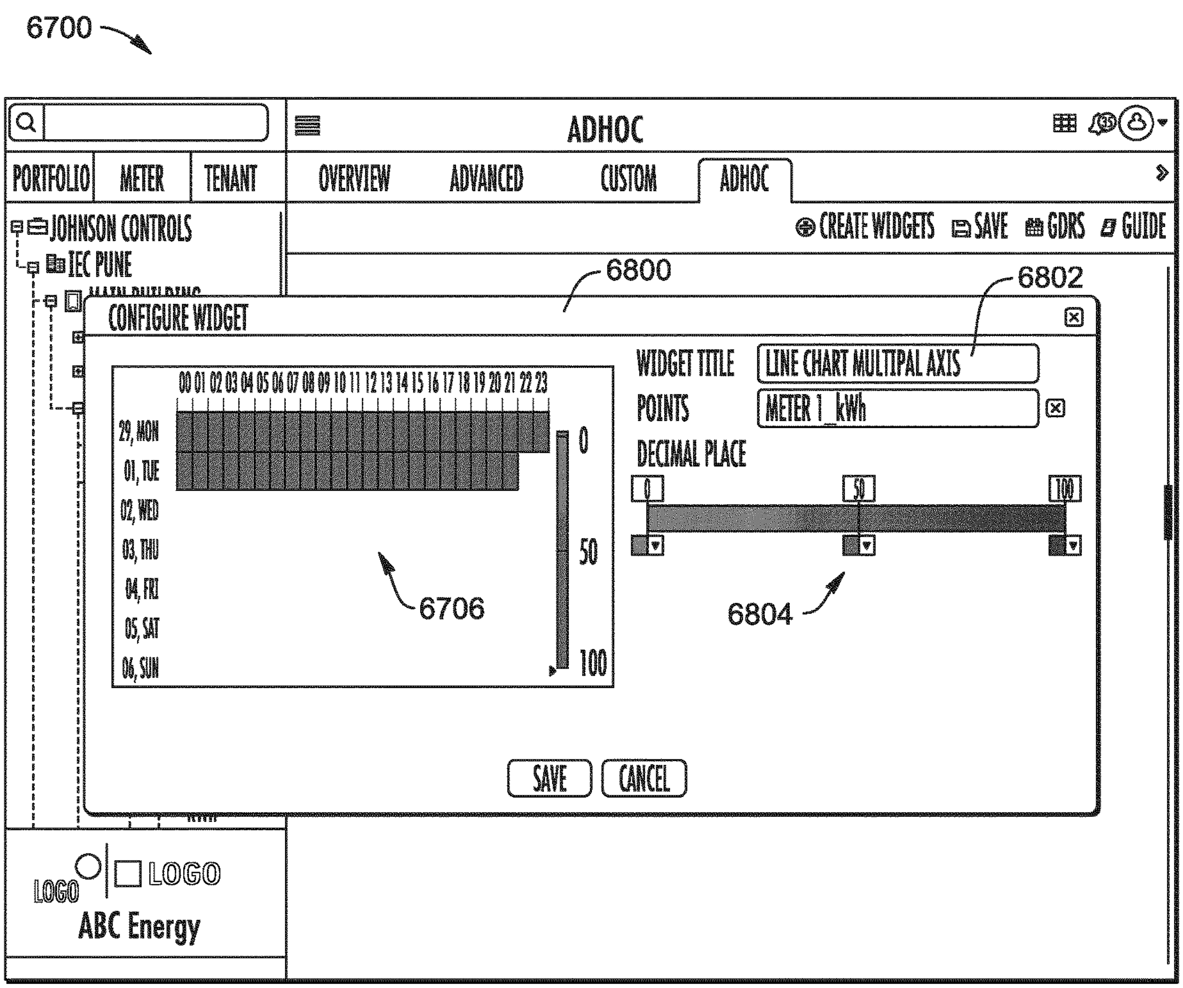
Figure 69:
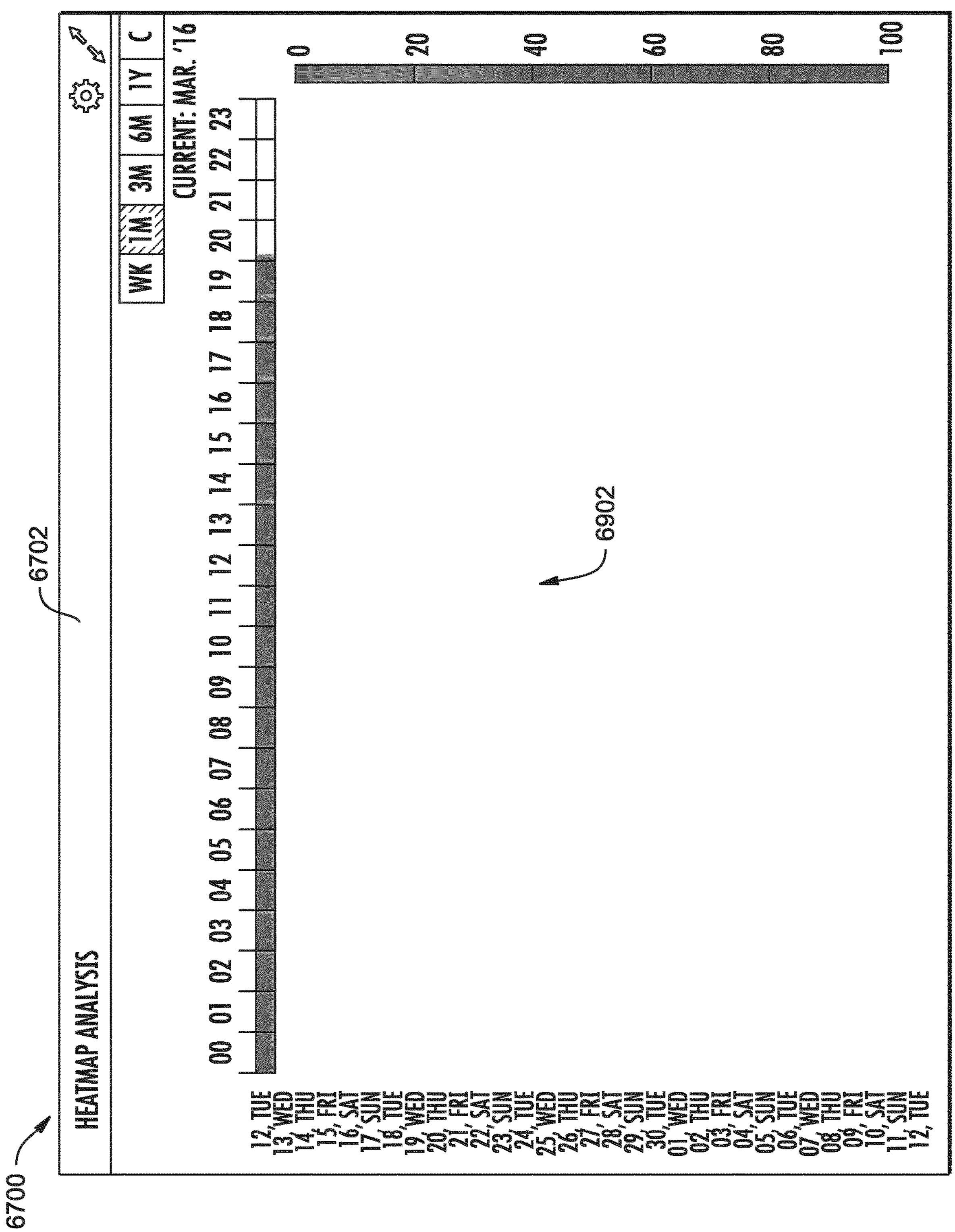

Referring now to FIGS. 67-69, an interface 6700 for creating and configuring a heat map widget 6702 is shown, according to an exemplary embodiment. Heat map widget 6702 can be created by selecting the create widgets button 5904 in ad hoc dashboard 5900 and selecting heat map from the data visualization dropdown menu 6004. When a user drags and drops any meter point from meter tree 6204, a heat map 6706 may appear. In some embodiments, heat map 6706 is automatically overwritten if the user drags and drops a second meter point from meter tree 6204. Interface 6700 may display a message indicating that the point mapping has been appended or changed when heat map 6706 is updated with a second meter point.

Heat map 6706 may present timeseries data as a plurality of cells 6710. Each of cells 6710 may correspond to one sample of the corresponding timeseries. For example, heat map 6706 is shown displaying hourly values of an energy consumption timeseries. Each row of heat map 6706 corresponds to a particular day, whereas each column of heat map 6706 corresponds to an hour of the day. Cells 6710 located at the intersections of the rows and columns represent the hourly values of the energy consumption timeseries. In some embodiments, the hourly energy consumption values (or any other type of data presented via heat map 6707) are indicated by the color or other attribute of cells 6710. For example, cells 6710 may have different colors that represent different energy consumption values. A key 6708 indicates the colors that represent different numerical values of the energy consumption timeseries. As new samples of the timeseries are collected, new cells 6710 may be added to heat map 6706. Hovering over any of cells 6710 may display the timestamp of the sample associated with the cell, the point name, and/or the numerical value of the sample associated with the cell.

In some embodiments, heat map widget 6702 includes an options button 6712. Selecting options button 6712 may display a configure widget popup 6800 (shown in FIG. 68). Configure widget popup 6800 may allow a user to edit the widget title 6802, delete the mapped point, edit the names of the mapped point, define the decimal places for the values of the mapped point, edit the minimum and maximum of the color range for heat map 6706, and select a color palate for heat map 6706. In some embodiments, configure widget popup 6800 includes a preview of heat map 6706. Heat map widget 6702 may automatically update heat map 6706 based on the time interval and custom filter selected. For example, selecting a time interval of one week may result in heat map 6706 which includes hourly values for each hour in the selected week (shown in FIG. 67). However, selecting a time interval of one year may result in heat map 6902 which includes energy consumption values (e.g., hourly, daily, etc.) for each day in the year.

Text Box Widget

Figure 70:
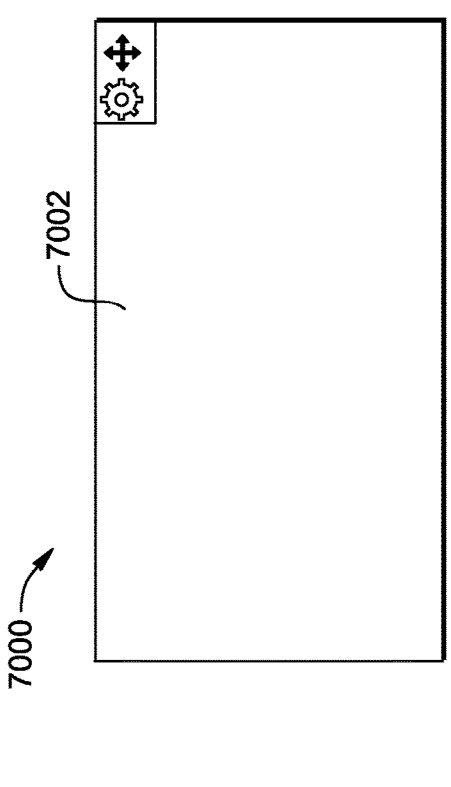
FIGS. 70-71 are interfaces for creating and configuring text box widgets in the ad hoc interface of FIG. 59, according to some embodiments.
Figure 71:
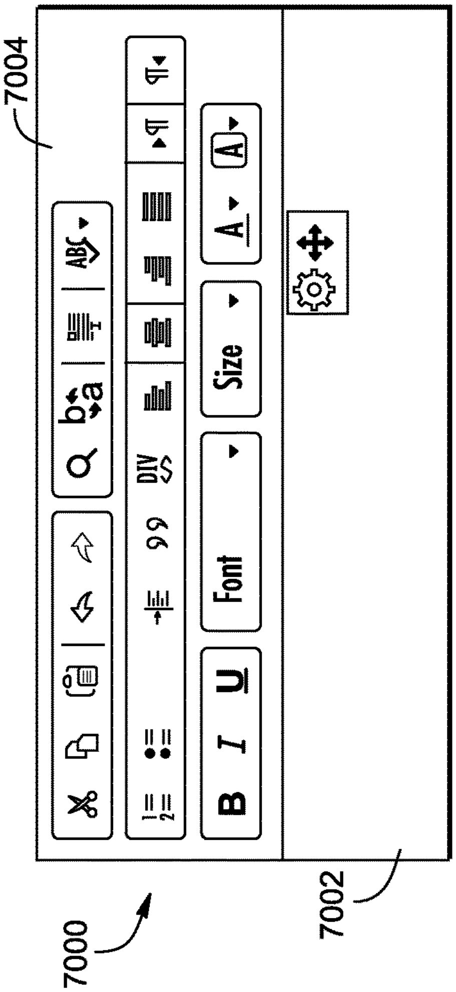

Referring now to FIGS. 70-71, an interface 7000 for creating and configuring a text box widget 7002 is shown, according to an exemplary embodiment. Text box widget 7002 can be created by selecting the create widgets button 5904 in ad hoc dashboard 5900 and selecting text box from the display dropdown menu 6010. Clicking anywhere within text box widget 7002 may display a menu 7004 to add or edit text. A user can change the font, size, color, or other attributes of the text via menu 7004. Clicking outside text box widget 7002 may hide menu 7004. Text box widget 7002 can be moved, resized, duplicated, and deleted by selecting various options presented via interface 7000.

Image Widget

Figure 72:
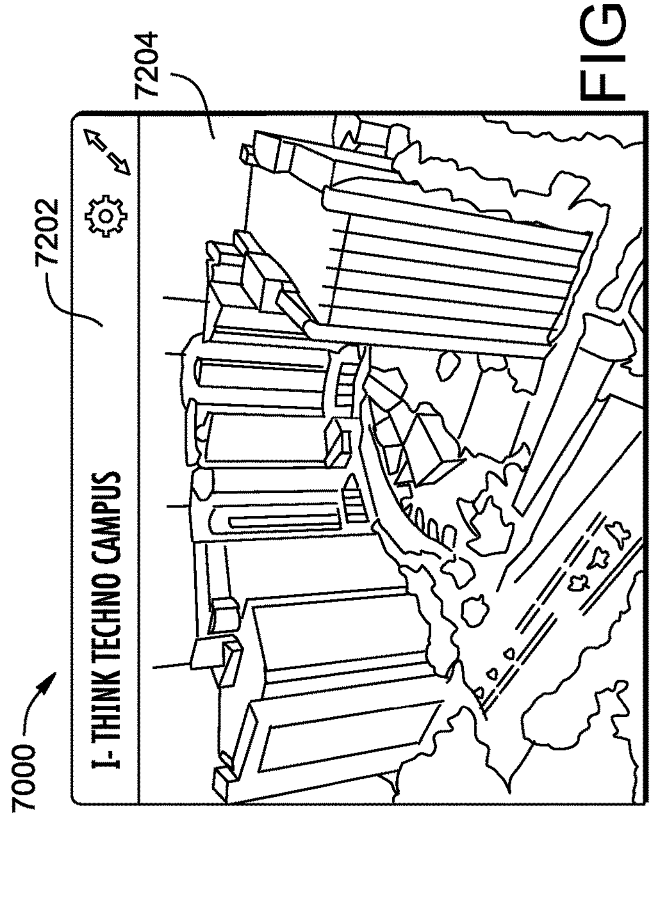
FIGS. 72-73 are interfaces for creating and configuring image widgets in the ad hoc interface of FIG. 59, according to some embodiments.
Figure 73:
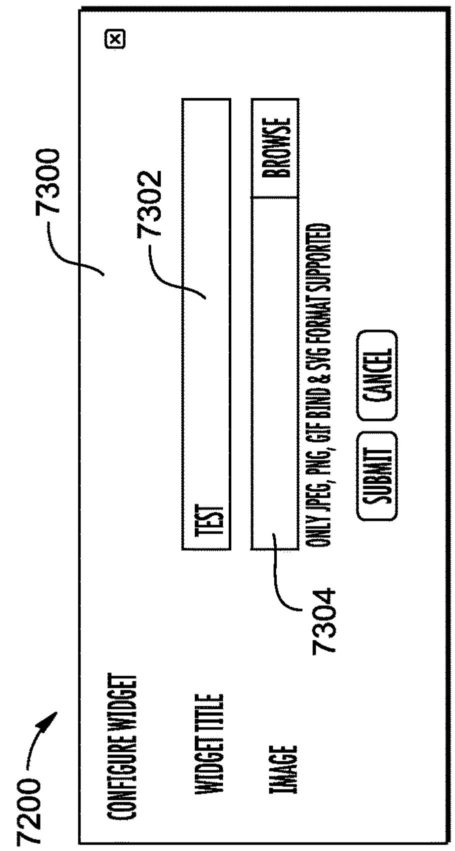
Figure 74:
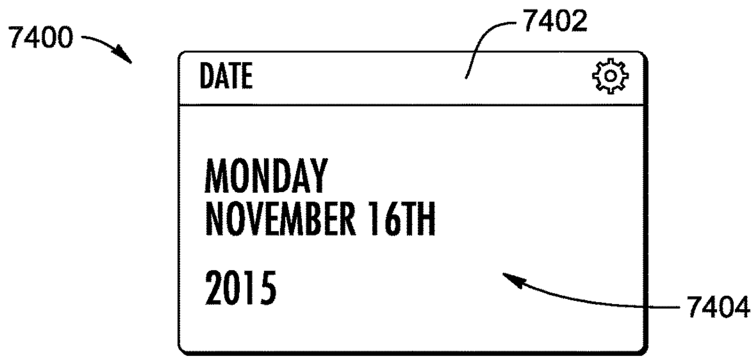
FIGS. 74-75 are interfaces for creating and configuring date widgets in the ad hoc interface of FIG. 59, according to some embodiments.
Figure 75:
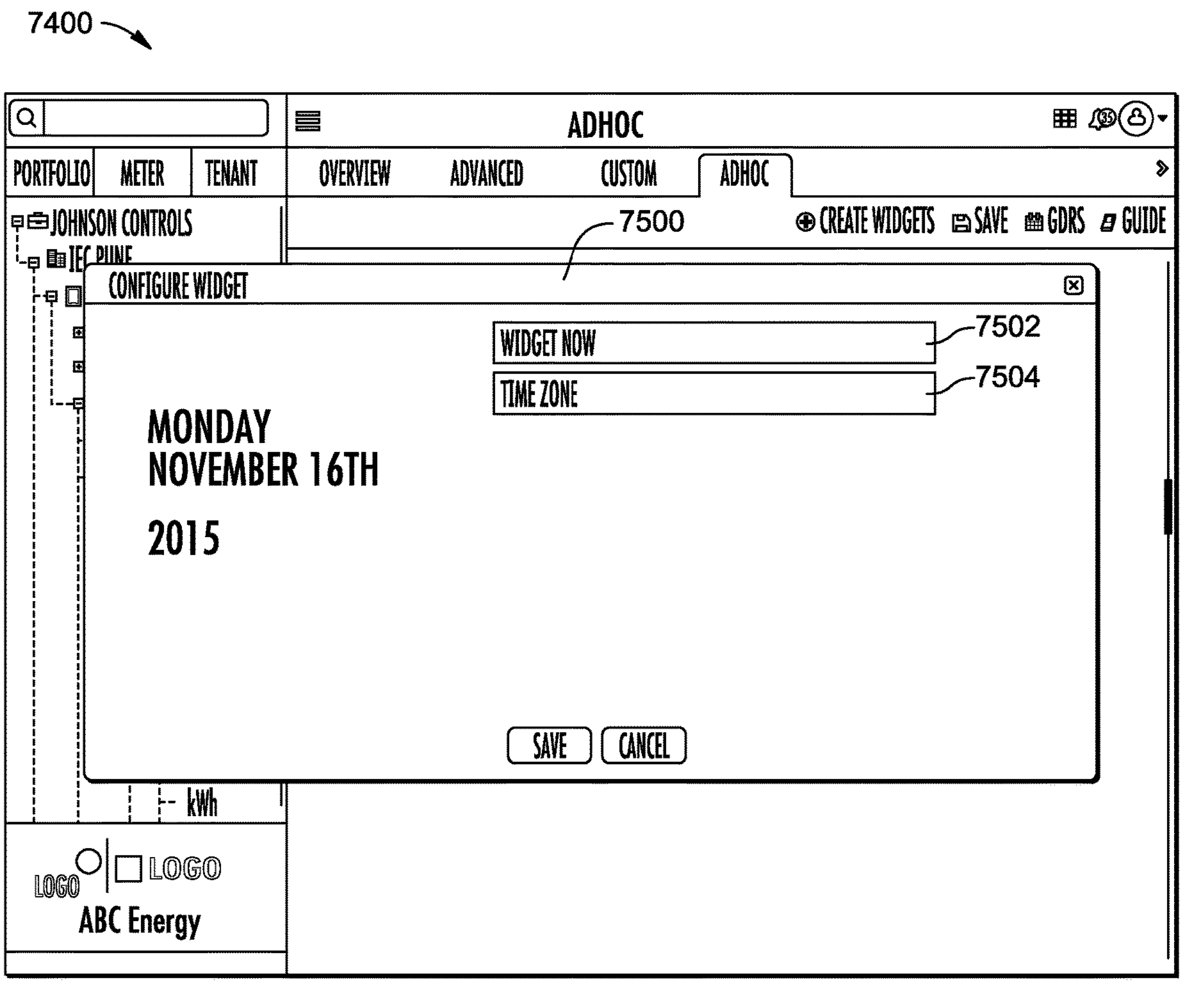
Figure 76:
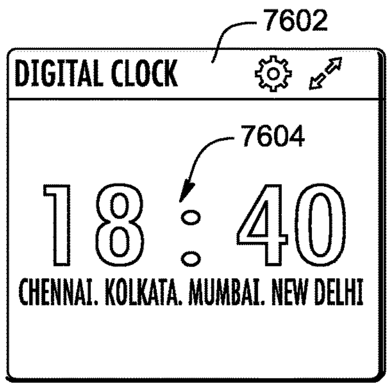
FIGS. 76-78 are interfaces for creating and configuring clock widgets in the ad hoc interface of FIG. 59, according to some embodiments.
Figure 77:
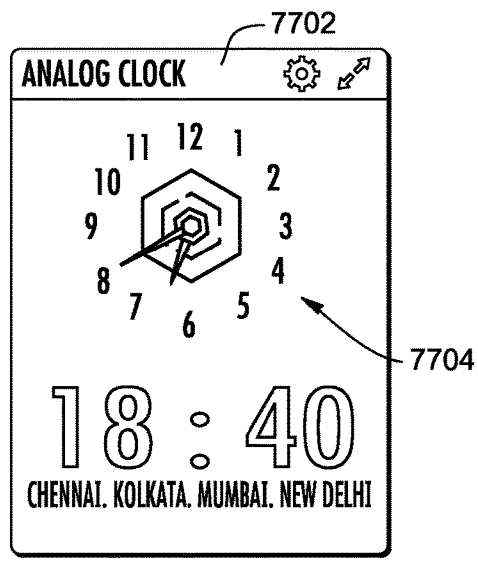
Figure 78:
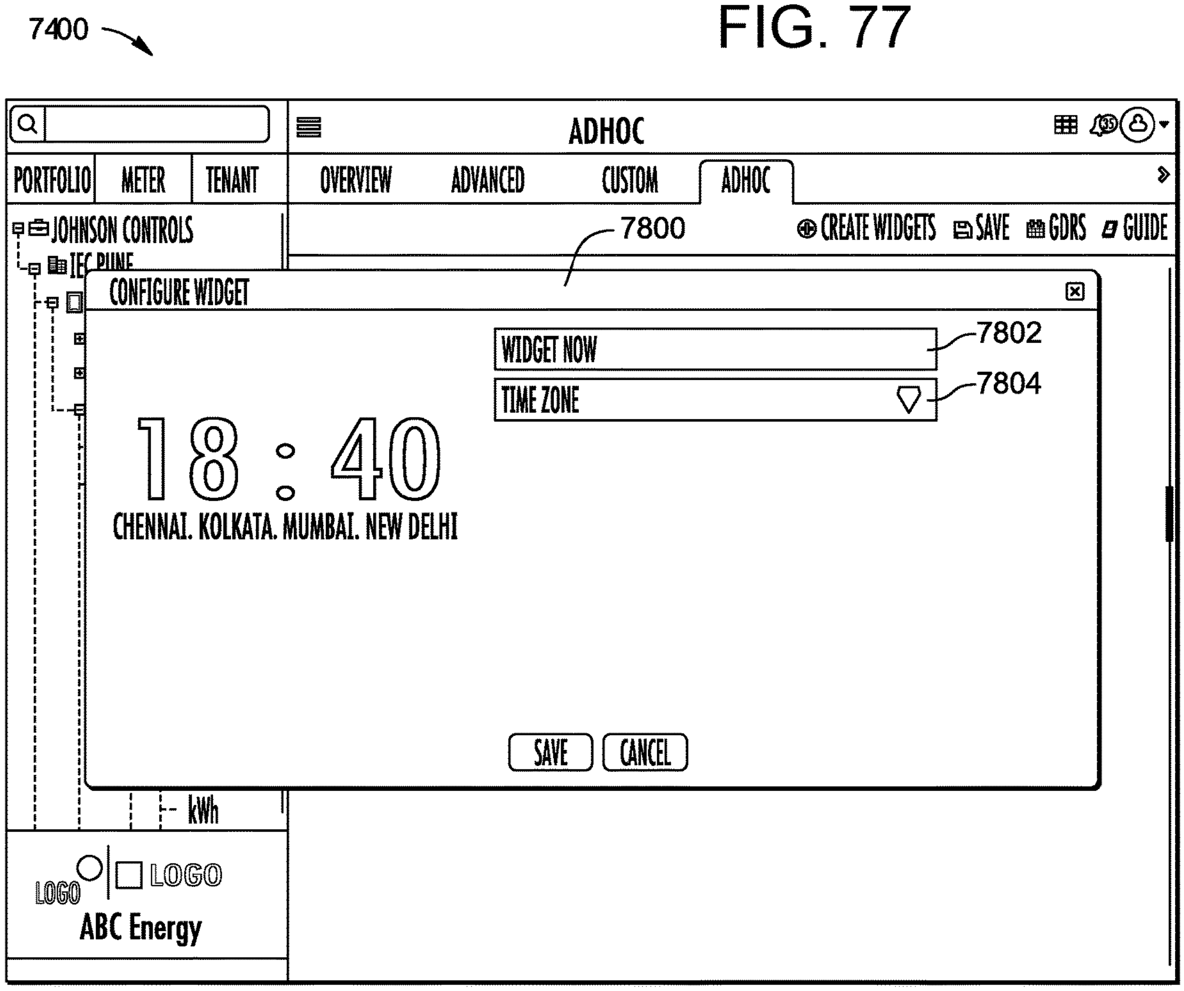

Referring now to FIGS. 72-73, an interface 7200 for creating and configuring an image widget 7202 is shown, according to an exemplary embodiment. Image widget 7202 can be created by selecting the create widgets button 5904 in ad hoc dashboard 5900 and selecting image from the display dropdown menu 6010. When image widget 7202 is first created, widget 7202 may be blank or may display text that instructs a user how to upload an image 7204 to widget 7202. Image 7204 can be selected via a configure widget popup 7300. Configure widget popup 7300 may allow the user to edit the widget title 7302 and select an image via image selector 7304. The selected image 7204 may occupy the entire area of image widget 7202.

Time and Date Widgets

Referring now to FIGS. 74-78, an interface 7400 for creating and configuring time and date widgets is shown, according to an exemplary embodiment. Time and date widgets can include a date widget 7402 (shown in FIG. 74), a digital clock widget 7602 (shown in FIG. 76), and an analog clock widget 7702 (shown in FIG. 77). Date widget 7402 can be created by selecting the create widgets button 5904 in ad hoc dashboard 5900 and selecting date display from the time & date dropdown menu 6008. Date widget 7402 may include graphics or text 7404 that indicates the current date, day of the week, month, year, or other date information. Date widget 7402 can be edited via a configure widget popup 7500 which allows a user to edit the widget title 7502, time zone 7504, and other information associated with date widget 7402.

Digital clock widget 7602 can be created by selecting the create widgets button 5904 in ad hoc dashboard 5900 and selecting digital clock from the time & date dropdown menu 6008. Similarly, analog clock widget 7702 can be created by selecting the create widgets button 5904 in ad hoc dashboard 5900 and selecting analog clock from the time & date dropdown menu 6008. Digital clock widget 7602 may include a digital clock 7604, whereas analog clock widget 7702 may include an analog clock 7704. Clock widgets 7602 and 7702 can be edited via a configure widget popup 7800 which allows a user to edit the widget title 7802, time zone 7804, and other information associated with clock widgets 7602 and 7702.

Weather Widgets

Figure 79:
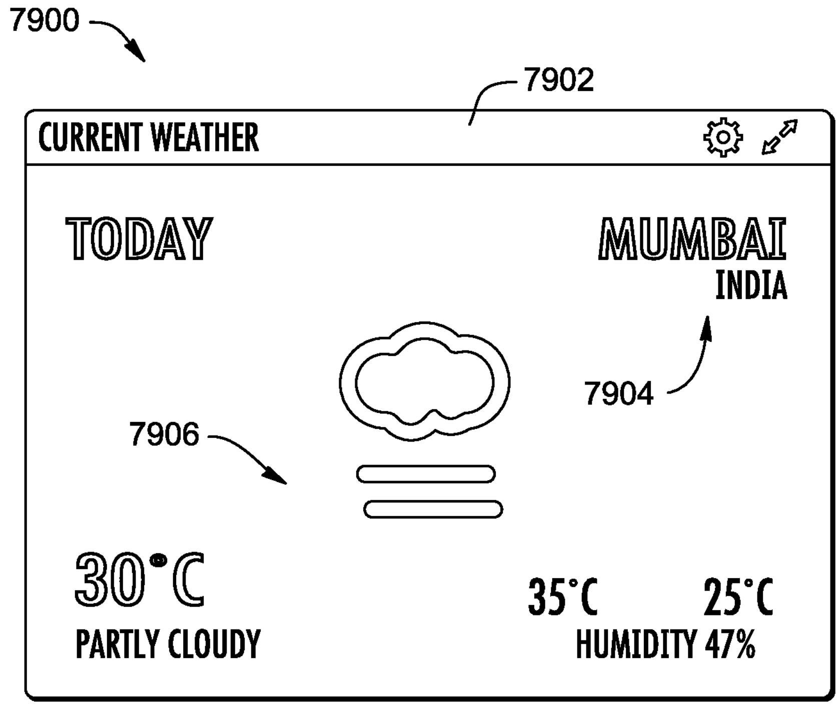
FIGS. 79-81 are interfaces for creating and configuring weather widgets in the ad hoc interface of FIG. 59, according to some embodiments.
Figure 80:
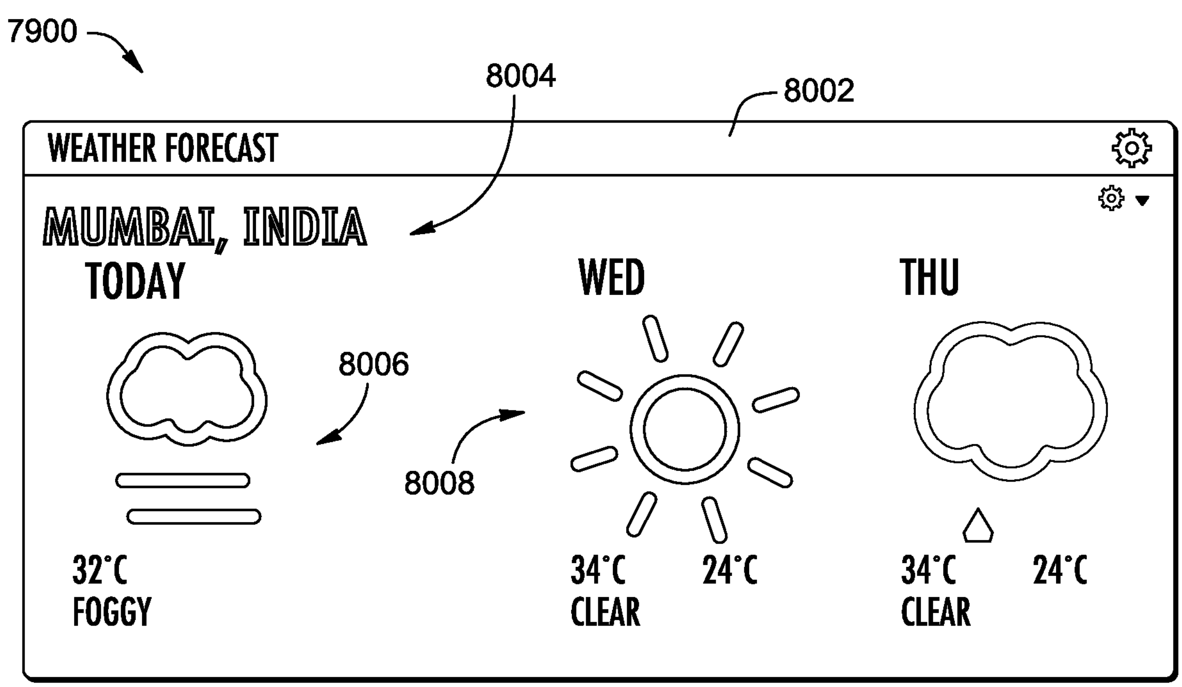
Figure 81:
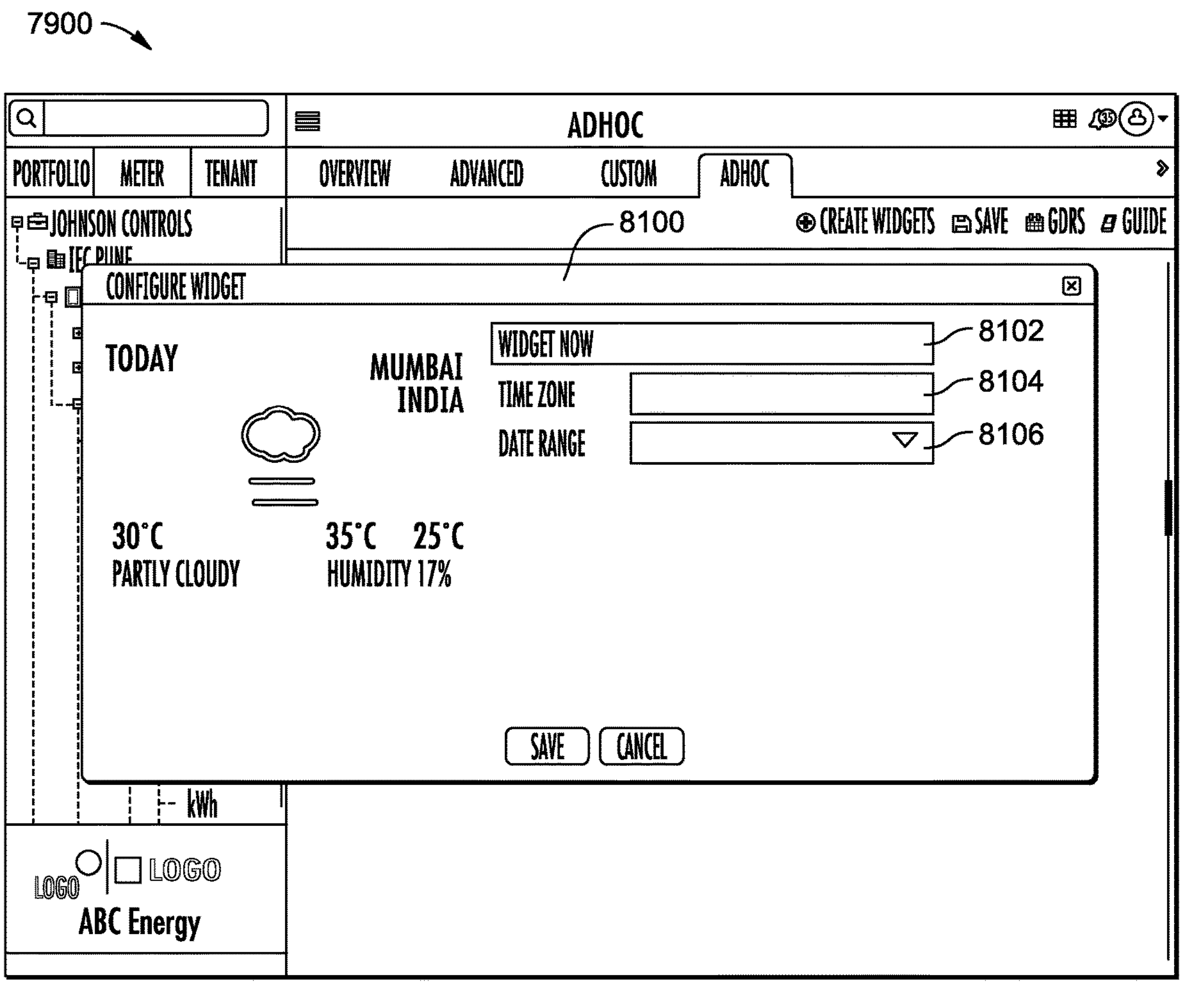

Referring now to FIGS. 79-81, an interface 7900 for creating and configuring weather widgets is shown, according to an exemplary embodiment. Weather widgets can include a current weather widget 7902 (shown in FIG. 79) and a weather forecast widget 8002 (shown in FIG. 80). Current weather widget 7902 can be created by selecting the create widgets button 5904 in ad hoc dashboard 5900 and selecting current weather from the weather dropdown menu 6012. Current weather widget 7902 may include graphics or text that indicate a geographic location 7904 and the current weather 7906 at the geographic location 7904.

Weather forecast widget 8002 can be created by selecting the create widgets button 5904 in ad hoc dashboard 5900 and selecting weather forecast from the weather dropdown menu 6012. Weather forecast widget 8002 may include graphics or text that indicate a geographic location 8004, the current weather 8006 at the geographic location 8004, and a forecast of future weather 8008 at the geographic location 8004. Weather widgets 7902 and 8002 can be edited via a configure widget popup 8100 which allows a user to edit the widget title 8102, location 8104, date range 8106, and other information associated with weather widgets 7902 and 8002.

Dashboard Sharing

Figure 82:
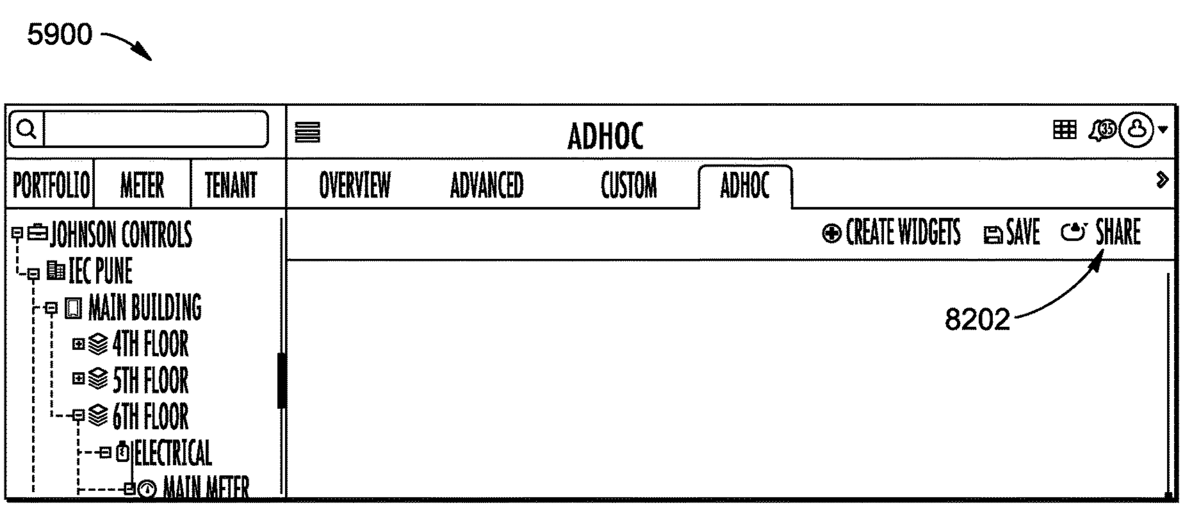
FIGS. 82-83 are interfaces for sharing the ad hoc interface of FIG. 59 with other users or groups, according to some embodiments.
Figure 83:
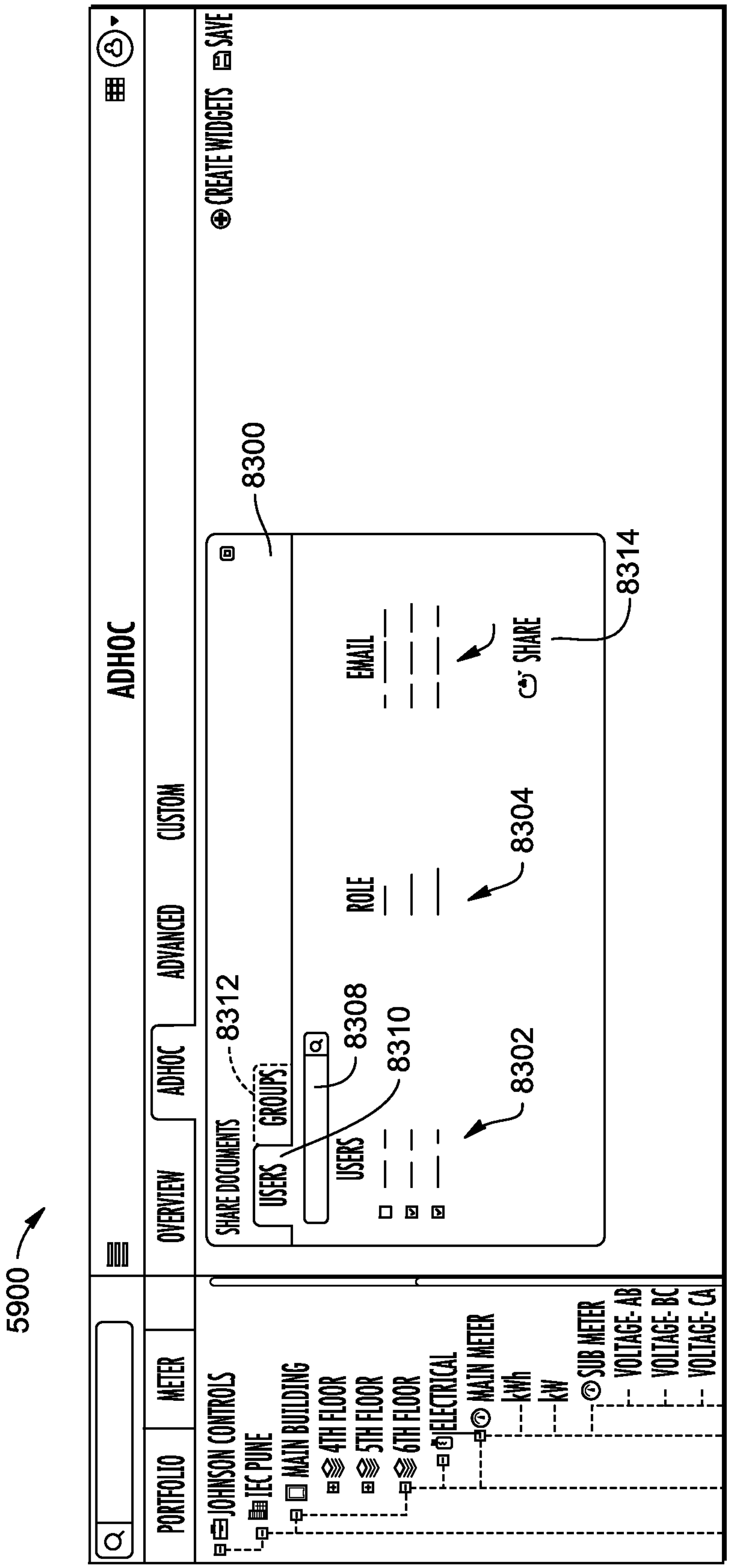

Referring now to FIGS. 82-83, a dashboard sharing interface 8300 is shown, according to an exemplary embodiment. Sharing interface 8300 may be displayed in response to selecting share icon 8202 in ad hoc dashboard 5900. Sharing interface 8300 can be used to share an instance of ad hoc dashboard 5900 with other users or groups once ad hoc dashboard 5900 has been created. Sharing interface 8300 is shown to include a users tab 8310 and a groups tab 8312. Selecting users tab 8310 may display a list of users 8302 present in the system along with their roles 8304 and email addresses 8306. Similarly, selecting groups tab 8312 may display a list of groups present in the system (e.g., administrators, building owners, service technicians, etc.). Sharing interface 8300 may allow one or more users or groups to be selected. Clicking share button 8314 may then share ad hoc dashboard 5900 with the selected users or groups.

In some embodiments, sharing interface 8300 automatically checks whether the users or groups are authorized to view ad hoc dashboard 5900. This check may be performed before populating the list of users 8302 and groups or in response to a user or group being selected. For example, only authorized users may be shown in the list of users 8302 in some embodiments. In other embodiments, all users and groups may be displayed in sharing interface 8300, but a warning message may be provided if an unauthorized user or group is selected. When ad hoc dashboard 5900 is shared, another tab may be added to the interfaces provided to the users with whom ad hoc dashboard 5900 is shared. The users can select the new tab may to view the shared instance of ad hoc dashboard 5900.

Stacked Chart Widget

Figure 84:
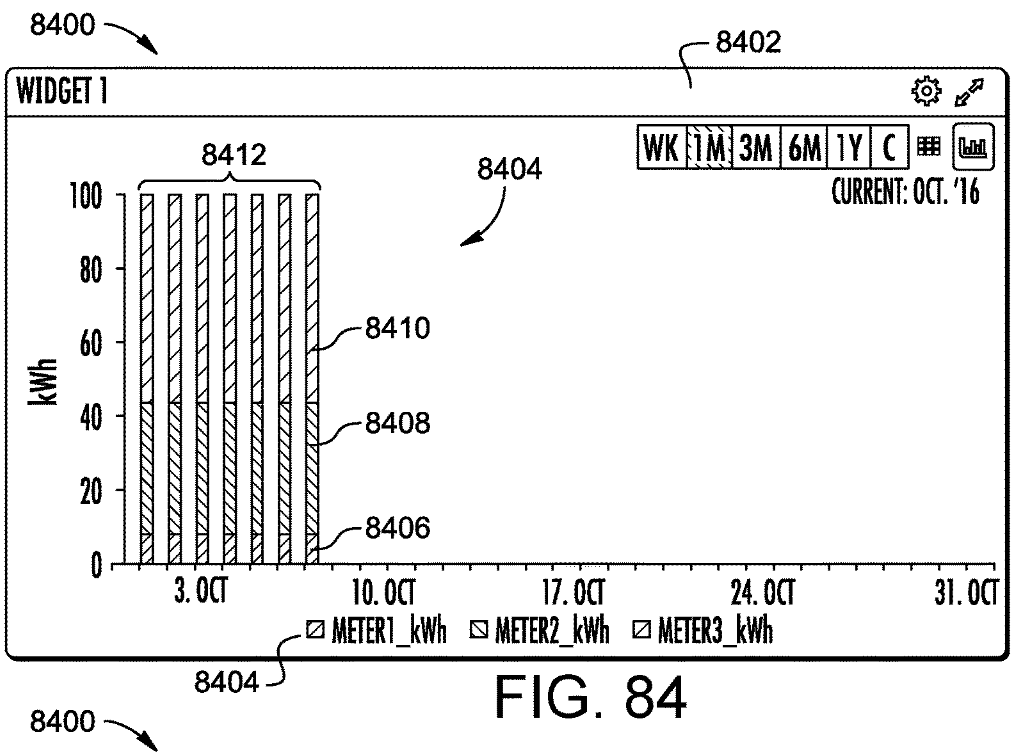
FIGS. 84-85 are interfaces for creating and configuring stacked chart widgets in the ad hoc interface of FIG. 59, according to some embodiments.
Figure 85:
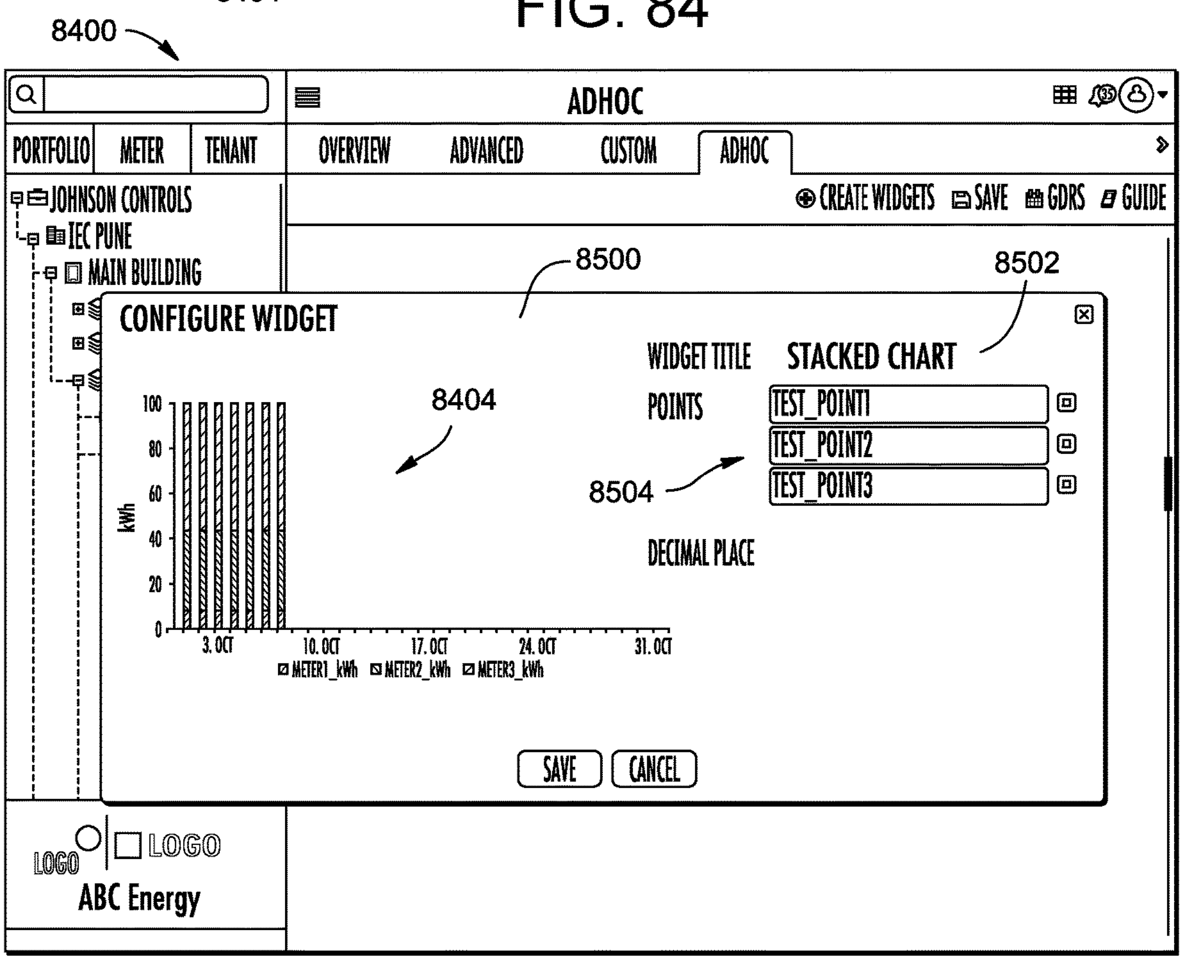

Referring now to FIGS. 84-85, an interface 8400 for creating and configuring a stacked chart widget 8402 is shown, according to an exemplary embodiment. Stacked chart widget 8402 can be created by selecting the create widgets button 5904 in ad hoc dashboard 5900 and selecting stacked chart from the charting dropdown menu 6006. Upon dragging and dropping a point into stacked chart widget 8402, a stacked chart 8404 of the timeseries data associated with the selected point may begin populating. Any number of points can be added to stacked chart widget 8402 as long as the points have the same unit of measure. In some embodiments, interface 8400 is configured to display a notification that only points with the same unit of measure are allowed if a user attempts to add points with different units of measure.

Stacked chart 8404 is shown to include a set of columns 8412. Each of columns 8412 may correspond to a particular time and may be associated with one or more samples that have timestamps of the corresponding time. If multiple points are added to stacked chart 8404, each of columns 8412 may be divided into multiple portions. For example, each of columns 8412 is shown to include a first portion 8406, a second portion 8408, and a third portion 8410. Each of portions 8406-8410 may correspond to a different timeseries or different point. The values of the corresponding timeseries may be represented by the size or height of each portion 8406-8410. In other embodiments, stacked chart 8404 may include horizontal bars rather than vertical columns 8412. A key or legend 8414 may indicate the names of the points associated with each portion 8406-8410. In some embodiments, point names are displayed in the format "meter/equipment name—point name."

In some embodiments, interface 8400 is configured to display a tooltip when a user hovers over any portion 8406-8410 of columns 8412. The tooltip may display various attributes of meter, sample, or timeseries associated with the portion. For example, hovering over portion 8406 may cause the tooltip to display the timestamp associated with the column 8412 in which portion 8406 is located, the name of the meter associated with portion 8406 (e.g., Meter1-kWh), the timeseries value associated with portion 8406 (e.g., 134 kWh), and the percentage of the total column 8412 which portion 8406 comprises (e.g., 13%). For example, if the total energy consumption of a particular column 8412 (i.e., the sum of portions 8406-8410) is 1000 kWh and portion 8406 has a value of 130 kWh, the tooltip may display a percentage of 13% since 130 kWh is 13% of the total 1000 kWh.

Stacked chart widget 8402 can be edited via a configure widget popup 8500. Configure widget popup 8500 may allow a user to edit the widget title 8502, edit the names of the mapped points 8504, delete the mapped points 8504, define decimal places for the mapped points 8504, and make other adjustments to the configuration of stacked chart widget 8402. In some embodiments, configure widget popup 8500 includes a preview of stacked chart 8404. The preview of stacked chart 8404 can be automatically updated in real time when changes are made via configure widget popup 8500 to allow the user to view the effects of the changes before applying the changes to stacked chart 8404. Stacked chart widget 8402 may include options to resize, maximize, duplicate, delete, move, adjust the theme, and otherwise edit stacked chart widget 8402. In some embodiments, stacked chart widget 8402 includes data aggregation options (as described with reference to FIGS. 64-66), unit conversion options, and supports weather service points.

Pie Chart Widget

Figure 86:
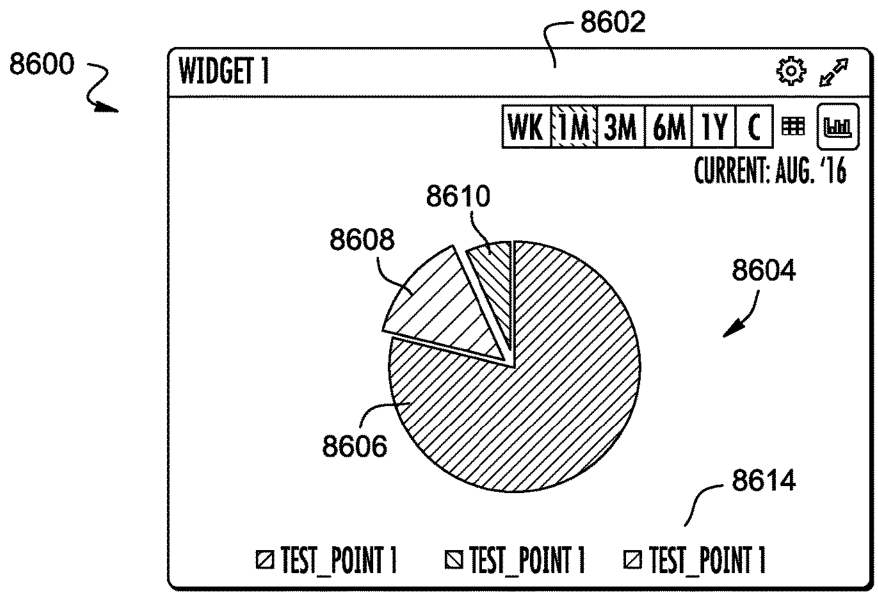
FIGS. 86-87 are interfaces for creating and configuring pie chart widgets in the ad hoc interface of FIG. 59, according to some embodiments.
Figure 87:
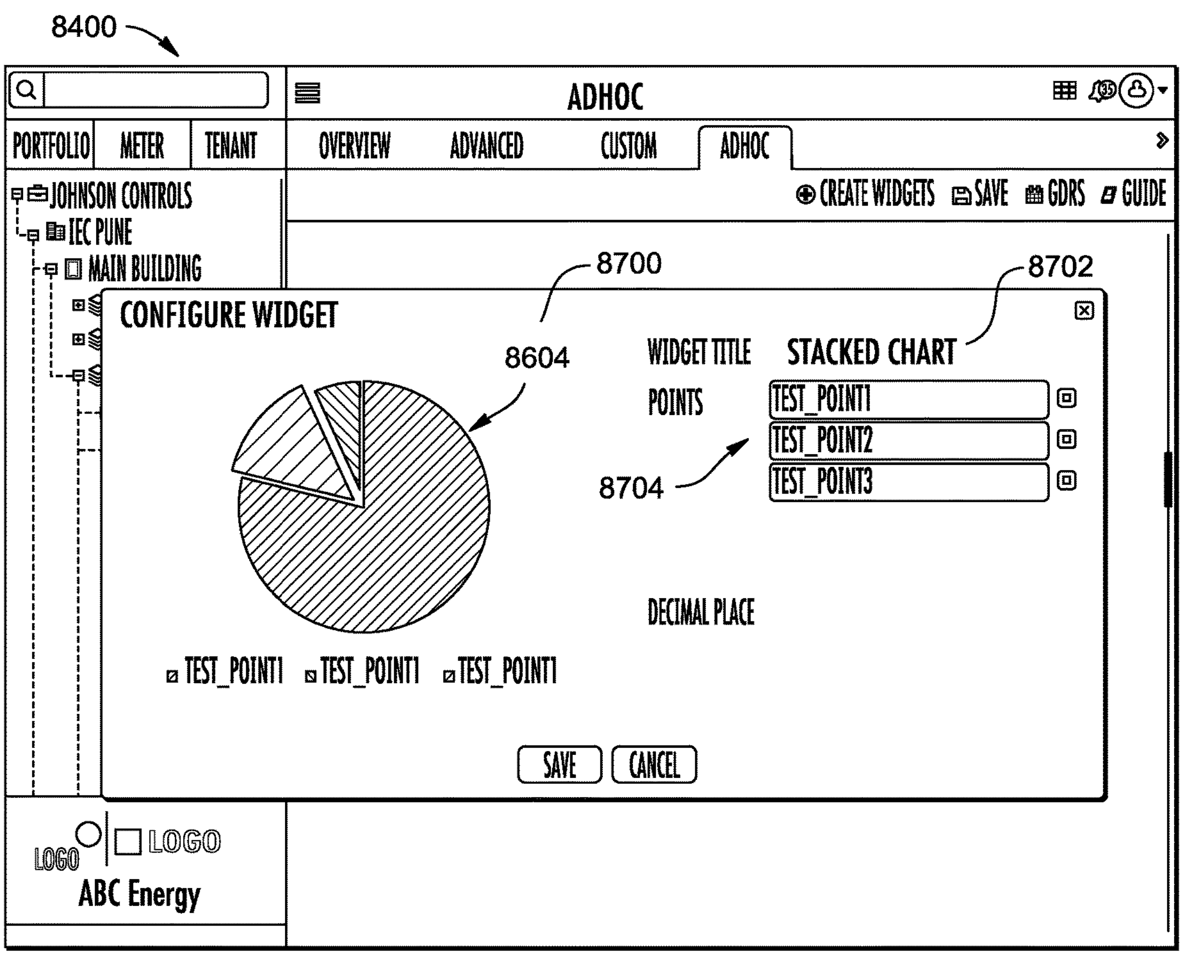

Referring now to FIGS. 86-87, an interface 8600 for creating and configuring a pie chart widget 8602 is shown, according to an exemplary embodiment. Pie chart widget 8602 can be created by selecting the create widgets button 5904 in ad hoc dashboard 5900 and selecting pie chart from the charting dropdown menu 6006. Upon dragging and dropping a point into pie chart widget 8602, a pie chart 8604 of the timeseries data associated with the selected point may begin populating. Any number of points can be added to pie chart widget 8602 as long as the points have the same unit of measure. In some embodiments, interface 8600 is configured to display a notification that only points with the same unit of measure are allowed if a user attempts to add points with different units of measure.

If multiple points are added to pie chart 8604, pie chart 8604 may be divided into multiple portions. For example, pie chart 8604 is shown to include a first portion 8606, a second portion 8608, and a third portion 8610. Each of portions 8606-8610 may correspond to a different timeseries or different point. The values of the corresponding timeseries may be represented by the size or arc length of each portion 8606-8610. A key or legend 8614 may indicate the names of the points associated with each portion 8606-8610. In some embodiments, point names are displayed in the format "meter/equipment name—point name."

In some embodiments, interface 8600 is configured to display a tooltip when a user hovers over any portion 8606-8610 of pie chart 8604. The tooltip may display various attributes of meter, sample, or timeseries associated with the portion. For example, hovering over portion 8606 may cause the tooltip to display the name of the meter associated with portion 8606 (e.g., Meter1-kWh), the timeseries value associated with portion 8606 (e.g., 134 kWh), and the percentage of the total pie chart 8604 which portion 8606 comprises (e.g., 13%). For example, if the total energy consumption represented by pie chart 8604 (i.e., the sum of portions 8606-8610) is 1000 kWh and portion 8606 has a value of 130 kWh, the tooltip may display a percentage of 13% since 130 kWh is 13% of the total 1000 kWh.

Pie chart widget 8602 can be edited via a configure widget popup 8700. Configure widget popup 8700 may allow a user to edit the widget title 8702, edit the names of the mapped points 8704, delete the mapped points 8704, define decimal places for the mapped points 8704, and make other adjustments to the configuration of pie chart widget 8602. In some embodiments, configure widget popup 8700 includes a preview of pie chart 8604. The preview of pie chart 8604 can be automatically updated in real time when changes are made via configure widget popup 8700 to allow the user to view the effects of the changes before applying the changes to pie chart 8604. Pie chart widget 8602 may include options to resize, maximize, duplicate, delete, move, adjust the theme, and otherwise edit pie chart widget 8602.

Stuck Point Detection

Figure 88:
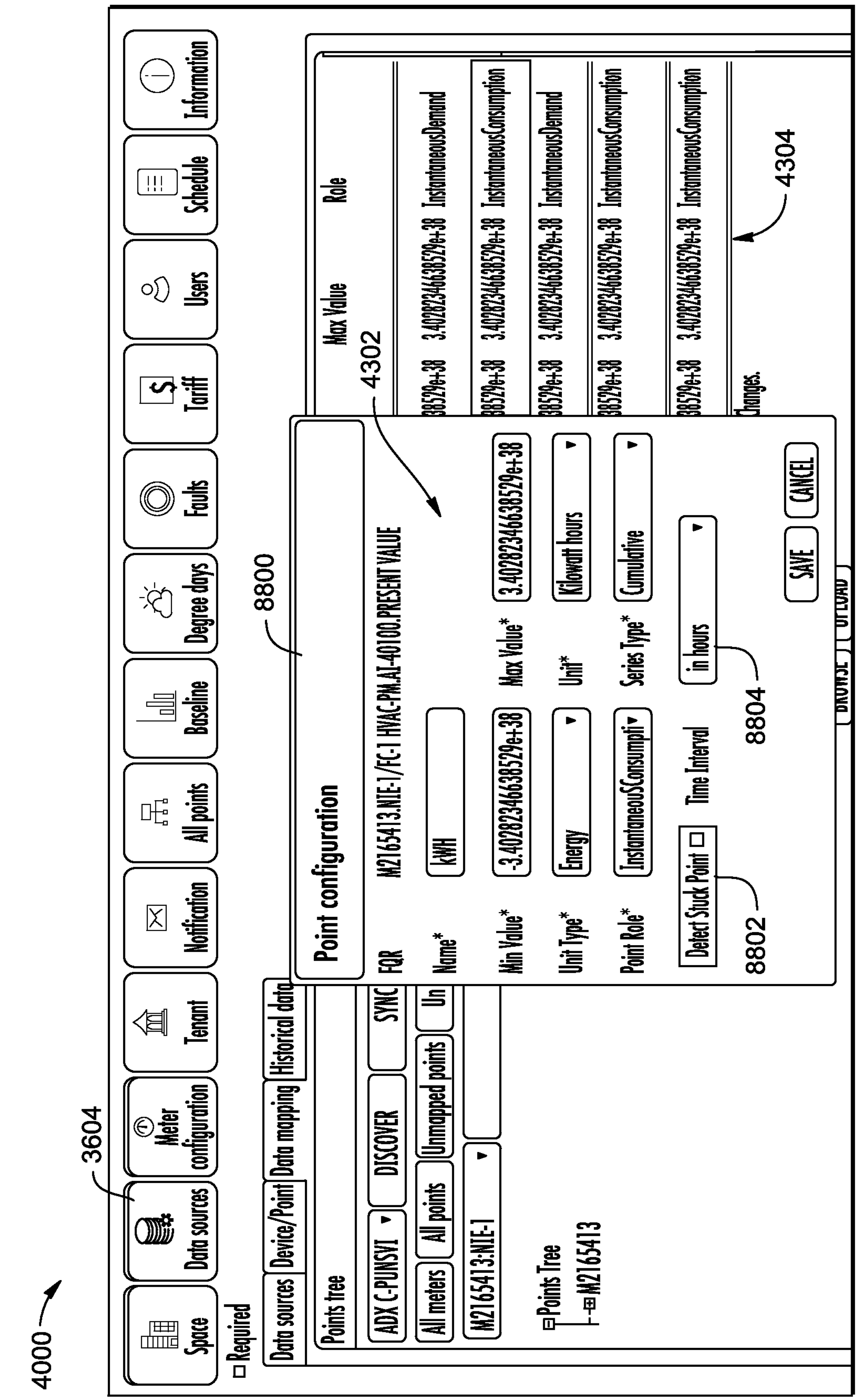
FIG. 88 is a point configuration interface with options to define a stuck point definition, according to some embodiments.

Referring now to FIG. 88, a point configuration interface 8800 is shown, according to an exemplary embodiment. Interface 8800 may be a component of data sources setup interface 4000, as described with reference to FIGS. 40-45. In some embodiments, point configuration interface 8800 is displayed when a user selects data sources tile 3604 in setup interface 4000 and selects a data point 4304. Point configuration interface 8800 allows the user to change various attributes 4302 of the data point 4304 such as units, minimum value, maximum value, point name, etc.

In some embodiments, point configuration interface 8800 allows a user to define a stuck point definition for the selected point 4304. The stuck point definition may be treated as a fault detection rule which can be evaluated by analytics service 524. For example, point configuration interface 8800 is shown to include a detect stuck point checkbox 8802. When checkbox 8802 is selected, analytics service 524 may begin monitoring the selected point 4304. Interface 8800 may also allow a user to choose a time period associated with the stuck point definition. For example, point configuration interface 8800 is shown to include a time period box 8804 which allows the user to define a threshold amount of time to use in the stuck point definition (e.g., one hour, two days, etc.).

Figure 89:
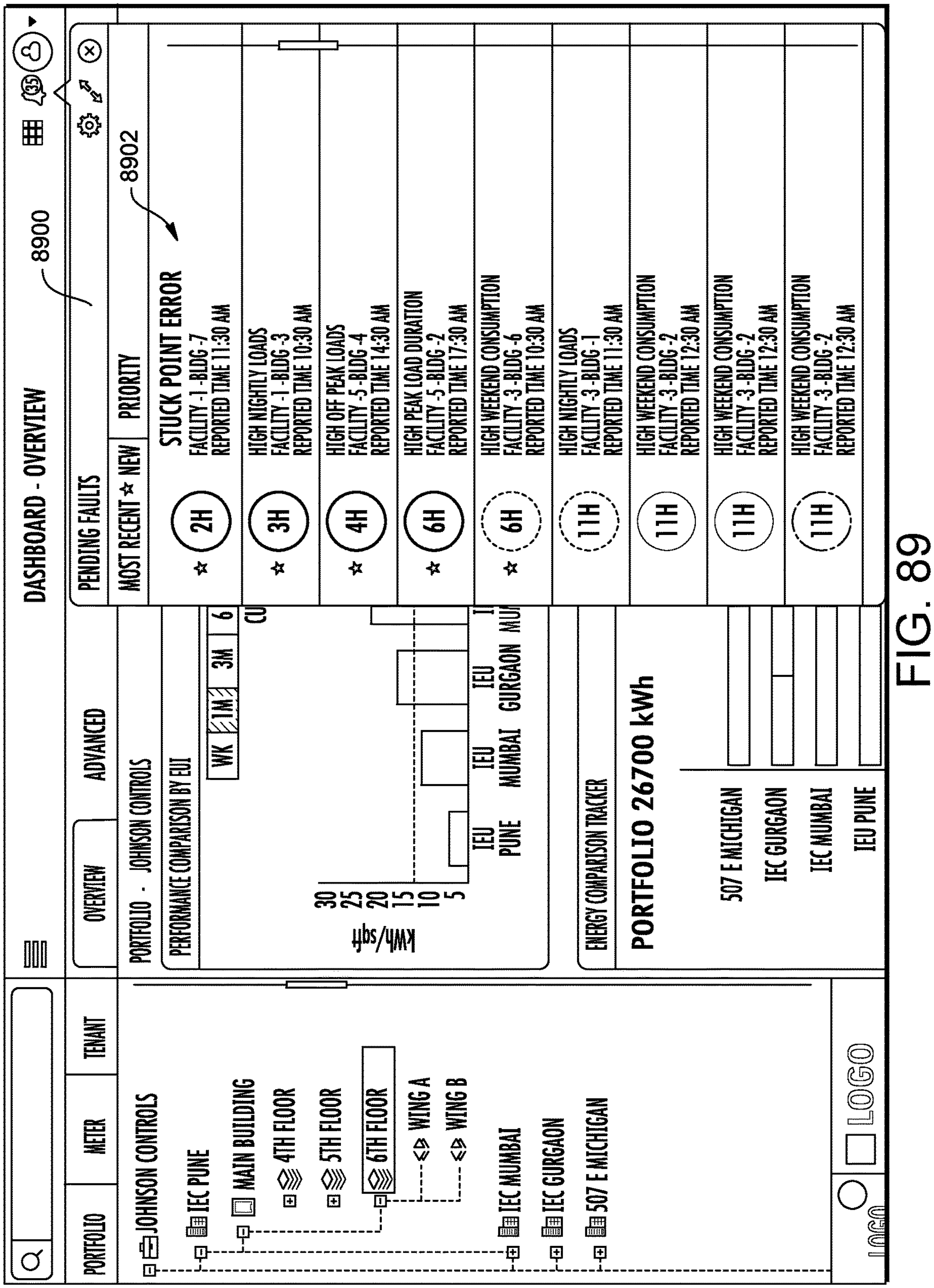
FIG. 89 is a pending fault interface which can be used to display detected faults to a user, according to some embodiments.

Analytics service 524 may monitor the value of the selected point 4304 and may determine whether the value has remained same for an amount of time exceeding the threshold amount of time specified via time period box 8804. If the value of the point has not changed for an amount of time exceeding the threshold, analytics service 524 may determine that the point is stuck and may generate a stuck point fault indication 8902 (shown in FIG. 89). Analytics service 524 may display the stuck point fault indication 8902 along with other fault indications in pending faults window 8900.

Virtual Audit Metrics

Often, building energy audits are conducted by a professional energy auditor who assess potential energy savings for a buildings. These energy audits generally require a person to physically inspect a building and talk to the facilities operators to understand the existing systems, operation and control strategies, occupancy times, etc. The auditor can look for opportunities to increase the efficiency of the building for energy cost savings to the customer. These saving can be achieved by a combination of short and/or long term retrofit recommendations, comfort and code issues that can be addressed, improvements in following lighting and comfort standards, and action plans for energy efficiency capital investments.

The American Society of heating, Refrigeration, and Air-Conditioning Engineers (ASHRAE) has three level of audits as a standard. Level 1 is a site assessment of preliminary audits to identify no cost and low cost energy savings opportunities and provide a view of potential capital improvements. This is achieved through review of energy bills and a site inspection of the building and/or buildings. Level 2 is an energy survey and engineering analysis audit that identifies no cost and low cost capital intensive energy savings opportunities. Level 2 audits have an in depth analysis of energy costs, energy usage and building characteristics, and a refined survey of how energy is used in the building. Level 3 is a detailed analysis of capital intensive modifications audits. This is sometimes called an investment grade audit which provides solid recommendations and financial analysis for major capital investments. Investment grade audits include monitoring, data collection and engineering analysis that goes beyond Level 1 and Level 2 audits. Instead of requiring professional energy auditors to be physically in a building, systems and methods of the present disclosure provide various data science and/or data mining techniques to automatically or semi-automatically identify some of the types of things through the Level 1 (and/or Level 2 and/or Level 3) building energy audits, which can significantly save human and financial resources.

Figure 90:
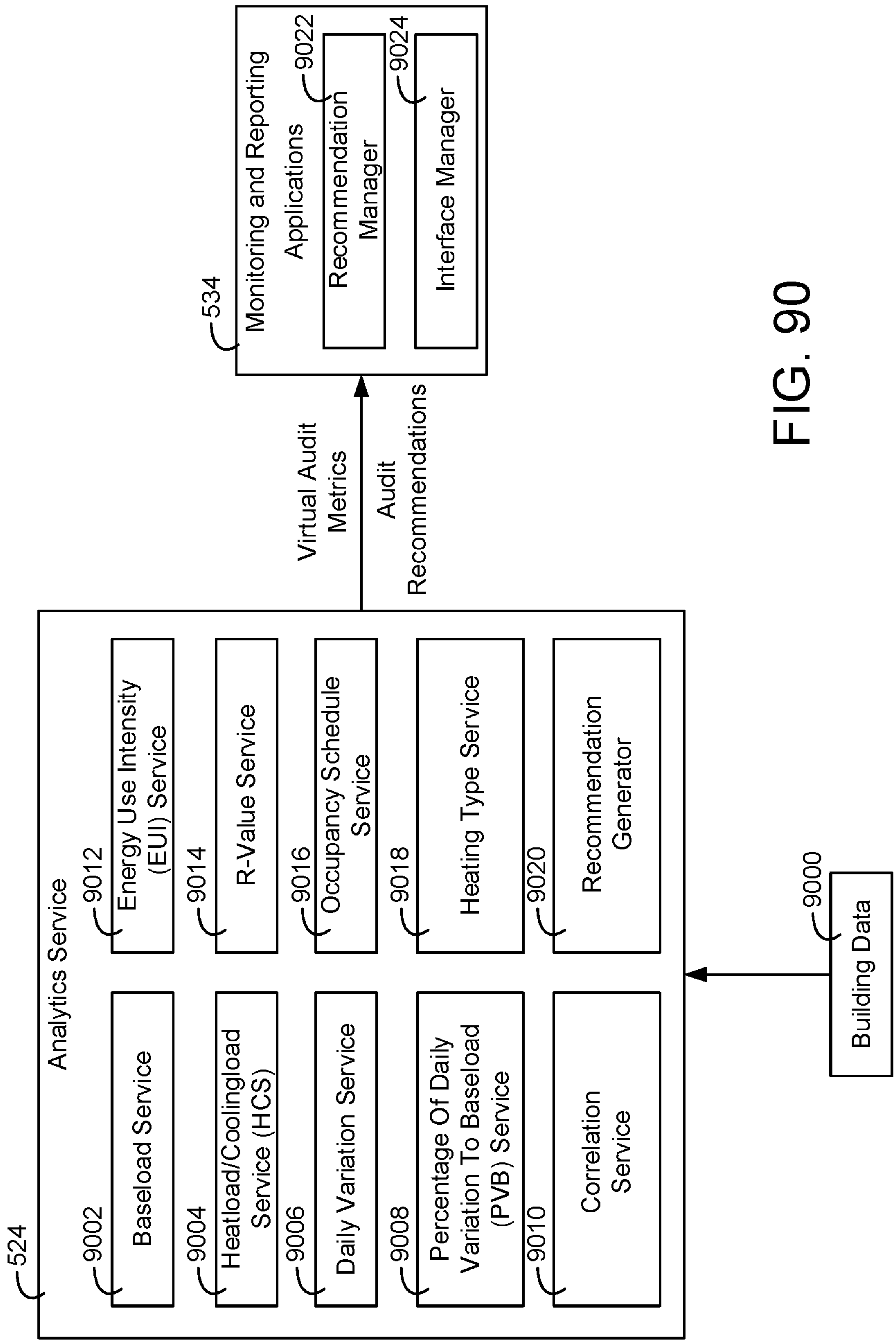
FIG. 90 is a block diagram of the analytics service of FIG. 6 generating virtual audit metrics for presentation to a user via a dashboard and generating recommendations based on the virtual audit metrics, according to some embodiments.

Referring now to FIG. 90, the analytics service 524 is shown to determine respective values of a number of virtual audit metrics for presentation to a user via a dashboard application, according to an exemplary embodiment. The analytics service 524 is shown to receive building data 900 which can be any data for a building and/or multiple buildings (e.g., a building campus). The building data 9000 can be data samples of one or more variables that a building management system (e.g., BMS 500) uses to operate HVAC equipment, lighting equipment, building meters, and any building equipment that are connected to a cloud data acquisition system. The building data 9000 can be analyzed by the analytics service 524 to perform a remote building energy audits.

The analytics service 524 can be configured to analyze the building data 9000 to calculate, estimate, generate, or otherwise provide values for various energy audit metrics, which are sometimes referred to as "virtual audit metrics," and use the values of the virtual audit metrics to perform a building and/or campus audit. The term "virtual audit metric," as used herein, may be referred to as an audit metric being calculated through various data science and/or data mining techniques. The analytics service 524 can be configured to perform data cleaning (e.g., data filtering) prior to or simultaneously with generating the values for the virtual audit metrics.

The values of virtual audit metrics can be indicative of characteristics of a building. In some embodiments, the virtual audit metrics may include, a baseload that a baseload service 9002 of the analytics service 524 can be configured to generate. The virtual audit metrics can include a heatload/coolingload metric that the heatload/coolingload service (HCS) 9004 can be configured to generate. Furthermore, the virtual audit metrics can include a daily variation metric that a daily variation service 9006 of the analytics service 524 can be configured to generate. The virtual audit metrics can include a percentage of daily variation to baseload metric that the percentage of daily variation to baseload (PVB) service 9008 can be configured to generate. The virtual audit metrics include an energy usage intensity (EUI) audit metric that an EUI service 9012 of the analytics service 524 can be configured to generate. The virtual audit metrics can include a R-value (e.g., an effective thermal resistance) that the R-value service 9014 of the analytics service 524 can be configured to generate. Furthermore, the analytics service 524 can include an occupancy schedule service 9016 of the analytics service 524 can be configured to generate an occupancy schedules virtual audit metric. A heating type service 9018 of the analytics service 524 can be configured to generate an electric or gas heating energy metric while the correlation service 9010 can be configured to generate a correlation between weather and energy usage virtual audit metric.

Based on the values of the various virtual audit metric generated by the analytics service 524, a recommendation generator 9020 of the analytics service 524 can be configured to generate various recommendations for improving the performance of a building and/or campus. In some embodiments, the recommendation generator 9020 can be configured to generate various Level 1, Level 2, and/or Level 3 ASHRAE audit recommendations. The recommendations that the recommendation generator 9020 can be configured to generate can include a recommendation to install and/or update the insulation used in a wall. Add and/or remove various windows to cause less heat to be lost in the building and/or to let more natural sunlight into the building reducing lighting costs.

The recommendation generator 9020 can be configured to perform various machine learning techniques with the values of virtual audit metrics generated by the analytics service 524. The machine learning techniques can include decision trees, neural networks (e.g., convolutional neural networks (CNN), recurrent neural networks (RNN), deep learning networks, etc.), Bayesian modeling, and/or any other type of machine learning. The recommendation generator 9020 can be configured to identify various recommendations implemented in a building and/or campus and determine the success of the recommendation.

For example, if the recommendation generator 9020 identifies that adding new insulation to a particular section of a building improved the performance of the building, the recommendation generator 9020 may recommend that the same and/or similar changes be made to another section of the building. Furthermore, if the performance a first building is improved based on a particular improvement, the recommendation generator 9020 can be configured to recommend the same and/or a similar improvement to a second building. The recommendation generator 9020 can improve the recommendations it generates over time with feedback based on the various machine learning techniques it can be configured to employ.

The analytics service 524 is shown to provide the values of virtual audit metrics determined by the various components of the analytics service 524 and the audit recommendations determined by the recommendation generator 9020 to the monitoring and reporting service 534. The monitoring and reporting applications 534 can be configured to generate and/or provide a dashboard interface to an end user for viewing the virtual audit metrics and/or audit recommendations. In some embodiments, the analytics service 524 can be configured to generate the values of virtual audit metrics periodically (each metric may have its own period). The period may be every fifteen minutes, every hour, every day, every week, every month, and/or every year. The monitoring and reporting applications 534 can be configured to generate various trend graphs, bar graphs, pie charts, and/or any other visual representation of the virtual audit metrics. Furthermore, the monitoring and reporting applications 534 can be configured to cause the dashboard to include the various audit recommendations generated by the recommendation generator 9020. The dashboard can include a recommended audit recommendation, a performance increase that will result from the audit recommendation, evidence of the success of the audit recommendation (e.g., an indication of the performance of other buildings caused by the audit recommendation), etc. The recommendation manager 9022 can be configured to generate the audit recommendation features of the dashboard while the interface manager 9024 can be configured to generate the dashboard and cause the dashboard to include indications of the virtual audit metrics.

The baseload service 9002 can be configured to generate the value of a baseload virtual audit metric. In some embodiments, the baseload may be referred to as the minimum level of demand on energy of a building. For example, the baseload service 9002 can be configured to generate the baseload based on a $5^{th}$ percentile of energy values for one or multiple days. In additional or alternative embodiments, the baseload service 9002 can be configured to fit a regression equation to building energy consumption and identify a constant value of the regression equation as an estimate for the building baseload.

The HCS 9004 can be configured to generate the value of a heatload virtual audit metric and/or the value of a coolingload virtual audit metric based on the baseload determined by the baseload service 9002 and a peak energy consumption. In some embodiments, the peak energy consumption may be referred to as the maximum level of demand on energy of a building. The HCS 9004 may further determine a season during which the building has gone through to generate the value for the heatload virtual audit metric and/or cooling load virtual audit metric. For example, during a heating season, the HCS 9004 can be configured to generate a value of the heatload virtual audit metric by taking a peak value of energy consumption of a building and subtracting the baseload value from the peak energy consumption value. During a cooling season, a value of the cooling load audit metric can be determined by the HCS 9004 by determining a peak energy consumption minus the baseload.

The daily variation service 9006 can be configured to determine the value of a daily variation virtual audit metric by taking a range (e.g., the maximum level of demand on energy of a building minus the minimum value of demand on energy of the building) for each day across the data set and averaging them. More particularly, the daily variation service 9006 can receive energy consumption data for a set of days and determine, for each day, a range. As such, the daily variation service 9006 can be configured to determine the value of a daily variation virtual audit metric by averaging the ranges for the set of days.

The PVB service 9008 can be configured to generate the value of a percentage of the value of daily variation to the value of baseload virtual audit metric based on the daily variation virtual audit metric determined by the daily variation service 9006 and based on the baseload virtual audit metric determined based on the baseload service 9002. A value of the percentage of the value of daily variation virtual audit metric to the value of baseload virtual audit metric can be determined based on the equation:

$$\frac{\text{daily variation}}{\text{baseload}} \times 100$$

The EUI service 9012 can be configured to generate the value of an energy use intensity (EUI) virtual audit metric. The EUI service 9012 can be configured to generate a value of the energy use intensity virtual audit metric based on the equation:

$$\frac{\text{kBtu}}{\text{square footage} \times \text{years}}$$

The R-value service 9014 can be configured to generate the value of an R-value virtual audit metric. In some embodiments, the R-value can sometimes be referred to as the thermal efficiency of a building. The R-value service 9014 can be configured to determine the R-values based on a total electricity consumption, internal and external temperatures, an estimate of the building surface area, and an estimate of the conductivity value of the building construction materials.

The occupancy schedule service 9016 can be configured to generate the value of an occupancy schedules virtual audit metric based on energy usage through the time of day for a daily consumption. The occupancy schedule service 9016 can be configured to determine the automatic morning turn on of HVAC and lighting systems and the automatic evening turnoff of HVAC and lighting systems based on the energy usage through time for a particular day and/or days.

The heating type service 9018 can be configured to determine the value of a virtual audit metric indicating a type of heating (e.g., electric heating or gas heating) based on a sign of the slop of an electric consumption verse heating degree days plot and/or the sign of the slope of a gas consumption verse heating degree days (HDD) plot. For example, the heating type service 9018 can use an electric consumption verse heating degree plot. When the heating type service 9018 determines that the plot has a positive slope, the heating type service 9018 may determine the type of heating as electric heat; and when the heating type service 9018 determines that the plot has a negative slope, the heating type service 9018 may determine the type of heating as gas heat. In some embodiments, the heating type service 9018 can be configured to confirm the value of the virtual audit metric determined by an electric consumption verse heating degree days plot, as discussed above, by looking at natural gas usage versus heating degree days plot. For a natural gas usage verse heating degree days, a positive slope may indicate natural gas while a flat and/or negative slope may indicate electric heating.

The correlation service 9010 can be configured to generate a correlation between weather and energy usage virtual audit metric by analyzing linear correlation coefficients between energy usage and temperature, irradiance, and relative humidity. This virtual audit metric can indicate a certain amount of information about the building dynamics. In some embodiments, the correlation calculations for heating and cooling seasons may be done separately. Negative correlations in the heating season can indicate electric heating is being used and positive correlations indicate that gas heating is predominately used. In practice, this method of looking at correlations tends to lead to low correlations due to large plug loads and occupancy. However, the correlation of a time-specific-averaged-ordered variable (TSAOV) can be determined by the correlations service 9010 to improve the correlations between the temperature and weather variables. Given 15 minute data sample so there are 96 samples per day, the TSAOV can be determined by the correlations service 9010 by first grouping all the temperature and energy usage values into a group for each time sample throughout the day so there are 96 groups with each member of a group having the same time during the day though they will have different days associated with them. Then each time specific data set can be reordered by the correlation service 9010 by temperature from highest to lowest. These ordered groups can be divided into sets of 30 observations by the correlation service 9010 so the observations are the ones most similar in temperatures and take the average of them. This yields the TSAOV which has stronger correlations than just looking at correlations between usage and temperature.

Referring generally to FIG. 90, a system for integrating building markers into a dashboard is shown, according to various exemplary embodiments. The system shown in FIG. 90 may be an automated virtual audit generator, the analytics service 524. The analytics service 524 may receive the building data 9000 at a predefined frequency (e.g., a period of fifteen minutes or higher), analyze the building data 9000 to create building markers (e.g., the virtual audit metrics), and make recommendations to customers for energy improvements as well as be display the virtual audit metrics and/or recommendations to a user via a dashboard in order to provide building energy efficiency insights.

The various virtual audit metrics described herein for determining building characteristics can be implemented into the analytics service 524. The building data 9000 can be provided to the analytics service 524 via a cloud (e.g., provided every fifteen minutes). The building data 9000 can include building and meter level electric load and weather data. Some of the markers (e.g., virtual audit metrics) can be generated yearly although they can also be generated more frequently (e.g., every hour, day, week, month, quarter, etc.).

In some embodiments, the analytics service 524 generates the virtual audit metrics at a particular period (e.g., once a year) or asynchronously in response to a change in building construction (e.g., a repair, renovation, building improvement, etc.). For example, R-values may not change very often unless there is a fundamental change to the building construction such as an addition to the building, added insulation, energy efficient windows, etc. A virtual audit metric such as an R-value may be determined once a year and/or in response to building construction occurring.

The building markers (e.g., the virtual audit metrics) can be stored by the analytics service 524 as virtual points. The virtual points may form various virtual point time-series that the analytics service 524 can be configured to store. Virtual points may be data points that are not equipment measurements (e.g., a meter measurement) but rather a calculated measurement. Over time, the analytics service 524 can be configured to generate a trend of the virtual points and report the virtual point trends to a user via a dashboard (e.g., via the monitoring and reporting applications 534. These metrics can show a building energy efficiency energy usage characteristic over a time period (e.g., a yearly metric).

Figure 91:
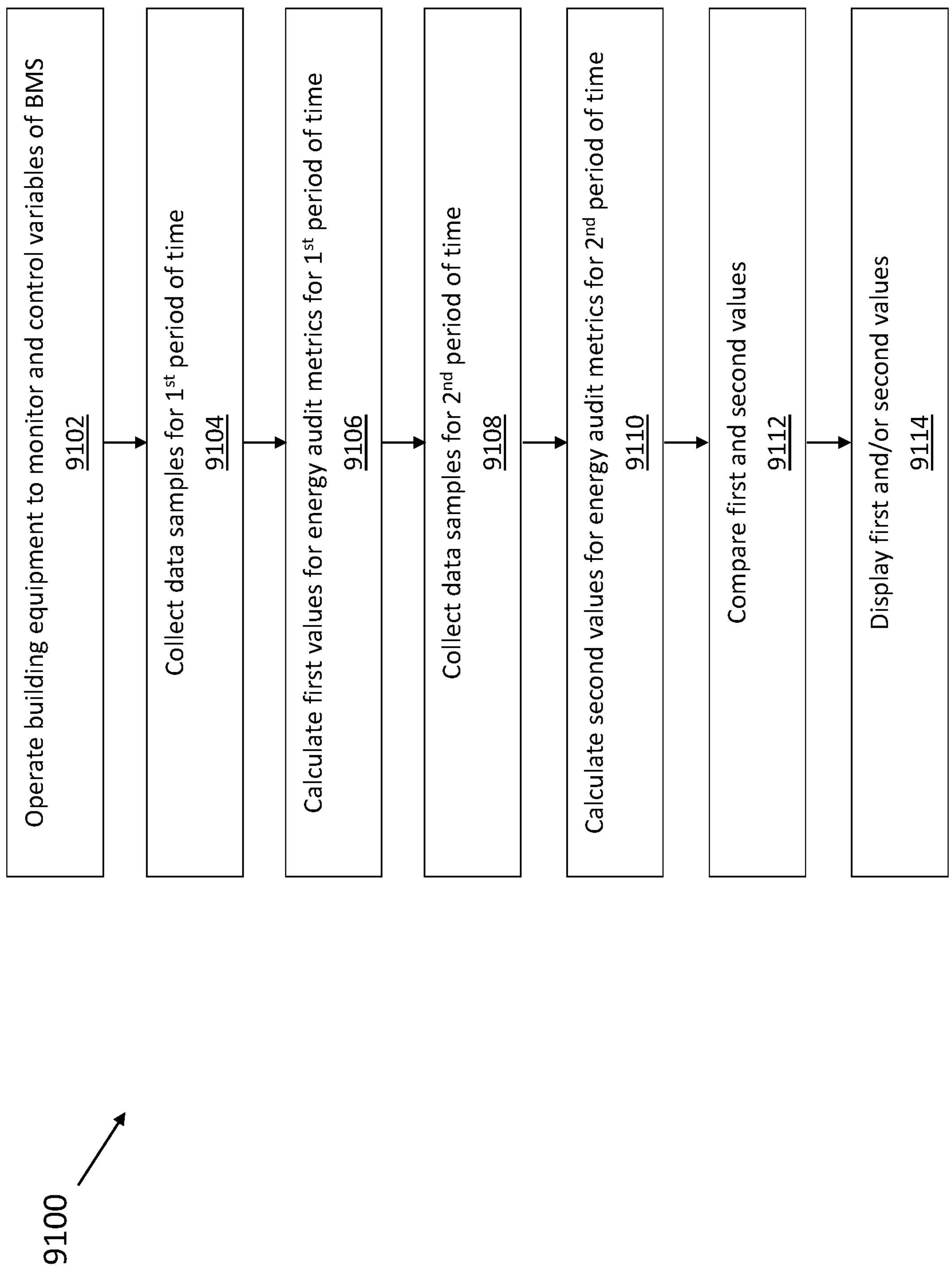
FIG. 91 is a flow chart of an example method for performing energy analytics in a building management system, according to some embodiments.

Referring to FIG. 91, depicted is a flow diagram of one embodiment of a method 9100 for performing energy analytics in a building management system. The functionalities of the method 9100 can be implemented using, or performed by, one or more of the components detailed herein in connection with FIGS. 1-90. For example, the analytics service 524 and monitoring and reporting applications 534 of FIG. 90 may collectively or respectively perform one or more operations of the method 9100 to perform energy analytics in a building management system.

At operation 9102, various building equipment of a building can be operated to monitor and control one or more variables of a building management system. In some embodiments, the building equipment can include HVAC equipment, lighting equipment, building meters, security equipment, and any building equipment that are communicatively coupled to a building management system (e.g., BMS 500).

Next, at operation 9104, the building management system can collect respective data samples of the one or more variables from the various building equipment during a first period of time. Each data sample can be a data point, a set of data point, a data structure, a data table, or the like. For example, the data sample can be a data point indicating an outdoor air temperature point and having a value which can be measured by a temperature sensor. In another example, the data sample can include a timeseries of data samples, each of which includes a timestamp and a data value. In yet another example, the data sample can include a data rollup time series, as discussed above with respect to FIGS. 7A-B. In some embodiments, the building management system may collect the data samples directly from the building equipment or indirectly from the building equipment through a cloud data acquisition system. The building management system can periodically (e.g., every 15 minute, every hour, every day, etc.) collect the data samples from the building equipment.

In response to collecting data samples of the one or more variables for first period of time, the building management system can calculate a number of first values for one or more energy audit metrics based on the data samples collected during the first period of time (operation 9106).

The one or more energy audit metrics can include at least one of: a minimum level of demand on energy of the building, a maximum level of demand on energy of the building, a range defined by a difference between the minimum level of demand on energy of the building and a maximum level of demand on energy of the building, an energy usage intensity (EUI), and a daily variation to the minimum level of demand on energy of the building. Based on the data samples collected during the first period of time, the building management system (e.g., baseload service 9002 of FIG. 90) can calculate a first value of the minimum level of demand on energy of the building during the first period of time to determine the baseload of the building during the first period of time. Based on the data samples collected during the first period of time, the building management system (e.g., heatload/coolingload service 9004 of FIG. 90) can calculate a first value of the maximum level of demand on energy of the building, and use the value and baseload to determine the heatload and/or coolingload of the building during the first period of time. Based on the data samples collected during the first period of time, the building management system (e.g., daily variation service 9006 of FIG. 90) can calculate a first value of the range for each time interval of the first period of time to determine the daily variation by averaging the respective values of the ranges over the first period of time. Based on the data samples collected during the first period of time, the building management system (e.g., PVB service 9008 of FIG. 90) can calculate a first value of the daily variation to the minimum level of demand on energy of the building for the first period of time by dividing the daily variation by the baseload. Based on the data samples collected during the first period of time, the building management system (e.g., EUI 9012 of FIG. 90) can calculate a first value of the EUI of the building during the first period of time.

Further, in some embodiments, the building management system (e.g., R-value service 9014 of FIG. 90) can calculate a first value of the thermal efficiency of the building during the first period of time based on the data samples collected during the first period of time and further based on electricity consumption of the building during the first period of time, one or more weather-related variables (indoor and/or outdoor temperatures around the building) during the first period of time, an area of a surface of the building during the first period of time, and a thermal conductivity of a construction material of the building during the first period of time.

Further, in some embodiments, the building management system (e.g., occupancy schedule service 9016 of FIG. 90) can calculate a first value of the occupancy schedule based on the data samples collected during the first period of time. The data samples can include at least one of an automatic turning on/off schedule of a lighting system, coupled to the building management system, during the first period of time or an automatic turning on/off schedule of the HVAC system, coupled to the building management system, during the first period of time.

Further, in some embodiments, the building management system (e.g., heating type service 9018 of FIG. 90) can calculate a heating degree day (HDD) for the first period of time variable based on the data samples collected during the first period of time. In response to determining the HDD variable for the first period of time, the heating type service 9018 may further determine the first value of an energy audit metric, which may be indicative of electric heating or gas heating, based on the HDD variable and energy consumption of the building during the first period of time. For example, the heating type service 9018 may generate a plot of the energy consumption versus the HDD variable (e.g., the X-axis representing the HDD variable and the Y-axis representing the energy consumption), and use the sign of a slope of the plot to determine whether the heating type is electric heating or gas heating.

Further, in some embodiments, based on the data samples collected during the first period of time, the building management system (e.g., correlation service 9010 of FIG. 90) can generate a model that defines a relationship between the data samples, which can include energy consumption of the building during the first period of time, and one or more weather-related variables (e.g., indoor/outdoor temperatures, irradiance, relative humidity) during the first period of time. Upon generating the model, the correlation service 9010 can determine a heating type of the building during the first period of time. Further, the correlation service 9010 may determine heating types separately for heating and cooling seasons. For example, in the heating season, the correlation service 9010 may determine that a negative correlation indicates electric heating that has been used during the first period of time and a positive correlation indicates gas heating that has been used during the first period of time.

At operation 9108, the building management system can collect data samples of the one or more variables for a second period of time. Such a second period of time may share a same time duration as the first period of time and occur later than the first period of time. For example, the first period of time may start from 12 AM of June $1^{st}$ and end at 12 AM of June $2^{nd}$; and the second period of time may start from 12 AM of June 3rd and end at 12 AM of June $4^{th}$. As the operation 9108 is substantially similar as the operation 9104, the discussion of operation 9108 is not repeated again. Similarly, in response to collecting the data samples for the second period of time, the building management system can calculate respective second values for the energy audit metrics for the second period of time based on the data samples, as discussed above. Thus, the discussion of operation 9110 is not repeated again.

Next, at operation 9112, the building management system can compare the first values and second values of the energy audit metrics. In some embodiments, the first values of the energy audit metrics may represent various characteristics (e.g., how efficient the building is in terms of consuming energy) of the building over the first period of time. Similarly, the second values of the energy audit metrics may represent various characteristics of the building over the second period of time. By automatically comparing the difference between the first values and second values and further displaying the difference and/or some of the first and second values on a dashboard (e.g., 1900 shown in FIGS. 19-34) at operation 9114, the building management system may allow a user or an administrator to be provided with more insights into performing energy analytics for the building management system. For example, by displaying the difference and/or some of the first and second values on the dashboard 1900, the building management system may facilitate the adjustments of the variables that the building management system uses to operate the various building equipment.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method for performing energy analytics in a building management system for a building, comprising:

collecting, by one or more processors, respective data samples of one or more variables of the building management system from building equipment during a first period of time;

calculating, by the one or more processors, a first plurality of values for one or more energy audit metrics based on the data samples collected during the first period of time;

collecting, by the one or more processors, respective data samples of the one or more variables from the building equipment during a second period of time;

calculating, by the one or more processors, a second plurality of values for the one or more energy audit metrics based on the data samples collected during the second period of time; and conducting, by the one or more processors, at least a portion of an American Society of Heating, Refrigeration, and Air-Conditioning Engineers (ASHRAE) building energy audit remotely without deploying an energy auditor to the building using the first plurality of values and the second plurality of values.

2. The method of claim 1, further comprising:

periodically calculating the first plurality of values for the one or more energy audit metrics based on the data samples collected during the first period of time; and periodically calculating the second plurality of values for the one or more energy audit metrics based on the data samples collected during the second period of time.

3. The method of claim 1, wherein the one or more energy audit metrics include at least one of: a minimum level of demand on energy of the building, a maximum level of demand on energy of the building, a range defined by a difference between the minimum level of demand on energy of the building and a maximum level of demand on energy of the building, an energy usage intensity (EUI), or a daily variation to the minimum level of demand on energy of the building.

4. The method of claim 1, wherein the one or more energy audit metrics include a thermal efficiency of the building, the method further comprising:

calculating at least one of the first plurality of values for the thermal efficiency further based on at least one of: electricity consumption of the building during the first period of time, one or more weather-related variables during the first period of time, an area of a surface of the building during the first period of time, or a thermal conductivity of a construction material of the building during the first period of time; and calculating at least one of the second plurality of values for the thermal efficiency further based on at least one of: electricity consumption of the building during the second period of time, one or more weather-related variables during the second period of time, an area of a surface of the building during the second period of time, or a thermal conductivity of a construction material of the building during the second period of time.

5. The method of claim 1, wherein the one or more energy audit metrics include an occupancy schedule of the building and wherein the building equipment includes a lightning system and/or a heating, ventilation, and air conditioning (HVAC) system, the method further comprising:

calculating at least one of the first plurality of values for the occupancy schedule based on at least one of an automatic turning on/off schedule of the lighting system during the first period of time or an automatic turning on/off schedule of the HVAC system during the first period of time; and calculating at least one of the second plurality of values for the occupancy schedule based on at least one of an automatic turning on/off schedule of the lighting system during the first period of time or an automatic turning on/off schedule of the HVAC system during the first period of time.

6. The method of claim 1, further comprising:

calculating a first heating degree day (HDD) variable based on the data samples collected during the first period of time;

determining at least one of the first plurality of values indicating a first heating type during the first period of time based on the first HDD variable and energy consumption of the building during the first period of time;

calculating a second HDD variable based on the data samples collected during the second period of time; and determining at least one of the second plurality of values indicating a second heating type during the second period of time based on the second HDD variable and energy consumption of the building during the second period of time.

7. The method of claim 1, further comprising:

generating a first model that defines a relationship between the data samples collected during the first period of time and one or more weather-related variables during the first period of time;

determining at least one of the first plurality of values indicating a first heating type during the first period of time based on the first model;

generating a second model that defines a relationship between the data samples collected during the second period of time and one or more weather-related variables during the second period of time; and determining at least one of the second plurality of values indicating a second heating type during the second period of time based on the second model.

8. A computing device comprising:

a memory; and one or more processors operatively coupled to the memory, the one or more processors configured to:

collect respective data samples of one or more variables of a building management system for a building from building equipment during a first period of time;

calculate a first plurality of values for one or more energy audit metrics based on the data samples collected during the first period of time;

collect respective data samples of the one or more variables from the building equipment during a second period of time;

calculate a second plurality of values for the one or more energy audit metrics based on the data samples collected during the second period of time; and conduct at least a portion of an American Society of Heating, Refrigeration, and Air-Conditioning Engineers (ASHRAE) building energy audit remotely without deploying an energy auditor to the building using the first plurality of values and the second plurality of values.

9. The computing device of claim 8, wherein the one or more energy audit metrics include at least one of: a minimum level of demand on energy of the building, a maximum level of demand on energy of the building, a range defined by a difference between the minimum level of demand on energy of the building and a maximum level of demand on energy of the building, an energy usage intensity (EUI), or a daily variation to the minimum level of demand on energy of the building.

10. The computing device of claim 8, wherein the one or more energy audit metrics include a thermal efficiency of the building, the one or more processors further configured to:

calculate at least one of the first plurality of values for the thermal efficiency further based on at least one of: electricity consumption of the building during the first period of time, one or more weather-related variables during the first period of time, an area of a surface of the building during the first period of time, or a thermal conductivity of a construction material of the building during the first period of time; and calculate at least one of the second plurality of values for the thermal efficiency further based on at least one of: electricity consumption of the building during the second period of time, one or more weather-related variables during the second period of time, an area of a surface of the building during the second period of time, or a thermal conductivity of a construction material of the building during the second period of time.

11. The computing device of claim 8, wherein the one or more energy audit metrics include an occupancy schedule of the building and wherein the building equipment includes a lightning system and/or a heating, ventilation, and air conditioning (HVAC) system, the one or more processors further configured to:

calculate at least one of the first plurality of values for the occupancy schedule based on at least one of an automatic turning on/off schedule of the lighting system during the first period of time or an automatic turning on/off schedule of the HVAC system during the first period of time; and calculate at least one of the second plurality of values for the occupancy schedule based on at least one of an automatic turning on/off schedule of the lighting system during the first period of time or an automatic turning on/off schedule of the HVAC system during the first period of time.

12. The computing device of claim 8, wherein the one or more processors are further configured to:

calculate a first heating degree day (HDD) variable based on the data samples collected during the first period of time;

determine at least one of the first plurality of values indicating a first heating type during the first period of time based on the first HDD variable and energy consumption of the building during the first period of time;

calculate a second HDD variable based on the data samples collected during the second period of time; and determine at least one of the second plurality of values indicating a second heating type during the second period of time based on the second HDD variable and energy consumption of the building during the second period of time.

13. The computing device of claim 8, wherein the one or more processors are further configured to:

generate a first model that defines a relationship between the data samples collected during the first period of time and one or more weather-related variables during the first period of time;

determine at least one of the first plurality of values indicating a first heating type during the first period of time based on the first model;

generate a second model that defines a relationship between the data samples collected during the second period of time and one or more weather-related variables during the second period of time; and determine at least one of the second plurality of values indicating a second heating type during the second period of time based on the second model.

14. A non-transitory computer readable medium storing program instructions for causing one or more processors to:

collect respective data samples of one or more variables of a building management system for a building from building equipment during a first period of time;

calculate a first plurality of values for one or more energy audit metrics based on the data samples collected during the first period of time;

collect respective data samples of the one or more variables from the building equipment during a second period of time;

calculate a second plurality of values for the one or more energy audit metrics based on the data samples collected during the second period of time;

conduct at least a portion of an American Society of Heating, Refrigeration, and Air-Conditioning Engineers (ASHRAE) building energy audit remotely without deploying an energy auditor to the building using the first plurality of values and the second plurality of values.

15. The non-transitory computer readable medium of claim 14, wherein the one or more energy audit metrics include at least one of: a minimum level of demand on energy of the building, a maximum level of demand on energy of the building, a range defined by a difference between the minimum level of demand on energy of the building and a maximum level of demand on energy of the building, an energy usage intensity (EUI), or a daily variation to the minimum level of demand on energy of the building.

16. The non-transitory computer readable medium of claim 14, wherein the one or more energy audit metrics include a thermal efficiency of the building, and wherein the program instructions further causes the one or more processors to:

calculate at least one of the first plurality of values for the thermal efficiency further based on at least one of: electricity consumption of the building during the first period of time, one or more weather-related variables during the first period of time, an area of a surface of the building during the first period of time, or a thermal conductivity of a construction material of the building during the first period of time; and calculate at least one of the second plurality of values for the thermal efficiency further based on at least one of: electricity consumption of the building during the second period of time, one or more weather-related variables during the second period of time, an area of a surface of the building during the second period of time, or a thermal conductivity of a construction material of the building during the second period of time.

17. The non-transitory computer readable medium of claim 14, wherein the one or more energy audit metrics include an occupancy schedule of the building and wherein the building equipment includes a lightning system and/or a heating, ventilation, and air conditioning (HVAC) system, and wherein the program instructions further causes the one or more processors to:

calculate at least one of the first plurality of values for the occupancy schedule based on at least one of an automatic turning on/off schedule of the lighting system during the first period of time or an automatic turning on/off schedule of the HVAC system during the first period of time; and calculate at least one of the second plurality of values for the occupancy schedule based on at least one of an automatic turning on/off schedule of the lighting system during the first period of time or an automatic turning on/off schedule of the HVAC system during the first period of time.

18. The non-transitory computer readable medium of claim 14, wherein the program instructions further causes the one or more processors to:

calculate a first heating degree day (HDD) variable based on the data samples collected during the first period of time;

determine at least one of the first plurality of values indicating a first heating type during the first period of time based on the first HDD variable and energy consumption of the building during the first period of time;

calculate a second HDD variable based on the data samples collected during the second period of time; and determine at least one of the second plurality of values indicating a second heating type during the second period of time based on the second HDD variable and energy consumption of the building during the second period of time.

19. The non-transitory computer readable medium of claim 14, wherein the program instructions further causes the one or more processors to:

generate a first model that defines a relationship between the data samples collected during the first period of time and one or more weather-related variables during the first period of time;

determine at least one of the first plurality of values indicating a first heating type during the first period of time based on the first model;

generate a second model that defines a relationship between the data samples collected during the second period of time and one or more weather-related variables during the second period of time; and determine at least one of the second plurality of values indicating a second heating type during the second period of time based on the second model.

20. The non-transitory computer readable medium of claim 14, wherein the program instructions further causes the one or more processors to:

periodically calculate the first plurality of values for the one or more energy audit metrics based on the data samples collected during the first period of time; and periodically calculate the second plurality of values for the one or more energy audit metrics based on the data samples collected during the second period of time.

* * * * *